(12) United States Patent
Yamazaki et al.

(10) Patent No.: US 11,640,996 B2
(45) Date of Patent: May 2, 2023

(54) SEMICONDUCTOR DEVICE AND MANUFACTURING METHOD THEREOF

(71) Applicant: SEMICONDUCTOR ENERGY LABORATORY CO., LTD., Atsugi (JP)

(72) Inventors: Shunpei Yamazaki, Tokyo (JP); Junichi Koezuka, Tochigi (JP); Masami Jintyou, Tochigi (JP); Yukinori Shima, Gunma (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 8 days.

(21) Appl. No.: 17/320,557

(22) Filed: May 14, 2021

(65) Prior Publication Data

US 2021/0273112 A1 Sep. 2, 2021

Related U.S. Application Data

(60) Continuation of application No. 16/658,196, filed on Oct. 21, 2019, now Pat. No. 11,011,648, which is a
(Continued)

(30) Foreign Application Priority Data

Feb. 5, 2014 (JP) .................................. 2014-020061
Mar. 4, 2014 (JP) .................................. 2014-041446

(51) Int. Cl.
*H01L 29/786* (2006.01)
*H01L 29/66* (2006.01)
*H01L 29/423* (2006.01)

(52) U.S. Cl.
CPC .... *H01L 29/7869* (2013.01); *H01L 29/42384* (2013.01); *H01L 29/66969* (2013.01);
(Continued)

(58) Field of Classification Search
None
See application file for complete search history.

(56) References Cited

U.S. PATENT DOCUMENTS 5,658,808 A 8/1997 Lin
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.
(Continued)

*Primary Examiner* — Bo B Jang
(74) *Attorney, Agent, or Firm* — Nixon Peabody LLP; Jeffrey L. Costellia

(57) ABSTRACT

A semiconductor device with favorable electric characteristics is provided. The semiconductor device includes a first insulating layer, a second insulating layer, an oxide semiconductor layer, and first to third conductive layers. The oxide semiconductor layer includes a region in contact with the first insulating layer, the first conductive layer is connected to the oxide semiconductor layer, and the second conductive layer is connected to the oxide semiconductor layer. The second insulating layer includes a region in contact with the oxide semiconductor layer, and the third conductive layer includes a region in contact with the second insulating layer. The oxide semiconductor layer includes first to third regions. The first region and the second region are separated from each other, and the third region is located
(Continued)

between the first region and the second region. The third region and the third conductive layer overlap with each other with the second insulating layer located therebetween. The first region and the second region include a region having a higher carbon concentration than the third region.

20 Claims, 69 Drawing Sheets

Related U.S. Application Data continuation of application No. 15/907,315, filed on Feb. 28, 2018, now Pat. No. 10,680,116, which is a division of application No. 14/610,336, filed on Jan. 30, 2015, now Pat. No. 9,929,279.

(52) U.S. Cl.
CPC .. *H01L 29/78606* (2013.01); *H01L 29/78618* (2013.01); *H01L 29/78648* (2013.01); *H01L 29/78696* (2013.01)

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,520 B2 | 10/2009 | Hirao et al. |
| 7,674,650 B2 | 3/2010 | Akimoto et al. |
| 7,732,819 B2 | 6/2010 | Akimoto et al. |
| 7,781,964 B2 | 8/2010 | Hara et al. |
| 7,910,490 B2 | 3/2011 | Akimoto et al. |
| 7,932,521 B2 | 4/2011 | Akimoto et al. |
| 7,993,964 B2 | 8/2011 | Hirao et al. |
| 8,003,981 B2 | 8/2011 | Iwasaki et al. |
| 8,110,436 B2 | 2/2012 | Hayashi et al. |
| 8,164,090 B2 | 4/2012 | Iwasaki et al. |
| 8,274,077 B2 | 9/2012 | Akimoto et al. |
| 8,355,195 B2 | 1/2013 | Sato |
| 8,384,076 B2 | 2/2013 | Park et al. |
| 8,399,882 B2 | 3/2013 | Jeon et al. |
| 8,420,553 B2 | 4/2013 | Yamazaki |
| 8,456,889 B2 | 6/2013 | Kim et al. |
| 8,466,463 B2 | 6/2013 | Akimoto et al. |
| 8,513,661 B2 | 8/2013 | Takahashi et al. |
| 8,530,273 B2 | 9/2013 | Den Boer |
| 8,624,240 B2 | 1/2014 | Sato et al. |
| 8,629,069 B2 | 1/2014 | Akimoto et al. |
| 8,669,550 B2 | 3/2014 | Akimoto et al. |
| 8,748,240 B2 | 6/2014 | Yamazaki |
| 8,790,959 B2 | 7/2014 | Akimoto et al. |
| 8,796,069 B2 | 8/2014 | Akimoto et al. |
| 8,860,021 B2 | 10/2014 | Isobe et al. |
| 8,883,556 B2 | 11/2014 | Yamazaki |
| 8,890,152 B2 | 11/2014 | Yamazaki et al. |
| 8,946,097 B2 | 2/2015 | Yamazaki |
| 8,946,790 B2 | 2/2015 | Yokoi et al. |
| 9,059,432 B2 | 6/2015 | Kim et al. |
| 9,093,540 B2 | 7/2015 | Lee et al. |
| 9,099,303 B2 | 8/2015 | Yamazaki |
| 9,166,055 B2 | 10/2015 | Yamazaki et al. |
| 9,184,296 B2 | 11/2015 | Koezuka et al. |
| 9,214,474 B2 | 12/2015 | Yamazaki |
| 9,218,966 B2 | 12/2015 | Honda et al. |
| 9,236,428 B2 | 1/2016 | Isobe et al. |
| 9,240,488 B2 | 1/2016 | Yamazaki et al. |
| 9,287,409 B2 | 3/2016 | Yamazaki et al. |
| 9,378,980 B2 | 6/2016 | Yamazaki et al. |
| 9,450,104 B2 | 9/2016 | Koezuka et al. |
| 9,455,333 B2 | 9/2016 | Lee et al. |
| 9,553,200 B2 | 1/2017 | Isobe et al. |
| 9,601,636 B2 | 3/2017 | Yamazaki et al. |
| 9,698,275 B2 | 7/2017 | Yamazaki |
| 9,728,651 B2 | 8/2017 | Yamazaki et al. |
| 9,780,225 B2 | 10/2017 | Yamazaki |
| 9,793,377 B2 | 10/2017 | Lee et al. |
| 10,192,990 B2 | 1/2019 | Yokoi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0203643 A1 | 10/2003 | Hasei et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Theiss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |

(56) References Cited

U.S. PATENT DOCUMENTS

| | | |
|---|---|---|
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0042670 A1 | 2/2011 | Sato et al. |
| 2011/0104851 A1 | 5/2011 | Akimoto et al. |
| 2011/0121290 A1 | 5/2011 | Akimoto et al. |
| 2011/0147738 A1 | 6/2011 | Yamazaki et al. |
| 2012/0001167 A1 | 1/2012 | Morosawa |
| 2012/0228606 A1 | 9/2012 | Koezuka et al. |
| 2013/0105865 A1 | 5/2013 | Honda et al. |
| 2013/0187150 A1 | 7/2013 | Yamazaki et al. |
| 2013/0221345 A1 | 8/2013 | Ohno et al. |
| 2013/0221347 A1 | 8/2013 | Isobe et al. |
| 2014/0027762 A1 | 1/2014 | Tsurume et al. |
| 2016/0163880 A1 | 6/2016 | Ohno et al. |
| 2017/0110586 A1 | 4/2017 | Isobe et al. |
| 2017/0323976 A1 | 11/2017 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2007-220817 A | 8/2007 |
| JP | 2011-142309 A | 7/2011 |
| JP | 2011-146694 A | 7/2011 |
| JP | 2012-015436 A | 1/2012 |
| JP | 2012-151461 A | 8/2012 |
| JP | 2012-209543 A | 10/2012 |
| JP | 2013-016785 A | 1/2013 |
| JP | 2013-021312 A | 1/2013 |
| JP | 2013-021315 A | 1/2013 |
| JP | 2013-038400 A | 2/2013 |
| JP | 2013-102150 A | 5/2013 |
| JP | 2013-149964 A | 8/2013 |
| JP | 2013-149968 A | 8/2013 |
| JP | 2013-164581 A | 8/2013 |
| JP | 2013-168646 A | 8/2013 |
| JP | 2013-211538 A | 10/2013 |
| JP | 2013-211543 A | 10/2013 |
| JP | 2013-251526 A | 12/2013 |
| JP | 2013-545273 | 12/2013 |
| WO | WO-2004/114391 | 12/2004 |
| WO | WO-2011/070892 | 6/2011 |
| WO | WO-2011/074407 | 6/2011 |
| WO | WO-2012/044344 | 4/2012 |
| WO | WO-2012/090973 | 7/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and Sn-Doped Zinc Indium Oxide Thin Film Transistors for Amoled Back-plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated By TFT Transfer Technology", IEDM 05: Technical Digest of International Electron Devices Meeting, Decembers, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects In ZnO", Phys. Rev. B (Physical Review. B), Oct. 4, 2007, vol. 76, No. 16, pp. 165202-1-165202-22.

(56) References Cited

OTHER PUBLICATIONS

Janotti.A et al., "Oxygen Vacancies In ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1 Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Nl, Cu,Or Zn] At Temperatures Over 1000° C", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 9 3, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

(56) References Cited

OTHER PUBLICATIONS

Park.S et al., "Challenge To Future Displays: Transparent AM-OLED Driven By Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

FIG. 20A
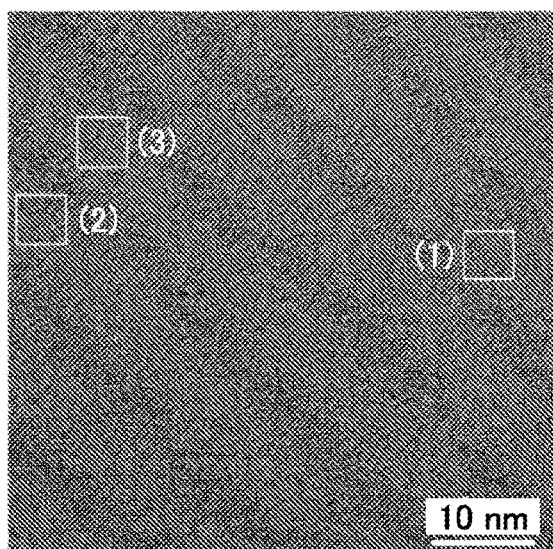
FIG. 20B  FIG. 20C  FIG. 20D
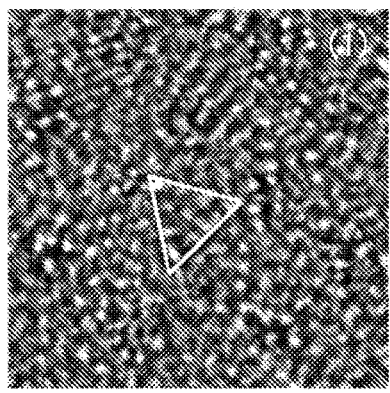 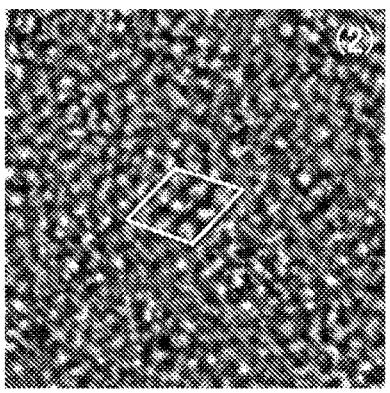 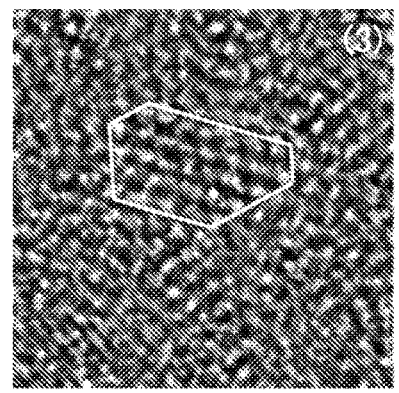

Transistor A          Transistor B

FIG. 29A
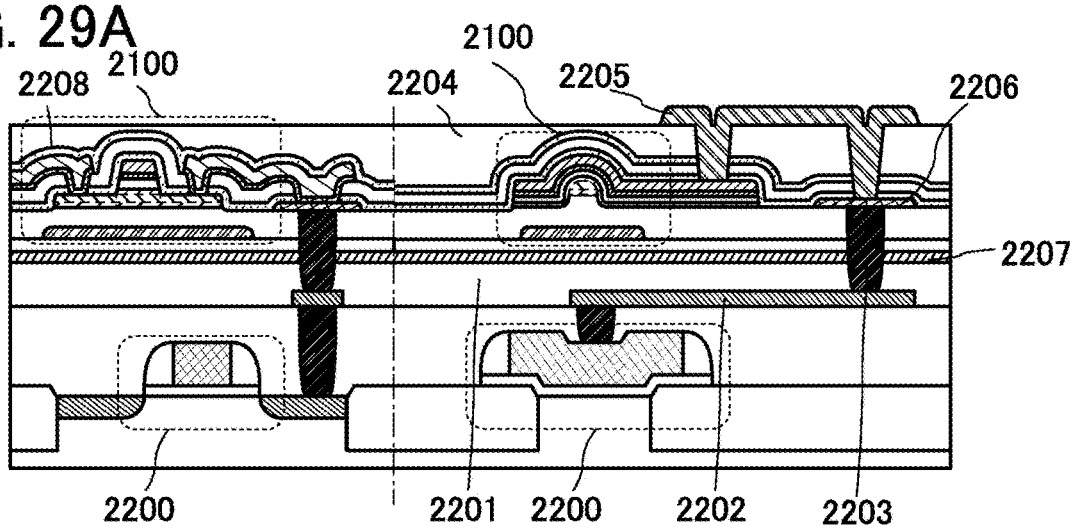
FIG. 29B
FIG. 29C
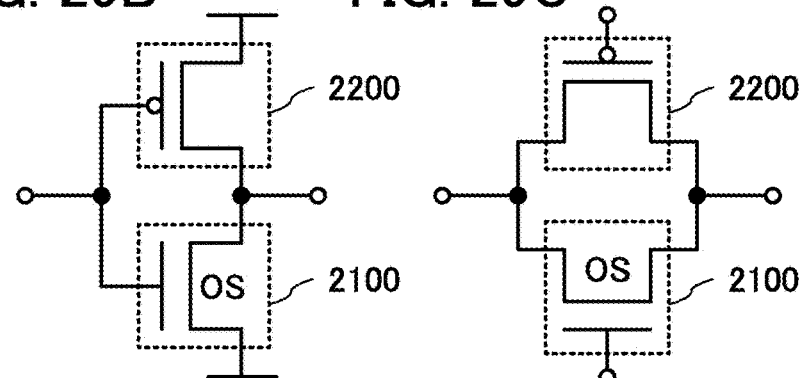
FIG. 29D
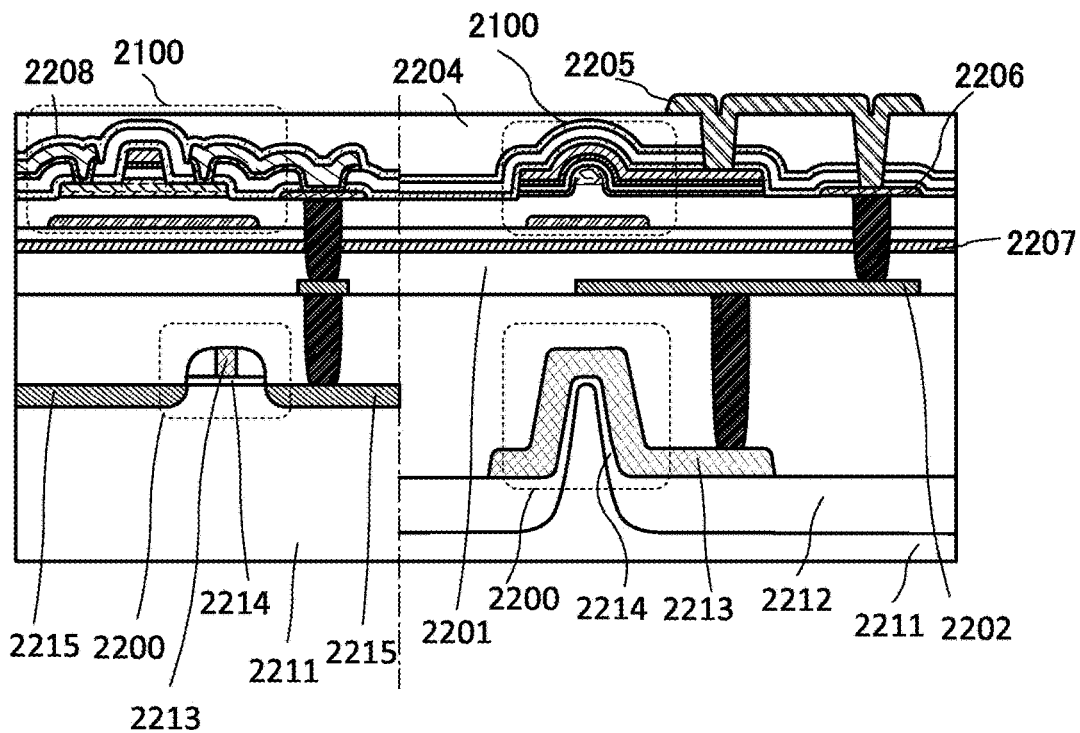

channel-protective
BGTC transistor
L/W=10.2/82.6 μm Vg=±30V channel-etched
BGTC transistor
L/W=6/576 μm Vg=±30V argon-added
TGSA transistor
L/W=2/50 μm Vg=±12V argon-plasma-treated
TGSA transistor B2
L/W=2/50 μm Vg=±12V InGaZnO₄

100psec after Ar enter

100psec after O enter

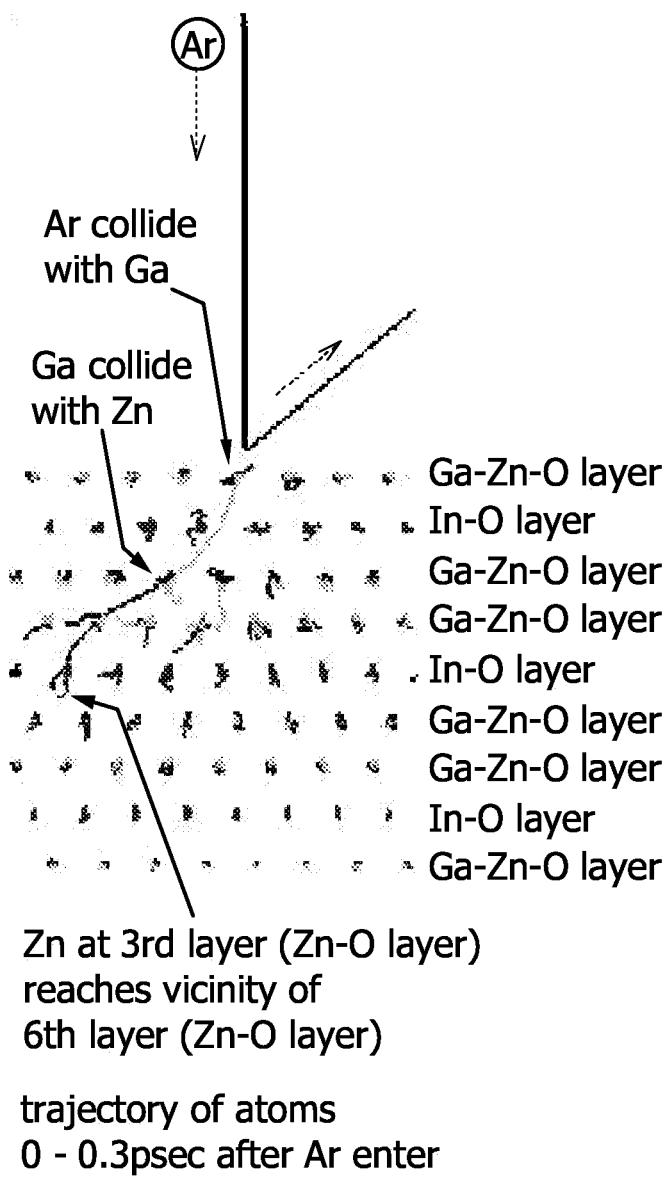

Ar collide with Ga
Ga collide with Zn

- Ga-Zn-O layer
- In-O layer
- Ga-Zn-O layer
- Ga-Zn-O layer
- In-O layer
- Ga-Zn-O layer
- Ga-Zn-O layer
- In-O layer
- Ga-Zn-O layer Zn at 3rd layer (Zn-O layer) reaches vicinity of 6th layer (Zn-O layer)

trajectory of atoms
0 - 0.3psec after Ar enter

FIG. 66B

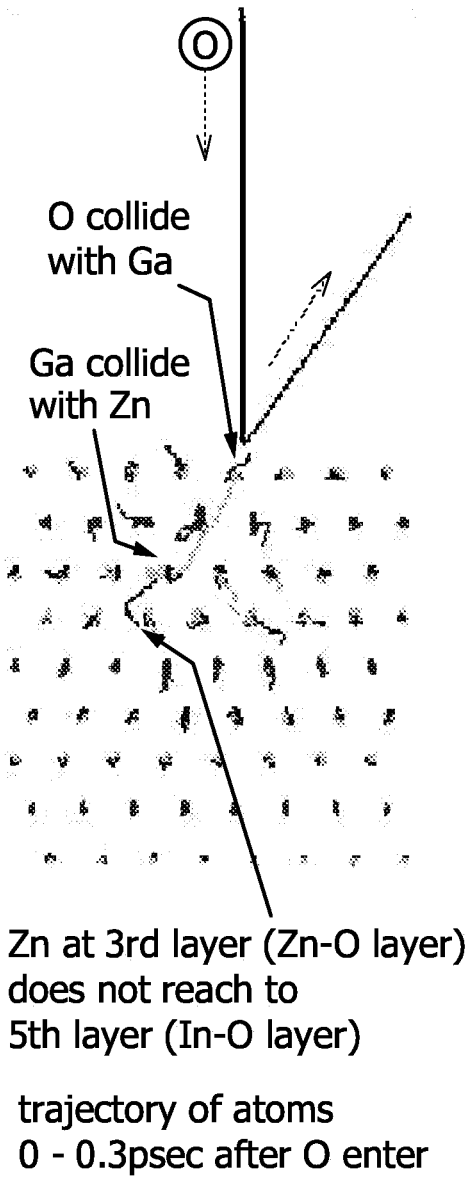

O collide with Ga
Ga collide with Zn

Zn at 3rd layer (Zn-O layer) does not reach to 5th layer (In-O layer)

trajectory of atoms
0 - 0.3psec after O enter

CAAC-OS  |—— 1 nm ——| target  |—— 1 nm ——|

FIG. 68A
FIG. 68B
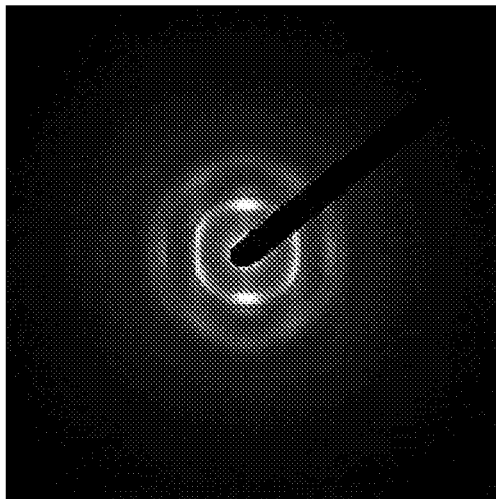
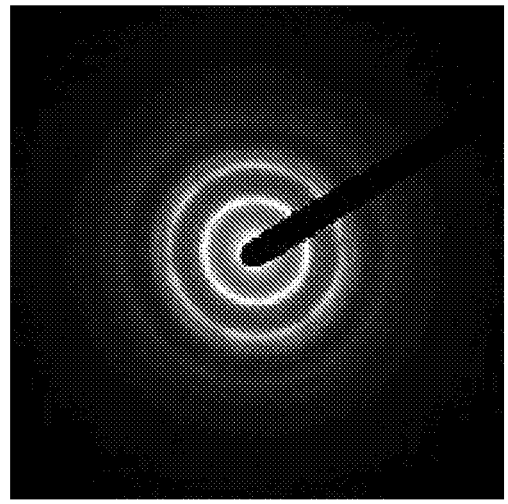

SEMICONDUCTOR DEVICE AND MANUFACTURING METHOD THEREOF

BACKGROUND OF THE INVENTION

1. Field of the Invention

One embodiment of the present invention relates to a semiconductor device using an oxide semiconductor and a method for manufacturing the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, or an electronic device includes a semiconductor device.

2. Description of the Related Art

A technique by which a transistor is formed using a semiconductor thin film formed over a substrate having an insulating surface has been attracting attention. The transistor is used in a wide range of electronic devices such as an integrated circuit (IC) or an image display device (also simply referred to as a display device). As the semiconductor thin film that can be used in the transistor, silicon-based semiconductor materials have been widely known, but oxide semiconductors have been attracting attention as alternative materials.

For example, a technique for forming a transistor using zinc oxide or an In—Ga—Zn-based oxide semiconductor as an oxide semiconductor is disclosed (see Patent Documents 1 and 2).

REFERENCE

Patent Document

[Patent Document 1] Japanese Published Patent Application No. 2007-123861
[Patent Document 2] Japanese Published Patent Application No. 2007-096055

SUMMARY OF THE INVENTION

An object of one embodiment of the present invention is to provide a semiconductor device with favorable electrical characteristics. Another object of one embodiment of the present invention is to provide a semiconductor device with a high on-state current. Another object is to provide a semiconductor device that is suitable for high-speed operation. In addition, another object is to provide a highly integrated semiconductor device. Another object is to provide a semiconductor device with low power consumption. Another object is to provide a semiconductor device with high reliability. Another object is to provide a semiconductor device that can retain data even when power supply is stopped. Another object is to provide a novel semiconductor device. Another object is to provide a manufacturing method of the above-described semiconductor device.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

One embodiment of the present invention relates to a transistor that includes an oxide semiconductor layer in a channel formation region.

One embodiment of the present invention is a semiconductor device including a first insulating layer, a second insulating layer, an oxide semiconductor layer, a first conductive layer, a second conductive layer, and a third conductive layer. In the semiconductor device, the oxide semiconductor layer includes a region in contact with the first insulating layer. The first conductive layer is electrically connected to the oxide semiconductor layer. The second conductive layer is electrically connected to the oxide semiconductor layer. The second insulating layer includes a region in contact with the oxide semiconductor layer. The third conductive layer includes a region in contact with the second insulating layer. The second insulating layer includes a region that can function as a gate insulating film. The first conductive layer includes a region that can function as one of a source electrode and a drain electrode. The second conductive layer includes a region that can function as the other of the source electrode and the drain electrode. The third conductive layer includes a region that can function as a gate electrode. The oxide semiconductor layer includes a first region, a second region, and a third region. The first region and the second region are separated from each other. The third region is located between the first region and the second region. The third region and the third conductive layer overlap with each other with the second insulating layer located therebetween. The first region and the second region include a region having a higher carbon concentration than the third region.

Note that in this specification and the like, ordinal numbers such as "first", "second", and the like are used in order to avoid confusion among components and do not limit the number.

The first region and the second region may each include a region having a higher concentration of at least one element selected from phosphorus, arsenic, antimony, boron, aluminum, silicon, nitrogen, helium, neon, argon, krypton, xenon, indium, fluorine, chlorine, titanium, zinc, and hydrogen than the third region.

The first region and the second region may each include a region in contact with a nitride insulating film containing hydrogen.

One embodiment of the present invention is a semiconductor device including a first insulating layer, a second insulating layer, an oxide semiconductor layer, a first conductive layer, a second conductive layer, and a third conductive layer. In the semiconductor device, the oxide semiconductor layer includes a region in contact with the first insulating layer. The first conductive layer is electrically connected to the oxide semiconductor layer. The second conductive layer is electrically connected to the oxide semiconductor layer. The second insulating layer includes a region in contact with the oxide semiconductor layer. The third conductive layer includes a region in contact with the second insulating layer. The second insulating layer includes a region that can function as a gate insulating film. The first conductive layer includes a region that can function as one of a source electrode and a drain electrode. The second conductive layer includes a region that can function as the other of the source electrode and the drain electrode. The third conductive layer includes a region that can function as a gate electrode. The oxide semiconductor layer includes a first region, a second region, a third region, a fourth region, and a fifth region. The first region and the second region are separated from each other. The first region includes a region overlapping with the first conductive layer. The second region includes a region overlapping with the second conductive layer. The third region and the third conductive layer overlap with each other with the second insulating layer located therebetween. The third region is located between the first region and the second region. The fourth region is located between the first region and the third region. The fifth region is located between the second region and the third region. The fourth region and the fifth region include a region having a higher carbon concentration than the first region, the second region, and the third region.

The fourth region and the fifth region may each include a region having a higher concentration of at least one element selected from phosphorus, arsenic, antimony, boron, aluminum, silicon, nitrogen, helium, neon, argon, krypton, xenon, indium, fluorine, chlorine, titanium, zinc, and hydrogen than the first region, the second region, and the third region.

The fourth region and the fifth region may each include a region in contact with a nitride insulating film containing hydrogen.

The semiconductor device may further include a fourth conductive layer that overlaps with the oxide semiconductor layer with the first insulating layer located therebetween.

The oxide semiconductor layer may include a first oxide semiconductor layer and a second oxide semiconductor layer; the second oxide semiconductor layer and the first oxide semiconductor layer may be located in this order from the first insulating layer side. The first oxide semiconductor layer may cover the second oxide semiconductor layer.

In the above-described structure of the oxide semiconductor layer, the first oxide semiconductor layer and the second oxide semiconductor layer each preferably include indium, zinc, and M (M is aluminum, titanium, gallium, yttrium, zirconium, lanthanum, cerium, neodymium, or hafnium); the first oxide semiconductor layer preferably has a larger atomic ratio of M to indium than the second oxide semiconductor layer.

The oxide semiconductor layer may include a first oxide semiconductor layer, a second oxide semiconductor layer, and a third oxide semiconductor layer. The third oxide semiconductor layer, the second oxide semiconductor layer, and the first oxide semiconductor layer may be located in this order from the first insulating layer side. The first oxide semiconductor layer may cover the second oxide semiconductor layer and the third oxide semiconductor layer.

In the above-described structure of the oxide semiconductor layer, the first oxide semiconductor layer, the second oxide semiconductor layer, and the third oxide semiconductor layer each preferably include indium, zinc, and M (M is aluminum, titanium, gallium, yttrium, zirconium, lanthanum, cerium, neodymium, or hafnium); the first oxide semiconductor layer and the third oxide semiconductor layer preferably have a larger atomic ratio of M to indium than the second oxide semiconductor layer.

Non-single-crystal can be used in the oxide semiconductor layer, and the oxide semiconductor layer preferably includes c-axis-aligned crystal.

One embodiment of the present invention is a method for manufacturing a semiconductor device, which includes the steps of: forming an oxide semiconductor film over an insulating surface; forming a first resist mask over the oxide semiconductor film; selectively etching the oxide semiconductor film using the first resist mask to form an oxide semiconductor layer; removing the first resist mask; forming a first insulating film over the oxide semiconductor layer; forming a conductive film over the first insulating film; forming a second resist mask over the conductive film; selectively etching the conductive film and the first insulating film using the second resist mask to form a stack including a first insulating layer and a conductive layer and to expose a first region and a second region of the oxide semiconductor layer; adding an impurity to the first region and the second region by plasma treatment to form oxygen vacancies; removing the second resist mask; forming a second insulating film containing hydrogen over the first region and the second region of the oxide semiconductor layer, the first insulating layer, and the conductive layer; and making the hydrogen diffuse from the second insulating film to the first region and the second region, to lower resistances of the first region and the second region.

With one embodiment of the present invention, a semiconductor device with favorable electrical characteristics can be provided. A semiconductor device with a high on-state current can be provided. A semiconductor device that is suitable for high-speed operation can be provided. In addition, a highly integrated semiconductor device can be provided. A semiconductor device with low power consumption can be provided. A semiconductor device with high reliability can be provided. A semiconductor device that can retain data even when power supply is stopped can be provided. A novel semiconductor device can be provided. A manufacturing method of the above-described semiconductor device can be provided.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

In the accompanying drawings:

FIGS. 1.5A and 15B are a top view and a cross-sectional view of a transistor;

FIGS. 20A to 20D are Cs-corrected high-resolution TEM images of a plane of a CAAC-OS;

FIGS. 29A and 29D are each a cross-sectional view of a semiconductor device, and FIGS. 29B and 29C are each a circuit diagram of a semiconductor device;

FIGS. 64A and 64B show a structure of $InGaZnO_4$ before collision of an atom, and the like;

FIGS. 66A and 66B show trajectories of atoms after collision of an atom;

FIGS. 68A and 68B show electron diffraction patterns of a CAAC-OS; and

DETAILED DESCRIPTION OF THE INVENTION

Figure 1A:
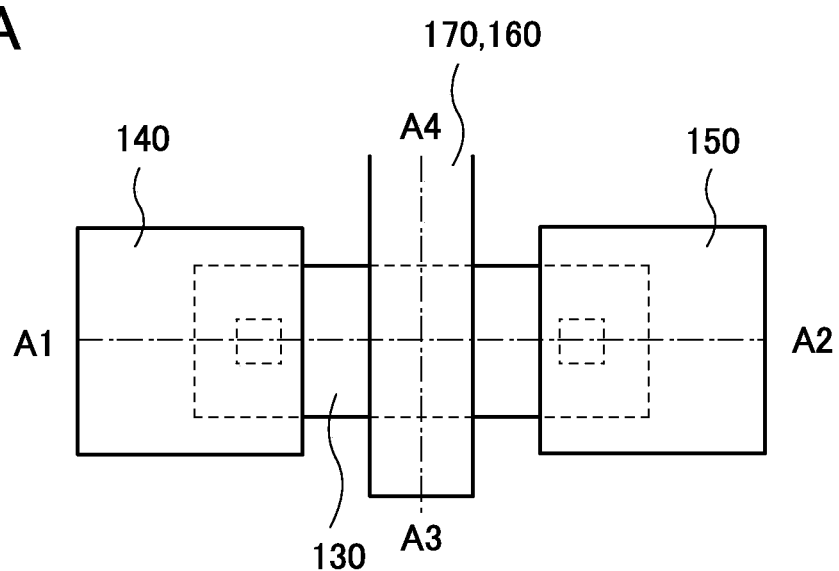
FIGS. 1A and 1B are a top view and a cross-sectional view of a transistor.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of the embodiments below. Note that in structures of the invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

Note that in this specification and the like, an explicit description "X and Y are connected" means that X and Y are electrically connected, X and Y are functionally connected, and X and Y are directly connected. Here, X and Y each denote an object (e.g., a device, an element, a circuit, a wiring, an electrode, a terminal, a conductive film, a layer, or the like). Accordingly, without limiting to a predetermined connection relation, for example, a connection relation shown in drawings and texts, another element may be interposed between elements having the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be turned on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit, and a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. When a signal output from X is transmitted to Y, it can be said that X and Y are functionally connected even if another circuit is provided between X and Y.

Note that an explicit description "X and Y are connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit description "A and B are electrically connected" is the same as the description "A and B are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, each of X, Y, Z1, and Z2 denotes an object (e.g., a device, an element, a circuit, a wiring, an electrode, a terminal, a conductive film, a layer, or the like).

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. As examples of the glass substrate, a barium borosilicate glass substrate, an aluminoborosilicate glass substrate, a soda lime glass substrate, and the like can be given. For the flexible substrate, a flexible synthetic resin such as plastic typified by polyethylene terephthalate (PET), polyethylene naphthalate (PEN), and polyether sulfone (PES), or acrylic can be used, for example. For the attachment film, polypropylene, polyester, polyvinyl fluoride, polyvinyl chloride, or the like can be used, for example. For the base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. With the use of such a substrate, a transistor with excellent properties, a transistor with low power consumption, or a device with high durability can be formed, high heat resistance can be provided, or a reduction in weight or thickness can be achieved.

Embodiment 1

In this embodiment, a transistor of one embodiment of the present invention will be described with reference to drawings.

In a transistor of one embodiment of the present invention, silicon (including strained silicon), germanium, silicon germanium, silicon carbide, gallium arsenide, aluminum gallium arsenide, indium phosphide, gallium nitride, an organic semiconductor, an oxide semiconductor, or the like can be used for a channel formation region. It is particularly preferable to use an oxide semiconductor having a wider band gap than silicon for the channel formation region.

For example, the oxide semiconductor preferably contains at least indium (In) or zinc (Zn). More preferably, the oxide semiconductor contains an oxide represented by an In-M-Zn-based oxide (M is a metal such as Al, Ti, Ga, Ge, Y, Zr, Sn, La, Ce, or Hf).

In the description below, unless otherwise specified, transistors described as examples include an oxide semiconductor in their channel formation regions.

Figure 1B:
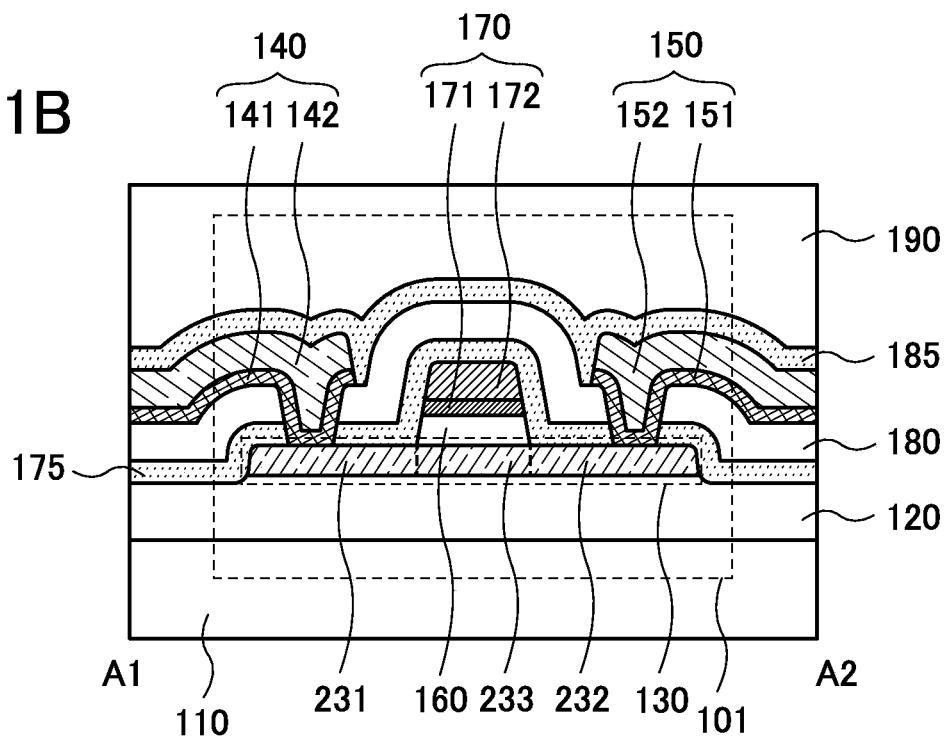

FIGS. 1A and 1B are a top view and a cross-sectional view of a transistor 101 of one embodiment of the present invention. FIG. 1A is the top view. FIG. 1B illustrates a cross section in the direction of a dashed-dotted line A1-A2 in FIG. 1A. A cross section in the direction of a dashed-dotted line A3-A4 in FIG. 1A corresponds to FIG. 2A or 2B. In these drawings, some components are enlarged, reduced in size, or omitted for easy understanding. In some cases, the direction of the dashed-dotted line A1-A2 is referred to as a channel length direction, and the direction of the dashed-dotted line A3-A4 is referred to as a channel width direction.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

Note that the channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, without accurate information on the shape of a semiconductor, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from the value obtained by calculation using an effective channel width is obtained in some cases.

The transistor 101 includes an insulating layer 120 in contact with a substrate 110, an oxide semiconductor layer 130 in contact with the insulating layer 120, a gate insulating film 160 in contact with the oxide semiconductor layer 130, a gate electrode layer 170 in contact with the gate insulating film 160, an insulating layer 175 covering the oxide semiconductor layer 130, the gate insulating film 160, and the gate electrode layer 170, an insulating layer 180 in contact with the insulating layer 175, a source electrode layer 140 and a drain electrode layer 150 that are electrically connected to the oxide semiconductor layer 130 through openings provided in the insulating layers 175 and 180, and an insulating layer 185 formed over the above-described components. An insulating layer 190 (planarization film) in contact with the insulating layer 185 or the like may be provided as necessary.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification. In addition, the term "electrode layer" can be replaced with the term "wiring".

The gate electrode layer 170 includes two layers, a conductive layer 171 and a conductive layer 172, in the drawing, but may also be a single layer or a stack of three or more layers.

The source electrode layer 140 includes two layers, a conductive layer 141 and a conductive layer 142, in the drawing, but may also be a single layer or a stack of three or more layers. Similarly, the drain electrode layer 150, which includes a conductive layer 151 and a conductive layer 152 in the drawing, may be a single layer or a stack of three or more layers.

Figure 2A:
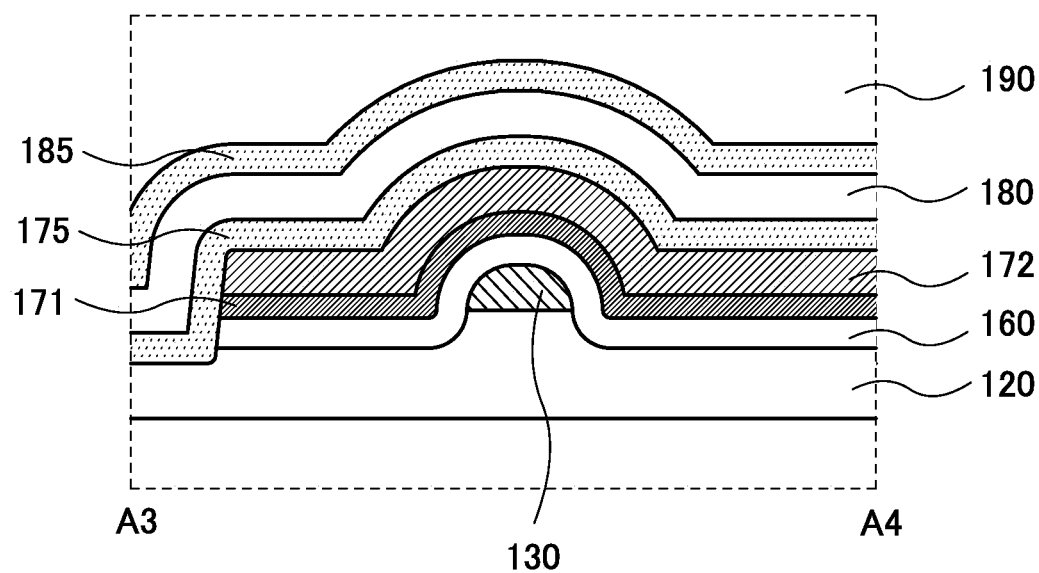
FIGS. 2A and 2B each illustrate a cross section of a transistor in a channel width direction.
Figure 2B:
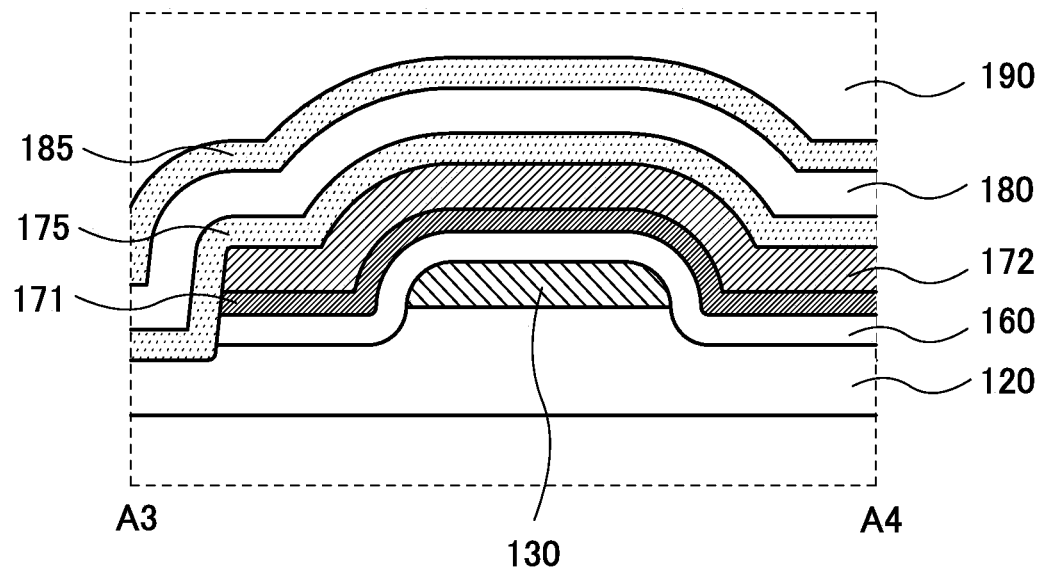

In the case where the channel width is shortened, it is preferable that a top surface of the oxide semiconductor layer 130 have a curvature as illustrated in FIG. 2A. The curvature of the top surface can improve coverage with a film formed over the top surface. However, in the case where the channel width is relatively long, the oxide semiconductor layer 130 may have a flat top region as illustrated in FIG. 2B. Note that this description of the channel width can also apply to the other transistors disclosed in this specification.

The transistor of one embodiment of the present invention has a self-aligned structure in which the gate electrode layer 170 overlaps with neither the source electrode layer 140 nor the drain electrode layer 150. Since a transistor with a self-aligned structure has extremely small parasitic capacitance between a gate electrode layer and source and drain electrode layers, it is suitable for applications that require high-speed operation.

In the transistor 101, the oxide semiconductor layer 130 includes a region 231 (source region) and a region 232 (drain region) provided apart from each other, and a region 233 (channel region) that is provided between the region 231 and the region 232 and overlaps with the gate electrode layer 170 with the gate insulating film 160 placed therebetween.

Here, the region 231 and the region 232 each includes a region in contact with the insulating layer 175 as illustrated in FIG. 1B. When an insulating material containing hydrogen is used for the insulating layer 175, the region 231 and the region 232 can have lower resistance.

Specifically, by the steps up to and including the formation of the insulating layer 175, the interaction between oxygen vacancies generated in the region 231 and the region 232 and hydrogen that diffuses into the region 231 and the region 232 from the insulating layer 175 changes the region 231 and the region 232 to n-type regions with low resistance. As the insulating material containing hydrogen, for example, a silicon nitride film, an aluminum nitride film, or the like can be used.

Furthermore, an impurity for forming oxygen vacancies to increase conductivity may be added to the region 231 and the region 232. As the impurity for forming oxygen vacancies in the oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, an ion implantation method, an ion doping method, a plasma immersion ion implantation method, or the like can be used.

When the above element is added as an impurity element to the oxide semiconductor layer, a bond between a metal element and oxygen in the oxide semiconductor layer is cut, whereby an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

As the method for adding the impurity, plasma treatment that can easily deal with large-area substrates is preferably employed. For example, a substrate on which a transistor is to be formed is placed on one (cathode) of a pair of electrodes so that bias is applied to the substrate, high-frequency power (e.g., 13.56 MHz) is applied between the pair of electrodes in a reduced-pressure argon atmosphere to generate argon plasma. At this time, part of the gate electrode layer 170 might be sputtered and deposited on an end portion of the gate insulating film 160, which might bring about a short circuit between the regions 231 and 232 and the gate electrode layer 170.

Therefore, in the case of performing plasma treatment, it is preferable that a resist mask for forming patterns of the gate electrode layer 170 and the gate insulating film 160 be left over the gate electrode layer 170 during the plasma treatment.

By leaving the resist mask over the gate electrode layer 170 during the plasma treatment, sputtering of the gate electrode layer 170 is suppressed, so that a short circuit between the regions 231 and 232 and the gate electrode layer 170 can be prevented and a gate leakage current can be reduced. Moreover, since part of the resist mask is sputtered, in the case of performing the treatment with argon plasma, argon and carbon can be added to the regions 231 and 232. Since addition of carbon to the oxide semiconductor layer forms an oxygen vacancy as described above, the conductivity of the oxide semiconductor layer can be further increased.

Thus, the regions 231 and 232 in the transistor 101 include an area having a higher concentration of the impurity that forms an oxygen vacancy than the region 233. Since hydrogen enters the oxygen vacancy, the regions 231 and 232 include an area having a higher hydrogen concentration than the region 233. In the transistor with this structure, the source region and the drain region can have lower resistance, whereby on-state current of the transistor can be increased.

Note that elements which form oxygen vacancies in the oxide semiconductor layer are described as impurities (impurity elements). Typical examples of impurity elements are boron, carbon, nitrogen, fluorine, aluminum, silicon, phosphorus, chlorine, and rare gas elements. Typical examples of rare gas elements are helium, neon, argon, krypton, and xenon.

When hydrogen is added to an oxide semiconductor in which oxygen vacancies are generated by addition of impurity elements, hydrogen enters oxygen vacant sites and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. An oxide semiconductor generally has a visible light transmitting property because of its large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

The temperature dependence of resistivity in a film formed using an oxide conductor (hereinafter, referred to as oxide conductor layer) is described with reference to FIG. 57.

Samples each including an oxide conductor layer were formed. As the oxide conductor layer, the following three layers were formed: an oxide conductor layer (OC_$SiN_x$) formed by making an oxide semiconductor layer in contact with a silicon nitride film; an oxide conductor layer (OC_Ar dope+SiN$_x$) obtained by adding argon to an oxide semiconductor layer with a doping apparatus and making the oxide semiconductor layer in contact with a silicon nitride film; and an oxide conductor layer (OC_Ar plasma+SiN$_x$) obtained by exposing an oxide semiconductor layer to argon plasma with a plasma processing apparatus and making the oxide semiconductor layer in contact with a silicon nitride film. Note that the silicon nitride film contains hydrogen.

A method for fabricating the sample including the oxide conductor layer (OC_SiN$_x$) is as follows. A 400-nm-thick silicon oxynitride film was formed over a glass substrate by a plasma CVD method, and then exposed to oxygen plasma to add oxygen ions to the silicon oxynitride film, thereby forming a silicon oxynitride film from which oxygen is released by heating. Next, a 100-nm-thick In—Ga—Zn oxide film was formed over the silicon oxynitride film by a sputtering method using a sputtering target with an atomic ratio of In:Ga:Zn=5:5:6, and heat treatment at 450° C. in a nitrogen atmosphere and subsequently heat treatment at 450° C. in a mixed gas atmosphere of nitrogen and oxygen were performed. After that, a 100-nm-thick silicon nitride film was formed by a plasma CVD method. Then, heat treatment was performed at 350° C. in a mixed gas atmosphere of nitrogen and oxygen.

A method for fabricating the sample including the oxide conductor layer (OC_Ar dope+SiN$_x$) is as follows. A 400-nm-thick silicon oxynitride film was formed over a glass substrate by a plasma CVD method, and then exposed to oxygen plasma to add oxygen ions to the silicon oxynitride film, thereby forming a silicon oxynitride film from which oxygen is released by heating. Next, a 100-nm-thick In—Ga—Zn oxide film was formed over the silicon oxynitride film by a sputtering method using a sputtering target with an atomic ratio of In:Ga:Zn=5:5:6, and heat treatment at 450° C. in a nitrogen atmosphere and subsequently heat treatment at 450° C. in a mixed gas atmosphere of nitrogen and oxygen were performed. Then, by a doping apparatus, argon was added to the In—Ga—Zn oxide film with a dose of $5 \times 10^{14}$/cm$^2$ at an acceleration voltage of 10 kV to form oxygen vacancies in the In—Ga—Zn oxide film. After that, a 100-nm-thick silicon nitride film was formed by a plasma CVD method. Then, heat treatment was performed at 350° C. in a mixed gas atmosphere of nitrogen and oxygen.

A method for fabricating the sample including the oxide conductor layer (OC_Ar plasma+SiN$_x$) is as follows. A 400-nm-thick silicon oxynitride film was formed over a glass substrate by a plasma CVD method, and then exposed to oxygen plasma, thereby forming a silicon oxynitride film from which oxygen is released by heating. Next, a 100-nm-thick In—Ga—Zn oxide film was formed over the silicon oxynitride film by a sputtering method using a sputtering target with an atomic ratio of In:Ga:Zn=5:5:6, and heat treatment at 450° C. in a nitrogen atmosphere and subsequently heat treatment at 450° C. in a mixed gas atmosphere of nitrogen and oxygen were performed. After that, in a plasma processing apparatus, argon plasma was generated and argon ions were accelerated to collide with the In—Ga—Zn oxide film, whereby oxygen vacancies were formed. Next, a 100-nm-thick silicon nitride film was formed by plasma CVD method. Then, heat treatment was performed at 350° C. in a mixed gas atmosphere of nitrogen and oxygen.

Figure 57:
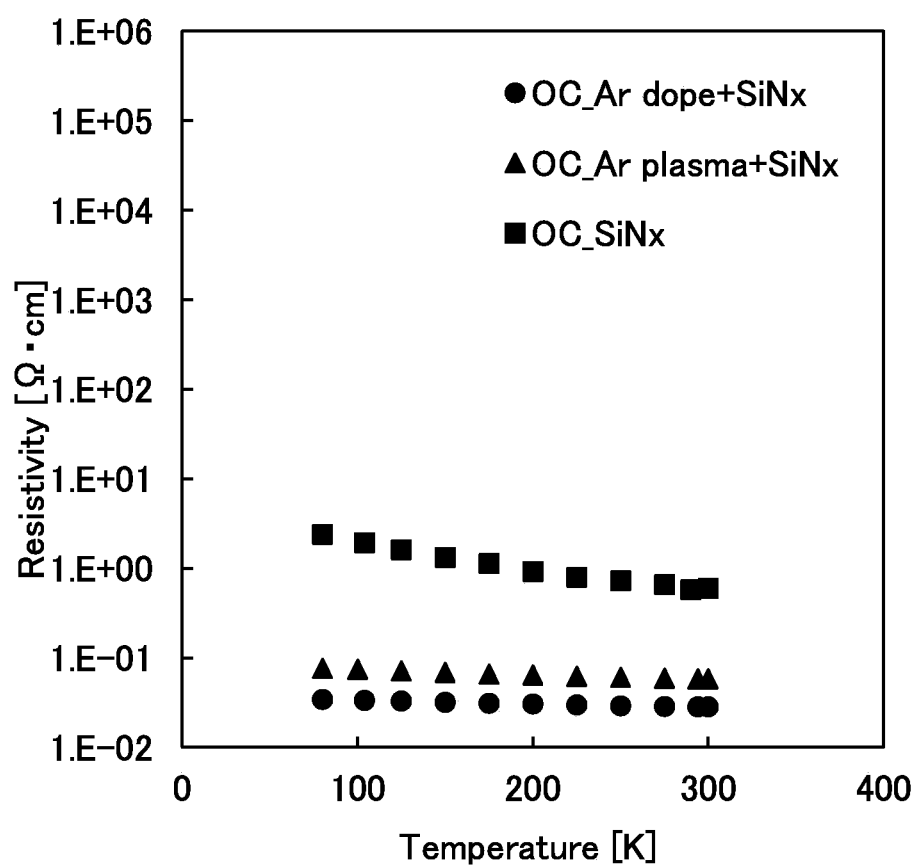
FIG. 57 shows temperature dependence of resistivity.

FIG. 57 shows the measured resistivity of the samples. Here, the resistivity was measured by a four-probe van der Pauw method. In FIG. 57, the horizontal axis represents measurement temperature, and the vertical axis represents resistivity. Furthermore, a square represents the measurement result of the oxide conductor layer (OC_SiN$_x$); a triangle, the measurement result of the oxide conductor layer (OC_Ar plasma+SiN$_x$); and a circle, the measurement result of the oxide conductor layer (OC_Ar dope+SiN$_x$).

Although not shown, the resistivity of an oxide semiconductor layer that is not in contact with a silicon nitride film was too high to measure. It is therefore found that the oxide conductor layer has lower resistivity than the oxide semiconductor layer.

As is seen from FIG. 57, there is a small variation in the resistivity of the oxide conductor layer (OC_Ar dope+SiN$_x$) and the oxide conductor layer (OC_Ar plasma+SiN$_x$), each of which includes oxygen vacancies and hydrogen. Typically, the variation in the resistivity is less than ±20% at temperatures from 80 K to 290 K or less than ±10% at temperatures from 150 K to 250 K. In other words, the oxide conductor is a degenerate semiconductor and it is suggested that the conduction band edge agrees with or substantially agrees with the Fermi level. Thus, when the oxide conductor layer is used for a source region and a drain region of a transistor, an ohmic contact is made between the oxide conductor layer and conductive films functioning as a source electrode and a drain electrode, thereby reducing the contact resistance between the oxide conductor layer and the conductive films functioning as the source and drain electrodes. Since the temperature dependence of the resistivity of an oxide conductor is low, the amount of change in the contact resistance between the oxide conductor layer and the conductive films functioning as the source and drain electrodes is small; thus, a highly reliable transistor can be fabricated.

Figure 3A:
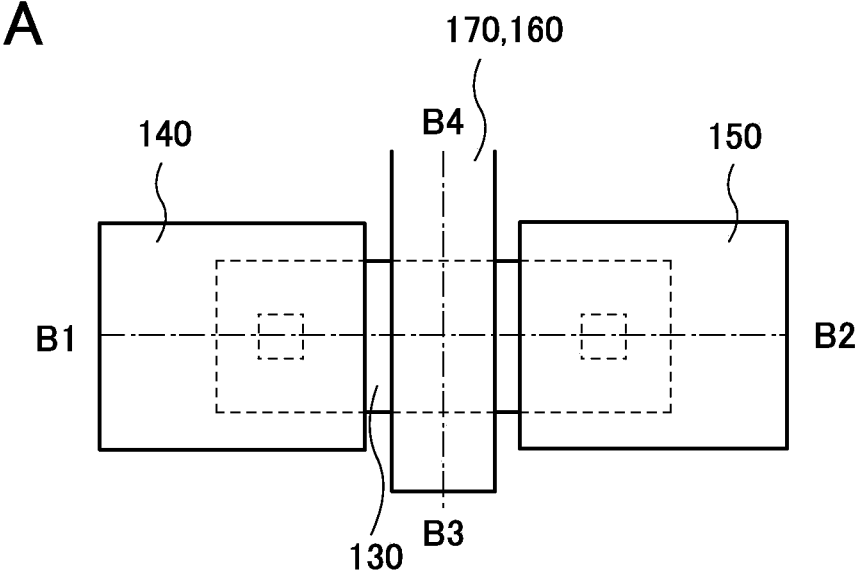
FIGS. 3A and 3B are a top view and a cross-sectional view of a transistor.
Figure 3B:
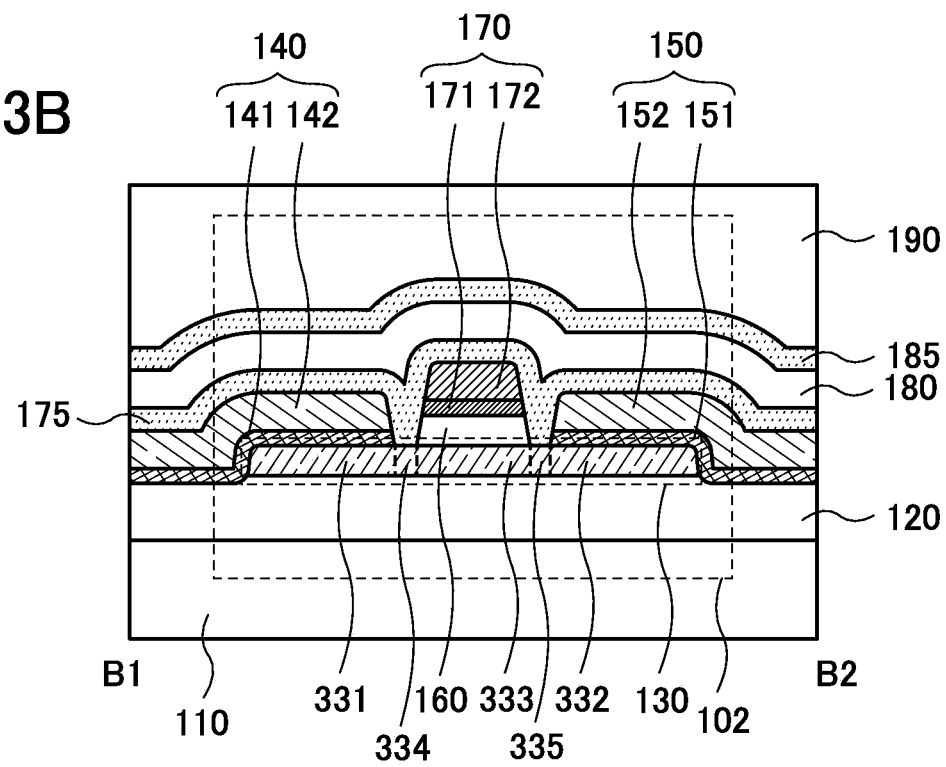

Furthermore, the transistor of one embodiment of the present invention may have a structure of FIGS. 3A and 3B. FIG. 3A is a top view of a transistor 102. FIG. 3B illustrates a cross section in the direction of a dashed-dotted line B1-B2 in FIG. 3A. A cross section in the direction of a dashed-dotted line B3-B4 in FIG. 3A corresponds to the cross section in the channel width direction of the transistor 101 in FIG. 2A or 2B. In these drawings, some components are enlarged, reduced in size, or omitted for easy understanding. In some cases, the direction of the dashed-dotted line B1-B2 is referred to as a channel length direction, and the direction of the dashed-dotted line B3-B4 is referred to as a channel width direction.

The transistor 102 includes the insulating layer 120 in contact with the substrate 110, the oxide semiconductor layer 130 in contact with the insulating layer 120, the source electrode layer 140 and the drain electrode layer 150 that are electrically connected to the oxide semiconductor layer 130, the gate insulating film 160 in contact with the oxide semiconductor layer 130, the gate electrode layer 170 in contact with the gate insulating film 160, the insulating layer 175 covering the oxide semiconductor layer 130, the gate insulating film 160, the source electrode layer 140, the drain electrode layer 150, and the gate electrode layer 170, the insulating layer 180 in contact with the insulating layer 175, and the insulating layer 185 formed over the above-described components. The insulating layer 190 (planarization film) in contact with the insulating layer 185 or the like may be provided as necessary.

Note that the transistor 102 has the same structure as the transistor 101 except for the source electrode layer 140 and the drain electrode layer 150 that are formed directly over the oxide semiconductor layer 130 and the structures of the source region and the drain region.

In the transistor 102, the oxide semiconductor layer 130 includes a region 331 and a region 332 provided apart from each other, a region 333 that is provided between the region 331 and the region 332 and overlaps with the gate electrode layer 170 with the gate insulating film 160 placed therebetween, a region 334 provided between the region 331 and the region 333, and a region 335 provided between the region 332 and the region 333.

In the transistor 102, the region 331 includes a region in contact with the source electrode layer 140, and the region 332 includes a region in contact with the drain electrode layer 150. Accordingly, oxygen moves from the regions 331 and 332 to a metal material used in the source electrode layer 140 and the drain electrode layer 150, so that oxygen vacancies are generated in the regions 331 and 332, and the regions 331 and 332 are changed into n-type and reduced in resistance.

Furthermore, the regions 334 and 335 are not in contact with the source electrode layer 140 or the drain electrode layer 150 but include a region in contact with the insulating layer 175 containing hydrogen. By the steps up to and including the formation of the insulating layer 175, the interaction between oxygen vacancies generated in the regions 334 and 335 and hydrogen that diffuses into the regions 334 and 335 from the insulating layer 175 changes the regions 334 and 335 to n-type regions with low resistance.

Accordingly, the regions 331 and 334 can function as a source region, and the regions 332 and 335 can function as a drain region.

Note that the addition of an impurity for increasing oxygen vacancies may be subjected to the regions 334 and 335, like the regions 231 and 232 of the transistor 101.

Here, in the case of adding the impurity by plasma treatment, since part of the gate electrode layer 170 might be sputtered and deposited on the end portion of the gate insulating film 160, it is preferable that the resist mask be left over the gate electrode layer 170 during the plasma treatment, in a manner similar to that of the transistor 101.

By leaving the resist mask over the gate electrode layer 170 during the plasma treatment, sputtering of the gate electrode layer 170 is suppressed, so that a short circuit between the regions 334 and 335 and the gate electrode layer 170 can be prevented and a gate leakage current can be reduced. Moreover, since part of the resist mask is sputtered, in the case of performing the treatment with argon plasma, argon and carbon can be added to the regions 334 and 335. Since addition of carbon to the oxide semiconductor layer forms an oxygen vacancy as described above, the conductivity of the oxide semiconductor layer can be further increased.

Thus, the regions 334 and 335 in the transistor 102 include an area having a higher concentration of the impurity for forming an oxygen vacancy than the regions 331, 332, and 333. Since hydrogen enters the oxygen vacancy, the regions 334 and 335 include an area having a higher hydrogen concentration than the region 333. In the transistor with this structure, the source region and the drain region can have lower resistance, whereby on-state current of the transistor can be increased.

In the case where the width of the regions 334 and 335 in the channel length direction is less than or equal to 100 nm, preferably less than or equal to 50 nm, a gate electric field contributes to preventing a significant decrease in on-state current; therefore, a structure other than the above-described structure for reducing the resistance can be employed.

Figure 4A:
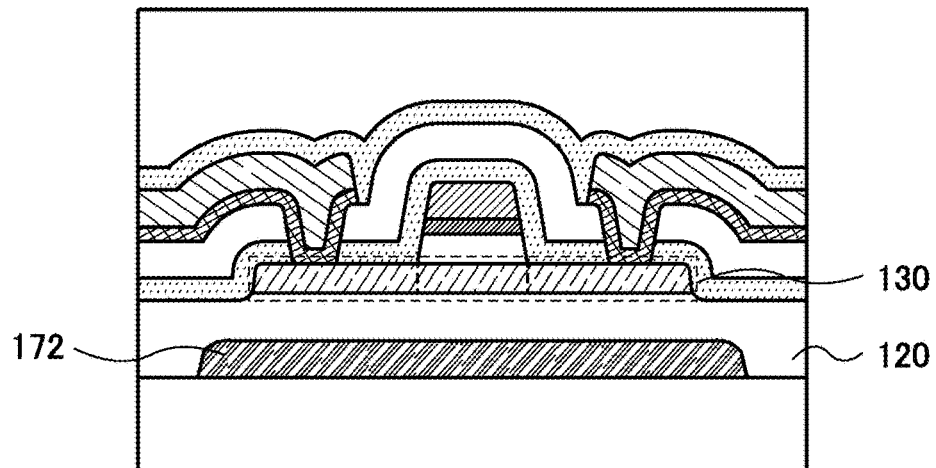
FIGS. 4A to 4C are each a cross-sectional view of a transistor.
Figure 4B:
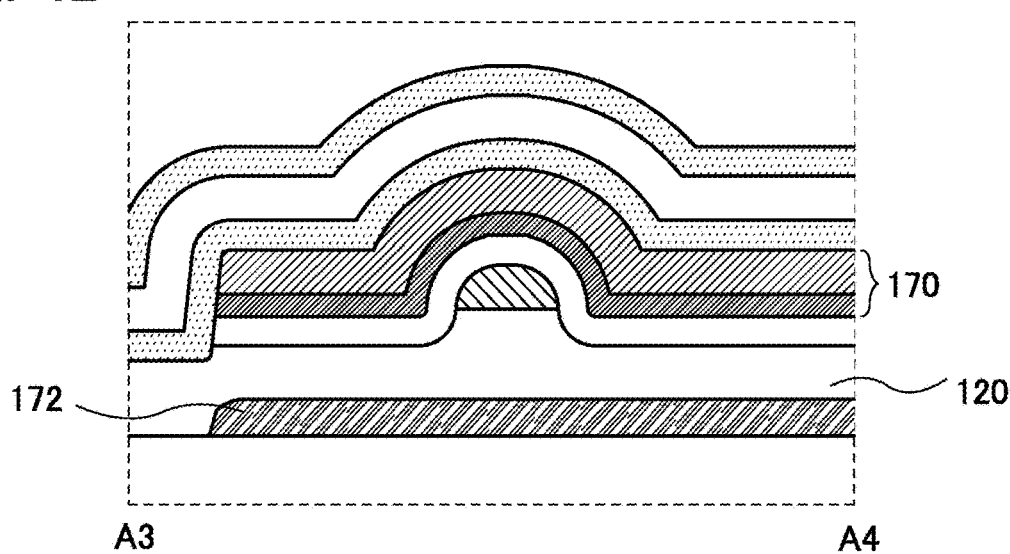

The transistor of one embodiment of the present invention may include the conductive layer 172 between the oxide semiconductor layer 130 and the substrate 110 as illustrated in FIGS. 4A and 4B. When the conductive layer is used as a second gate electrode layer (back gate), the on-state current can be further increased and the threshold voltage can be controlled. In the cross section in the channel length direction illustrated in FIG. 4A, the width of the conductive layer 172 may be shortened so that the conductive layer 172 may not overlap with the source electrode layer 140, the drain electrode layer 150, or the like. Moreover, the width of the conductive layer 172 may be further shortened so as to be shorter than the width of the gate electrode layer 170.

Figure 4C:
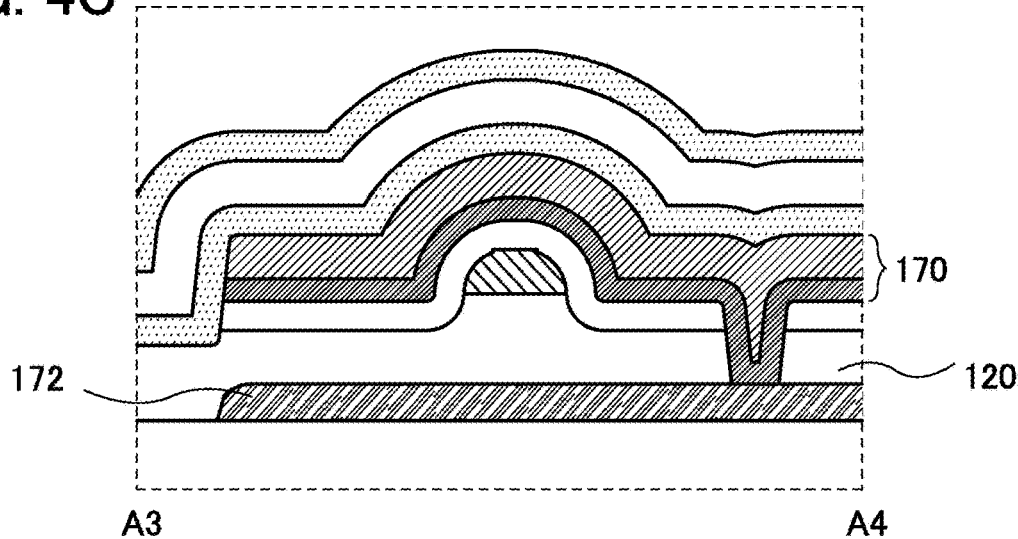

In order to increase the on-state current, for example, the gate electrode layer 170 and the conductive layer 172 may be set to have the same potential, and the transistor may be driven as a double-gate transistor. Furthermore, to control the threshold voltage, a fixed potential that is different from the potential of the gate electrode layer 170 may be supplied to the conductive layer 172. To set the gate electrode layer 170 and the conductive layer 172 at the same potential, for example, as illustrated in FIG. 4C, the gate electrode layer 170 and the conductive layer 172 may be electrically connected to each other through a contact hole. Note that although the examples illustrated in FIGS. 4A to 4C are variations of the transistor 101, the structures of these examples can be applied to the transistor 102 illustrated in FIGS. 3A and 3B.

Figure 5A:
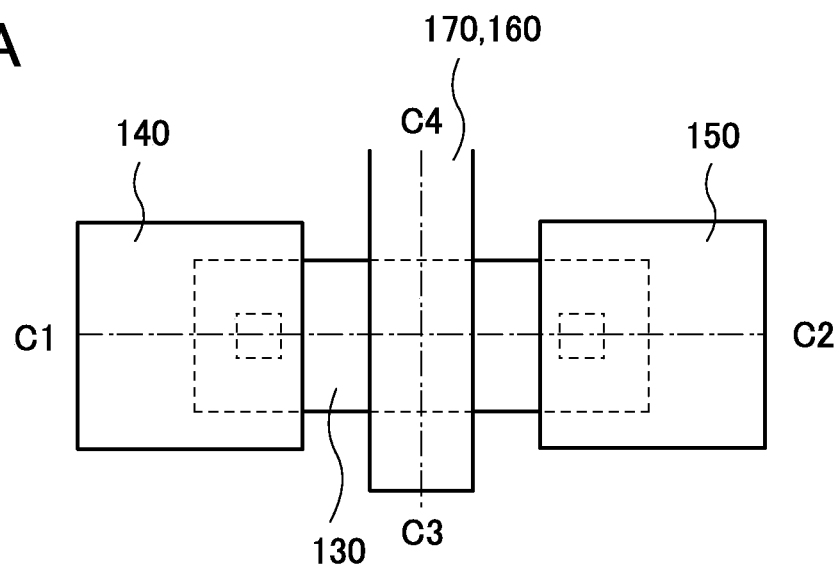
FIGS. 5A and 5B are a top view and a cross-sectional view of a transistor.
Figure 5B:
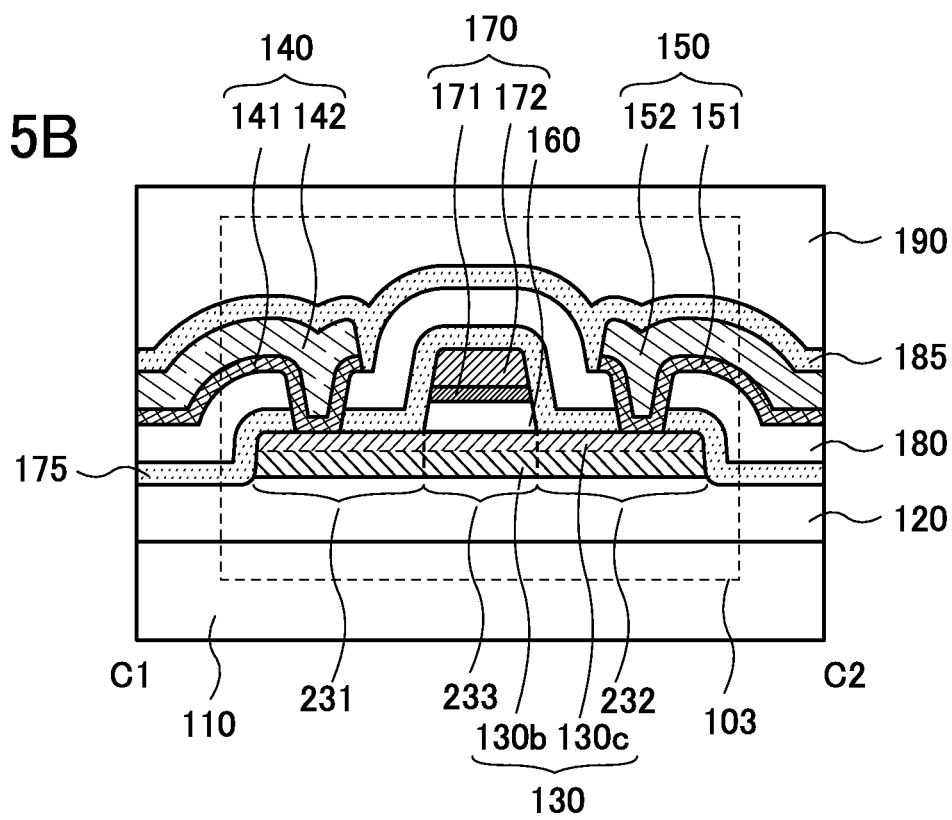
Figure 6A:
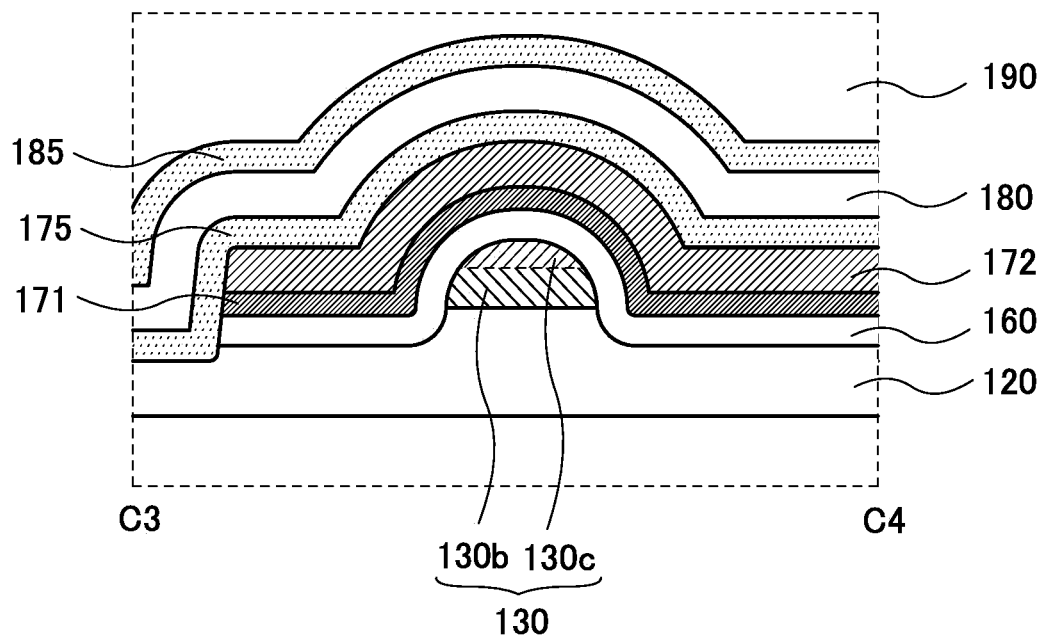
FIGS. 6A and 6B each illustrate a cross section of a transistor in a channel width direction.
Figure 6B:
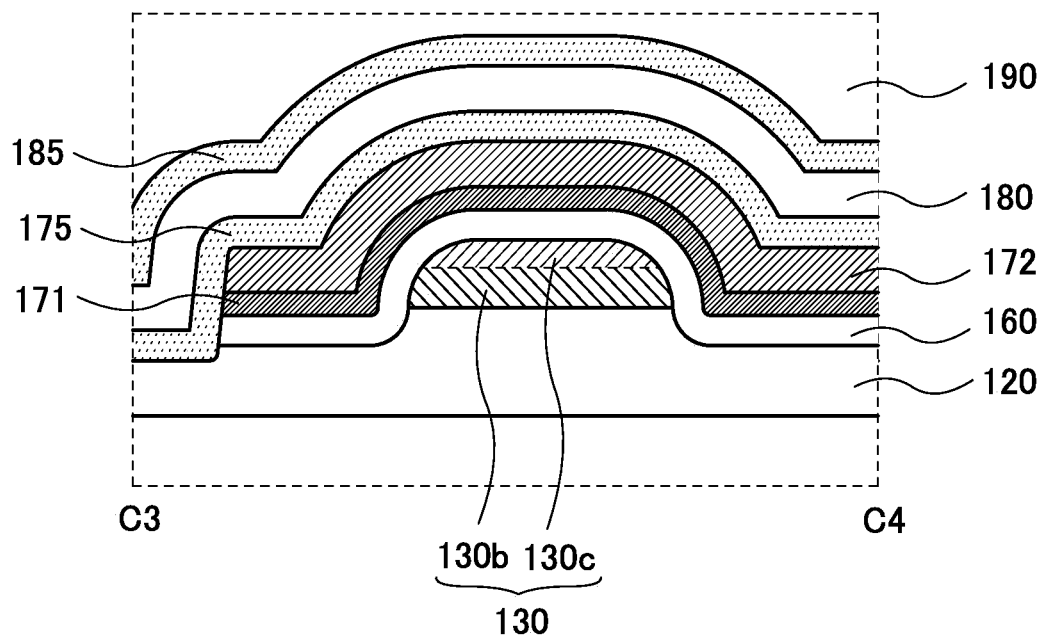

Furthermore, the transistor of one embodiment of the present invention may have a structure of FIGS. 5A and 5B. FIG. 5A is a top view of a transistor 103. FIG. 5B illustrates a cross section in the direction of a dashed-dotted line C1-C2 in FIG. 5A. A cross section in the direction of a dashed-dotted line C3-C4 in FIG. 5A corresponds to FIG. 6A or FIG. 6B. In these drawings, some components are enlarged, reduced in size, or omitted for easy understanding. In some cases, the direction of the dashed-dotted line C1-C2 is referred to as a channel length direction, and the direction of the dashed-dotted line C3-C4 is referred to as a channel width direction.

The transistor 103 illustrated in FIGS. 5A and 5B has the same structure as the transistor 101 except that the oxide semiconductor layer 130 includes an oxide semiconductor layer 130b and an oxide semiconductor layer 130c that are provided in this order from the insulating layer 120 side.

Oxide semiconductor layers having different compositions, for example, can be used as the oxide semiconductor layer 130b and the oxide semiconductor layer 130c.

Figure 7A:
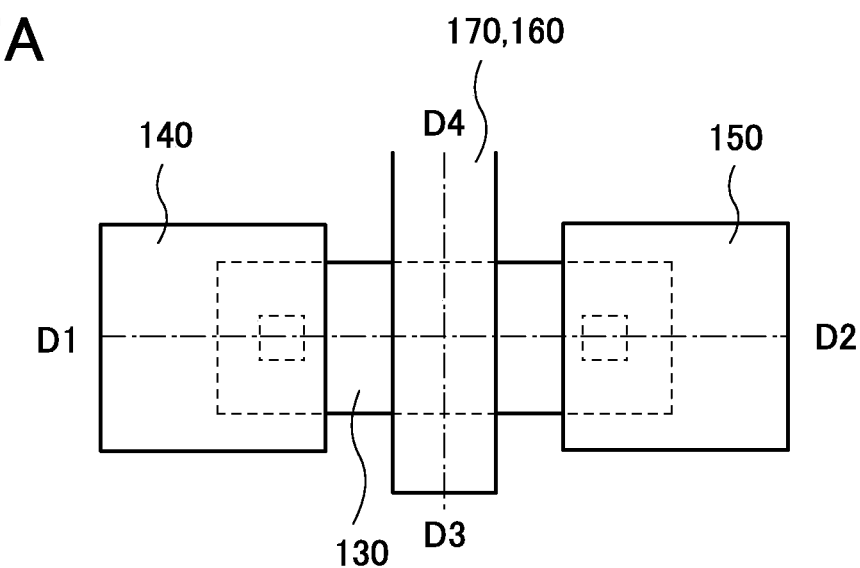
FIGS. 7A and 7B are a top view and a cross-sectional view of a transistor.
Figure 7B:
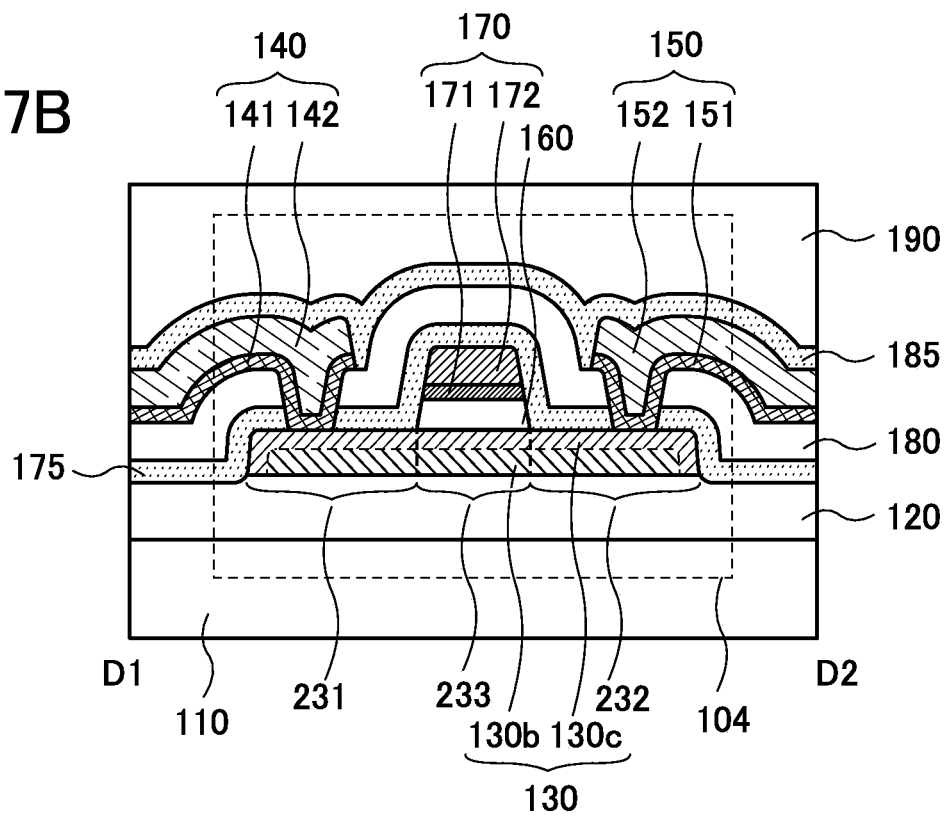
Figure 8A:
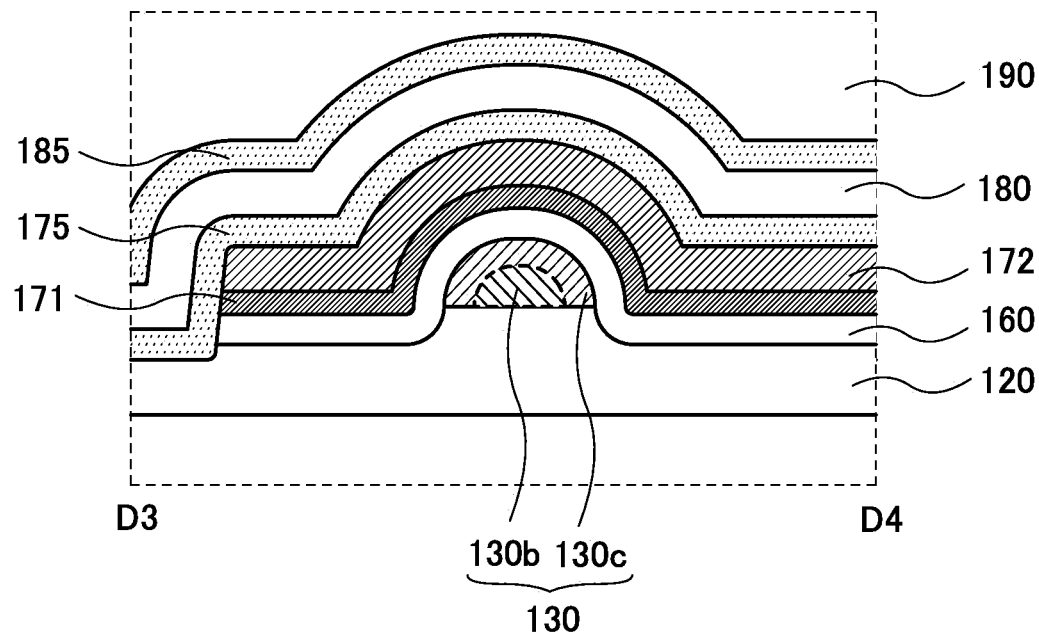
FIGS. 8A and 8B each illustrate a cross section of a transistor in a channel width direction.
Figure 8B:
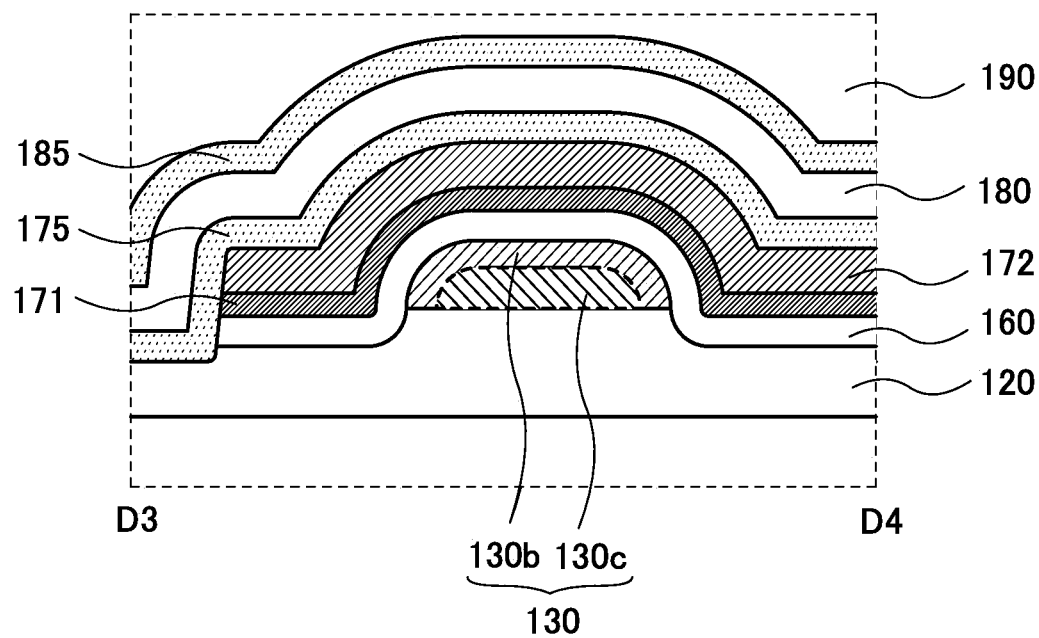

Furthermore, the transistor of one embodiment of the present invention may have a structure of FIGS. 7A and 7B. FIG. 7A is a top view of a transistor 104. FIG. 7B illustrates a cross section in the direction of a dashed-dotted line D1-D2 in FIG. 7A. A cross section in the direction of a dashed-dotted line D3-D4 in FIG. 7A corresponds to FIG. 8A or FIG. 8B. In these drawings, some components are enlarged, reduced in size, or omitted for easy understanding. In some cases, the direction of the dashed-dotted line D1-D2 is referred to as a channel length direction, and the direction of the dashed-dotted line D3-D4 is referred to as a channel width direction.

The transistor 104 illustrated in FIGS. 7A and 7B has the same structure as the transistor 103 except that the oxide semiconductor layer 130b is covered with the oxide semiconductor layer 130e.

Figure 9A:
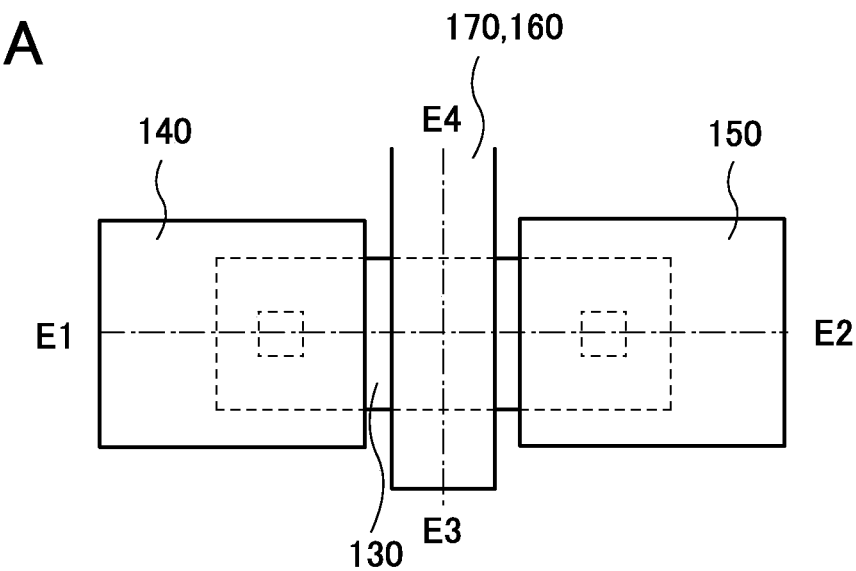
FIGS. 9A and 9B are a top view and a cross-sectional view of a transistor.
Figure 9B:
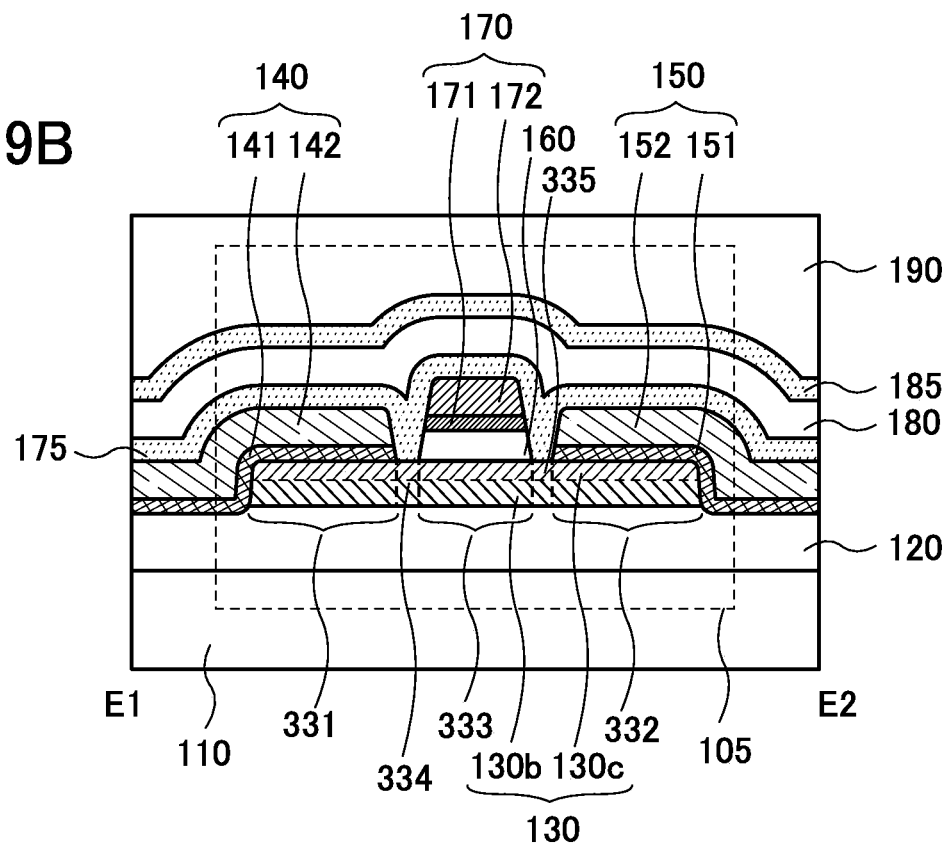

Furthermore, the transistor of one embodiment of the present invention may have a structure of FIGS. 9A and 9B. FIG. 9A is a top view of a transistor 105. FIG. 9B illustrates a cross section in the direction of a dashed-dotted line E1-E2 in FIG. 9A. A cross section in the direction of a dashed-dotted line E3-E4 in FIG. 9A corresponds to the cross section in the channel width direction of the transistor 103 in FIG. 6A or FIG. 6B. In these drawings, some components are enlarged, reduced in size, or omitted for easy understanding. In some cases, the direction of the dashed-dotted line E1-E2 is referred to as a channel length direction, and the direction of the dashed-dotted line E3-E4 is referred to as a channel width direction.

The transistor 105 illustrated in FIGS. 9A and 9B has the same structure as the transistor 102 except that the oxide semiconductor layer 130 includes the oxide semiconductor layer 130b and the oxide semiconductor layer 130c that are provided in this order from the insulating layer 120 side. The oxide semiconductor layer 130 of the transistor 105 may have a structure in which the oxide semiconductor layer 130b is covered with the oxide semiconductor layer 130c like the transistor 104.

Figure 10A:
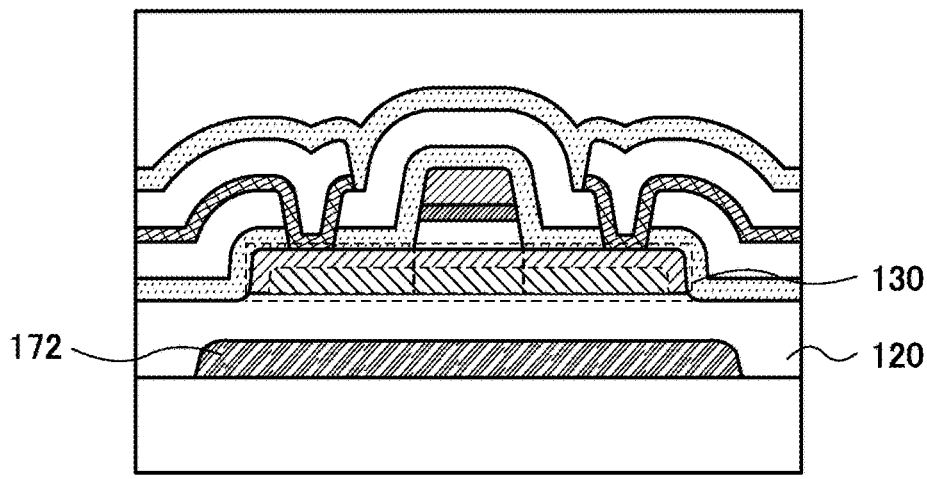
FIGS. 10A to 10C are each a cross-sectional view of a transistor.
Figure 10B:
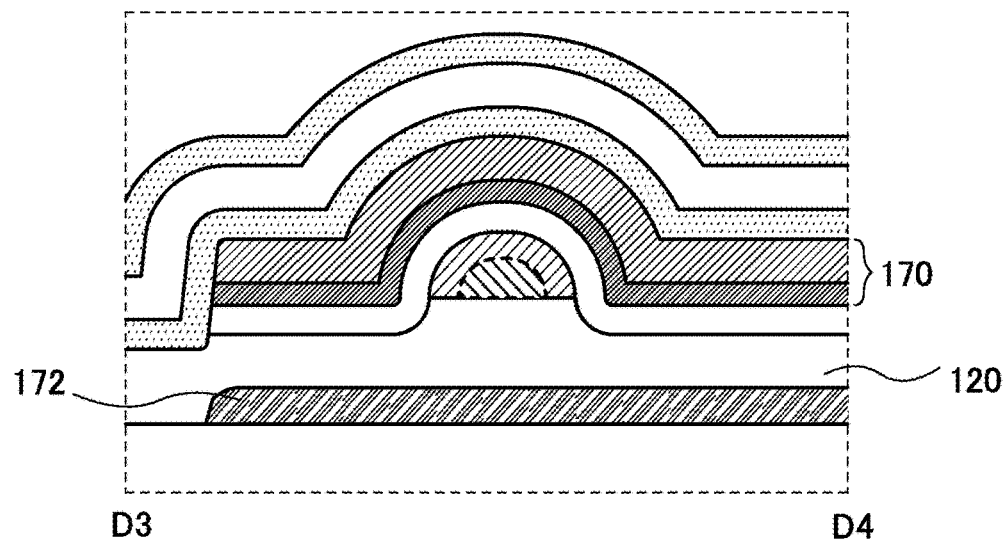
Figure 10C:
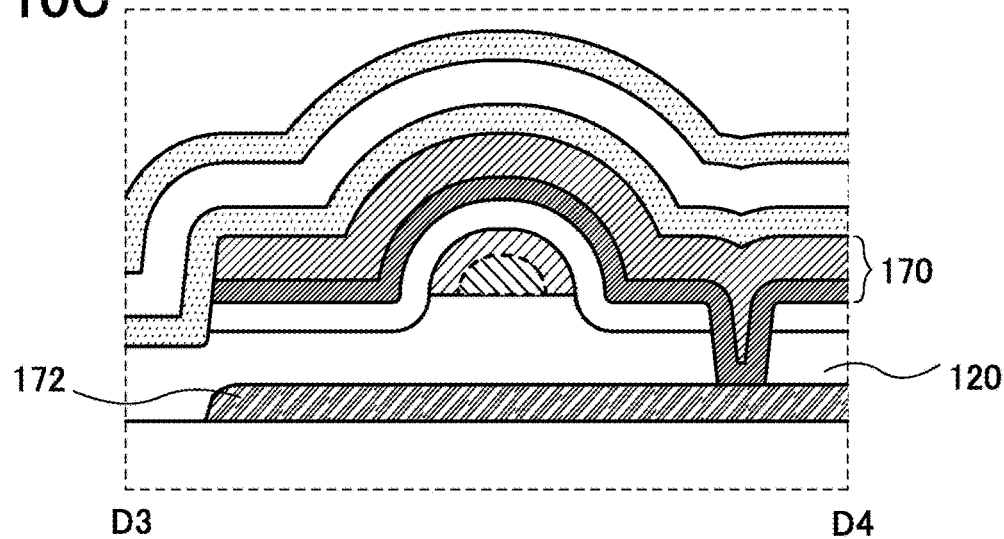

The transistor of one embodiment of the present invention may include the conductive layer 172 between the oxide semiconductor layer 130 and the substrate 110 as illustrated in FIGS. 10A to 10C. When the conductive layer is used as a second gate electrode layer (back gate), the on-state current can be further increased and the threshold voltage can be controlled. In the cross section in the channel length direction illustrated in FIG. 10A, the width of the conductive layer 172 may be shortened so that the conductive layer 172 may not overlap with the source electrode layer 140, the drain electrode layer 150, or the like. Moreover, the width of the conductive layer 172 may be further shortened so as to be shorter than the width of the gate electrode layer 170. Note that although the examples illustrated in FIGS. 10A to 10C are variations of the transistor 104, the structures of these examples can be applied to the transistors 103 and 105.

Figure 11A:
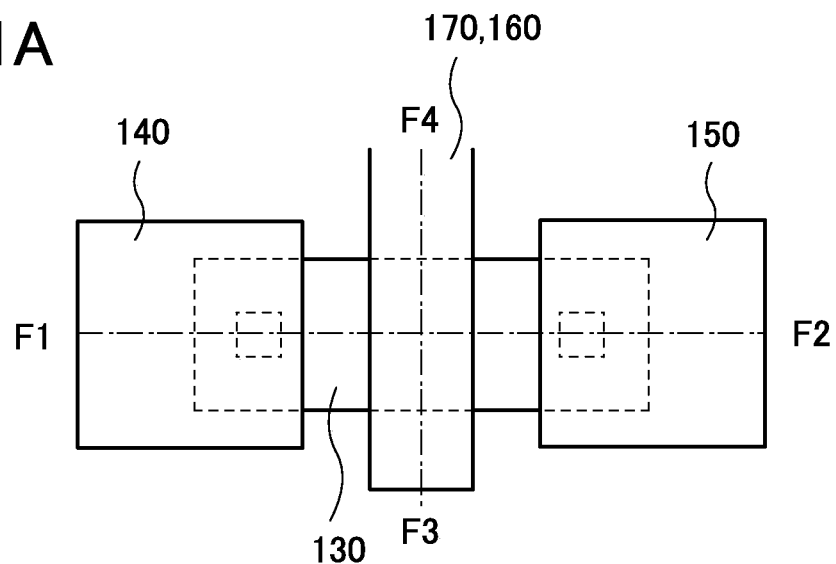
FIGS. 11A and 11B are a top view and a cross-sectional view of a transistor.
Figure 11B:
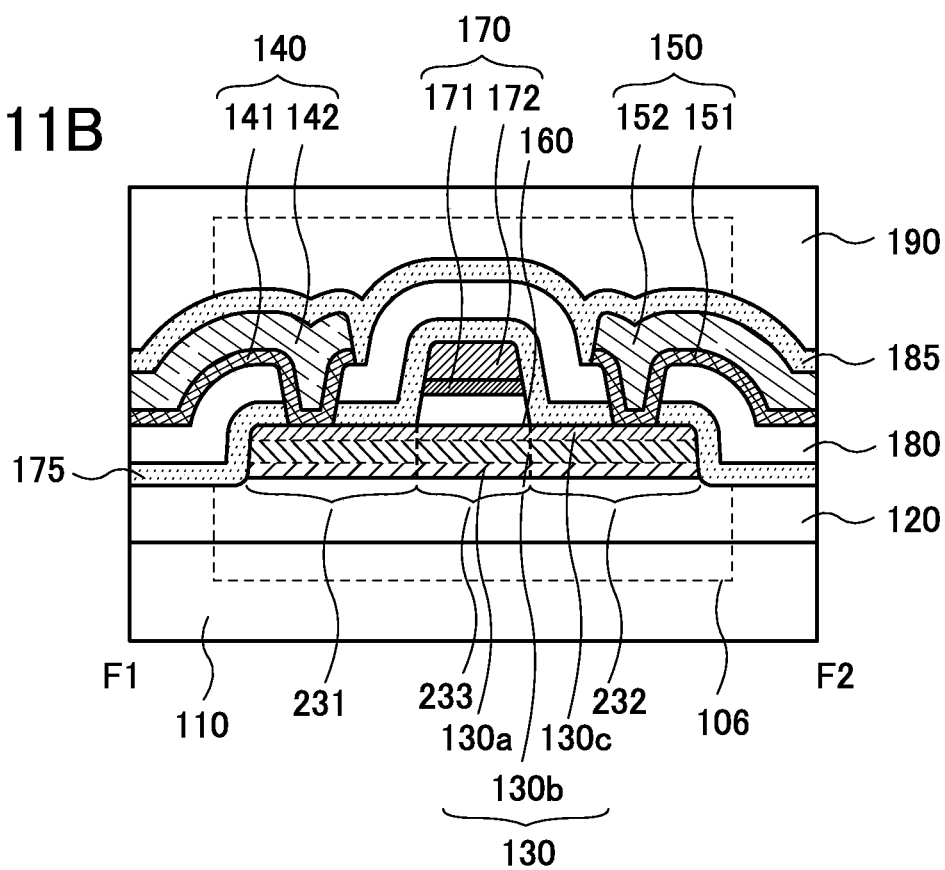
Figure 12A:
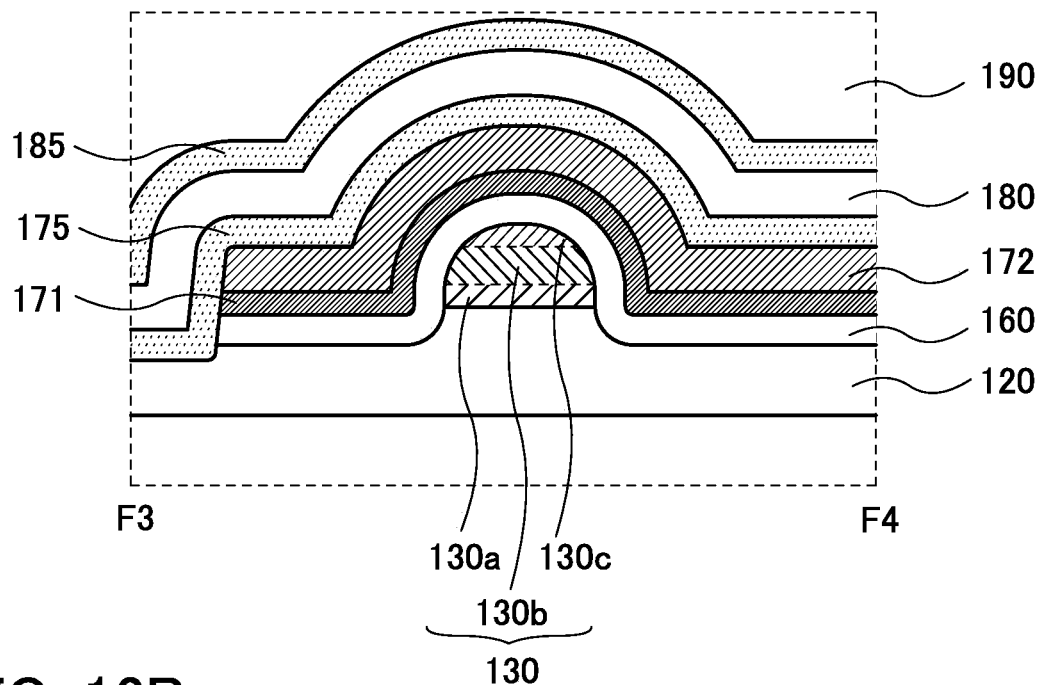
FIGS. 12A and 12B each illustrate a cross section of a transistor in a channel width direction.
Figure 12B:
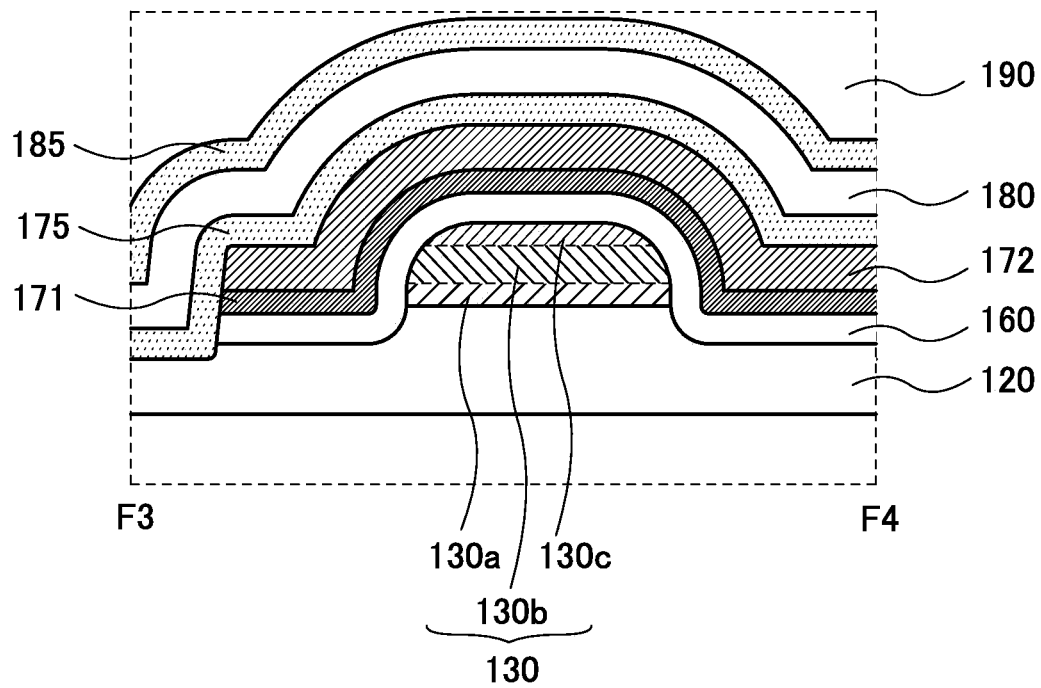

Furthermore, the transistor of one embodiment of the present invention may have a structure of FIGS. 11A and 11B. FIG. 11A is a top view of a transistor 106. FIG. 11B illustrates a cross section in the direction of a dashed-dotted line F1-F2 in FIG. 11A. A cross section in the direction of a dashed-dotted line F3-F4 in FIG. 11A corresponds to FIG. 12A or FIG. 12B. In these drawings, some components are enlarged, reduced in size, or omitted for easy understanding. In some cases, the direction of the dashed-dotted line F1-F2 is referred to as a channel length direction, and the direction of the dashed-dotted line F3-F4 is referred to as a channel width direction.

The transistor 106 illustrated in FIGS. 11A and 11B has the same structure as the transistor 101 except that the oxide semiconductor layer 130 includes an oxide semiconductor layer 130a, the oxide semiconductor layer 130b, and the oxide semiconductor layer 130c that are provided in this order from the insulating layer 120 side.

Oxide semiconductor layers having different compositions, for example, can be used as the oxide semiconductor layers 130a, 130b, and 130c.

Figure 13A:
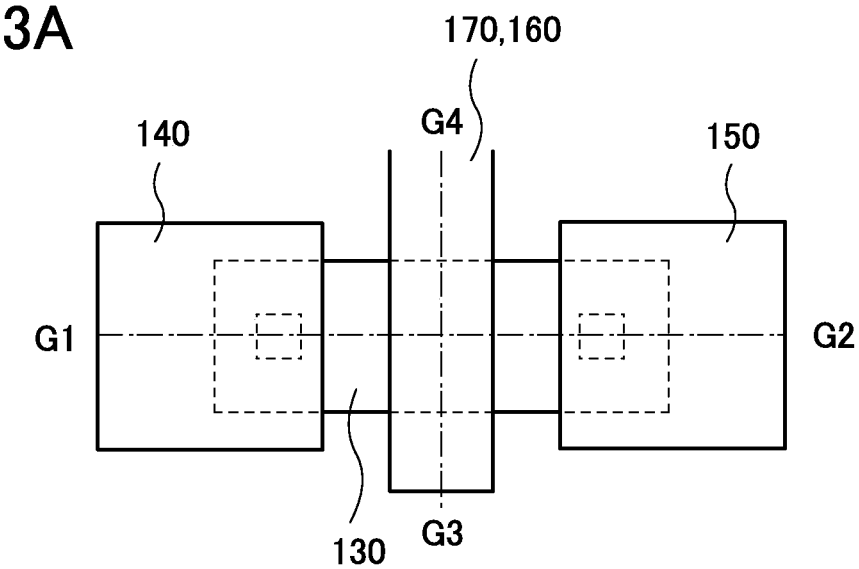
FIGS. 13A and 13B are a top view and a cross-sectional view of a transistor.
Figure 13B:
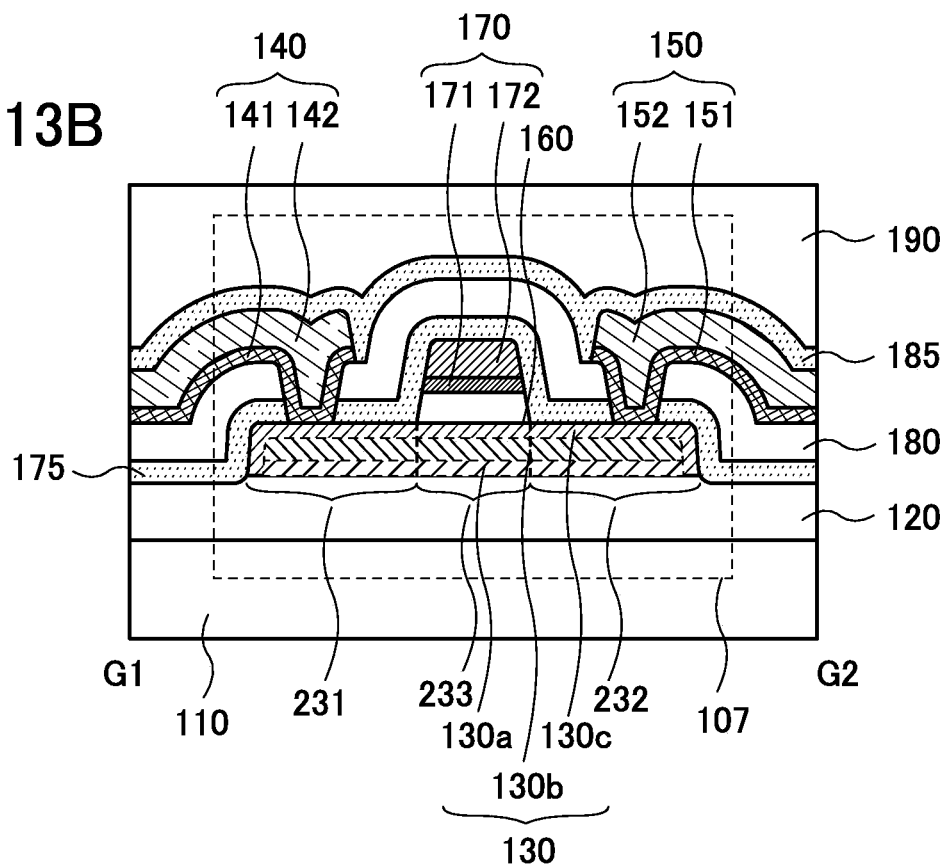
Figure 14A:
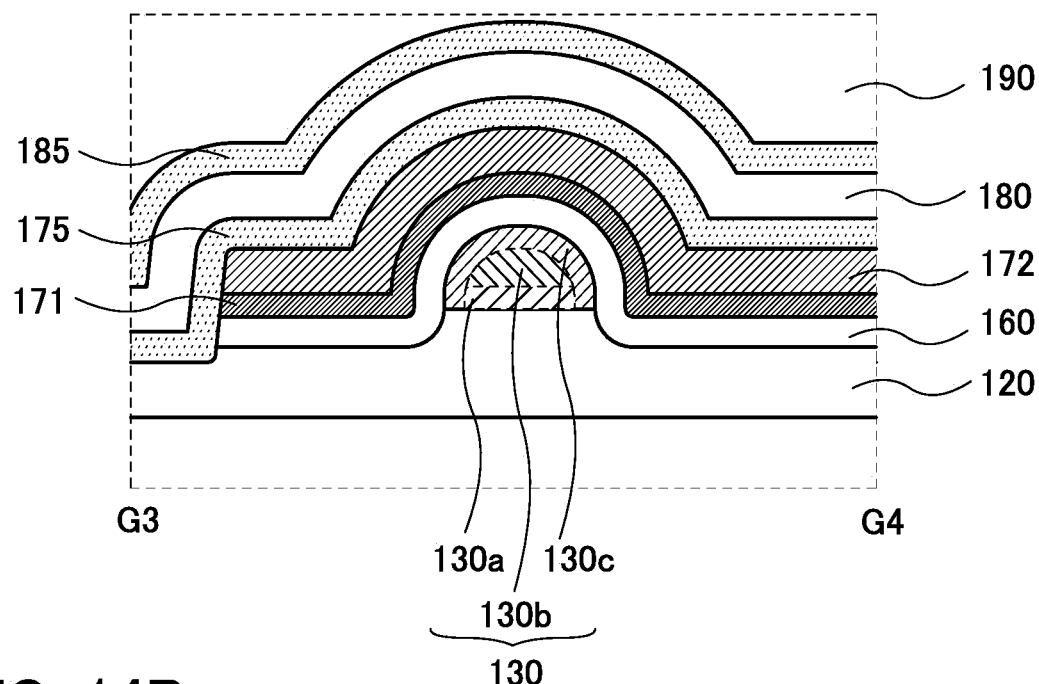
FIGS. 14A and 14B each illustrate a cross section of a transistor in a channel width direction.
Figure 14B:
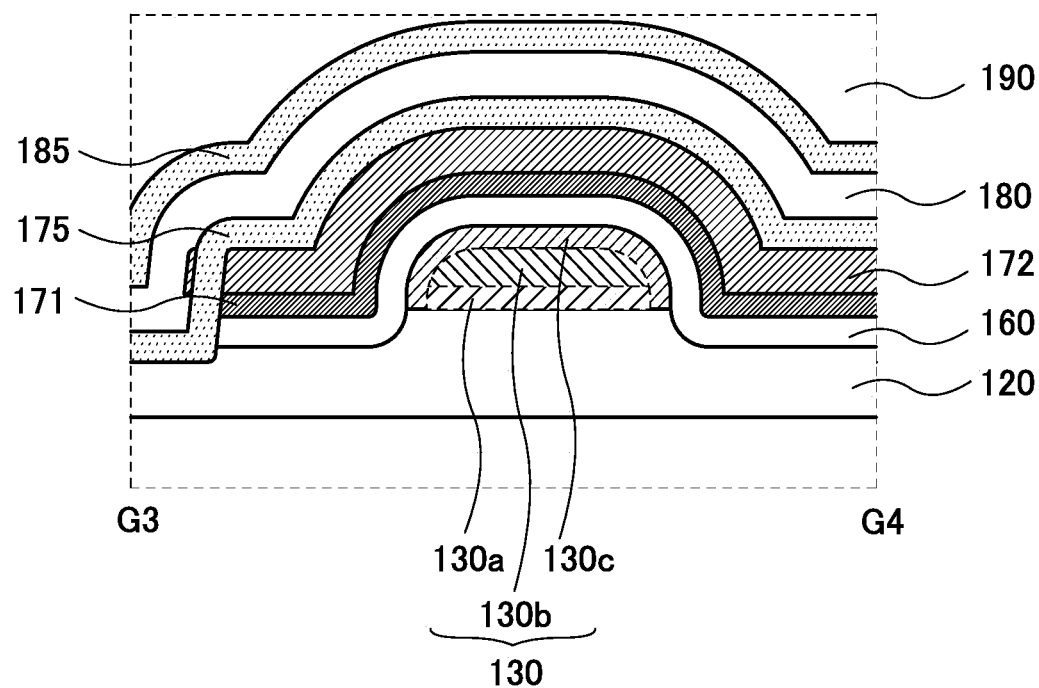

Furthermore, the transistor of one embodiment of the present invention may have a structure of FIGS. 13A and 13B. FIG. 13A is a top view of a transistor 107. FIG. 13B illustrates a cross section in the direction of a dashed-dotted line G1-G2 in FIG. 13A. A cross section in the direction of a dashed-dotted line G3-G4 in FIG. 13A corresponds to FIG. 14A or FIG. 14B. In these drawings, some components are enlarged, reduced in size, or omitted for easy understanding. In some cases, the direction of the dashed-dotted line G1-G2 is referred to as a channel length direction, and the direction of the dashed-dotted line G3-G4 is referred to as a channel width direction.

The transistor 107 illustrated in FIGS. 13A and 13B has the same structure as the transistor 106 except that the oxide semiconductor layers 130a and 130b are covered with the oxide semiconductor layer 130c.

Figure 15A:
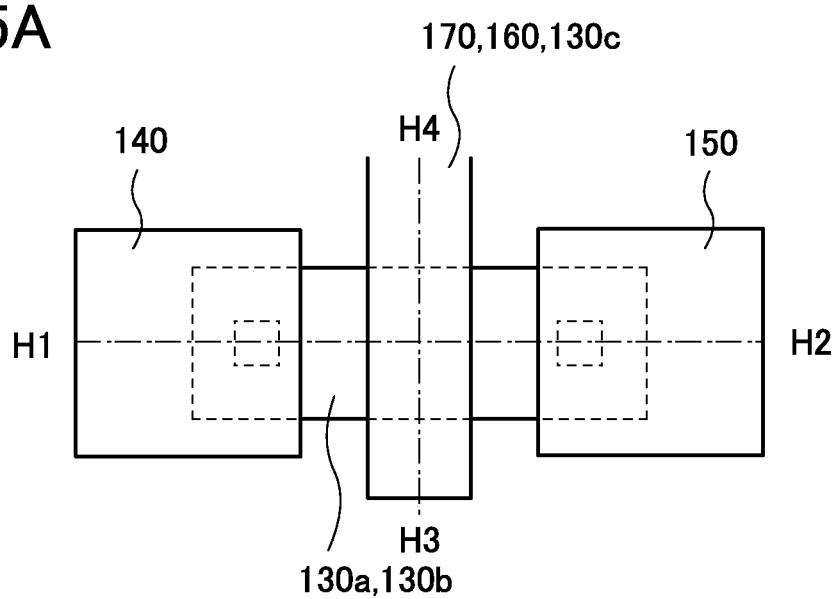
Figure 15B:
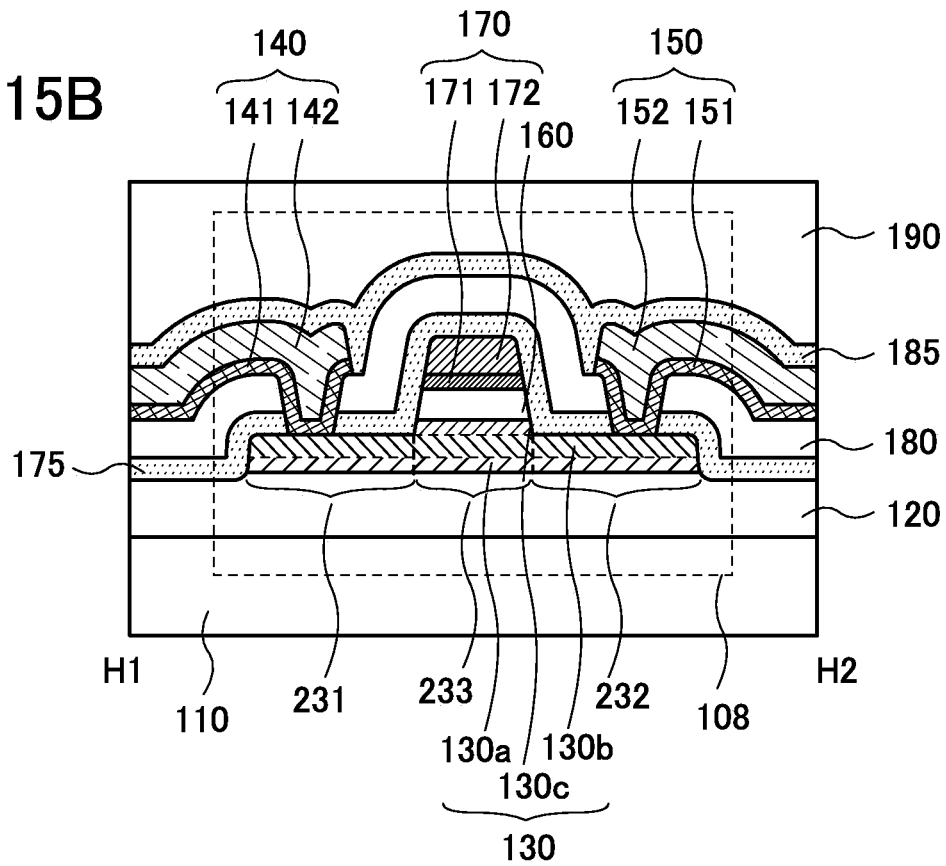
Figure 16A:
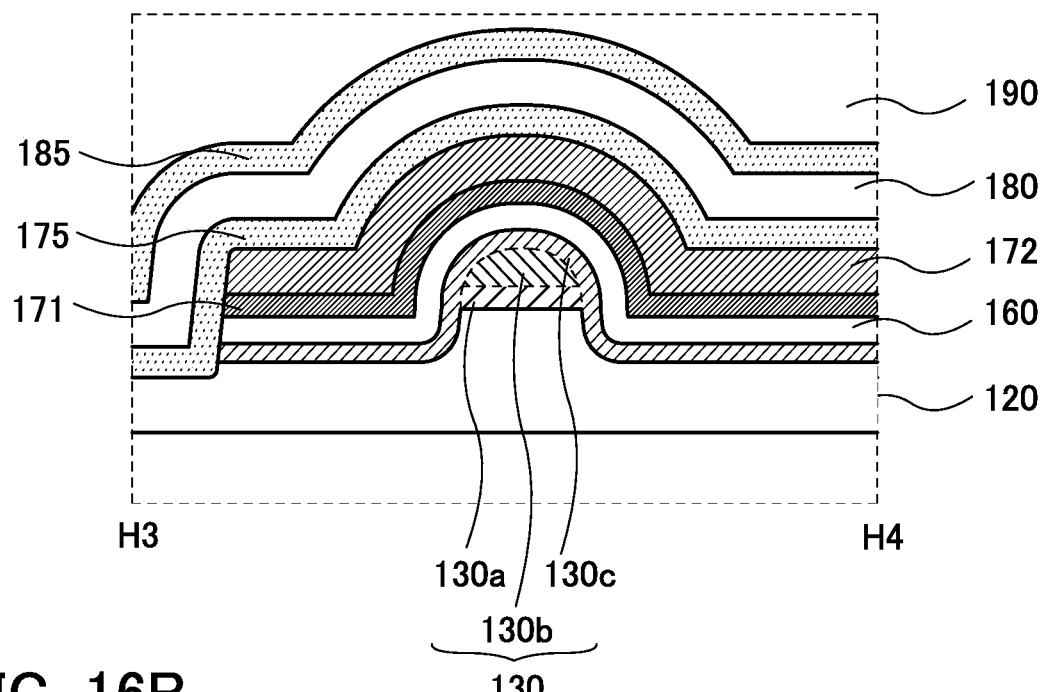
FIGS. 16A and 16B each illustrate a cross section of a transistor in a channel width direction.
Figure 16B:
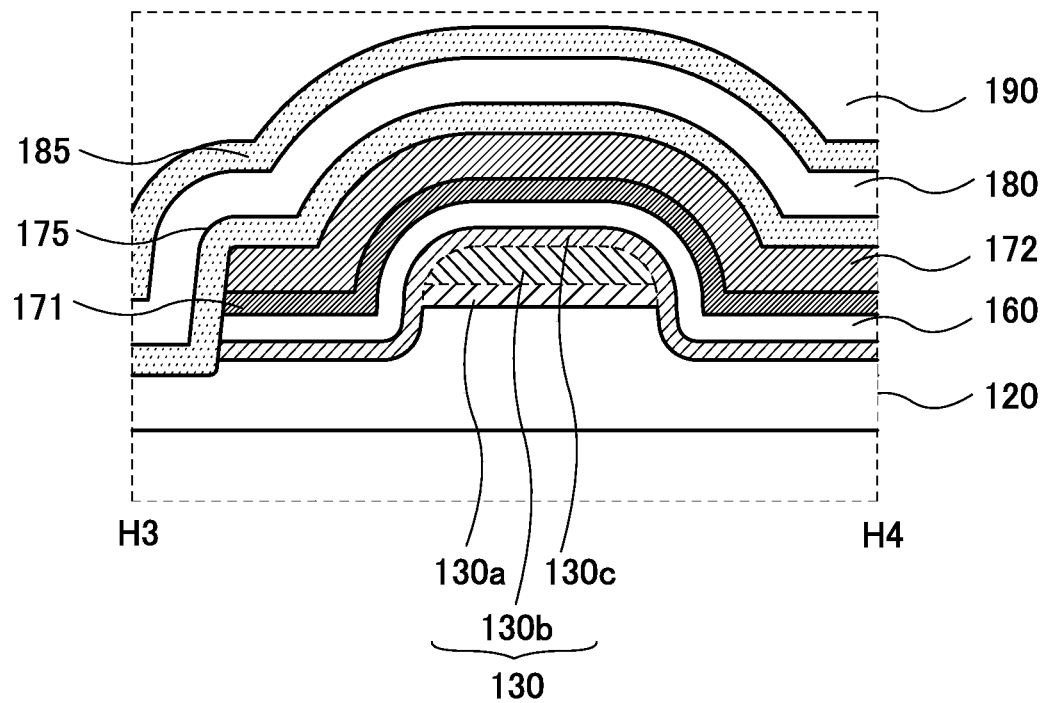

Furthermore, the transistor of one embodiment of the present invention may have a structure of FIGS. 15A and 15B. FIG. 15A is a top view of a transistor 108. FIG. 15B illustrates a cross section in the direction of a dashed-dotted line H1-H2 in FIG. 15A. A cross section in the direction of a dashed-dotted line H3-H4 in FIG. 15A corresponds to FIG. 16A or FIG. 16B. In these drawings, some components are enlarged, reduced in size, or omitted for easy understanding. In some cases, the direction of the dashed-dotted line H1-H2 is referred to as a channel length direction, and the direction of the dashed-dotted line H3-H4 is referred to as a channel width direction.

The transistor 108 illustrated in FIGS. 15A and 15B has the same structure as the transistor 106 except that the oxide semiconductor layers 130a and 130b are partly covered with the oxide semiconductor layer 130e.

Figure 17A:
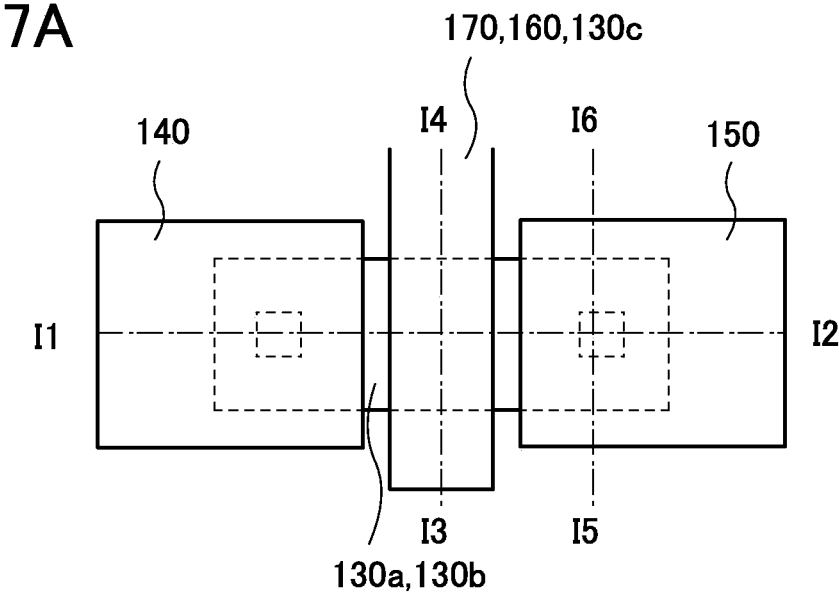
FIGS. 17A and 17B are a top view and a cross-sectional view of a transistor.
Figure 17B:
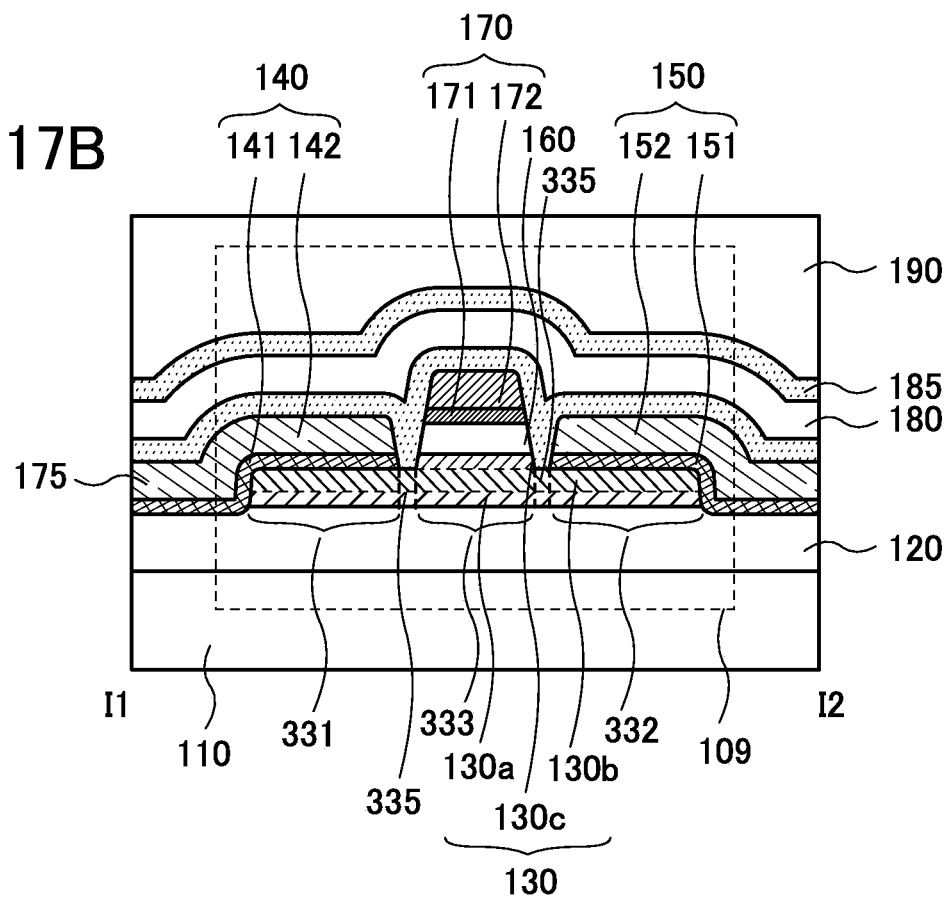

Furthermore, the transistor of one embodiment of the present invention may have a structure of FIGS. 17A and 17B. FIG. 17A is a top view of a transistor 109. FIG. 17B illustrates a cross section in the direction of a dashed-dotted line I1-I2 in FIG. 17A. A cross section in the direction of a dashed-dotted line I3-I4 in FIG. 17A corresponds to the cross section in the channel width direction of the transistor 108 in FIG. 16A or FIG. 16B. In these drawings, some components are enlarged, reduced in size, or omitted for easy understanding. In some cases, the direction of the dashed-dotted line I1-I2 is referred to as a channel length direction, and the direction of the dashed-dotted line I3-I4 is referred to as a channel width direction.

The transistor 109 illustrated in FIGS. 17A and 17B has the same structure as the transistor 102 except that the oxide semiconductor layer 130 includes the oxide semiconductor layer 130a, the oxide semiconductor layer 130b, and the oxide semiconductor layer 130c that are provided in this order from the insulating layer 120 side. The oxide semiconductor layer 130 of the transistor 109 may have a structure in which the oxide semiconductor layer 130a and the oxide semiconductor layer 130b are partly or entirely covered with the oxide semiconductor layer 130c, like the transistors 107 and 108.

Figure 18A:
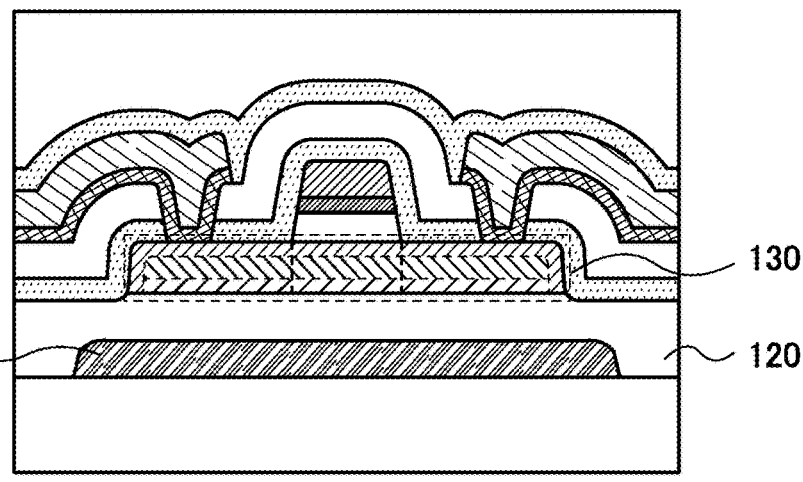
FIGS. 18A to 18C are each a cross-sectional view of a transistor.
Figure 18B:
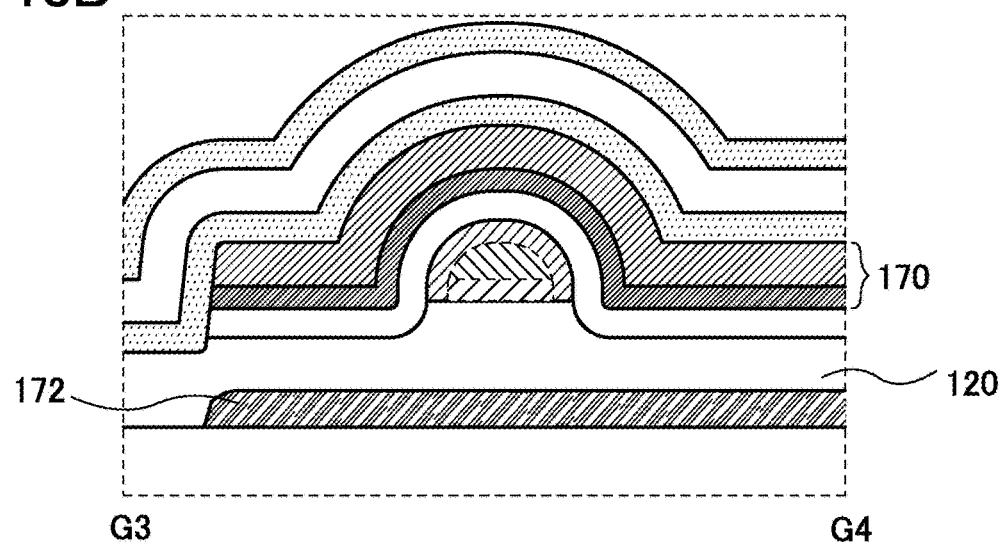
Figure 18C:
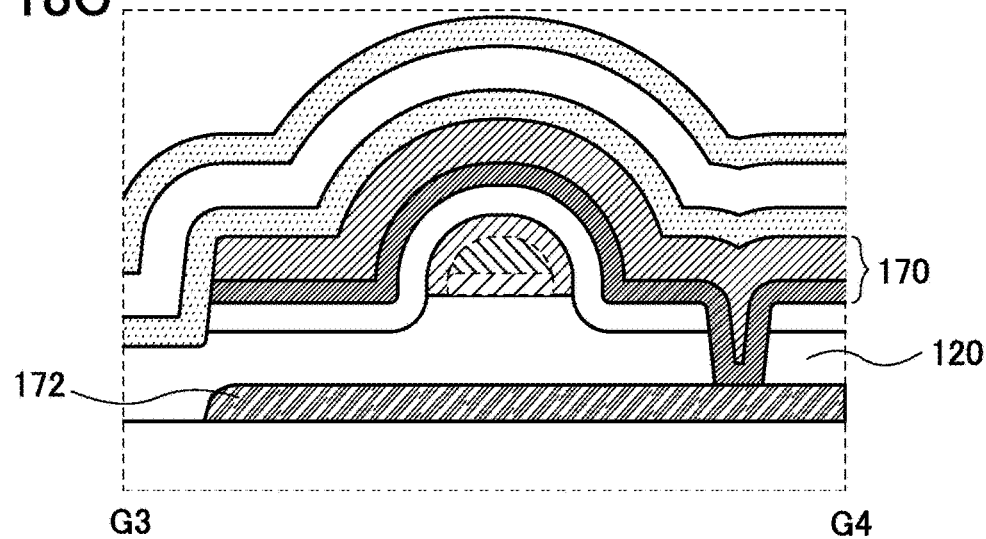

The transistor of one embodiment of the present invention may include the conductive layer 172 between the oxide semiconductor layer 130 and the substrate 110 as illustrated in FIGS. 18A to 18C. When the conductive layer is used as a second gate electrode layer (back gate), the on-state current can be further increased and the threshold voltage can be controlled. In the cross section in the channel length direction illustrated in FIG. 18A, the width of the conductive layer 172 may be shortened so that the conductive layer 172 may not overlap with the source electrode layer 140, the drain electrode layer 150, or the like. Moreover, the width of the conductive layer 172 may be further shortened so as to be shorter than the width of the gate electrode layer 170. Note that although the examples illustrated in FIGS. 18A to 18C are variations of the transistor 107, the structures of these examples can be applied to the transistors 106, 108, and 109.

In the transistor of one embodiment of the present invention (the transistors 101 to 109), the gate electrode layer 170 electrically surrounds the oxide semiconductor layer 130 in the channel width direction, with the gate insulating film 160 positioned therebetween, whereby on-state current is increased. Such a structure of the transistor is referred to as a surrounded channel (s-channel) structure.

In the transistor including the oxide semiconductor layers 130a and 130b and the transistor including the oxide semiconductor layers 130a, 130b, and 130c, selecting appropriate materials for the two or three layers forming the oxide semiconductor layer 130 allows current to flow in the oxide semiconductor layer 130b. Since a current flows in the oxide semiconductor layer 130b, the current is hardly influenced by interface scattering, leading to a high on-state current. Note that increasing the thickness of the oxide semiconductor layer 130b can increase on-state current. The thickness of the oxide semiconductor layer 130b may be, for example, 100 nm to 200 nm.

A semiconductor device using a transistor having any of the above structures can have favorable electrical characteristics.

This embodiment can be combined with any of the other embodiments described in this specification as appropriate.

Embodiment 2

In this embodiment, components of the transistors described in Embodiment 1 are described in detail.

The substrate 110 is not limited to a simple supporting substrate, and may be a substrate where another device such as a transistor is formed. In that case, one or more of the gate electrode layer 170, the source electrode layer 140, and the drain electrode layer 150 of the transistor may be electrically connected to the another device.

As the substrate 110, a glass substrate, a ceramic substrate, a quartz substrate, a sapphire substrate, or the like can be used, for example. Alternatively, a single crystal semiconductor substrate or a polycrystalline semiconductor substrate of silicon or silicon carbide, a compound semiconductor substrate of silicon germanium, a silicon-on-insulator (SOI) substrate, or the like may be used.

The insulating layer 120 can have a function of supplying oxygen to the oxide semiconductor layer 130 as well as a function of preventing diffusion of impurities from the substrate 110. For this reason, the insulating layer 120 is preferably an insulating film containing oxygen, and further preferably an insulating film containing oxygen in which the oxygen content is higher than that in the stoichiometric composition. For this reason, the insulating layer 120 is a film in which the amount of released oxygen when converted into oxygen atoms is $1.0 \times 10^{19}$ atoms/cm$^3$ or more in TDS analysis. In the TDS analysis, heat treatment is performed at a temperature of a film surface of higher than or equal to 100° C. and lower than or equal to 700° C., preferably higher than or equal to 100° C. and lower than or equal to 500° C. In the case where the substrate 110 is a substrate where another device is formed as described above, the insulating layer 120 also has a function as an interlayer insulating film. In that case, planarization treatment such as chemical mechanical polishing (CMP) is preferably performed so as to form a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film including silicon nitride, silicon nitride oxide, aluminum nitride, aluminum nitride oxide, or the like, or a mixed material of any of these. The insulating layer 120 may be a stack of any of the above materials.

In this embodiment, detailed description is given mainly on the case where the oxide semiconductor layer 130 has a three-layer structure in which the oxide semiconductor layer 130a, the oxide semiconductor layer 130b, and the oxide semiconductor layer 130c are stacked in this order from the insulating layer 120 side as in the transistors 106, 107, 108, and 109.

Note that in the case where the oxide semiconductor layer 130 is a single layer as in the transistors 101 and 102, a layer corresponding to the oxide semiconductor layer 130b is used.

In the case where the oxide semiconductor layer 130 has a two-layer structure as in the transistors 103, 104, and 105, a stack in which a layer corresponding to the oxide semiconductor layer 130b and a layer corresponding to the oxide semiconductor layer 130c are stacked in this order from the insulating layer 120 side is used. In such a case, the oxide semiconductor layer 130b and the oxide semiconductor layer 130c can be replaced with each other.

In the case where the oxide semiconductor layer 130 has a stacked-layer structure of four or more layers, for example, a structure in which another oxide semiconductor layer is stacked over the three-layer stack of the oxide semiconductor layer 130 described in this embodiment or a structure in which another oxide semiconductor layer is inserted in any one of the interfaces in the three-layer stack can be employed.

For the oxide semiconductor layer 130b, for example, an oxide semiconductor whose electron affinity (an energy difference between a vacuum level and the conduction band minimum) is higher than those of the oxide semiconductor layer 130a and the oxide semiconductor layer 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layer 130a and the oxide semiconductor layer 130c each contain one or more kinds of metal elements contained in the oxide semiconductor layer 130b. For example, the oxide semiconductor layer 130a and the oxide semiconductor layer 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode layer 170, a channel is formed in the oxide semiconductor layer 130b whose conduction band minimum is the lowest in the oxide semiconductor layer 130.

Further, since the oxide semiconductor layer 130a contains one or more kinds of metal elements contained in the oxide semiconductor layer 130b, an interface state is unlikely to be formed at the interface between the oxide semiconductor layer 130b and the oxide semiconductor layer 130a, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, fluctuations in electrical characteristics of the transistor, such as threshold voltage, can be reduced. Further, the reliability of the transistor can be improved.

Furthermore, since the oxide semiconductor layer 130c contains one or more kinds of metal elements contained in the oxide semiconductor layer 130b, scattering of carriers is unlikely to occur at the interface between the oxide semiconductor layer 130b and the oxide semiconductor layer 130c, compared with the interface between the oxide semiconductor layer 130b and the gate insulating film 160 on the assumption that the oxide semiconductor layer 130b is in contact with the gate insulating film 160. Thus, with the oxide semiconductor layer 130c, the field-effect mobility of the transistor can be increased.

For the oxide semiconductor layer 130a and the oxide semiconductor layer 130c, for example, a material containing Al, Ti, Ga, Ge, Y, Zr, Sn, La, Ce, or Hf at a higher atomic ratio than that in the oxide semiconductor layer 130b can be used. Specifically, an atomic ratio of any of the above metal elements in the oxide semiconductor layer 130a and the oxide semiconductor layer 130c is 1.5 times or more, preferably 2 times or more, further preferably 3 times or more as much as that in the oxide semiconductor layer 130b. Any of the above metal elements is strongly bonded to oxygen and thus has a function of suppressing generation of an oxygen vacancy in the oxide semiconductor layer 130a and the oxide semiconductor layer 130c. That is, an oxygen vacancy is less likely to be generated in the oxide semiconductor layer 130a and the oxide semiconductor layer 130c than in the oxide semiconductor layer 130b.

An oxide semiconductor that can be used for the oxide semiconductor layers 130a, 130b, and 130c preferably contains at least indium (In) or zinc (Zn). Both In and Zn are preferably contained. In order to reduce fluctuations in electrical characteristics of the transistor including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a film containing the In—Ga—Zn oxide is also referred to as an IGZO film.

A material represented by $InMO_3(ZnO)_m$ (m>0 is satisfied, and m is not an integer) may be used. Note that M represents one or more metal elements selected from Ga, Y, Zr, La, Ce, and Nd. Alternatively, a material represented by $In_2SnO_5(ZnO)_n$ (n>0, n is an integer) may be used.

Note that when each of the oxide semiconductor layer 130a, the oxide semiconductor layer 130b, and the oxide semiconductor layer 130c is an In-M-Zn oxide containing at least indium, zinc, and M (M is a metal such as Al, Ti, Ga, Ge, Y, Zr, Sn, La, Ce, or Hf), and when the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layer 130a and the oxide semiconductor layer 130c are preferably less than 50 atomic % and greater than or equal to 50 atomic %, respectively, further preferably less than 25 atomic % and greater than or equal to 75 atomic %, respectively. In the case where Zn and O are not taken into consideration, the proportion of In and the proportion of M in the oxide semiconductor layer 130b are preferably greater than or equal to 25 atomic % and less than 75 atomic %, respectively, further preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of M has higher mobility than an oxide having a composition in which the proportion of In is equal to or lower than that of M. Thus, with the use of an oxide having a high content of indium for the oxide semiconductor layer 130b, a transistor having high field-effect mobility can be obtained.

The thickness of each of the oxide semiconductor layers 130a and 130c is greater than or equal to 3 nm and less than or equal to 100 nm, preferably greater than or equal to 3 nm and less than or equal to 50 nm. The thickness of the oxide semiconductor layer 130b is greater than or equal to 3 nm and less than or equal to 200 nm, preferably greater than or equal to 10 nm and less than or equal to 150 nm, further preferably greater than or equal to 10 nm and less than or equal to 100 nm. In addition, the oxide semiconductor layer 130b is preferably thicker than the oxide semiconductor layer 130a and the oxide semiconductor layer 130c.

Note that in order that a transistor in which an oxide semiconductor layer serves as a channel have stable electrical characteristics, it is effective to reduce the concentration of impurities in the oxide semiconductor layer to make the oxide semiconductor layer intrinsic (i-type) or substantially intrinsic. The term "substantially intrinsic" refers to the state where an oxide semiconductor layer has a carrier density lower than $1\times10^{19}/cm^3$, preferably lower than $1\times10^{15}/cm^3$, further preferably lower than $1\times10^{13}/cm^3$, still further preferably lower than $1\times10^{8}/cm^3$ and higher than or equal to $1\times10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level serves as a trap and might cause deterioration of electrical characteristics of the transistor. Accordingly, in the oxide semiconductor layer 130a, the oxide semiconductor layer 130b, and the oxide semiconductor layer 130c and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of hydrogen at a certain depth of the oxide semiconductor layer or in a region of the oxide semiconductor layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Further, the concentration of nitrogen at a certain depth of the oxide semiconductor layer or in a region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of carbon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which a highly purified oxide semiconductor film is used for a channel formation region as described above has an extremely low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the oxide semiconductor layer, which serves as a channel, not be in contact with the gate insulating film for the above-described reason. In the case where a channel is formed at the interface between the gate insulating film and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating film.

Accordingly, with the oxide semiconductor layer 130 having a stacked-layer structure including the oxide semiconductor layer 130a, the oxide semiconductor layer 130b, and the oxide semiconductor layer 130c, a channel can be formed in the oxide semiconductor layer 130b; thus, the transistor can have a high field-effect mobility and stable electrical characteristics.

In a band structure, the conduction band minimums of the oxide semiconductor layer 130a, the oxide semiconductor layer 130b, and the oxide semiconductor layer 130c are continuous. This can be understood also from the fact that the compositions of the oxide semiconductor layer 130a, the oxide semiconductor layer 130b, and the oxide semiconductor layer 130c are close to one another and oxygen is easily diffused among the oxide semiconductor layer 130a, the oxide semiconductor layer 130b, and the oxide semiconductor layer 130c. Thus, the oxide semiconductor layer 130a, the oxide semiconductor layer 130b, and the oxide semiconductor layer 130c have a continuous physical property although they have different compositions and form a stack. In the drawings of this specification, interfaces between the oxide semiconductor layers of the stack are indicated by dotted lines.

The oxide semiconductor layer 130 in which layers containing the same main components are stacked is formed to have not only a simple stacked-layer structure of the layers but also a continuous energy band (here, in particular, a well structure having a U shape in which the conduction band minimums are continuous (U-shape well)). In other words, the stacked-layer structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layer 130a and the oxide semiconductor layer 130c, and an In—Ga—Zn oxide whose atomic ratio of In to Ga and Zn is 1:1:1, 2:1:3, 5:5:6, or 3:1:2, can be used for the oxide semiconductor layer 130b. In each of the oxide semiconductor layers 130a, 130b, and 130c, the proportion of each atom in the above atomic ratios may vary within a range of ±20% as an error.

The oxide semiconductor layer 130b of the oxide semiconductor layer 130 serves as a well, so that a channel is formed in the oxide semiconductor layer 130b in a transistor including the oxide semiconductor layer 130. Note that since the conduction band minimums are continuous, the oxide semiconductor layer 130 can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the oxide semiconductor layer 130a and the oxide semiconductor layer 130c. The oxide semiconductor layer 130b can be distanced away from the trap levels owing to the existence of the oxide semiconductor layer 130a and the oxide semiconductor layer 130c.

However, when the energy differences between the conduction band minimum of the oxide semiconductor layer 130b and the conduction band minimum of each of the oxide semiconductor layer 130a and the oxide semiconductor layer 130c are small, an electron in the oxide semiconductor layer 130b might reach the trap level by passing over the energy differences. When the electron causing a negative charge is trapped in the trap level, the threshold voltage of the transistor is shifted in the positive direction.

Thus, to reduce fluctuations in the threshold voltage of the transistor, energy differences of at least certain values between the conduction band minimum of the oxide semiconductor layer 130*b* and the conduction band minimum of each of the oxide semiconductor layer 130*a* and the oxide semiconductor layer 130*c* are necessary. Each of the energy differences is preferably greater than or equal to 0.1 eV, further preferably greater than or equal to 0.15 eV.

The oxide semiconductor layer 130*a*, the oxide semiconductor layer 130*b*, and the oxide semiconductor layer 130*c* preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

The gate insulating film 160 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 160 may be a stack of any of the above materials. The gate insulating film 160 may contain lanthanum (La), nitrogen, or zirconium (Zr) as an impurity.

An example of a stacked-layer structure of the gate insulating film 160 will be described. The gate insulating film 160 includes, for example, oxygen, nitrogen, silicon, or hafnium. Specifically, the gate insulating film 160 preferably includes hafnium oxide and silicon oxide or silicon oxynitride.

Hafnium oxide and aluminum oxide have higher dielectric constant than silicon oxide and silicon oxynitride. Therefore, by using hafnium oxide or aluminum oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

A surface over which the hafnium oxide with a crystalline structure is formed might have interface states due to defects. The interface states might function as trap centers. Therefore, in the case where the hafnium oxide is provided close to the channel region of the transistor, the electrical characteristics of the transistor might deteriorate owing to the interface states. In order to reduce the adverse effect of the interface states, in some cases, it is preferable to separate the channel region of the transistor and the hafnium oxide from each other by providing another film therebetween. The film has a buffer function. The film having a buffer function may be included in the gate insulating film 160 or included in the oxide semiconductor film. That is, the film having a buffer function can be formed using silicon oxide, silicon oxynitride, an oxide semiconductor, or the like. Note that the film having a buffer function is formed using, for example, a semiconductor or an insulator having a larger energy gap than a semiconductor to be the channel region. Alternatively, the film having a buffer function is formed using, for example, a semiconductor or an insulator having lower electron affinity than a semiconductor to be the channel region. Further alternatively, the film having a buffer function is formed using, for example, a semiconductor or an insulator having higher ionization energy than a semiconductor to be the channel region.

In some cases, the threshold voltage of the transistor can be controlled by trapping charge in the interface states (trap centers) at the surface over which the hafnium oxide with a crystalline structure is formed. In order that the charge stably exists, for example, an insulator having a larger energy gap than the hafnium oxide is provided between the channel region and the hafnium oxide. Alternatively, a semiconductor or an insulator having smaller electron affinity than the hafnium oxide is provided. The film having a buffer function may be formed using a semiconductor or an insulator having higher ionization energy than hafnium oxide. Use of such an insulator inhibits discharge of the charge trapped by the interface states, so that the charge can be retained for a long time.

Examples of such an insulator include silicon oxide and silicon oxynitride. In order to make the interface states in the gate insulating film 160 trap charge, electrons are transferred from the oxide semiconductor layer 130 toward the gate electrode layer 170. As a specific example, the potential of the gate electrode layer 170 is kept higher than the potential of the source or drain electrode under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons are trapped in interface states in the gate insulating film 160 or the like shifts in the positive direction. The amount of electrons to be trapped (the amount of change in threshold voltage) can be controlled by adjusting the voltage of the gate electrode layer 170 or the time for which the voltage is applied. Note that a location in which charge is trapped is not necessarily limited to the inside of the gate insulating film 160 as long as charge can be trapped therein. A stacked film having a similar structure may be used as another insulating layer.

For the gate electrode layer 170, for example, a conductive film formed using Al, Ti, Cr, Co, Ni, Cu, Y, Zr, Mo, Ru, Ag, Mn, Nd, Sc, Ta, W, or the like can be used. It is also possible to use an alloy or a conductive nitride of any of these materials. It is also possible to use a stack of a plurality of materials selected from these materials, alloys of these materials, and conductive nitrides of these materials. Typically, tungsten, a stack of tungsten and titanium nitride, a stack of tungsten and tantalum nitride, or the like can be used. It is also possible to use Cu or an alloy such as Cu—Mn, which has low resistance, or a stack of any of the above materials and Cu or an alloy such as Cu—Mn. In this embodiment, tantalum nitride is used for the conductive layer 171 and tungsten is used for the conductive layer 172 to form the gate electrode layer 170.

As the insulating layer 175, a silicon nitride film, an aluminum nitride film, or the like containing hydrogen is preferably used. When an insulating film containing hydrogen is used as the insulating layer 175, part of the oxide semiconductor layer can have n-type conductivity as described above. In addition, a nitride insulating film functions as a blocking film against moisture and the like and can improve the reliability of the transistor.

Further, the insulating layer 180 is preferably formed over the insulating layer 175. The insulating layer 185 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating layer may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the gate insulating film 160, so that oxygen vacancies formed in the channel formation region can be filled with the oxygen. In this manner, stable electrical characteristics of the transistor can be achieved.

As each of the source electrode layer 140 and the drain electrode layer 150, for example, a single layer or a stacked layer formed using a material selected from Al, Cr, Cu, Ta, Ti, Mo, W, Ni, Mn, Nd, Sc, and alloys of any of these metal materials can be used. Typically, it is preferable to use Ti, which is particularly easily bonded to oxygen, or W, which has a high melting point and thus allows subsequent process temperatures to be relatively high. It is also possible to use a stack of any of the above materials and Cu or an alloy such as Cu—Mn, which has low resistance. In this embodiment, W is used for the conductive layers 141 and 151 and Cu is used for the conductive layers 142 and 152 to form the source electrode layer 140 and the drain electrode layer 150.

The above materials are capable of extracting oxygen from an oxide semiconductor film. Therefore, in a region of the oxide semiconductor layer that is in contact with any of the above materials, oxygen is released from the oxide semiconductor film and an oxygen vacancy is formed. Hydrogen slightly contained in the film enters the oxygen vacancy, whereby the region is markedly changed to an n-type region. Accordingly, the n-type regions can serve as a source or a drain region of the transistor.

It is preferable to form the insulating layer 185 as a protective film for the source electrode layer 140, the drain electrode layer 150, and the insulating layer 180. As the insulating layer 185, an insulating film that is similar to the insulating layer 175 can be used. An aluminum oxide film can also be used as the insulating layer 185. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor layer 130, preventing release of oxygen, which is a main component of the oxide semiconductor layer 130, from the oxide semiconductor layer, and preventing unnecessary release of oxygen from the insulating layer 120. Further, oxygen contained in the aluminum oxide film can be diffused into the oxide semiconductor layer.

High integration of a semiconductor device requires miniaturization of a transistor. However, it is known that miniaturization of a transistor causes deterioration of electrical characteristics of the transistor. A decrease in channel width causes a reduction in on-state current.

In the transistors 103 to 109 of embodiments of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor of one embodiment of the present invention, as described above, the gate electrode layer 170 is formed to electrically surround the oxide semiconductor layer 130 in the channel width direction; accordingly, a gate electric field is applied to the oxide semiconductor layer 130 in the side surface direction in addition to the perpendicular direction. In other words, a gate electric field is applied to the entire channel formation layer and an effective channel width is increased, leading to a further increase in the on-state current.

In the transistor 106 to the transistor 109 of one embodiment of the present invention, the oxide semiconductor layer 130b where a channel is formed is provided over the oxide semiconductor layer 130a, so that an interface state is less likely to be formed. In addition, since the oxide semiconductor layer 130b is positioned at the middle of the three-layer structure, the influence of an impurity that enters from upper and lower layers on the oxide semiconductor layer 130b is eliminated. Therefore, the transistor can achieve not only the increase in the on-state current of the transistor but also stabilization of the threshold voltage and a reduction in the S value (subthreshold value). Thus, Icut (current when gate voltage VG is 0 V) can be reduced and power consumption can be reduced. Further, the threshold voltage of the transistor becomes stable; thus, long-term reliability of the semiconductor device can be improved. In addition, the transistor of one embodiment of the present invention is suitable for a highly integrated semiconductor device because deterioration of electrical characteristics due to miniaturization is reduced.

This embodiment can be combined as appropriate with any of the other embodiments and examples in this specification.

Embodiment 3

In this embodiment, an oxide semiconductor film that can be used for a transistor of one embodiment of the present invention is described.

Note that in this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 19A:
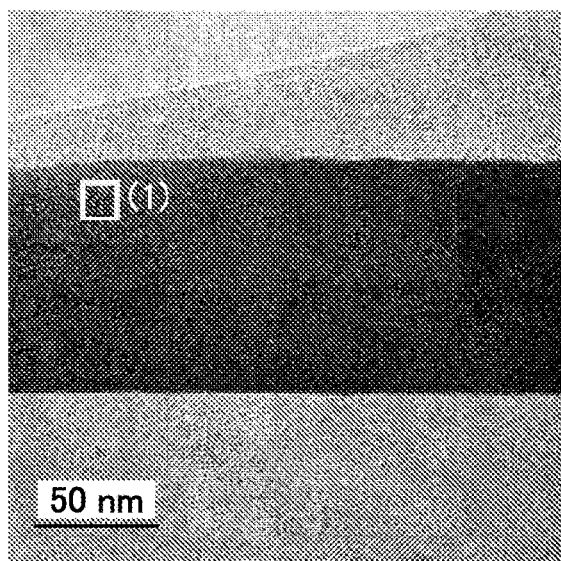
FIGS. 19A to 19D are Cs-corrected high-resolution TEM images of a cross section of a CAAC-OS and a cross-sectional schematic view of a CAAC-OS.

A CAAC-OS observed with TEM is described below. FIG. 19A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 19B:
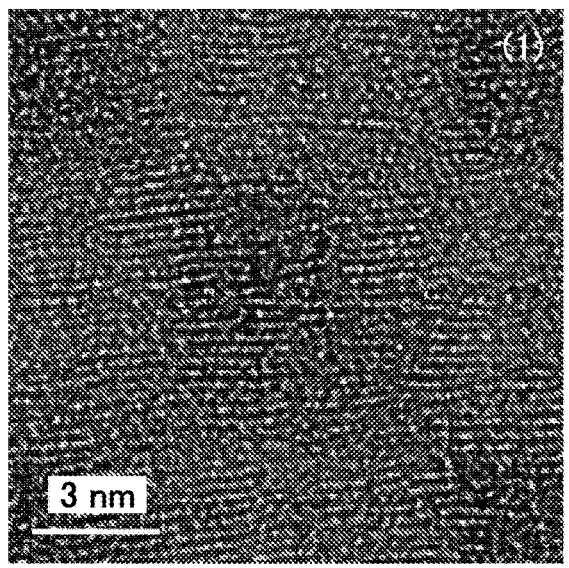

FIG. 19B is an enlarged Cs-corrected high-resolution TEM image of a region (1) in FIG. 19A. FIG. 19B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 19C:
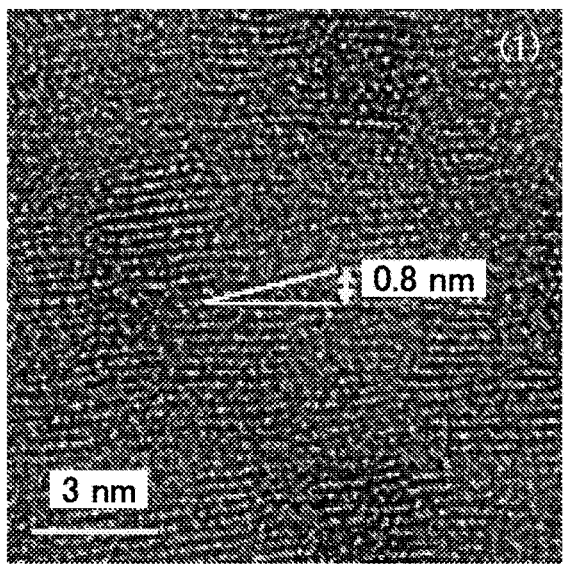

As shown in FIG. 19B, the CAAC-OS has a characteristic atomic arrangement. The characteristic atomic arrangement is denoted by an auxiliary line in FIG. 19C. FIGS. 19B and 19C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 19D:
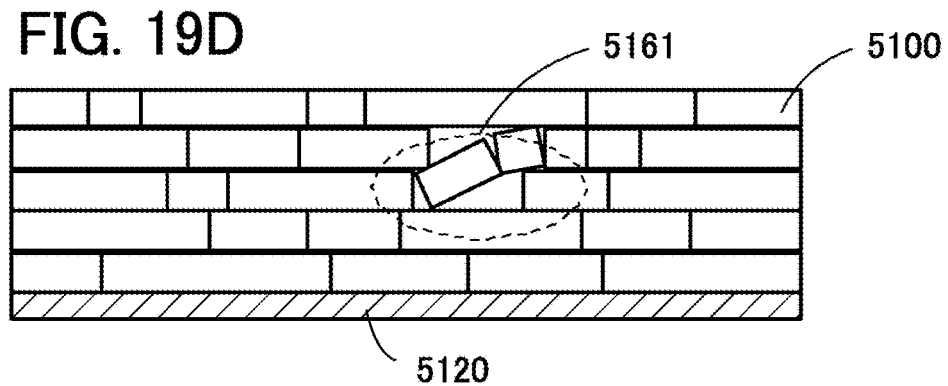

Here, according to the Cs-corrected high-resolution TEM images, the schematic arrangement of pellets 5100 of a CAAC-OS over a substrate 5120 is illustrated by such a structure in which bricks or blocks are stacked (see FIG. 19D). The part in which the pellets are tilted as observed in FIG. 19C corresponds to a region 5161 shown in FIG. 19D.

FIG. 20A shows a Cs-corrected high-resolution TEM image of a plane of the CAAC-OS observed from a direction substantially perpendicular to the sample surface. FIGS. 20B, 20C, and 20D are enlarged Cs-corrected high-resolution TEM images of regions (1), (2), and (3) in FIG. 20A, respectively. FIGS. 20B, 20C, and 20D indicate that metal atoms are arranged in a triangular, quadrangular, or hexagonal configuration in a pellet. However, there is no regularity of arrangement of metal atoms between different pellets.

Figure 21A:
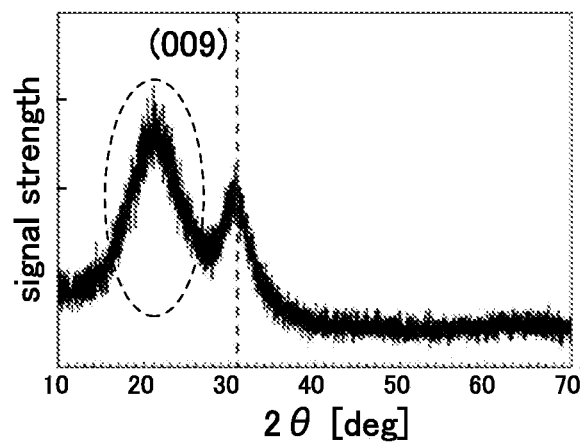
FIGS. 21A to 21C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 21A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 21B:
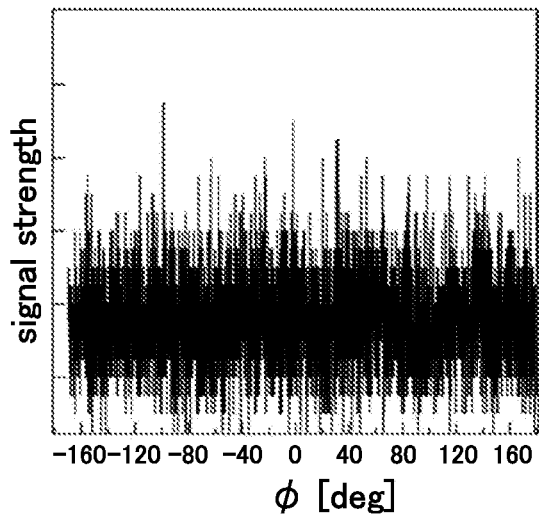
Figure 21C:
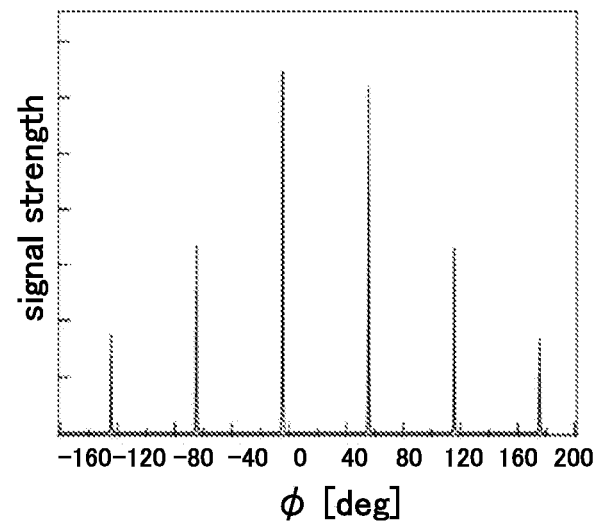

On the other hand, in structural analysis of the CAAC-OS by an in-plane method in which an X-ray beam is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 21B, a peak is not clearly observed. In contrast, in the case of a single crystal oxide semiconductor of $InGaZnO_4$, when $\phi$ scan is performed with $2\theta$ fixed at around 56°, as shown in FIG. 21C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 68A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 68B shows a diffraction pattern obtained in such a manner that an electron beam with a probe diameter of 300 nm is incident on the same sample in a direction perpendicular to the sample surface. As shown in FIG. 68B, a ring-like diffraction pattern is observed. Thus, the electron diffraction also indicates that the a-axes and b-axes of the pellets included in the CAAC-OS do not have regular alignment. The first ring in FIG. 68B is considered to be derived from the (010) plane, the (100) plane, and the like of the InGaZnO$_4$ crystal. The second ring in FIG. 68B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 69:
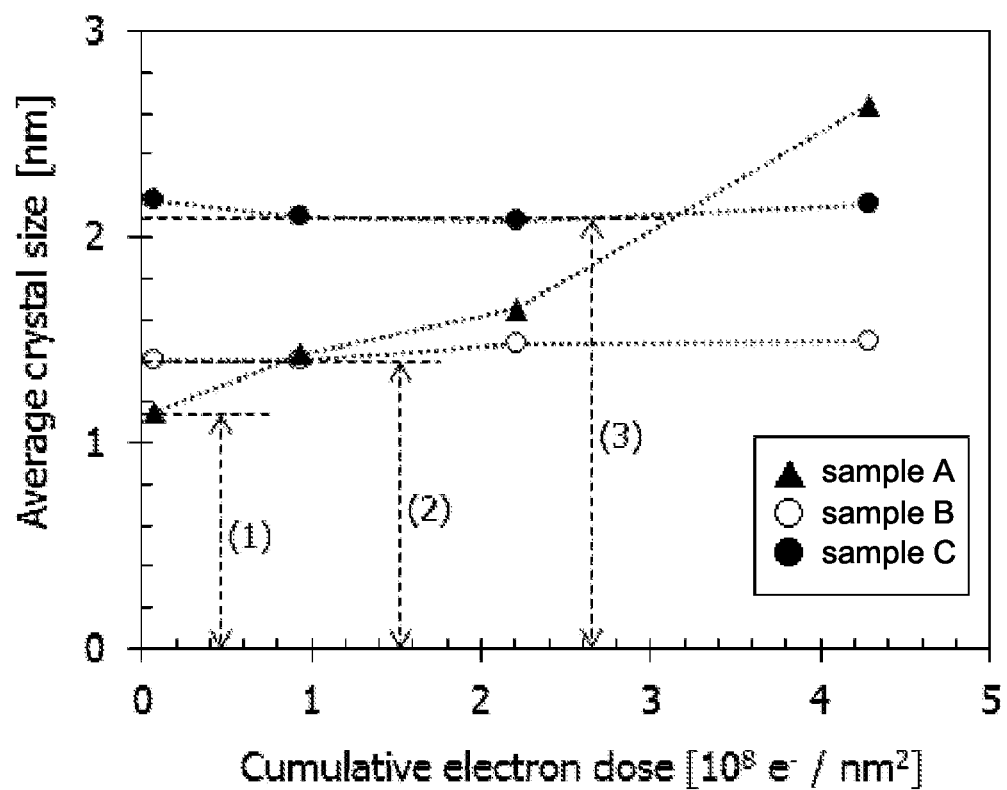
FIG. 69 shows a change in crystal part of an In—Ga—Zn oxide by electron irradiation.

FIG. 69 shows change in the average size of crystal parts (at 22 points to 45 points) in each sample. Note that the crystal part size corresponds to the length of a lattice fringe. FIG. 69 indicates that the crystal part size in the a-like OS increases with an increase in the cumulative electron dose. Specifically, as shown by (1) in FIG. 69, a crystal part of approximately 1.2 nm (also referred to as an initial nucleus) at the start of TEM observation grows to a size of approximately 2.6 nm at a cumulative electron dose of $4.2 \times 10^8$ e⁻/nm². In contrast, the crystal part size in the nc-OS and the CAAC-OS shows little change from the start of electron irradiation to a cumulative electron dose of $4.2 \times 10^8$ e⁻/nm². Specifically, as shown by (2) and (3) in FIG. 69, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO₄ with a rhombohedral crystal structure is 6.357 g/cm³. Accordingly, in the case of the oxide semiconductor having an atomic ratio of In:Ga:Zn=1:1:1, the density of the a-like OS is higher than or equal to 5.0 g/cm³ and lower than 5.9 g/cm³. For example, in the case of the oxide semiconductor having an atomic ratio of In:Ga:Zn=1:1:1, the density of each of the nc-OS and the CAAC-OS is higher than or equal to 5.9 g/cm³ and lower than 6.3 g/cm³.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

This embodiment can be combined with any of the other embodiments described in this specification as appropriate.

Embodiment 4

In this embodiment, a display device of one embodiment of the present invention will be described with reference to drawings.

The "display device" in this specification means an image display device or a light source (including a lighting device). Further, the display device includes any of the following modules in its category: a module including a connector such as a flexible printed circuit (FPC), or tape carrier package (TCP); a module including TCP which is provided with a printed wiring board at the end thereof; and a module including a driver circuit which is directly mounted on a display element by a chip on glass (COG) method.

Figure 22:
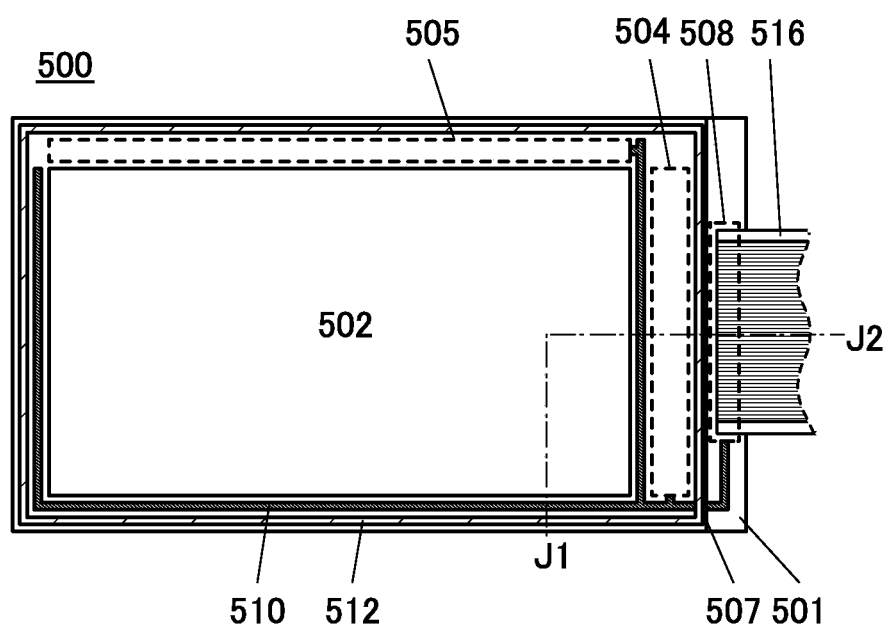
FIG. 22 is a top view of a display device.

FIG. 22 is a top view of a display device 500 that is one embodiment of the present invention. In FIG. 22, some components are enlarged, reduced in size, made to be visible, or omitted for easy understanding.

The display device 500 includes a pixel portion 502 over a substrate 501, a circuit portion 504 and a circuit portion 505 configured to drive the pixel portion, a sealant 512 provided to surround the pixel portion 502, the circuit portion 504, and the circuit portion 505, and a substrate 507 provided to face the substrate 501. Note that a signal line driver circuit (source driver) and a scan line driver circuit (gate driver) can be used, for example, as the circuit portion 504 and the circuit portion 505, respectively.

The substrate 501 and the substrate 507 are bonded to each other with the sealant 512. Although not shown in FIG. 22, a display element is provided between the substrate 501 and the substrate 507. In other words, the pixel portion 502, the circuit portion 504, the circuit portion 505, and the display element are sealed with the substrate 501, the sealant 512, and the substrate 507.

Furthermore, in the display device 500, an FPC terminal portion 508 (FPC: flexible printed circuit) that is electrically connected to the pixel portion 502, the circuit portion 504, and the circuit portion 505 is provided over the substrate 501 in a region different from a region surrounded by the sealant 512.

The FPC terminal portion 508 is connected to an FPC 516, and a variety of signals are supplied to the pixel portion 502, the circuit portion 504, and the circuit portion 505 with the FPC 516. In addition, signal lines 510 are connected to the pixel portion 502, the circuit portion 504, the circuit portion 505, and the FPC terminal portion 508. The variety of signals supplied from the FPC 516 are given to the pixel portion 502, the circuit portion 504, and the circuit portion 505 through the signal lines 510.

In FIG. 22, the circuits for driving the pixel circuit portion 502 are positioned in two regions; however, the structure of the circuit is not limited thereto. For example, the circuit may be positioned in one region. Alternatively, the circuit may be divided into three or more parts. Further alternatively, only one of the circuit portion 504 and the circuit portion 505 may be provided over the substrate 501, and the other circuit may be externally provided.

Further, the circuit for driving the pixel portion 502 may be formed over the substrate 501 like a transistor included in the pixel portion 502, or may be formed by mounting an IC chip on the substrate 501 by chip on glass (COG) or the like. Alternatively, the circuit may be connected to a TCP or the like.

The pixel portion 502, the circuit portion 504, and the circuit portion 505 in the display device 500 include a plurality of transistors in which a channel formation region is formed using an oxide semiconductor layer.

Since the transistor using an oxide semiconductor layer has high mobility, an area occupied by transistors can be made small, and the aperture ratio can be increased. With use of the transistor, the circuit portion 504 and the circuit portion 505 can be formed over the substrate provided with the pixel portion 502. In addition, the transistor has extremely low off-state current and can hold a video signal or the like for a longer period; thus, the frame frequency can be lowered, and the power consumption of the display device can be reduced.

The oxide semiconductor layer preferably includes a c-axis aligned crystal. In the case where the oxide semiconductor layer including the crystal is used for a channel formation region of the transistor, a crack or the like is less likely to occur in the oxide semiconductor layer when the display device 500 is bent, for example. As a result, the reliability can be improved.

Thus, with use of the transistor using an oxide semiconductor layer, a display device that is superior to a display device including an amorphous silicon layer or a polycrystalline silicon layer can be formed, for example.

As a display element included in the display device 500, a liquid crystal element or a light-emitting element can be typically used.

Figure 23:
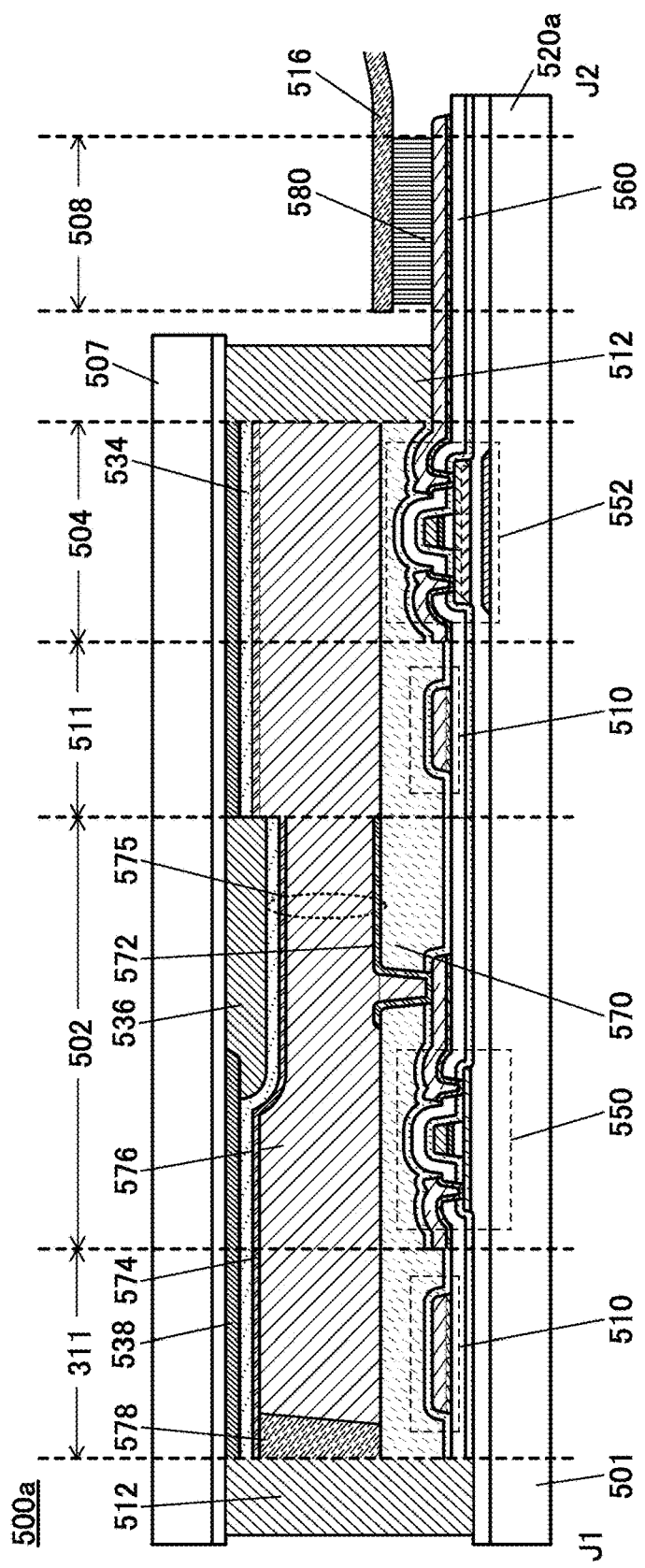
FIG. 23 is a cross-sectional view of a display device.

Next, a liquid crystal display device 500a is described. FIG. 23 is a cross-sectional view along dashed-dotted line J1-J2 in FIG. 22 in the case where a liquid crystal element is used for the display device 500.

In the liquid crystal display device 500a, the substrate 501, a first element layer, a second element layer, and the substrate 507 are stacked in this order.

In FIG. 23, the first element layer includes transistors 550 and 552, a planarization insulating film 570, a connection electrode 560, a conductive film 572, and the like. The second element layer includes a conductive film 574, an insulating film 534, a coloring layer 536 (color filter), a light-blocking layer 538 (black matrix), and the like. There is a case where some of the above components is not included or a component other than the above components is included in the first element layer and the second element layer.

The first element layer and the second element layer are sealed with a liquid crystal layer 576 and the sealant 512 to form a liquid crystal element 575.

The liquid crystal display device 500a includes a lead wiring portion 511, the pixel portion 502, the circuit portion 504, and the FPC terminal portion 508. Note that the lead wiring portion 511 includes the signal line 510.

The liquid crystal display device 500a has a structure in which the transistor 550 and the transistor 552 are included in the pixel portion 502 and the circuit portion 504, respectively.

The structure of the transistor 550 and the transistor 552 is not limited to that illustrated in FIG. 23. The sizes of the transistor 550 and the transistor 552 can be changed (in the channel length, the channel width, and the like) as appropriate, or the number of transistors can be changed. In addition, the circuit portion 505 (not shown in FIG. 23) can have a structure similar to that of the circuit portion 504.

The signal line 510 included in the lead wiring portion 511 can be formed in a step of forming a source electrode layer and a drain electrode layer of the transistor 550.

The FPC terminal portion 508 includes the connection electrode 560, an anisotropic conductive film 580, and the FPC 516. The connection electrode 560 can be formed in a step of forming the source electrode layer and the drain electrode layer of the transistor 550. In addition, the connection electrode 560 is electrically connected to a terminal of the FPC 516 through the anisotropic conductive film 580.

A wiring containing a copper element is preferably used for the signal line connected to the transistor in the pixel portion and the transistor in the driver circuit portion. When the wiring containing a copper element is used, the signal delay due to the wiring resistance and the like can be suppressed.

Further, in FIG. 23, the planarization insulating film 570 is provided over the transistor 550 and the transistor 552.

The planarization insulating film 570 can be formed using a heat-resistant organic material, such as a polyimide resin, an acrylic resin, a polyimide amide resin, a benzocyclobutene resin, a polyamide resin, or an epoxy resin. Note that the planarization insulating film 570 may be formed by stacking a plurality of insulating films formed from these materials. Alternatively, a structure without the planarization insulating film 570 may be employed.

The conductive film 572 is electrically connected to one of the source electrode layer and the drain electrode layer of the transistor 550. The conductive film 572 functions as a pixel electrode formed over the planarization insulating film 570, i.e., one electrode of the liquid crystal element. As the conductive film 572, a conductive film having properties of transmitting visible light is preferably used. For example, a material including one of indium (In), zinc (Zn), and tin (Sn) is preferably used for the conductive film.

The liquid crystal element 575 includes the conductive film 572, the conductive film 574, and the liquid crystal layer 576. The conductive film 574 is provided on the substrate 507 side and functions as a counter electrode. In the liquid crystal display device 500a illustrated in FIG. 23, an orientation state of the liquid crystal layer 576 is changed by the voltage applied to the conductive film 572 and the conductive film 574, so that transmission or non-transmission of light is changed and thus an image can be displayed.

Although not shown in FIG. 23, alignment films may be formed between the conductive film 572 and the liquid crystal layer 576 and between the conductive film 574 and the liquid crystal layer 576. An optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a sidelight, or the like may be used as a light source.

A spacer 578 is provided between the substrate 501 and the substrate 507. The spacer 578 is a columnar spacer obtained by selective etching of an insulating film and is provided in order to adjust the thickness (cell gap) of the liquid crystal layer 576. Note that as the spacer 578, a spherical spacer may be used.

For the liquid crystal layer 576, a liquid crystal material such as thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal showing a blue phase and a chiral material has a short response time and optical isotropy, which makes the alignment process unneeded and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where the liquid crystal element is used as a display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. There are some examples of a vertical alignment mode; for example, a multi-domain vertical alignment (MVA) mode, a patterned vertical alignment (PVA) mode, an ASV mode, or the like can be employed.

As a display method in the pixel portion 502, a progressive method, an interlace method, or the like can be employed. Further, color elements controlled in a pixel at the time of color display are not limited to three colors: R, G, and B (R, G, and B correspond to red, green, and blue, respectively). For example, a display unit may be composed of four pixels of the R pixel, the G pixel, the B pixel, and a W (white) pixel. Alternatively, a display unit may be composed of two of color elements among R, G, and B as in PenTile layout. The two colors may differ among display units. Alternatively, one or more colors of yellow, cyan, magenta, and the like may be added to RGB. Further, the size of a display region may be different depending on respective dots of the color components. Embodiments of the disclosed invention are not limited to a display device for color display; the disclosed invention can also be applied to a display device for monochrome display.

Figure 24:
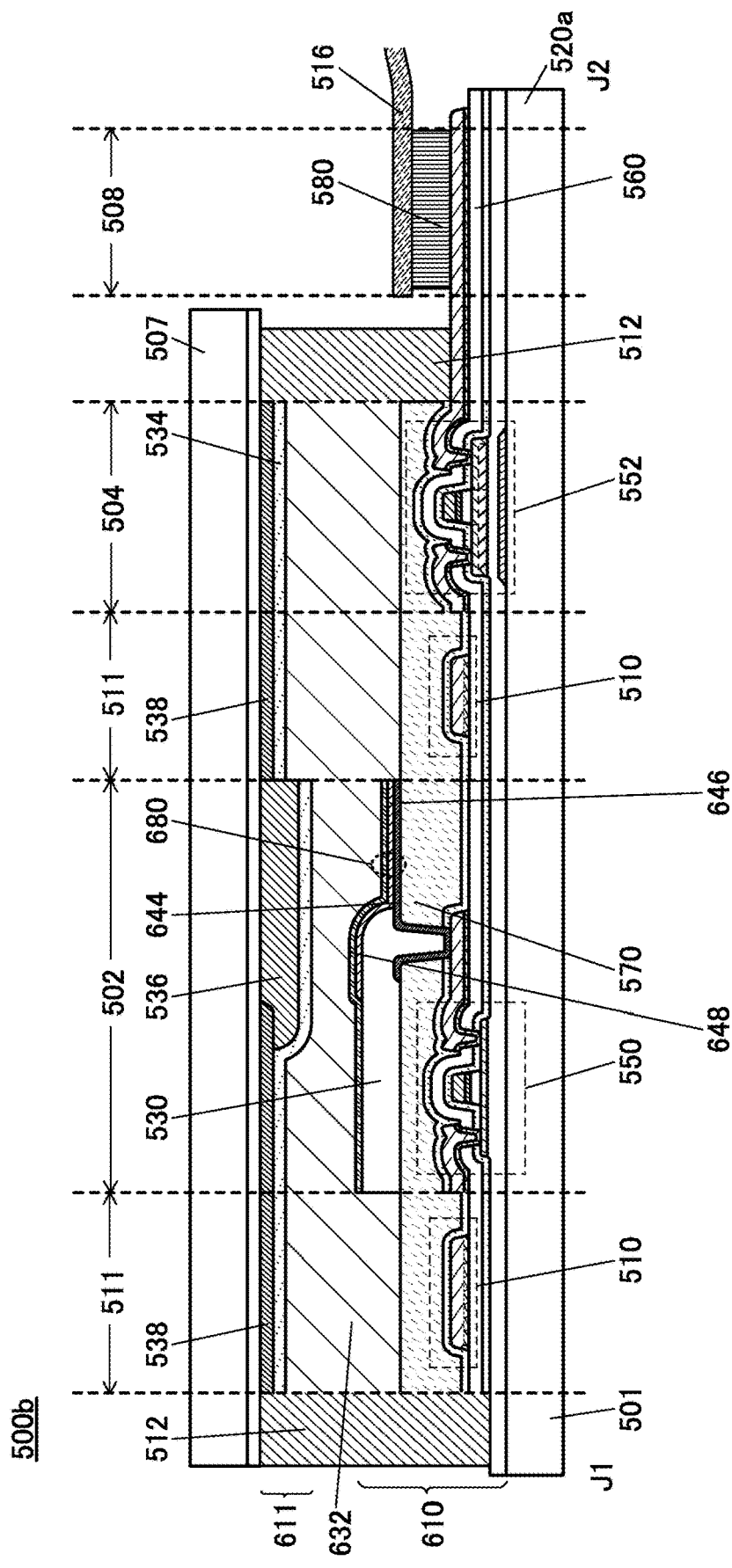
FIG. 24 is a cross-sectional view of a display device.

Next, an EL display device 500b including a light-emitting element is described. FIG. 24 is a cross-sectional view along dashed-dotted line J1-J2 in FIG. 22 in the case where a light-emitting element is used for the display device 500. Note that the same description as that of the liquid crystal display device 500a is omitted.

In the EL display device 500b, the substrate 501, a first element layer 610, a second element layer 611, and the substrate 507 are stacked in this order.

In FIG. 24, the first element layer 610 includes the transistors 550 and 552, the planarization insulating film 570, the connection electrode 560, a light-emitting element 680, an insulating film 530, the signal line 510, and the connection electrode 560. The second element layer 611 includes the insulating film 534, the coloring layer 536, and the light-blocking layer 538. The first element layer 610 and the second element layer 611 are sealed with a sealing layer 632 and the sealant 512. Note that there is a case where part of the above components is not included or a component other than the above components is included in the first element layer 610 and the second element layer 611.

The light-emitting element 680 includes a conductive film 644, an EL layer 646, and a conductive film 648. The EL display device 500b enables an image to be displayed when the EL layer 646 in the light-emitting element 680 emits light.

The insulating film 530 is provided over the conductive film 644 over the planarization insulating film 570. The insulating film 530 partly covers the conductive film 644. A conductive film with high properties of reflecting light emitted from the EL layer is used for the conductive film 644, and a conductive film with high properties of transmitting light emitted from the EL layer is used for the conductive film 648, whereby the light-emitting element 680 can have a top emission structure. Alternatively, a conductive film with high properties of transmitting the light is used for the conductive film 644, and a conductive film with high properties of reflecting light is used for the conductive film 648, whereby the light-emitting element 680 can have a bottom emission structure. Further alternatively, a conductive film with high properties of transmitting the light is used for both the conductive film 644 and the conductive film 648, whereby a dual emission structure can be obtained.

The coloring layer 536 is provided to overlap with the light-emitting element 680, and the light-blocking layer 538 is provided to overlap with the insulating film 530 and to be included in the lead wiring portion 511 and in the circuit portion 504. The coloring layer 536 and the light-blocking layer 538 are covered with the insulating film 534. A space between the light-emitting element 680 and the insulating film 534 is filled with the sealing layer 632. Although a structure with the coloring layer 536 is described as the EL display device 500b, the structure is not limited thereto. In the case where the EL layer 646 is formed by a side-by-side method, the coloring layer 536 is not necessarily provided.

This embodiment can be combined as appropriate with any of the other embodiments and examples in this specification.

Embodiment 5

In this embodiment, transistors included in a display device of one embodiment of the present invention will be described.

The transistors included in the display device of one embodiment of the present invention do not necessarily have a uniform structure. For example, a transistor in a pixel portion in the display device and a transistor used in a driver circuit portion for driving the pixel portion have different structures; thus, the transistors can have electric characteristics appropriate to the respective portions, and the reliability of the display device can be improved.

When the transistor included in the driver circuit has a double gate structure, the transistor can have high field-effect mobility.

Furthermore, the transistor in the driver circuit portion and the transistor in the pixel portion may have different channel lengths. Typically, the channel length of the transistor in the driver circuit portion can be less than 2.5 µm, or greater than or equal to 1.45 µm and less than or equal to 2.2 µm. The channel length of the transistor in the pixel portion can be greater than or equal to 2.5 µm, or greater than or equal to 2.5 µm and less than or equal to 20 µm.

When the channel length of the transistor in the driver circuit portion is less than 2.5 µm, preferably greater than or equal to 1.45 µm and less than or equal to 2.2 µm, as compared with the transistor in the pixel portion, the field-effect mobility can be increased, and the amount of on-state current can be increased. Consequently, a driver circuit portion capable of high-speed operation can be formed.

When the transistor in the driver circuit portion has high field-effect mobility, the number of input terminals can be made small.

The liquid crystal display device 500a illustrated in FIG. 23 and the EL display device 500b illustrated in FIG. 24 are examples in which the transistor 101 illustrated in FIGS. 1A and 1B is used as the transistor in the pixel portion, and the transistor 104 illustrated in FIGS. 7A and 7B is used as the transistor in the driver circuit portion.

For the transistor in the pixel portion, a transistor with high reliability for light irradiation from the backlight or an EL element is preferable. For example, an oxide semiconductor layer deposited by a sputtering method using a material with an atomic ratio In:Ga:Zn=1:1:1 or 5:5:6 as a target is used for a channel formation region, whereby a transistor with high reliability for light irradiation can be formed.

In contrast, for the transistor in the driver circuit portion, a transistor with high field-effect mobility is preferable. For example, an oxide semiconductor layer deposited by a sputtering method using a material with an atomic ratio In:Ga:Zn=3:1:2 as a target is used for a channel formation region, whereby a transistor with high field-effect mobility can be formed.

In this embodiment, a method by which the above two types of transistors can be easily formed over one substrate is described with reference to FIGS. 25A to 25D and FIGS. 26A to 26D. When one of the transistors has an oxide semiconductor layer with a stacked structure, the two types of transistors can be easily formed over one substrate. On the left side of the drawings, a cross section in the channel length direction of a transistor A whose structure is similar to that of the transistor 101 in FIGS. 1A and 1B is shown, as the transistor in the pixel portion. On the right side of the drawings, a cross section in the channel length direction of a transistor B whose structure is similar to that of the transistor 104 in FIGS. 7A and 7B is shown, as the transistor in the driver circuit portion. Note that the reference numerals common in the transistor A and the transistor B are given in only one of the transistors.

First, the insulating layer 120 is formed over the substrate 110. Embodiment 2 can be referred to for the kind of the substrate 110 and the material of the insulating layer 120. Note that the insulating layer 120 can be formed by a sputtering method, a CVD method, an MBE method, or the like.

Oxygen may be added to the insulating layer 120 by an ion implantation method, an ion doping method, a plasma immersion ion implantation method, or the like. Adding oxygen facilitates supply of oxygen from the insulating layer 120 to the oxide semiconductor layer 130.

In the case where a surface of the substrate 110 is made of an insulator and there is no influence of impurity diffusion to the oxide semiconductor layer 130 to be formed later, a structure without the insulating layer 120 can be employed.

Next, over the insulating layer 120, an oxide semiconductor film 130B that is to be the oxide semiconductor layer 130b in the driver circuit transistor is deposited by a sputtering method, a CVD method, an MBE method, or the like.

Figure 25A:
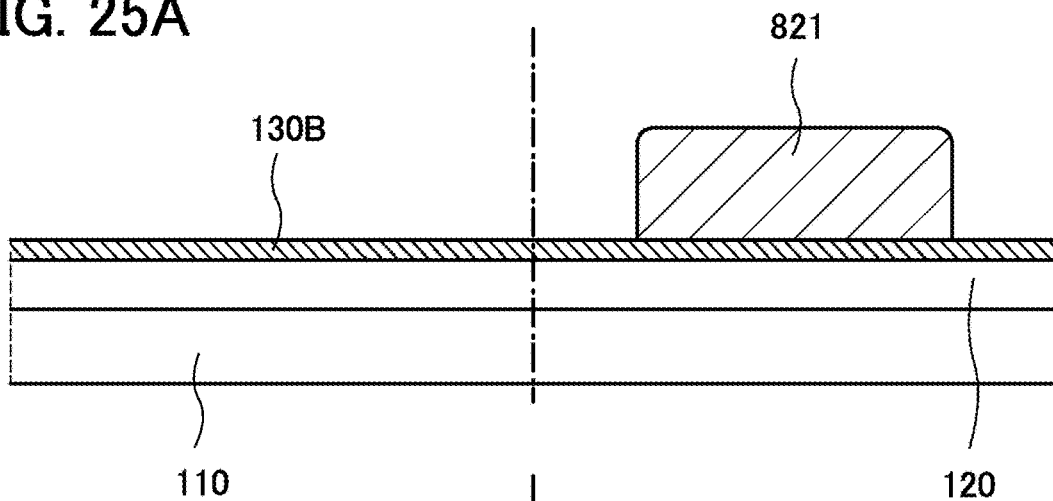
FIGS. 25A to 25D illustrate a method for manufacturing a transistor.
Figure 25B:
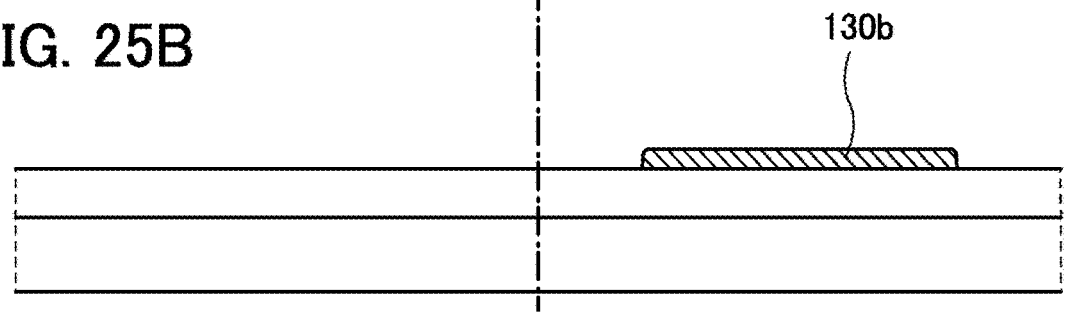
Figure 25C:
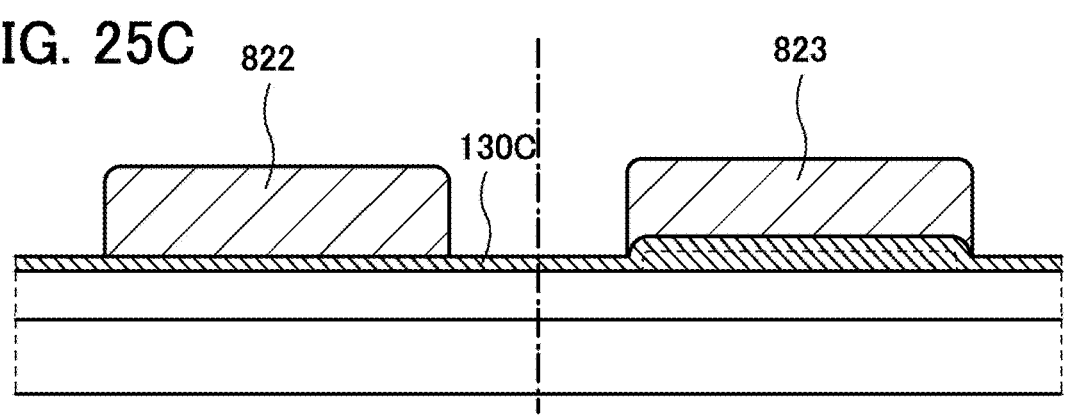
Figure 25D:
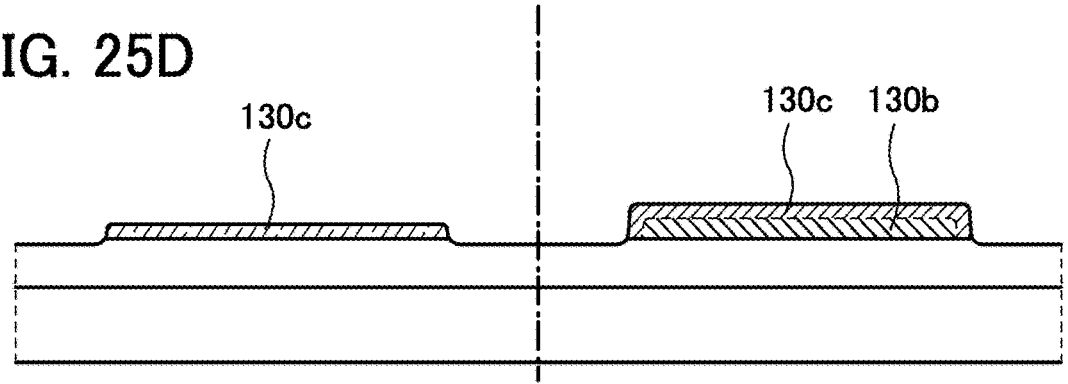

Next, a resist mask 821 is formed in a driver circuit region by a lithography method (see FIG. 25A). Then, using the resist mask, the oxide semiconductor film 130B is selectively etched to form the oxide semiconductor layer 130b (see FIG. 25B).

Next, an oxide semiconductor film 130C is formed to cover the oxide semiconductor layer 130b.

The oxide semiconductor films are preferably formed with a multi-chamber deposition apparatus (e.g., a sputtering apparatus) provided with a load lock chamber. It is preferable that each chamber of the sputtering apparatus be able to be evacuated to a high vacuum (to about $5 \times 10^{-7}$ Pa to $1 \times 10^{-4}$ Pa) by an adsorption vacuum pump such as a cryopump and that the chamber be able to heat a substrate over which a film is to be deposited to 100° C. or higher, preferably 500° C. or higher so that water and the like acting as impurities of the oxide semiconductor are removed as much as possible. Alternatively, a combination of a turbo molecular pump and a cold trap is preferably used to prevent back-flow of a gas containing a carbon component, moisture, or the like from an exhaust system into the chamber. Alternatively, a combination of a turbo molecular pump and a cryopump may be used as an exhaust system.

Not only high vacuum evacuation of the chamber but also high purity of a sputtering gas is necessary to obtain a highly purified intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor film can be prevented as much as possible.

For the oxide semiconductor film 130B and the oxide semiconductor film 130C, any of the materials of the oxide semiconductor layers 130b and 130c described in Embodiment 2 can be used. In this embodiment, for example, an In—Ga—Zn oxide with an atomic ratio of In:Ga:Zn=3:1:2 is used for the oxide semiconductor film 130B, and an In—Ga—Zn oxide with an atomic ratio of In:Ga:Zn=1:1:1 or 5:5:6 is used for the oxide semiconductor film 130C. In each of the oxide semiconductor films 130B and 130C, the proportion of each atom in the above atomic ratio may vary within a range of ±20% as an error. In the case where a sputtering method is used for deposition, the above materials can be used as a target.

Note that the oxide semiconductor films are preferably formed by a sputtering method. As a sputtering method, an RF sputtering method, a DC sputtering method, an AC sputtering method, or the like can be used.

After the oxide semiconductor film 130C is formed, first heat treatment may be performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure atmosphere. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. The first heat treatment can increase the crystallinity of the oxide semiconductor film 130B and the oxide semiconductor film 130C and remove impurities such as water and hydrogen from the insulating layer 120, the oxide semiconductor film 130B, and the oxide semiconductor film 130C. Note that the first heat treatment may be performed after etching for forming the stacked layers of the oxide semiconductor layer 130b and the oxide semiconductor layer 130c described later.

Next, a resist mask 822 is formed in a pixel region by a lithography method. In addition, a resist mask 823 is formed over the stacked layers of the oxide semiconductor layer 130b and the oxide semiconductor film 130C in the driver circuit region (see FIG. 25C).

Next, using the resist masks, the oxide semiconductor film 130C is selectively etched to form the oxide semiconductor layer 130c in the pixel region. In addition, stacked layers of the oxide semiconductor layer 130b and the oxide semiconductor layer 130c are formed in the driver circuit region (see FIG. 25D). At this time, the oxide semiconductor layer 130c in the driver circuit region is formed to cover the oxide semiconductor layer 130b.

Next, an insulating film 160a to be a gate insulating film is formed over the oxide semiconductor layer in the pixel region and the stacked layers of the oxide semiconductor layer 130b and the oxide semiconductor layer 130c in the driver circuit region. The insulating film 160a can be formed using a material that can be used for the gate insulating film 160 described in Embodiment 3. A sputtering method, a CVD method, an MBE method, or the like can be used for the formation of the insulating film 160a.

Then, a conductive film 171a and a conductive film 172a to be the gate electrode layer 170 are formed over the insulating film 160a. The conductive film 171a and the conductive film 172a can be formed using a material that can be used for the gate electrode layer 170 described in Embodiment 2. A sputtering method, a CVD method, an MBE method, or the like can be used for the formation of the conductive film 171a and the conductive film 172a (see FIG. 26A).

Next, a resist mask 824 is formed over the conductive film 172a. Using the resist mask, the conductive film 172a, the conductive film 171a, and the insulating film 160a are selectively etched, so that the gate electrode layer 170 and the gate insulating film 160 are formed.

Then, with the resist mask 824 formed in the above step left, an impurity 830 for forming an oxygen vacancy is added to the region 231 and the region 232 to make the regions have lower resistance. Thus, a source region and a drain region are formed (see FIG. 26B). As the impurity 830, argon is, for example, added by plasma treatment.

Since the resist mask changes its quality because of argon plasma, oxygen ashing is preferably performed for removal.

Next, the insulating layer 175 is formed over the above-described structure. Embodiment 2 can be referred to for the material of the insulating layer 175. The insulating layer 175 can be formed by a sputtering method, a CVD method, an MBE method, or the like.

Figure 26A:
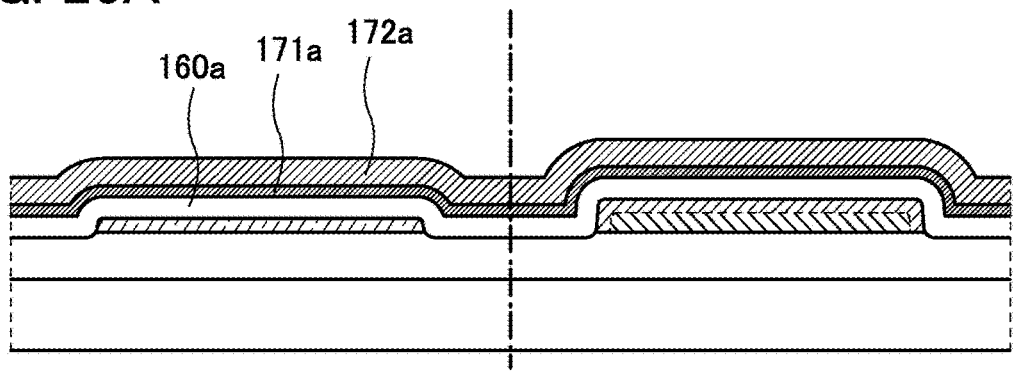
FIGS. 26A to 26D illustrate a method for manufacturing a transistor.
Figure 26B:
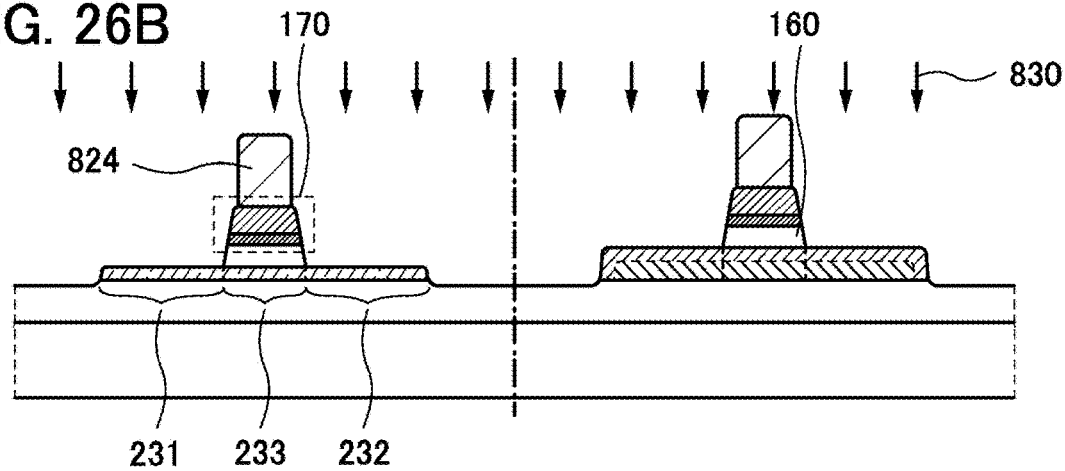
Figure 26C:
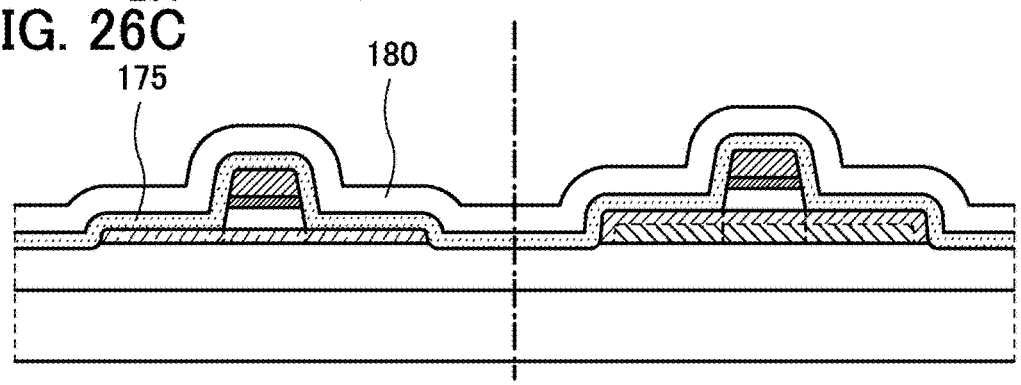

Next, the insulating layer 180 is formed over the insulating layer 175 (see FIG. 26C). Embodiment 2 can be referred to for the material of the insulating layer 180. The insulating layer 180 can be formed by a sputtering method, a CVD method, an MBE method, or the like.

Next, a resist mask is formed over the insulating layer 180. Using the resist mask, the insulating layer 180 and the insulating layer 175 are selectively etched to form contact holes reaching the region 231 and the region 232.

Then, a conductive film is formed to cover the contact holes and selectively etched, so that the source electrode layer 140 and the drain electrode layer 150 are formed. Embodiment 2 can be referred to for the material of the conductive film. The conductive film can be formed by a sputtering method, a CVD method, an MBE method, or the like.

Figure 26D:
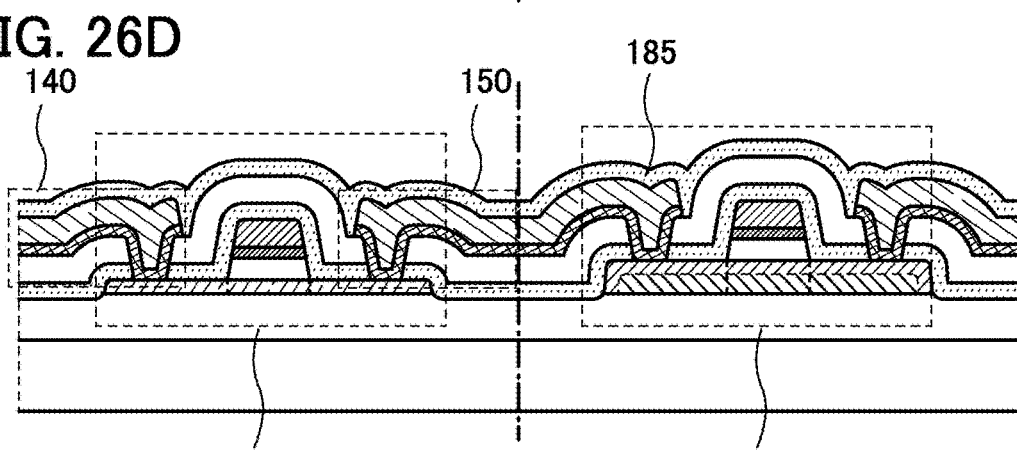

Next, the insulating layer 185 is formed over the above-described structure (see FIG. 26D). Embodiment 3 can be referred to for the material of the insulating layer 185. The insulating layer 185 can be formed by a sputtering method, a CVD method, an MBE method, or the like.

Oxygen may be added to the insulating layer 180 and/or the insulating layer 185 by plasma treatment, an ion implantation method, an ion doping method, a plasma immersion ion implantation method, or the like. Adding oxygen facilitates supply of oxygen from the insulating layer 180 and/or the insulating layer 185 to the insulating layer 185.

Then, second heat treatment may be performed. The second heat treatment can be performed under conditions similar to those of the first heat treatment. By the second heat treatment, excess oxygen is easily released from the insulating layers 120, 180, and 185, so that oxygen vacancies in the oxide semiconductor layer can be reduced.

Through the above steps, the transistor including the oxide semiconductor layer with a single-layer structure and the transistor including the oxide semiconductor layer with a stacked structure can be easily formed over one substrate. In addition, a display device that can operate at high speed, less deteriorates due to light irradiation, and includes a pixel portion with excellent display quality can be formed.

Although the variety of films such as the metal films, the semiconductor films, and the inorganic insulating films which are described in this embodiment can be typically formed by a sputtering method or a plasma CVD method, such films may be formed by another method, e.g., a thermal chemical vapor deposition (CVD) method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for film formation.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method is performed in such a manner that the pressure in a chamber is set to an atmospheric pressure or a reduced pressure, source gases for reaction are sequentially introduced into the chamber, and then the sequence of gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust the thickness and thus is suitable for manufacturing minute FETs.

The variety of films such as the metal films, the semiconductor films, and the inorganic insulating films which have been disclosed in this embodiment can be formed by a thermal CVD method such as an MOCVD method or an ALD method. For example, in the case where an In—Ga—Zn—$O_x$ (x>0) film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula:

$Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced a plurality of times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—$O_x$ (x>0) film is formed using a deposition apparatus employing ALD, an $In(CH_3)_3$ gas and an $O_3$ gas are sequentially introduced a plurality of times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined with any of the other embodiments described in this specification as appropriate.

Embodiment 6

In this embodiment, configuration examples of a display device using a transistor of one embodiment of the present invention are described.

Configuration Example

Figure 27A:
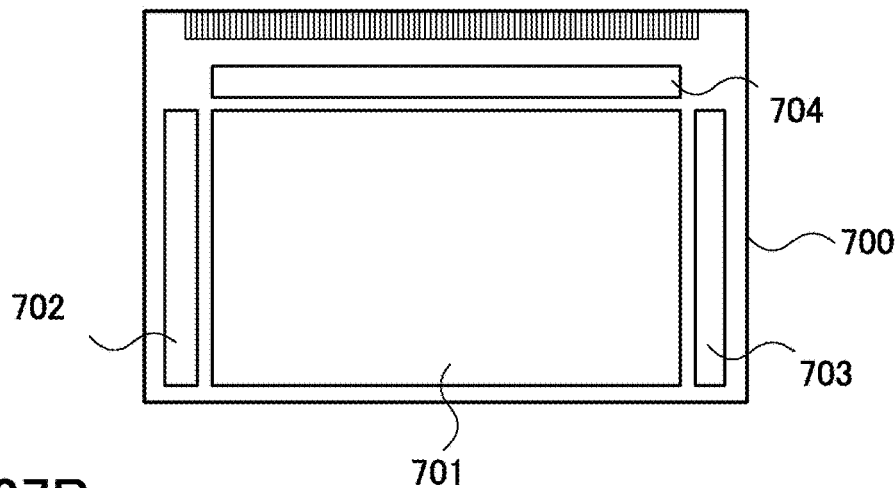
FIG. 27A illustrates a configuration example of a display device.
Figure 27B:
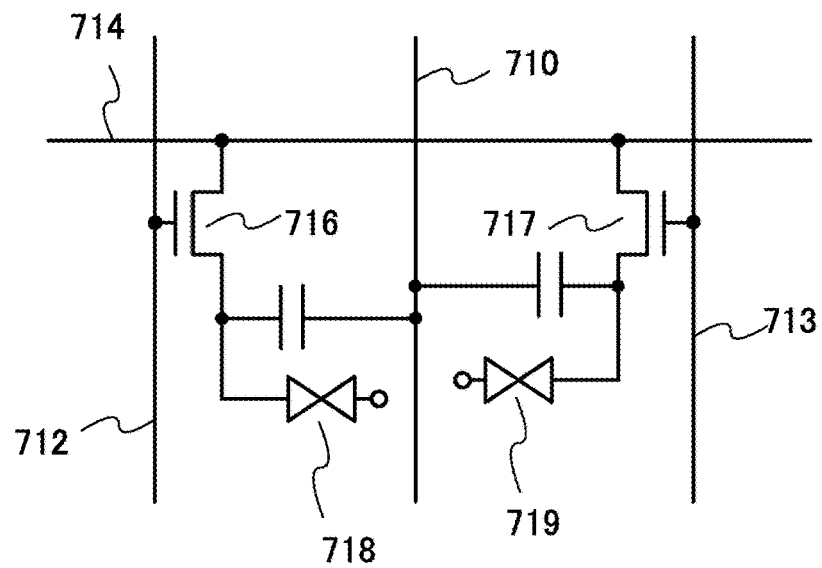
FIGS. 27B and 27C are circuit diagrams of pixels.
Figure 27C:
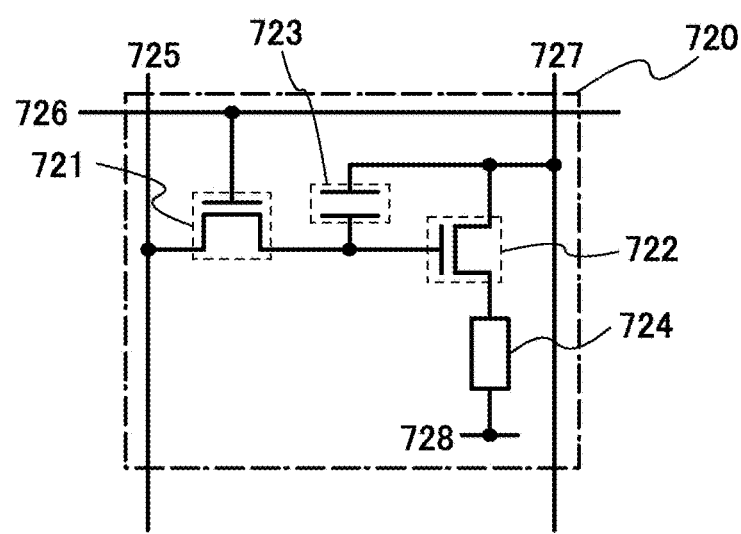

FIG. 27A is a top view of the display device of one embodiment of the present invention. FIG. 27B is a circuit diagram illustrating a pixel circuit that can be used in the case where a liquid crystal element is used in a pixel in the display device of one embodiment of the present invention. FIG. 27C is a circuit diagram illustrating a pixel circuit that can be used in the case where an organic EL element is used in a pixel in the display device of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiment for the pixel portion or the driver circuit in this manner, a highly reliable display device can be provided.

FIG. 27A illustrates an example of a top view of an active matrix display device. A pixel portion 701, a scan line driver circuit 702, a scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the scan line driver circuit 702 and the scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 27A, the scan line driver circuit 702, the scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Display Device]

FIG. 27B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in any of the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that illustrated in FIG. 27B. For example, a switch, a resistor, a capacitor, a transistor, a sensor, a logic circuit, or the like may be added to the pixel illustrated in FIG. 27B.

[Organic EL Display Device]

FIG. 27C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 27C illustrates an applicable example of a pixel circuit. Here, one pixel includes two n-channel transistors. Note that a metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of the other embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage Vth of the driver transistor 722 is applied to the signal line 725.

In the case of performing analog grayscale driving, a voltage greater than or equal to a voltage which is the sum of the forward voltage of the light-emitting element 724 and the threshold voltage Vth of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 27C. For example, a switch, a resistor, a capacitor, a sensor, a transistor, a logic circuit, or the like may be added to the pixel circuit illustrated in FIG. 27C.

In the case where the transistor shown in any of the above embodiments is used for the circuit shown in FIGS. 27A to 27C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by electrical or magnetic action may be included. Note that examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

This embodiment can be combined as appropriate with any of the other embodiments and examples in this specification.

Embodiment 7

In this embodiment, a display module using a semiconductor device of one embodiment of the present invention will be described with reference to FIG. 28.

Figure 28:
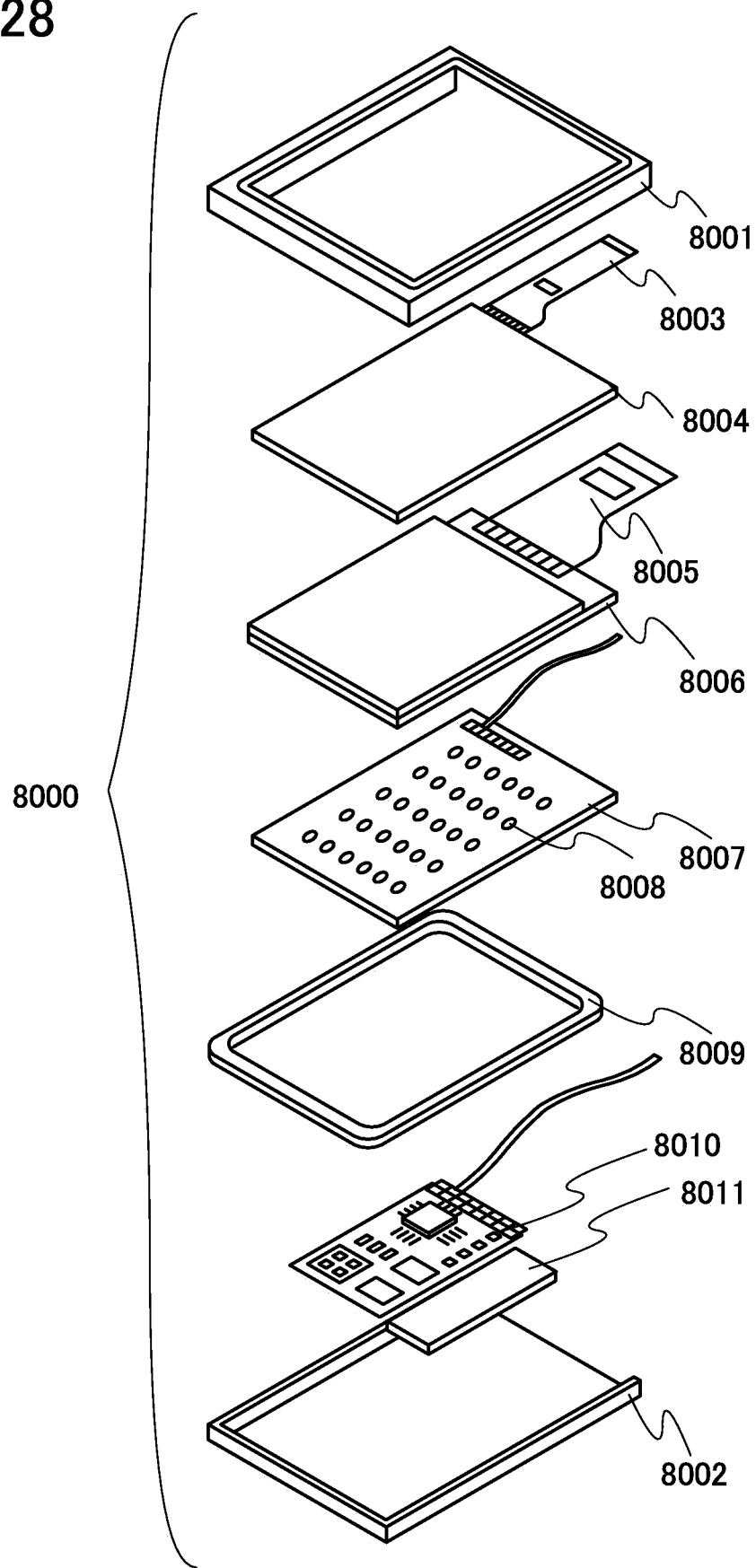
FIG. 28 illustrates a display module.

In a display module 8000 in FIG. 28, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 can function as a radiator plate too.

The printed board 8010 is provided with a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

This embodiment can be combined with any of the other embodiments described in this specification as appropriate.

Embodiment 8

In this embodiment, an example of a circuit including the transistor of one embodiment of the present invention is described with reference to drawings.

[Cross-Sectional Structure]

FIG. 29A is a cross-sectional view of a semiconductor device of one embodiment of the present invention. The semiconductor device illustrated in FIG. 29A includes a transistor 2200 containing a first semiconductor material in a lower portion and a transistor 2100 containing a second semiconductor material in an upper portion. In FIG. 29A, an example is described in which the transistor described in the above embodiment as an example is used as the transistor 2100 containing the second semiconductor material. A cross-sectional view of the transistors in a channel length direction is on the left side of a dashed-dotted line, and a cross-sectional view of the transistors in a channel width direction is on the right side of the dashed-dotted line.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor using an oxide semiconductor has low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 29A illustrates a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of plugs 2203 embedded in the insulating films. An insulating film 2204 covering the transistor 2100, a wiring 2205 over the insulating film 2204, and a wiring 2206 formed by processing a conductive film that is also used for a pair of electrodes of the transistor 2100 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 can also be improved.

The insulating film 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film 2208 (corresponding to the insulating layer 180 in the transistors 101 to 103) having a function of preventing diffusion of hydrogen is preferably formed over the transistor 2100 to cover the transistor 2100 including an oxide semiconductor film. For the blocking film 2208, a material that is similar to that of the insulating film 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the blocking film 2208 covering the transistor 2100, release of oxygen from the oxide semiconductor film included in the transistor 2100 can be prevented and entry of water and hydrogen into the oxide semiconductor film can be prevented.

Note that the transistor 2200 can be a transistor of various types without being limited to a planar type transistor. For example, the transistor 2200 can be a fin-type transistor, a tri-gate transistor, or the like. An example of a cross-sectional view in this case is shown in FIG. 29D. An insulating film 2212 is provided over a semiconductor substrate 2211. The semiconductor substrate 2211 includes a projecting portion with a thin tip (also referred to a fin). Note that an insulating film may be provided over the projecting portion. The insulating film functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulating film 2214 is provided over the projecting portion of the semiconductor substrate 2211, and a gate electrode 2213 is provided over the gate insulating film 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

[Circuit Configuration Example]

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

[CMOS Circuit]

A circuit diagram in FIG. 29B shows a configuration of a so-called CMOS circuit in which the p-channel transistor 2200 and the n-channel transistor 2100 are connected to each other in series and in which gates of them are connected to each other.

[Analog Switch]

A circuit diagram in FIG. 29C shows a configuration in which sources of the transistors 2100 and 2200 are connected to each other and drains of the transistors 2100 and 2200 are connected to each other. With such a configuration, the transistors can function as a so-called analog switch.

[Memory Device Example]

Figure 30A:
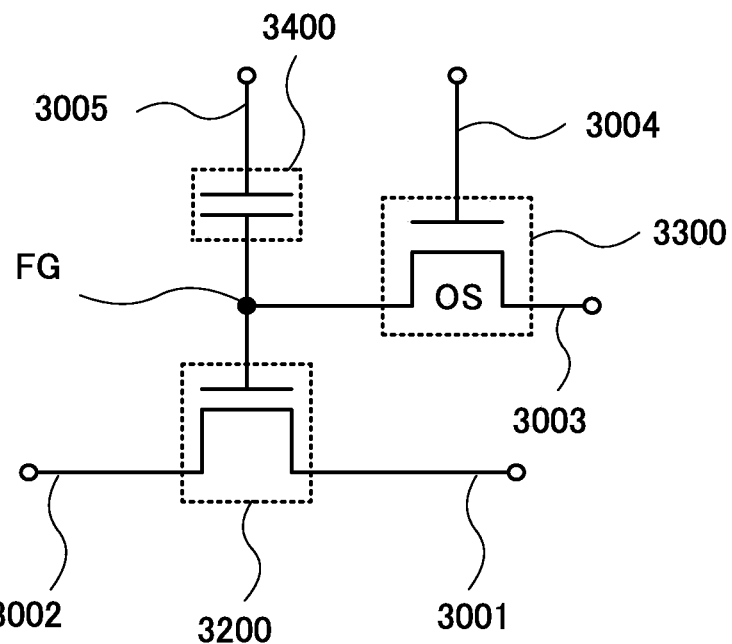
FIGS. 30A to 30C are a cross-sectional view and circuit diagrams of memory devices.
Figure 30B:
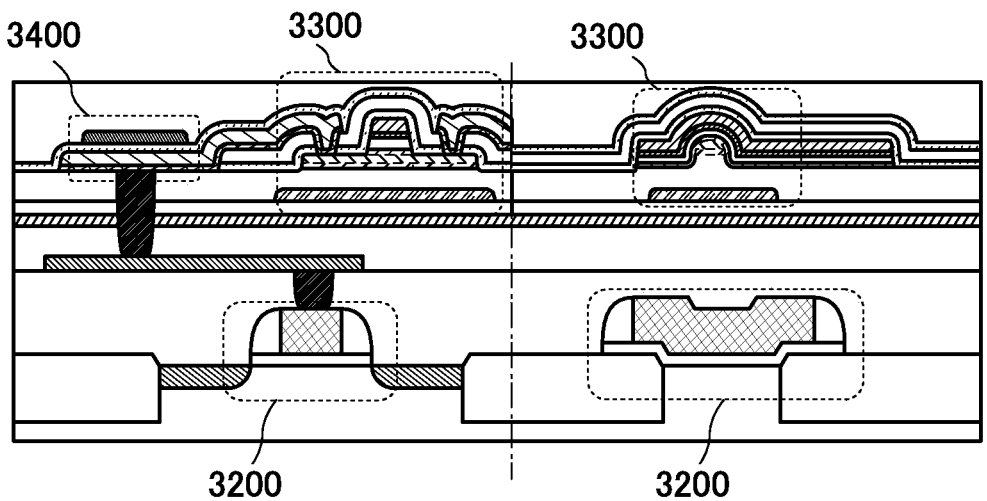
Figure 30C:
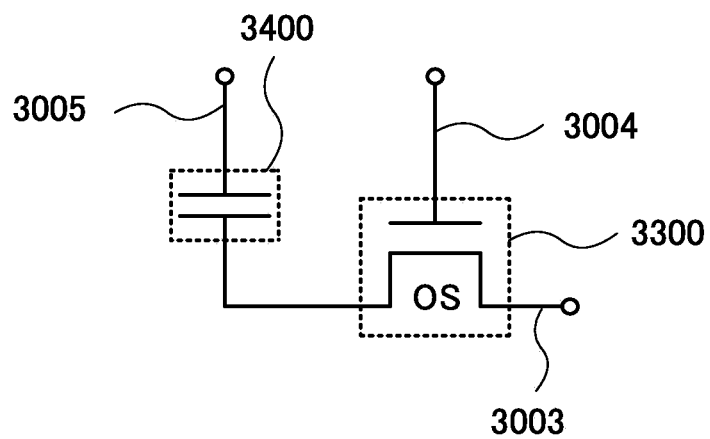

An example of a semiconductor device (memory device) which includes the transistor of one embodiment of the present invention, which can retain stored data even when not powered, and which has an unlimited number of write cycles is shown in FIGS. 30A to 30C.

The semiconductor device illustrated in FIG. 30A includes a transistor 3200 using a first semiconductor material, a transistor 3300 using a second semiconductor material, and a capacitor 3400. Note that any of the above-described transistors can be used as the transistor 3300.

FIG. 30B is a cross-sectional view of the semiconductor device illustrated in FIG. 30A. The semiconductor device in the cross-sectional view has a structure in which the transistor 3300 is provided with a back gate; however, a structure without a back gate may be employed.

The transistor 3300 is a transistor in which a channel is formed in a semiconductor layer including an oxide semiconductor. Since the off-state current of the transistor 3300 is low, stored data can be retained for a long period. In other words, power consumption can be sufficiently reduced because a semiconductor memory device in which refresh operation is unnecessary or the frequency of refresh operation is extremely low can be provided.

In FIG. 30A, a wiring 3001 is electrically connected to a source electrode of the transistor 3200. A wiring 3002 is electrically connected to a drain electrode of the transistor 3200. A wiring 3003 is electrically connected to one of a source electrode and a drain electrode of the transistor 3300. A wiring 3004 is electrically connected to a gate electrode of the transistor 3300. A gate electrode of the transistor 3200 is electrically connected to the other of the source electrode and the drain electrode of the transistor 3300 and one electrode of the capacitor 3400. A wiring 3005 is electrically connected to the other electrode of the capacitor 3400.

The semiconductor device in FIG. 30A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate of the transistor 3200 is retained for a long time.

Next, reading of data is described. An appropriate potential (a reading potential) is supplied to the wiring 3005 while a predetermined potential (a constant potential) is supplied to the wiring 3001, whereby the potential of the wiring 3002 varies depending on the amount of charge retained in the gate of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the wiring 3005 which is needed to turn on the transistor 3200. Thus, the potential of the wiring 3005 is set to a potential $V_0$ which is between $V_{th\_H}$ and $V_{th\_L}$, whereby charge supplied to the gate of the transistor 3200 can be determined. For example, in the case where the high-level charge is supplied to the gate electrode of the transistor 3200 in writing and the potential of the wiring 3005 is $V_0$ ($>V_{th\_H}$), the transistor 3200 is turned on. In the case where the low-level charge is supplied to the gate electrode of the transistor 3200 in writing, even when the potential of the wiring 3005 is $V_0$ ($<V_{th\_L}$), the transistor 3200 remains off. Thus, the data retained in the gate electrode of the transistor 3200 can be read by determining the potential of the wiring 3002.

Note that in the case where memory cells are arrayed to be used, it is necessary that only data of a desired memory cell be able to be read. In the case where such reading is not performed, the wiring 3005 may be supplied with a potential at which the transistor 3200 is turned off regardless of the state of the gate, that is, a potential lower than $V_{th\_H}$. Alternatively, the wiring 3005 may be supplied with a potential at which the transistor 3200 is turned on regardless of the state of the gate, that is, a potential higher than $V_{th\_L}$.

The semiconductor device illustrated in FIG. 30C is different from the semiconductor device illustrated in FIG. 30A in that the transistor 3200 is not provided. Also in this case, writing and retaining operation of data can be performed in a manner similar to the semiconductor device illustrated in FIG. 30A.

Next, reading of data is described. When the transistor 3300 is turned on, the wiring 3003 which is in a floating state and the capacitor 3400 are electrically connected to each other, and the charge is redistributed between the wiring 3003 and the capacitor 3400. As a result, the potential of the wiring 3003 is changed. The amount of change in the potential of the wiring 3003 varies depending on the potential of a first terminal of the capacitor 3400 (or the charge accumulated in the capacitor 3400).

For example, the potential of the wiring 3003 after the charge redistribution is $(C_B \times V_{B0} C \times V)/(C_B + C)$, where V is the potential of the first terminal of the capacitor 3400, C is the capacitance of the capacitor 3400, $C_B$ is the capacitance component of the wiring 3003, and $V_{B0}$ is the potential of the wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the wiring 3003 in the case of retaining the potential $V_1$ ($=(C_B \times V_{B0} C \times V_1)/(C_B + C)$) is higher than the potential of the wiring 3003 in the case of retaining the potential $V_0$ ($=(C_B \times V_{B0} + C \times V_0)/(C_B + C)$).

Then, by comparing the potential of the wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film hardly occurs. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

This embodiment can be combined as appropriate with any of the other embodiments and examples in this specification.

Embodiment 9

In this embodiment, an RF tag that includes the transistor described in the above embodiments or the memory device described in the above embodiment is described with reference to FIG. 31.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 31. FIG. 31 is a block diagram illustrating a configuration example of an RF tag.

Figure 31:
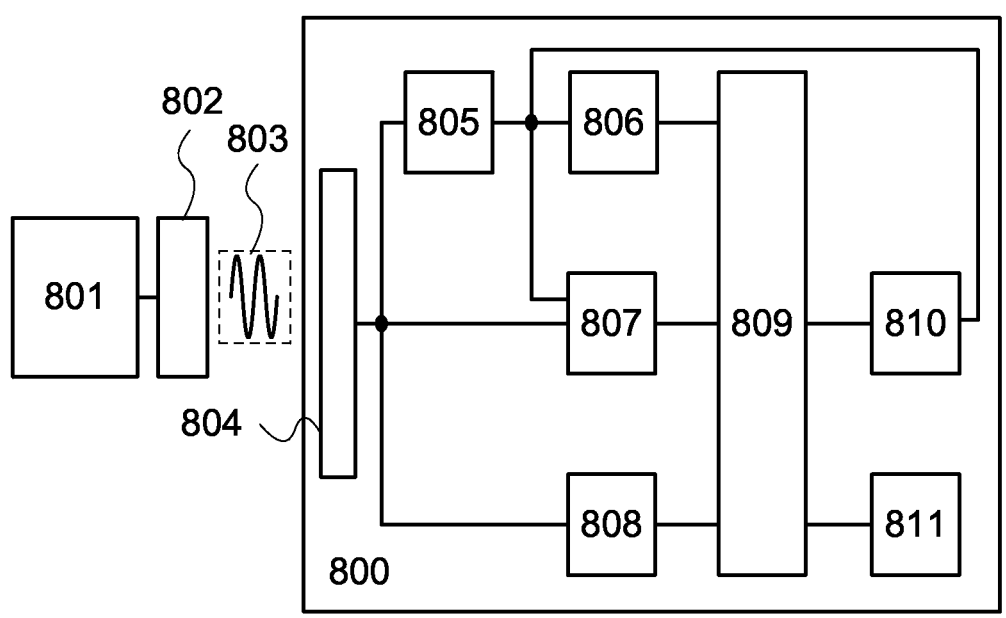
FIG. 31 illustrates a configuration example of an RF tag.

As shown in FIG. 31, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory device described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

This embodiment can be combined as appropriate with any of the other embodiments and examples in this specification.

Embodiment 10

In this embodiment, a CPU that includes the memory device described in the above embodiment is described.

Figure 32:
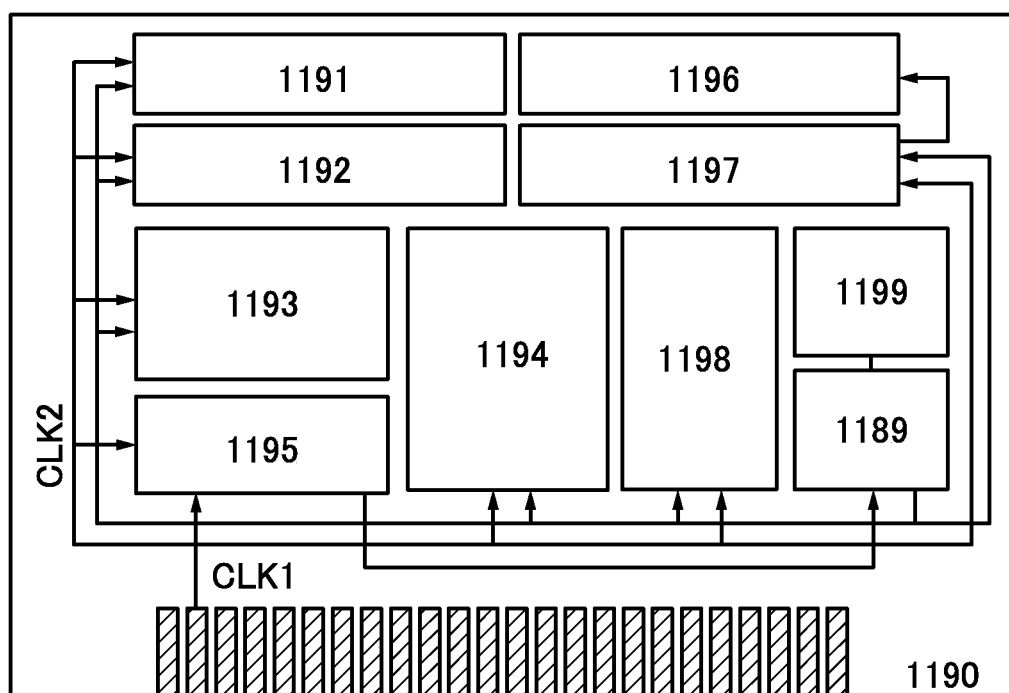
FIG. 32 illustrates a configuration example of a CPU.

FIG. 32 is a block diagram illustrating a configuration example of a CPU at least partly including any of the transistors described in the above embodiments as a component.

The CPU illustrated in FIG. 32 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 32 is just an example in which the configuration is simplified, and an actual CPU may have a variety of configurations depending on the application. For example, the CPU may have the following configuration: a structure including the CPU illustrated in FIG. 32 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 32, a memory cell is provided in the register 1196. For the memory cell of the register 1196, any of the transistors described in the above embodiments can be used.

In the CPU illustrated in FIG. 32, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 33:
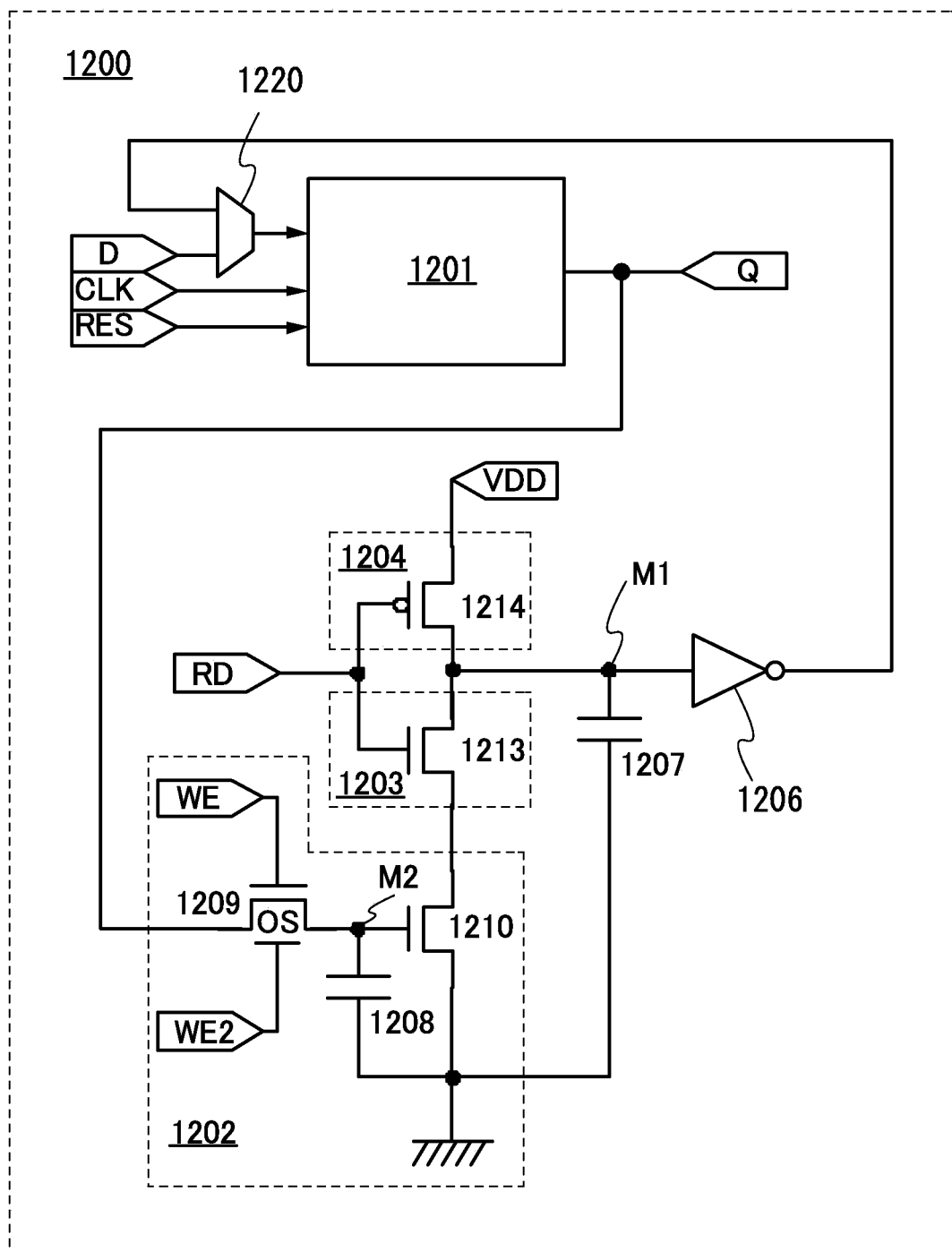
FIG. 33 is a circuit diagram of a memory element.

FIG. 33 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the first gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

Note that the transistor 1209 in FIG. 33 has a structure with a second gate (second gate electrode; back gate). The control signal WE can be input to the first gate and the control signal WE2 can be input to the second gate. The control signal WE2 is a signal having a constant potential. As the constant potential, for example, a ground potential GND or a potential lower than a source potential of the transistor 1209 is selected. The control signal WE2 is a potential signal for controlling the threshold voltage of the transistor 1209, and/cut of the transistor 1209 can be further reduced. The control signal WE2 may be a signal having the same potential as that of the control signal WE. Note that as the transistor 1209, a transistor without a second gate may be used.

A signal corresponding to data retained in the circuit 1201 is input to the other of the source and the drain of the transistor 1209. FIG. 33 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 33, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 33, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 33, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

This embodiment can be combined with any of the other embodiments described in this specification as appropriate.

Embodiment 11

In this embodiment, modification examples of the transistor of one embodiment of the present invention will be described with reference to FIGS. 34A to 34F, FIGS. 35A to 35F, FIGS. 36A to 36E, FIGS. 37A to 37C, and FIGS. 38A to 38D.

Transistors illustrated in FIGS. 34A to 34F each include an oxide semiconductor layer 755 over an insulating layer 753 over a substrate 751, an insulating layer 757 in contact with the oxide semiconductor layer 755, and a conductive layer 759 in contract with the insulating layer 757 and overlapping with the oxide semiconductor layer 755. The insulating layer 757 functions a gate insulating layer, and the conductive layer 759 functions as a gate electrode layer.

The transistors each include a nitride insulating layer 765 that is in contact with the oxide semiconductor layer 755 and an insulating layer 767 that is in contact with the nitride insulating layer 765. Conductive layers 768 and 769 that are in contact with the oxide semiconductor layer 755 through openings in the nitride insulating layer 765 and the insulating layer 767 are also included. Note that the conductive layers 768 and 769 function as a source electrode layer and a drain electrode layer.

Figure 34A:
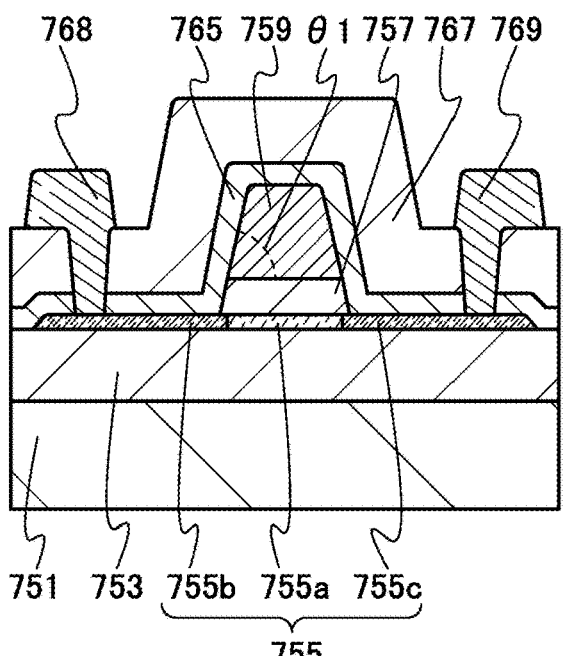
FIGS. 34A to 34F illustrate structures of a transistor.

In the transistor illustrated in FIG. 34A, the oxide semiconductor layer 755 includes a channel region 755a formed in a region overlapping with the conductive layer 759 and low-resistance regions 755b and 755c between which the channel region 755a is provided and which contain an impurity element. The conductive layers 768 and 769 are in contact with the low-resistance regions 755b and 755c, respectively. Note that the conductive layers 768 and 769 function as wirings.

Figure 34B:
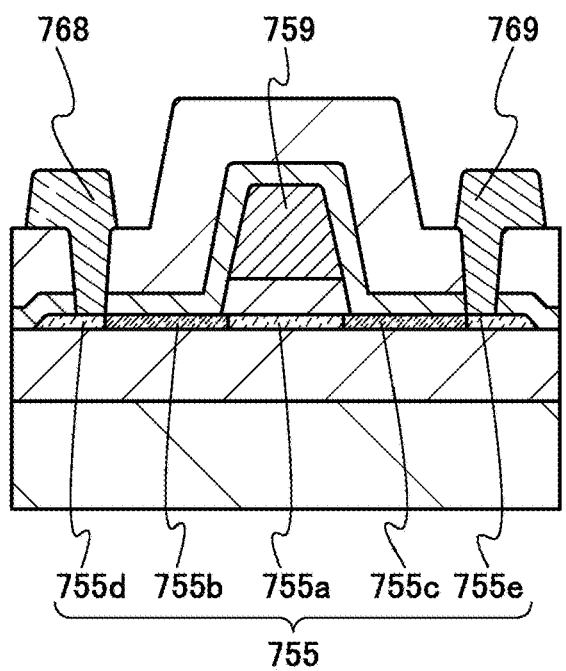

Alternatively, as in the transistor illustrated in FIG. 34B, the oxide semiconductor layer 755 may have a structure in which an impurity element is not added to regions 755d and 755e in contact with the conductive layers 768 and 769. In this case, regions containing an impurity element, i.e., the low-resistance regions 755b and 755c are provided. The low-resistance region (755b or 755c) is provided between the channel region 755a and the region (755d or 755e) in contact with the conductive film (768 or 769). The regions 755d and 755e have conductivity when voltage is applied to the conductive layers 768 and 769; thus, the regions 755d and 755e function as a source region and a drain region.

Note that the transistor illustrated in FIG. 34B can be formed in such a manner that the conductive layers 768 and 769 are formed and then an impurity element is added to the oxide semiconductor layer using the conductive layer 759 and the conductive layers 768 and 769 as masks.

An end portion of the conductive layer 759 may have a tapered shape. That is, an angle θ1 formed between a surface where the insulating layer 757 and the conductive layer 759 are in contact with each other and a side surface of the conductive layer 759 may be less than 90°, greater than or equal to 30° and less than or equal to 85°, greater than or equal to 45° and less than or equal to 85°, or greater than or equal to 60° and less than or equal to 85°. When the angle θ1 is less than 90°, greater than or equal to 30° and less than or equal to 85°, greater than or equal to 45° and less than or equal to 85°, or greater than or equal to 60° and less than or equal to 85°, the coverage of the side surfaces of the insulating layer 757 and the conductive layer 759 with the nitride insulating layer 765 can be improved.

Next, modification examples of the low-resistance regions 755b and 755c are described. FIGS. 34C to 34F are each an enlarged view of the vicinity of the oxide semiconductor layer 755 illustrated in FIG. 34A. The channel length L indicates a distance between a pair of low-resistance regions.

Figure 34C:
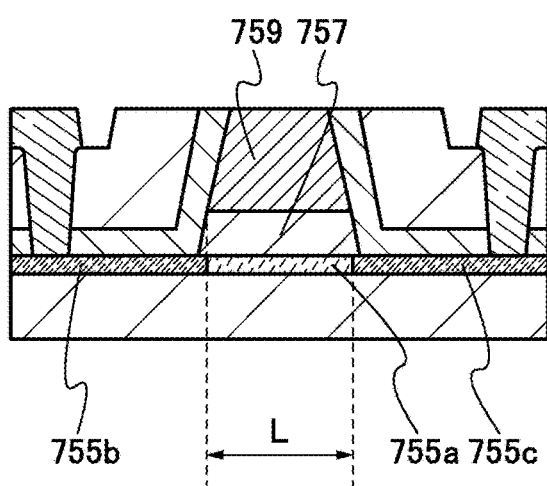

As illustrated in FIG. 34C, in a cross-sectional view in the channel length direction, the boundaries between the channel region 755a and the low-resistance regions 755b and 755c are aligned or substantially aligned with the end portions of the conductive layer 759 with the insulating layer 757 provided therebetween. That is, the boundaries between the channel region 755a and the low-resistance regions 755b and 755c are aligned or substantially aligned with the end portions of the conductive layer 759, when seen from the above.

Figure 34D:
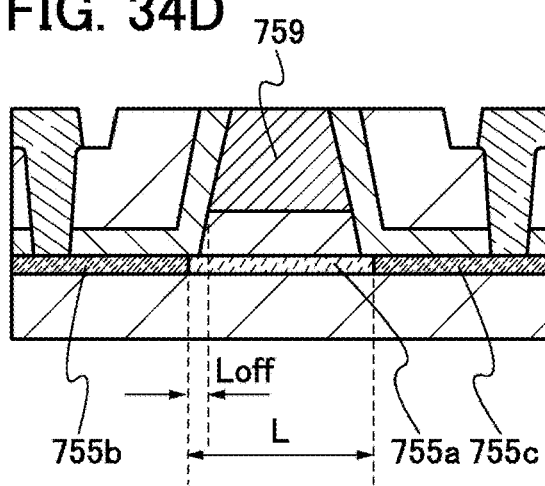

Alternatively, as illustrated in FIG. 34D, in a cross-sectional view in the channel length direction, the channel region 755a has a region that does not overlap with the conductive layer 759. The region functions as an offset region. The length of the offset region in the channel length direction is referred to as $L_{off}$. Note that in the case where a plurality of offset regions are provided, $L_{off}$ indicates the length of one offset region. $L_{off}$ is included in the channel length L. Note that $L_{off}$ is smaller than 20%, smaller than 10%, smaller than 5%, or smaller than 2% of the channel length L.

Figure 34E:
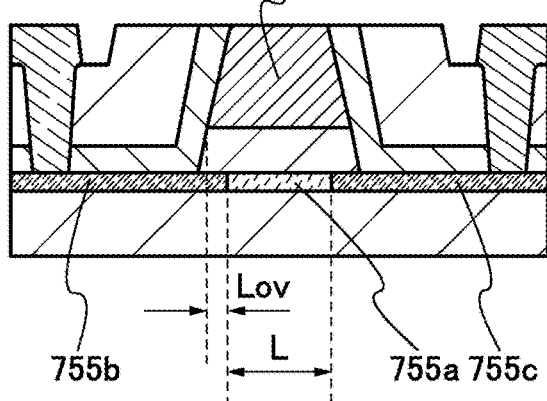

Alternatively, as illustrated in FIG. 34E, in a cross-sectional view in the channel length direction, the low-resistance regions 755b and 755c each have a region overlapping with the conductive layer 759 with the insulating layer 757 provided therebetween. This region functions as an overlap region. The overlap region in the channel length direction is referred to as $L_{ov}$. $L_{ov}$ is smaller than 20%, smaller than 10%, smaller than 5%, or smaller than 2% of the channel length L.

Figure 34F:
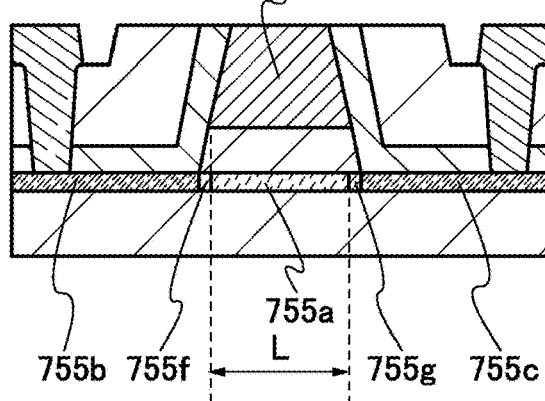

Alternatively, as illustrated in FIG. 34F, in a cross-sectional view in the channel length direction, a low-resistance region 755f between the channel region 755a and the low-resistance region 755b, and a low-resistance region 755g between the channel region 755a and the low-resistance region 755c are provided. The low-resistance regions 755f and 755g have lower impurity element concentrations and higher resistivity than the low-resistance regions 755b and 755c. Although the low-resistance regions 755f and 755g overlap with the insulating layer 757 here, they may overlap with the insulating layer 757 and the conductive layer 759.

Note that in FIGS. 34C to 34F, the transistor illustrated in FIG. 34A is described; however, the transistor illustrated in FIG. 34B can employ any of the structures in FIGS. 34C to 34F as appropriate.

Figure 35A:
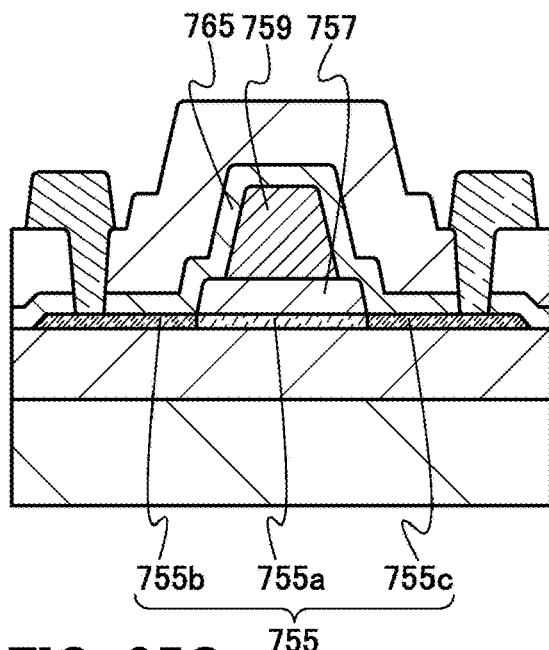
FIGS. 35A to 35F illustrate structures of a transistor.

In the transistor illustrated in FIG. 35A, an end portion of the insulating layer 757 is positioned on an outer side than the end portion of the conductive layer 759. In other words, the insulating layer 757 has such a shape that the end portion extends beyond the end portion of the conductive layer 759. The nitride insulating layer 765 can be distanced from the channel region 755a; thus, nitrogen, hydrogen, and the like contained in the nitride insulating layer 765 can be prevented from entering the channel region 755a.

Figure 35B:
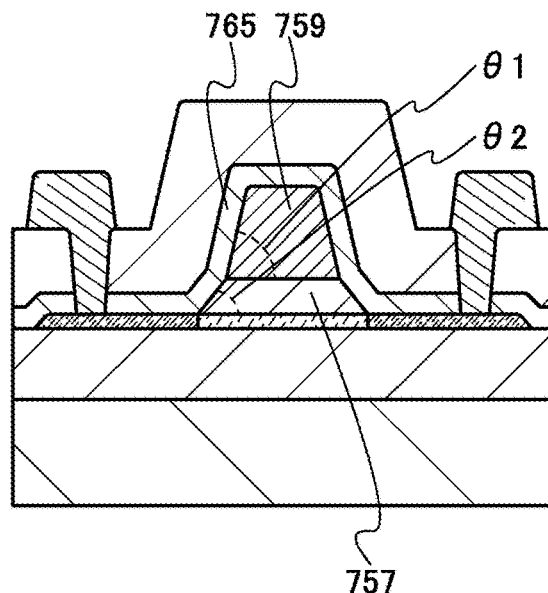

In the transistor illustrated in FIG. 35B, the insulating layer 757 and the conductive layer 759 each have a tapered shape, and the angles of the tapered shapes are different from each other. In other words, the angle θ1 formed between a surface where the insulating layer 757 and the conductive layer 759 are in contact with each other and a side surface of the conductive layer 759 is different from an angle θ2 formed between a surface where the oxide semiconductor layer 755 and the insulating layer 757 are in contact with each other and a side surface of the insulating layer 757. The angle θ2 may be less than 90°, greater than or equal to 30° and less than or equal to 85°, or greater than or equal to 45° and less than or equal to 70°. For example, when the angle θ2 is smaller than the angle θ1, the coverage with the nitride insulating layer 765 is improved. In contrast, when the angle θ2 is larger than the angle θ1, the nitride insulating layer 765 can be distanced from the channel region 755a; thus, nitrogen, hydrogen, and the like contained in the nitride insulating layer 765 can be prevented from entering the channel region 755a.

Next, modification examples of the low-resistance regions 755b and 755c are described with reference to FIGS. 35C to 35F. FIGS. 35C to 35F are each an enlarged view of the vicinity of the oxide semiconductor layer 755 illustrated in FIG. 35A.

Figure 35C:
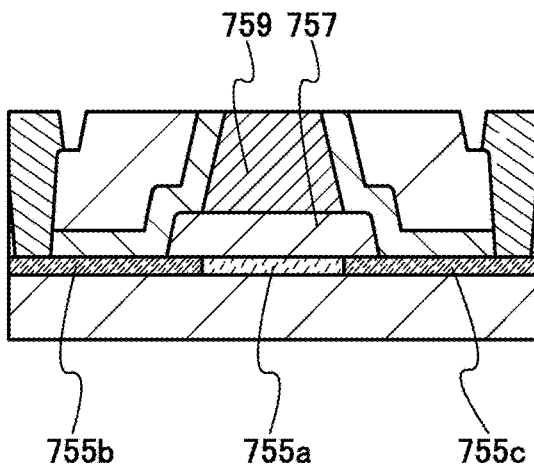

As illustrated in FIG. 35C, in a cross-sectional view in the channel length direction, the boundaries between the channel region 755a and the low-resistance regions 755b and 755c are aligned or substantially aligned with the end portions of the conductive layer 759 with the insulating layer 757 provided therebetween. That is, the boundaries between the channel region 755a and the low-resistance regions 755b and 755c are aligned or substantially aligned with the end portions of the conductive layer 759, when seen from the above.

Figure 35D:
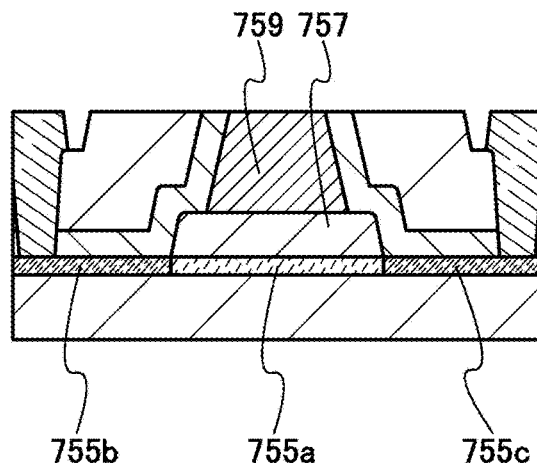

Alternatively, as illustrated in FIG. 35D, in a cross-sectional view in the channel length direction, the channel region 755a has a region that does not overlap with the conductive layer 759. The region functions as an offset region. That is, when seen from the above, the end portions of the low-resistance regions 755b and 755c are aligned or substantially aligned with the end portions of the insulating layer 757 and do not overlap with the end portions of the conductive layer 759.

Figure 35E:
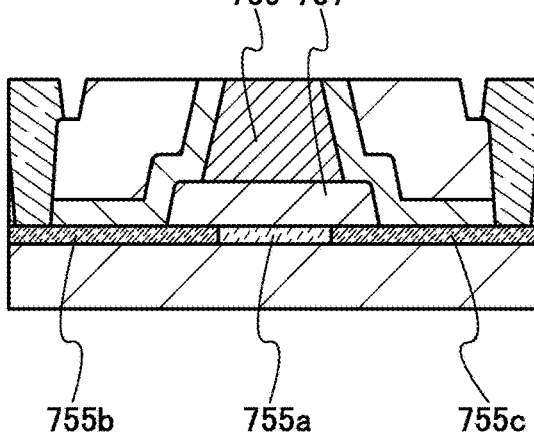

Alternatively, as illustrated in FIG. 35E, in a cross-sectional view in the channel length direction, the low-resistance regions 755b and 755c each have a region overlapping with the conductive layer 759 with the insulating layer 757 provided therebetween. The region is referred to as an overlap region. That is, when seen from the above, the end portions of the low-resistance regions 755b and 755c overlap with the conductive layer 759.

Figure 35F:
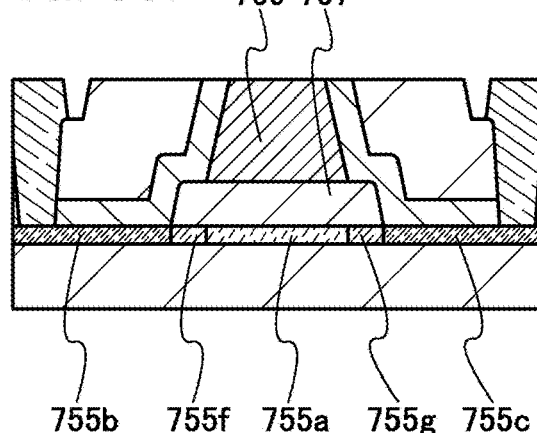

Alternatively, as illustrated in FIG. 35F, in a cross-sectional view in the channel length direction, the low-resistance region 755f between the channel region 755a and the low-resistance region 755b, and the low-resistance region 755g between the channel region 755a and the low-resistance region 755c are provided. The low-resistance regions 755f and 755g have lower impurity element concentrations and higher resistivity than the low-resistance regions 755b and 755c. Although the low-resistance regions 755f and 755g overlap with the insulating layer 757 here, they may overlap with the insulating layer 757 and the conductive layer 759.

Note that in FIGS. 35C to 35F, the transistor illustrated in FIG. 35A is described; however, the transistor illustrated in FIG. 35B can employ any of the structures in FIGS. 35C to 35F as appropriate.

Figure 36A:
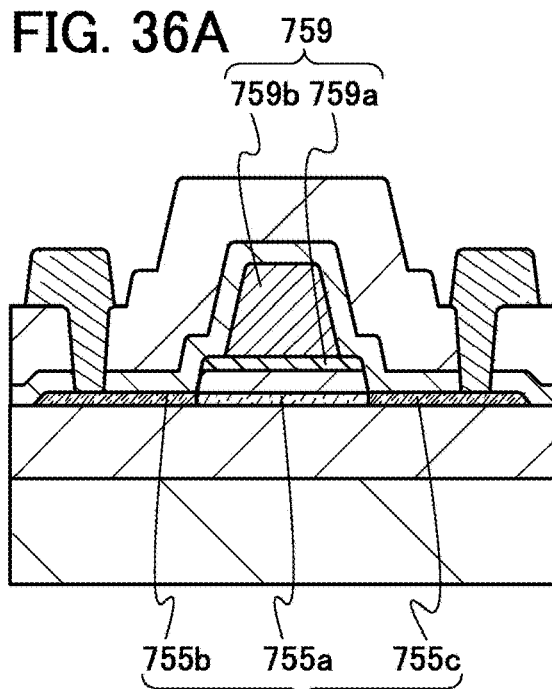
FIGS. 36A to 36E illustrate structures of a transistor.

In the transistor illustrated in FIG. 36A, the conductive layer 759 has a stacked-layer structure including a conductive layer 759a in contact with the insulating layer 757 and a conductive layer 759b in contact with the conductive layer 759a. An end portion of the conductive layer 759a is positioned on an outer side than an end portion of the conductive layer 759b. In other words, the conductive layer 759a has such a shape that the end portion extends beyond the end portion of the conductive layer 759b.

Next, modification examples of the low-resistance regions 755b and 755c are described. FIGS. 36B to 36E and FIGS. 37A and 37B are each an enlarged view of the vicinity of the oxide semiconductor layer 755 illustrated in FIG. 36A.

Figure 36B:
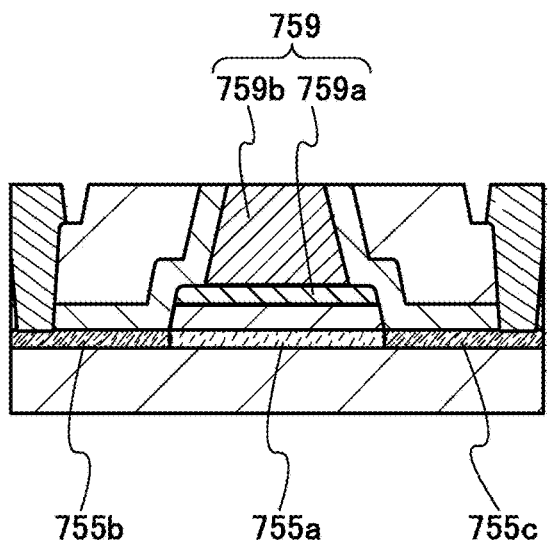

As illustrated in FIG. 36B, in a cross-sectional view in the channel length direction, the boundaries between the channel region 755a and the low-resistance regions 755b and 755c are aligned or substantially aligned with the end portions of the conductive layer 759a included in the conductive layer 759 with the insulating layer 757 provided therebetween. That is, the boundaries between the channel region 755a and the low-resistance regions 755b and 755c are aligned or substantially aligned with the end portions of the conductive layer 759, when seen from the above.

Figure 36C:
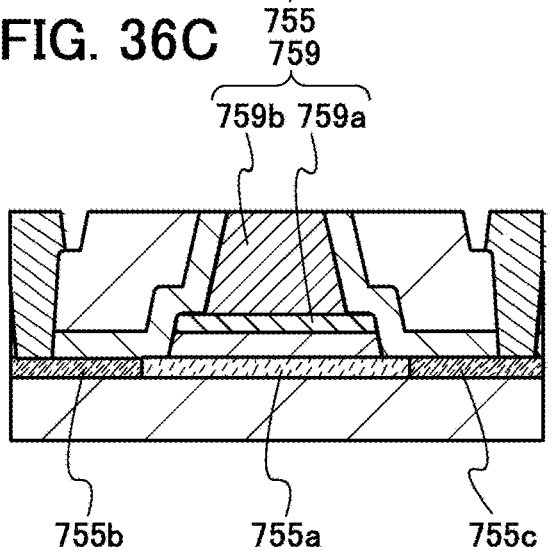

Alternatively, as illustrated in FIG. 36C, in a cross-sectional view in the channel length direction, the channel region 755a has a region that does not overlap with the conductive layer 759. The region functions as an offset region. That is, when seen from the above, the end portions of the low-resistance regions 755b and 755c do not overlap with the end portions of the conductive layer 759.

Figure 36D:
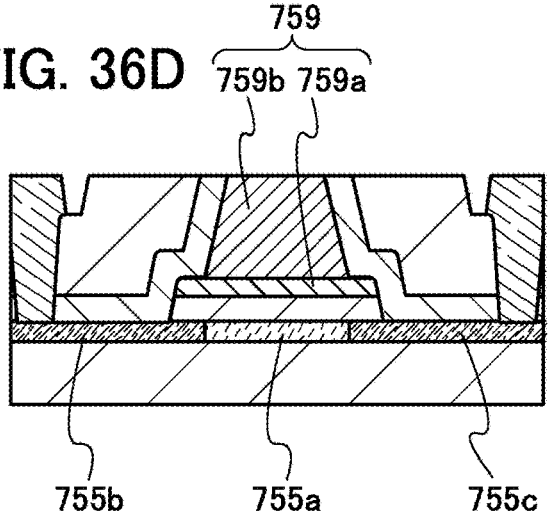

As illustrated in FIG. 36D, in a cross-sectional view in the channel length direction, the low-resistance regions 755b and 755c each have a region overlapping with the conductive layer 759, specifically the conductive layer 759a. The region is referred to as an overlap region. That is, when seen from the above, the end portions of the low-resistance regions 755b and 755c overlap with the conductive layer 759a.

Figure 36E:
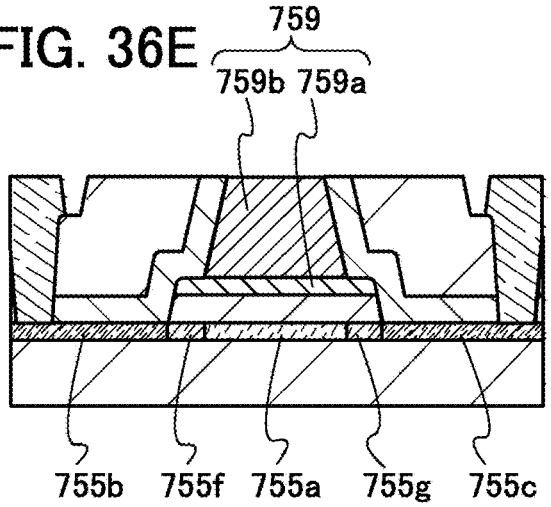

Alternatively, as illustrated in FIG. 36E, in a cross-sectional view in the channel length direction, the low-resistance region 755f between the channel region 755a and the low-resistance region 755b, and the low-resistance region 755g between the channel region 755a and the low-resistance region 755c are provided. An impurity element is added to the low-resistance regions 755f and 755g through the conductive layer 759a; thus, the low-resistance regions 755f and 755g have lower concentrations of an impurity element and higher resistivity than the low-resistance regions 755b and 755c. Although the low-resistance regions 755f and 755g overlap with the conductive layer 759a here, they may overlap with the conductive layer 759a and the conductive layer 759b.

Figure 37A:
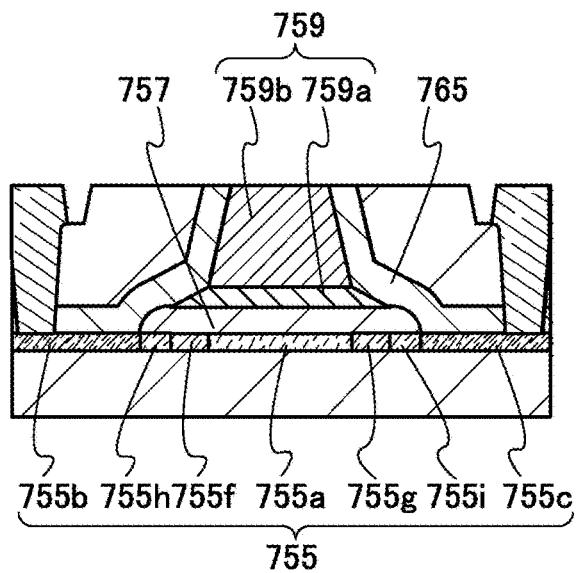
FIGS. 37A to 37C illustrate structures of a transistor.

As illustrated in FIG. 37A, in the cross-sectional view in the channel length direction, the end portion of the conductive layer 759a may be positioned on an outer side than the end portion of the conductive layer 759b and the conductive layer 759a may have a tapered shape. That is, an angle between a surface where the insulating layer 757 and the conductive layer 759a are in contact with each other and a side surface of the conductive layer 759a may be less than 90°, greater than or equal to 5° and less than or equal to 45°, or greater than or equal to 5° and less than or equal to 30°.

Furthermore, the end portion of the insulating layer 757 may be positioned on an outer side than the end portion of the conductive layer 759a.

Furthermore, a side surface of the insulating layer 757 may be curved.

The insulating layer 757 may have a tapered shape. That is, an angle formed between a surface where the oxide semiconductor layer 755 and the insulating layer 757 are in contact with each other and a side surface of the insulating layer 757 may be less than 90°, preferably greater than or equal to 30° and less than 90°.

The oxide semiconductor layer 755 illustrated in FIG. 37A includes the channel region 755a, the low-resistance regions 755f and 755g between which the channel region 755a is provided, low-resistance regions 755h and 755i between which the low-resistance regions 755f and 755g are provided, and the low-resistance regions 755b and 755c between which the low-resistance regions 755h and 755i are provided. An impurity element is added to the low-resistance regions 755f, 755g, 755h, and 755i through the insulating layer 757 and the conductive layer 759a; thus, the low-resistance regions 755f, 755g, 755h, and 755i have lower concentrations of an impurity element and higher resistivity than the low-resistance regions 755b and 755c.

Figure 37B:
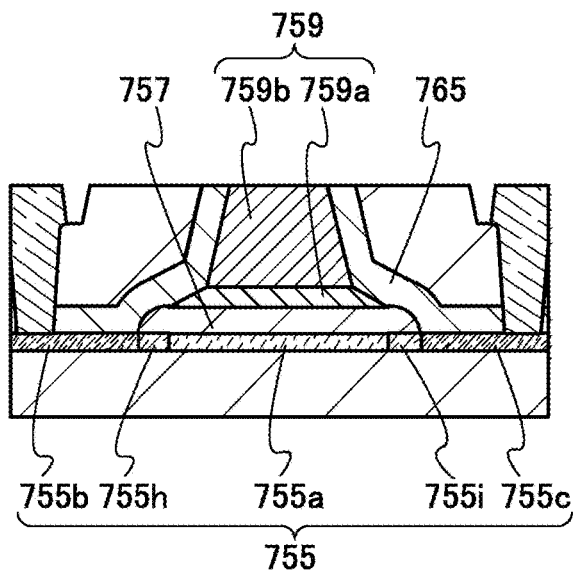

The oxide semiconductor layer 755 illustrated in FIG. 37B includes the channel region 755a, the low-resistance regions 755h and 755i between which the channel region 755a is provided, and the low-resistance regions 755b and 755c between which the low-resistance regions 755h and 755i are provided. An impurity element is added to the low-resistance regions 755h and 755i through the insulating layer 757; thus, the low-resistance regions 755h and 755i have lower concentrations of an impurity element and higher resistivity than the low-resistance regions 755b and 755c.

Note that in the channel length direction, the channel region 755a overlaps with the conductive layer 759b. The low-resistance regions 755f and 755g overlap with the conductive layer 759a projecting outside the conductive layer 759b. The low-resistance regions 755h and 755i overlap with the insulating layer 757 projecting outside the conductive layer 759a. The low-resistance regions 755b and 755c are positioned on outer sides than the insulating layer 757.

When the oxide semiconductor layer 755 includes the low-resistance regions 755f, 755g, 755h, and 755i having lower impurity element concentrations and higher resistivity than the low-resistance regions 755b and 755c as illustrated in FIG. 36E and FIGS. 37A and 37B, the electric field of the drain region can be relaxed. Thus, a shift of the threshold voltage of the transistor, can be prevented.

Figure 37C:
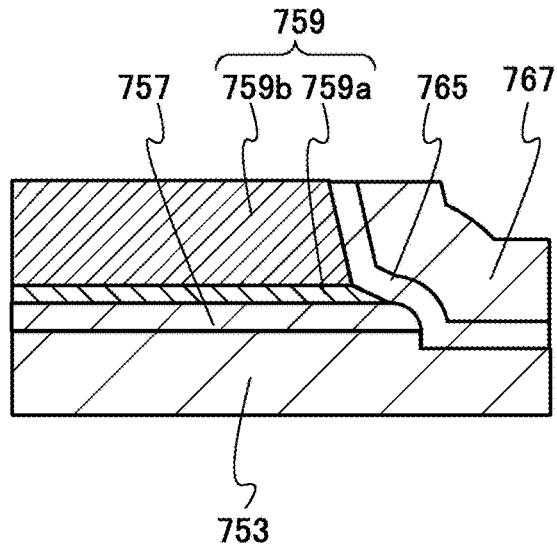

FIG. 37C is an enlarged view of the vicinity of the end portion of the conductive layer 759 in the channel width direction of the transistors illustrated in FIGS. 37A and 37B.

Figure 38A:
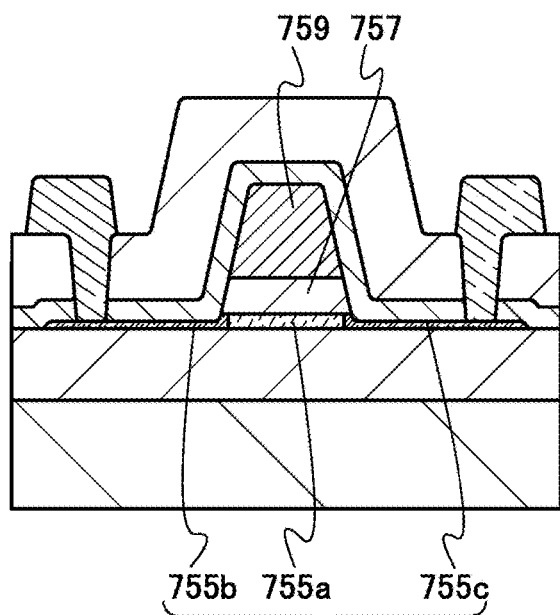
FIGS. 38A to 38D illustrate structures of a transistor.

The transistor shown in FIG. 38A includes the oxide semiconductor layer 755 including the channel region 755a and the low-resistance regions 755b and 755c. The low-resistance regions 755b and 755c each include a region with a thickness smaller than that of the channel region 755a. Typically, the low-resistance regions 755b and 755c each include a region with a thickness smaller than that of the channel region 755a by 0.1 nm or more and 5 nm or less.

Figure 38B:
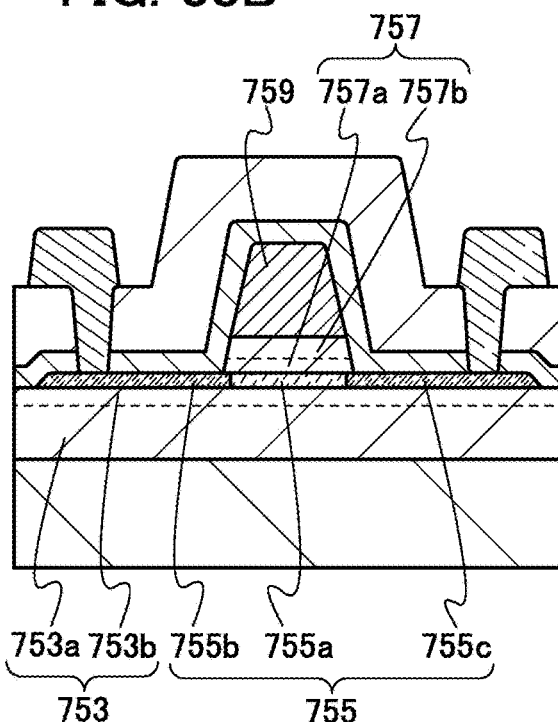

In the transistor shown in FIG. 38B, at least one of the insulating layers 753 and 757, which are in contact with the oxide semiconductor layer 755, has a multilayer structure. For example, the insulating layer 753 includes an insulating layer 753a and an insulating layer 753b in contact with the insulating layer 753a and the oxide semiconductor layer 755. For example, the insulating layer 757 includes an insulating layer 757a in contact with the oxide semiconductor layer 755 and an insulating layer 757b in contact with the insulating layer 757a.

The insulating layers 753b and 757a can be formed using an oxide insulating film with a low density of states of a nitrogen oxide between valence band maximum ($E_{v\_os}$) and a conduction band minimum ($E_{c\_os}$). As the oxide insulating film with a low density of states of a nitrogen oxide between $E_{v\_os}$ and $E_{c\_os}$, a silicon oxynitride film that releases less nitrogen oxide, an aluminum oxynitride film that releases less nitrogen oxide, or the like can be used. The average thickness of each of the insulating layers 753b and 757a is greater than or equal to 0.1 nm and less than or equal to 50 nm, or greater than or equal to 0.5 nm and less than or equal to 10 nm.

Note that a silicon oxynitride film that releases less nitrogen oxide is a film of which the amount of released ammonia is larger than the amount of released nitrogen oxide in thermal desorption spectroscopy (TDS) analysis; the amount of released ammonia is typically greater than or equal to $1\times10^{18}$ molecules/cm$^3$ and less than or equal to $5\times10^{19}$ molecules/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

The insulating layers 753a and 757b can be formed using an oxide insulating film that releases oxygen by being heated. Note that the average thickness of each of the insulating layers 753a and 757b is greater than or equal to 5 nm and less than or equal to 1000 nm, or greater than or equal to 10 nm and less than or equal to 500 nm.

Typical examples of the oxide insulating film that releases oxygen by being heated include a silicon oxynitride film and an aluminum oxynitride film.

Nitrogen oxide (NO$_x$; x is greater than or equal to 0 and less than or equal to 2, preferably greater than or equal to 1 and less than or equal to 2), typically NO$_2$ or NO, forms states in the insulating layer 753, the insulating layer 757, and the like. The states are positioned in the energy gap of the oxide semiconductor layer 755. Therefore, when nitrogen oxide is diffused to the interfaces between the insulating layers 753 and 757 and the oxide semiconductor layer 755, electrons might be trapped by the states on the insulating layer 753 side and the insulating layer 757 side. As a result, the trapped electrons remain in the vicinity of the interfaces between the insulating layers 753 and 757 and the oxide semiconductor layer 755; thus, the threshold voltage of the transistor is shifted in the positive direction.

Nitrogen oxide reacts with ammonia and oxygen in heat treatment. Since nitrogen oxide contained in the insulating layers 753a and 757b reacts with ammonia contained in the insulating layers 753a and 757b in heat treatment, nitrogen oxide contained in the insulating layers 753a and 757b is reduced. Therefore, electrons are hardly trapped at the interfaces between the insulating layers 753 and 757 and the oxide semiconductor layer 755.

By using the oxide insulating film with a low density of states of an nitrogen oxide between $E_{v\_os}$ and $E_{c\_os}$ as the insulating layers 753b and 757a, a shift in the threshold voltage of the transistor can be reduced, which leads to a smaller change in electrical characteristics of the transistor.

Note that in an ESR spectrum at 100 K or lower of the insulating layers 753b and 757a, by heat treatment in a manufacturing process of the transistor, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen dioxide (NO$_x$; x is greater than or equal to 0 and smaller than or equal to 2, preferably greater than or equal to 1 and smaller than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating layer is.

After heat treatment in a manufacturing process of the transistor, typically heat treatment at a temperature higher than or equal to 300° C. and lower than the strain point of the substrate, the oxide insulating layer containing nitrogen and having a small amount of defects has a nitrogen concentration of $6\times10^{20}$ atoms/cm$^3$ or lower by secondary ion mass spectrometry (SIMS).

By forming an oxide insulating layer containing nitrogen and having a small amount of defects by a plasma CVD method using silane and dinitrogen monoxide at a substrate temperature higher than or equal to 220° C., higher than or equal to 280° C., or higher than or equal to 350° C., a dense and hard film can be formed.

Figure 38C:
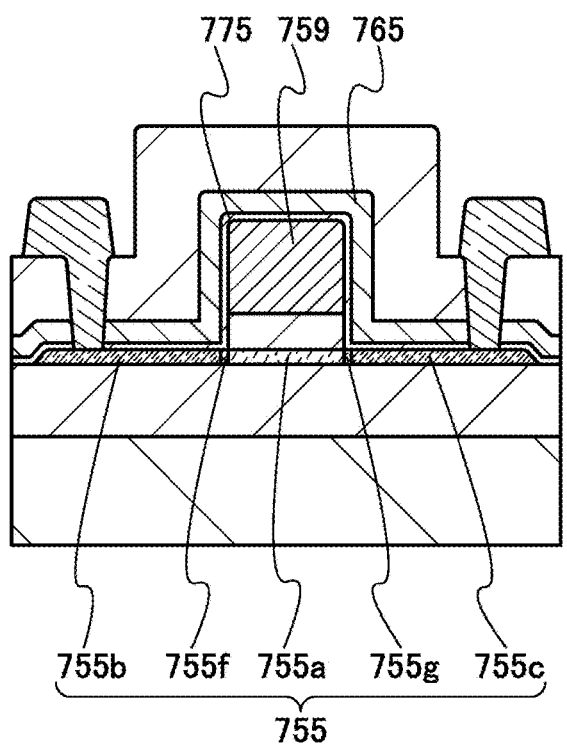

The transistor shown in FIG. 38C includes an insulating layer 775 between the nitride insulating layer 765 and the oxide semiconductor layer 755, the insulating layer 757, and the conductive layer 759. The insulating layer 775 can be formed using the oxide insulating layer containing nitrogen and having a small amount of defects for the insulating layers 753b and 757a shown in FIG. 38B.

Alternatively, in a cross-sectional view in the channel length direction, the low-resistance region 755f between the channel region 755a and the low-resistance region 755b, and the low-resistance region 755g between the channel region 755a and the low-resistance region 755c are provided. The low-resistance regions 755f and 755g have lower impurity element concentrations and higher resistivity than the low-resistance regions 755b and 755c. Although the low-resistance regions 755f and 755g overlap with the insulating layer 775 that is in contact with side surfaces of the insulating layer 757 and the conductive layer 759. Note that the low-resistance regions 755f and 755g may overlap with the insulating layer 757 and the conductive layer 759.

Figure 38D:
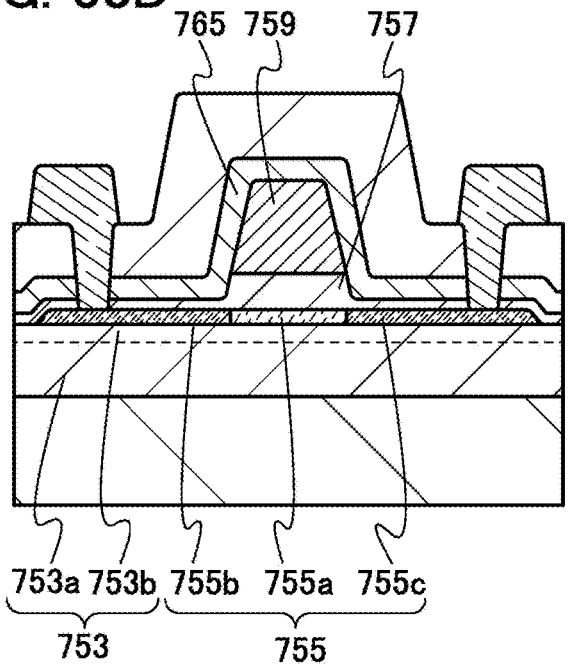

Note that in the transistor illustrated in FIG. 38D, the insulating layer 757 is in contact with the channel region 755a of the oxide semiconductor layer 755 and is in contact with the low-resistance regions 755b and 755c. Furthermore, in the insulating layer 757, the thicknesses of regions in contact with the low-resistance regions 755b and 755c are smaller than the thickness of a region in contact with the channel region 755a; the average thickness of the insulating layer 757 is typically greater than or equal to 0.1 nm and less than or equal to 50 nm, or greater than or equal to 0.5 nm and less than or equal to 10 nm. As a result, the impurity element can be added to the oxide semiconductor layer 755 through the insulating layer 757, and in addition, hydrogen contained in the nitride insulating layer 765 can be moved to the oxide semiconductor layer 755 through the insulating layer 757. Thus, the low-resistance regions 755b and 755c can be formed.

Furthermore, the insulating layer 753 has a multilayer structure of the insulating layers 753a and 753b; for example, the insulating layer 753a is formed using an oxide insulating layer that releases oxygen by being heated, and the insulating layer 753b is formed using an oxide insulating layer containing nitrogen and having a small amount of defects. Furthermore, the insulating layer 757 is formed using an oxide insulating layer containing nitrogen and having a small amount of defects. That is, the oxide semiconductor layer 755 can be covered with the oxide insulating layer containing nitrogen and having a small amount of defects. As a result, the carrier trap at the interfaces between the oxide semiconductor layer 755 and the insulating layers 753b and 757a can be reduced while oxygen contained in the insulating layer 753a is moved to the oxide semiconductor layer 755 by heat treatment to reduce oxygen vacancies contained in the channel region 755a of the oxide semiconductor layer 755. Consequently, a shift in the threshold voltage of the transistor can be reduced, which leads to a smaller variation in electrical characteristics of the transistor.

This embodiment can be combined as appropriate with any of the other embodiments and examples in this specification.

Embodiment 12

A band structure of the transistor of one embodiment of the present invention in an arbitrary cross section will be described.

Figure 39A:
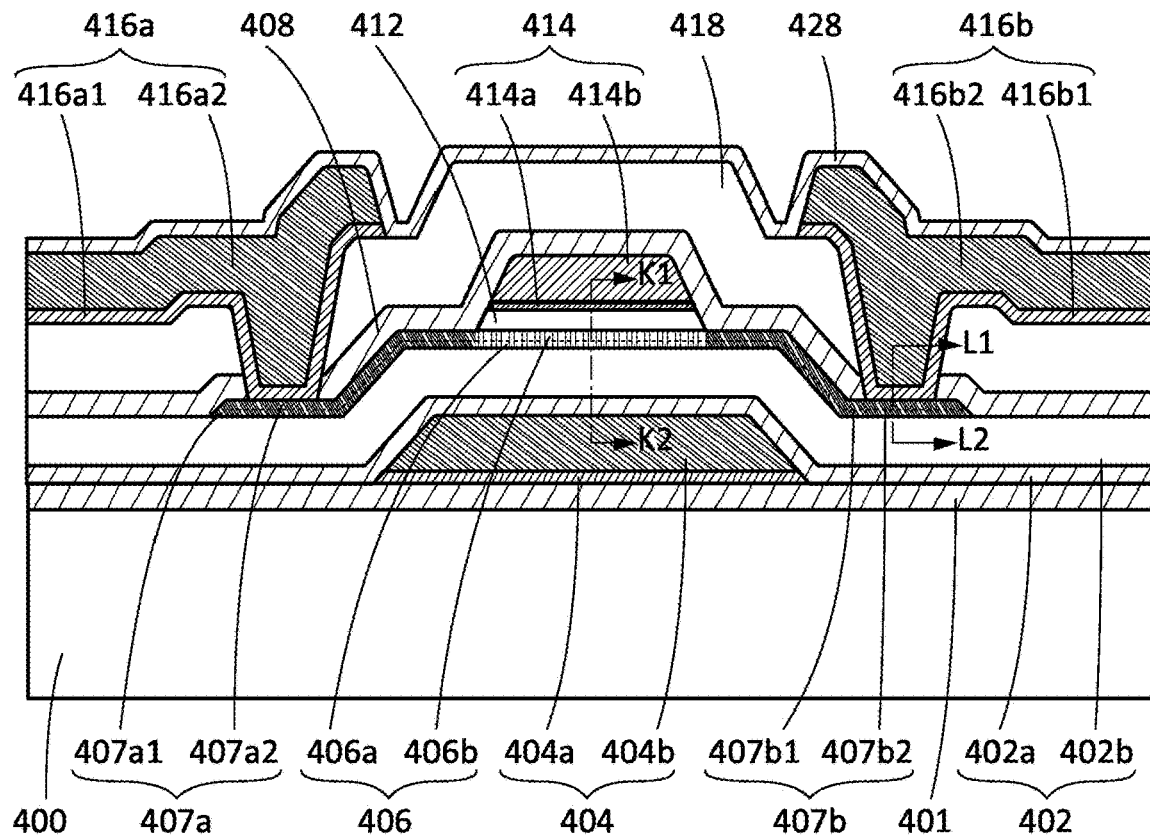
FIG. 39A is a cross-sectional view of a transistor and FIGS. 39B and 39C illustrate band structures.

FIG. 39A is a cross-sectional view of a transistor according to one embodiment of the present invention.

The transistor illustrated in FIG. 39A includes an insulating layer 401 over a substrate 400, a conductive layer 404a over the insulating layer 401, a conductive layer 404b over the conductive layer 404a, an insulating layer 402a over the insulating layer 401, the conductive layer 404a, and the conductive layer 404b, an insulating layer 402b over the insulating layer 402a, a semiconductor layer 406a over the insulating layer 402b, a semiconductor layer 406b over the semiconductor layer 406a, an insulating layer 412 over the semiconductor layer 406b, a conductive layer 414a over the insulating layer 412, a conductive layer 414b over the conductive layer 414a, an insulating layer 408 over the insulating layer 402b, the semiconductor layer 406a, the semiconductor layer 406b, the insulating layer 412, the conductive layer 414a, and the conductive layer 414b, an insulating layer 418 over the insulating layer 408, a conductive layer 416a1 and a conductive layer 416b1 over the insulating layer 418, a conductive layer 416a2 and a conductive layer 416b2 respectively over the conductive layer 416a1 and the conductive layer 416b1, and an insulating layer 428 over the insulating layer 418, the conductive layer 416a2, and the conductive layer 416b2.

In some cases, the insulating layer 401 has a function of suppressing entry of impurities to a channel formation region of the transistor. In the case where the conductive layer 404b or the like includes an impurity for the semiconductor layer 406a or 406b, such as copper, for example, the insulating layer 401 has a function of blocking copper or the like in some cases.

The stacked conductive layers 404a and 404b are collectively referred to as a conductive layer 404. The conductive layer 404 has a function of a gate electrode of the transistor in some cases. The conductive layer 404 has a function of shielding the channel formation region of the transistor from light in some cases.

The insulating layers 402a and 402b are collectively referred to as an insulating layer 402. The insulating layer 402 has a function of a gate insulating layer of the transistor in some cases. Furthermore, in some cases, the insulating layer 402a has a function of suppressing entry of impurities to the channel formation region of the transistor. In the case where the conductive layer 404b or the like includes an impurity for the semiconductor layer 406a or 406b, such as copper, for example, the insulating layer 402a has a function of blocking copper or the like in some cases.

The semiconductor layers 406a and 406b are collectively referred to as a semiconductor layer 406. In some cases, the semiconductor layer 406 has a function of the channel formation region of the transistor.

The semiconductor layer 406a includes a region 407a1 and a region 407b1 which overlap with none of the insulating layer 412, the conductive layer 414a, the conductive layer 414b, and the like. Furthermore, the semiconductor layer 406b includes a region 407a2 and a region 407b2 which overlap with none of the insulating layer 412, the conductive layer 414a, the conductive layer 414b, and the like. The region 407a1 and the region 407b1 have lower resistance than the region overlapping with the insulating layer 412, the conductive layer 414a, the conductive layer 414b, and the like in the semiconductor layer 406a. The region 407a2 and the region 407b2 have lower resistance than the region overlapping with the insulating layer 412, the conductive layer 414a, the conductive layer 414b, and the like in the semiconductor layer 406b. Note that the region with low resistance can also be referred to as a region with high carrier density.

The region 407a1 and the region 407a2 are collectively referred to as a region 407a. The region 407b1 and the region 407b2 are collectively referred to as a region 407b. The region 407a and the region 407b have functions of the source region and the drain region of the transistor, in some cases.

The conductive layers 414a and 414b are collectively referred to as a conductive layer 414. The conductive layer 414 has a function of a gate electrode of the transistor in some cases. The conductive layer 414 has a function of shielding the channel formation region of the transistor from light in some cases.

The insulating layer 412 has a function of a gate insulating layer of the transistor in some cases.

In some cases, the insulating layer 408 has a function of suppressing entry of impurities to the channel formation region of the transistor. In the case where the conductive layer 416a2, the conductive layer 416b2, or the like includes an impurity for the semiconductor layer 406a or 406b, such as copper, for example, the insulating layer 408 has a function of blocking copper or the like in some cases.

The insulating layer 418 has a function of an interlayer insulating layer of the transistor, in some cases. For example, parasitic capacitance between wirings of the transistor can be reduced by the insulating layer 418 in some cases.

The conductive layers 416a1 and 416a2 are collectively referred to as a conductive layer 416a. The conductive layers 416b1 and 416b2 are collectively referred to as a conductive layer 416b. The conductive layer 416a and the conductive layer 416b have functions of the source electrode and the drain electrode of the transistor, in some cases.

In some cases, the insulating layer 428 has a function of suppressing entry of impurities to the channel formation region of the transistor.

Figure 39B:
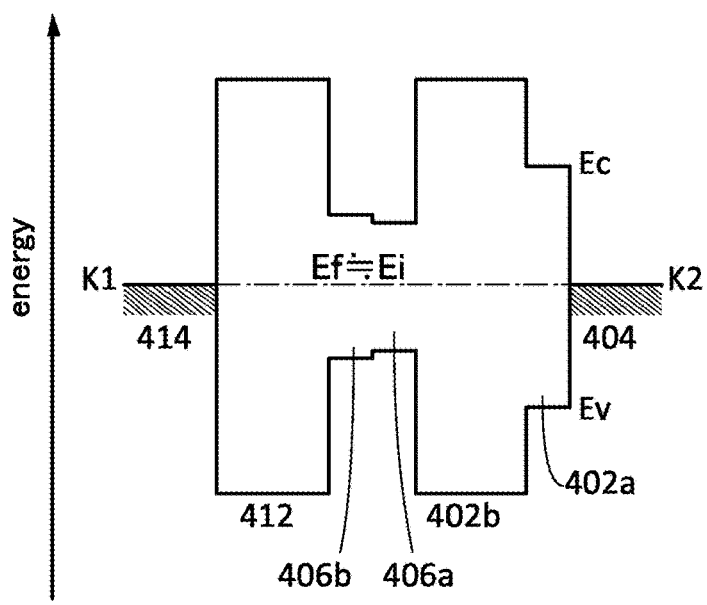

Here, a band structure in the K1-K2 cross section including the channel formation regions of the transistor is illustrated in FIG. 39B. Note that the semiconductor layer 406a is assumed to have a narrower energy gap than the semiconductor layer 406b. Furthermore, the insulating layer 402a, the insulating layer 402b, and the insulating layer 412 are assumed to have wider energy gaps than the semiconductor layer 406a and the semiconductor layer 406b. Furthermore, the Fermi levels (denoted by Ef) of the semiconductor layer 406a, the semiconductor layer 406b, the insulating layer 402a, the insulating layer 402b, and the insulating layer 412 are assumed to be equal to the intrinsic Fermi levels thereof (denoted by Ei). Furthermore, work functions of the conductive layer 404 and the conductive layer 414 are assumed equal to the Fermi levels.

When a gate voltage is set to be higher than or equal to the threshold voltage of the transistor, an electron flows preferentially in the semiconductor layer 406a owing to the difference between the energies of the conduction band minimums of the semiconductor layers 406a and 406b. That is, it is probable that an electron is embedded in the semiconductor layer 406a. Note that the energy at the conduction band minimum is denoted by Ec, and the energy at the valence band maximum is denoted by Ev.

Accordingly, in the transistor according to one embodiment of the present invention, the embedment of an electron reduces the influence of interface scattering. Therefore, the channel resistance of the transistor according to one embodiment of the present invention is low.

Figure 39C:
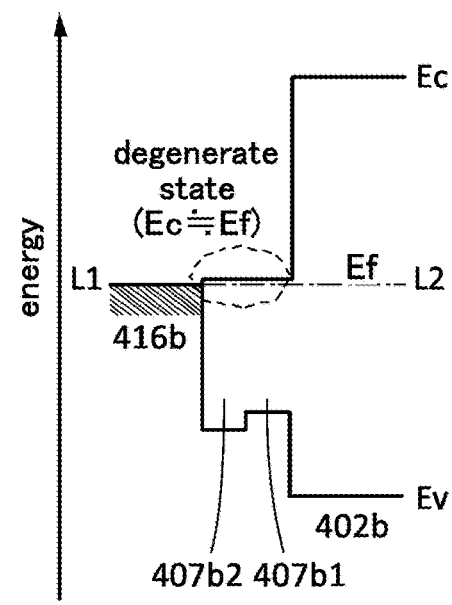

Next, FIG. 39C shows a band structure in the L1-L2 cross section including the source region or the drain region of the transistor. Note that the regions 407a1, 407b1, 407a2, and 407b2 are assumed to be in a degenerate state. Furthermore, the Fermi level of the semiconductor layer 406a is assumed to be approximately the same as the energy of the conduction band minimum in the region 407b1. Furthermore, the Fermi level of the semiconductor layer 406a is assumed to be approximately the same as the energy of the conduction band minimum in the region 407b2. The same can apply to the regions 407a1 and 407a2.

At this time, an ohmic contact is made between the conductive layer 416b functioning as a source electrode or a drain electrode and the region 407b2 because an energy barrier therebetween is sufficiently low. Furthermore, an ohmic contact is made between the region 407b2 and the region 407b1. Similarly, an ohmic contact is made between the conductive layer 416a functioning as a source electrode or a drain electrode and the region 407a2 because an energy barrier therebetween is sufficiently low. Furthermore, an ohmic contact is made between the region 407a2 and the region 407a1. Therefore, electron transfer is conducted smoothly between the conductive layers 416a and 416b and the semiconductor layers 406a and 406b.

As described above, the transistor according to one embodiment of the present invention is a transistor in which the channel resistance is low and electron transfer between the channel formation region and the source and the drain electrodes is conducted smoothly. That is, the transistor has excellent switching characteristics.

This embodiment can be combined as appropriate with any of the other embodiments in this specification.

Embodiment 13

In this embodiment, effects of an oxygen vacancy in an oxide semiconductor layer and hydrogen that enters the oxygen vacancy are described below.

<(1) Ease of Formation and Stability of $V_oH$>

In the case where an oxide semiconductor film (hereinafter referred to as IGZO) is a complete crystal, H preferentially diffuses along the a-b plane at a room temperature. In heat treatment at 450° C., H diffuses along the a-b plane and in the c-axis direction. Here, description is made on whether H easily enters an oxygen vacancy $V_o$ if the oxygen vacancy $V_o$ exists in IGZO. A state in which H is in an oxygen vacancy $V_o$ is referred to as $V_oH$.

Figure 40:
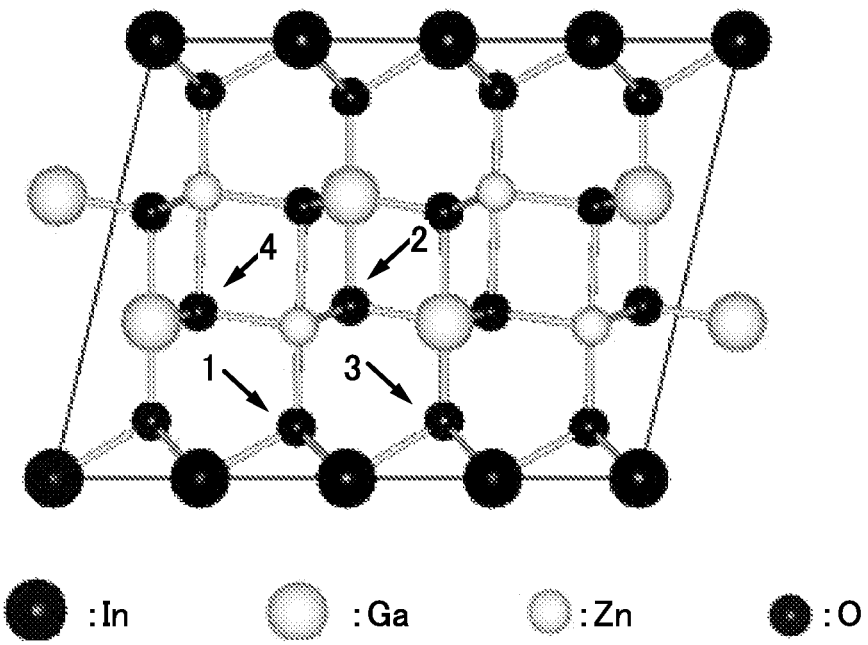
FIG. 40 shows a calculation model.

An $InGaZnO_4$ crystal model shown in FIG. 40 was used for calculation. The activation barrier ($E_a$) along the reaction path where H in $V_oH$ is released from $V_o$ and bonded to oxygen was calculated by a nudged elastic band (NEB) method. The calculation conditions are shown in Table 1.

TABLE 1

| Software | VASP |
|---|---|
| Calculation method | NEB method |
| Functional | GGA-PBE |
| Pseudopotential | PAW |
| Cut-off energy | 500 eV |
| K points | 2 × 2 × 3 |

In the $InGaZnO_4$ crystal model, there are oxygen sites 1 to 4 as shown in FIG. 40 which differ from each other in metal elements bonded to oxygen and the number of bonded metal elements. Here, calculation was made on the oxygen sites 1 and 2 in which an oxygen vacancy $V_o$ is easily formed.

First, calculation was made on the oxygen site 1 in which an oxygen vacancy $V_o$ is easily formed, which is herein the oxygen site that was bonded to three In atoms and one Zn atom.

Figure 41A:
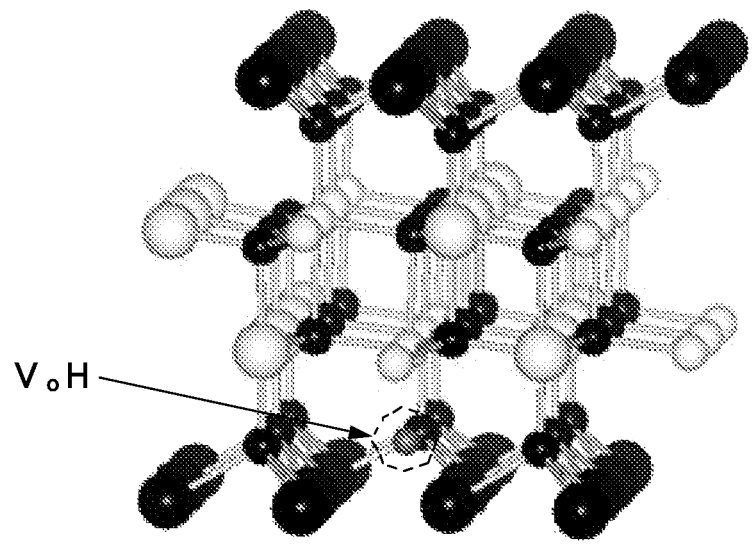
FIGS. 41A and 41B show the initial state and the final state, respectively.
Figure 41B:
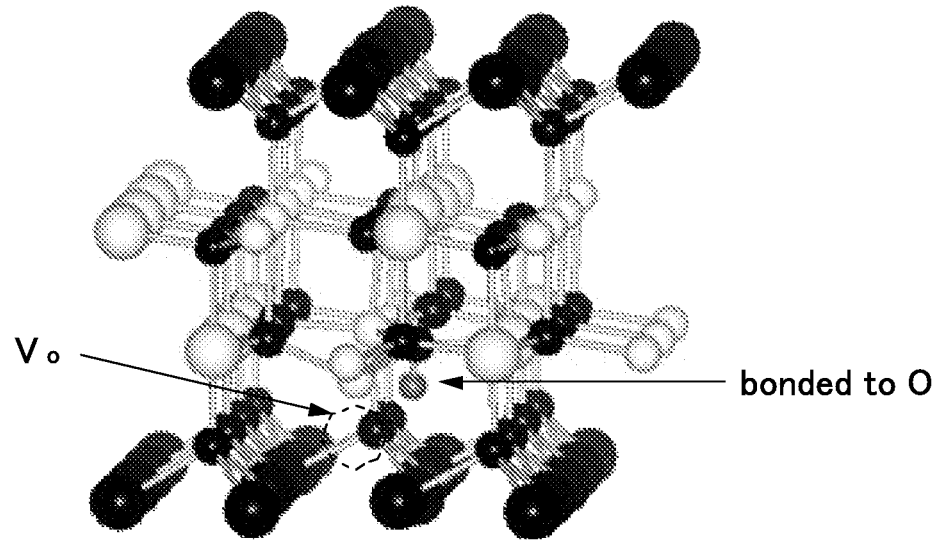
Figure 42:
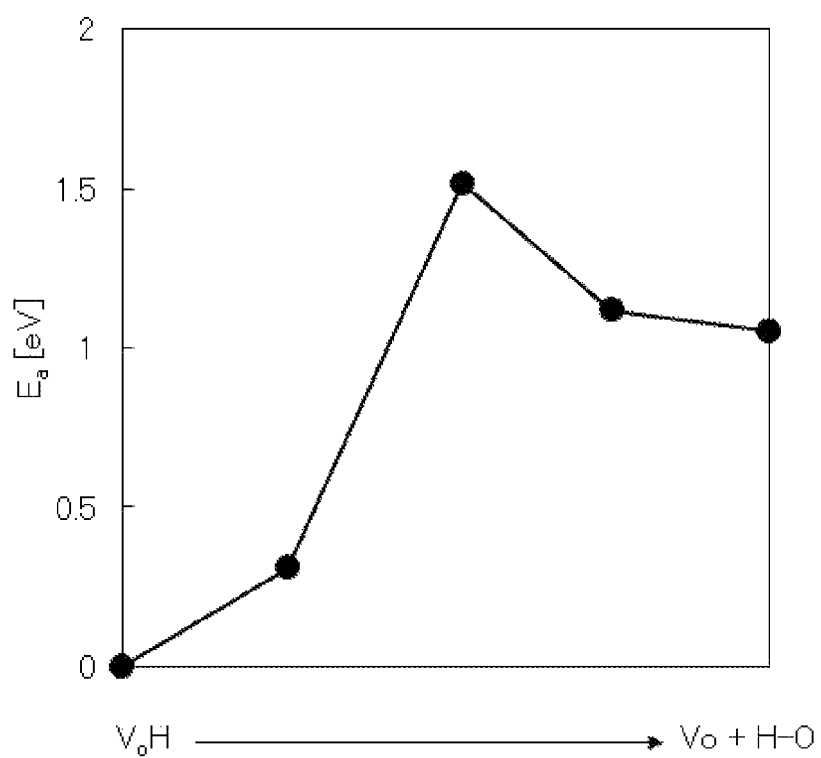
FIG. 42 shows an activation barrier.

FIG. 41A shows a model in the initial state and FIG. 41B shows a model in the final state. FIG. 42 shows the calculated activation barrier ($E_a$) in the initial state and the final state. Note that here, the initial state refers to a state in which H exists in an oxygen vacancy $V_o$ ($V_oH$), and the final state refers to a structure including an oxygen vacancy $V_o$ and a state in which H is bonded to oxygen bonded to one Ga atom and two Zn atoms (H—O).

From the calculation results, bonding of H in an oxygen vacancy $V_o$ to another oxygen atom needs an energy of approximately 1.52 eV, while entry of H bonded to O into an oxygen vacancy $V_o$ needs an energy of approximately 0.46 eV.

Reaction frequency (Γ) was calculated with use of the activation barriers ($E_a$) obtained by the calculation and Formula 1. In Formula 1, $k_B$ represents the Boltzmann constant and T represents the absolute temperature.

$$\Gamma = v\exp\left(-\frac{E_a}{k_B T}\right) \quad \text{[Formula 1]}$$

The reaction frequency at 350° C. was calculated on the assumption that the frequency factor $v=10^{13}$ [1/sec]. The frequency of H transfer from the model shown in FIG. 41A to the model shown in FIG. 41B was $5.52\times10^0$ [1/sec], whereas the frequency of H transfer from the model shown in FIG. 41B to the model shown in FIG. 41A was $1.82\times10^9$ [1/sec]. This suggests that H diffusing in IGZO is likely to faun $V_oH$ if an oxygen vacancy $V_o$ exists in the neighborhood, and H is unlikely to be released from the oxygen vacancy $V_o$ once $V_oH$ is formed.

Next, calculation was made on the oxygen site 2 in which an oxygen vacancy $V_o$ is easily formed, which is herein the oxygen site that was bonded to one Ga atom and two Zn atoms.

Figure 43A:
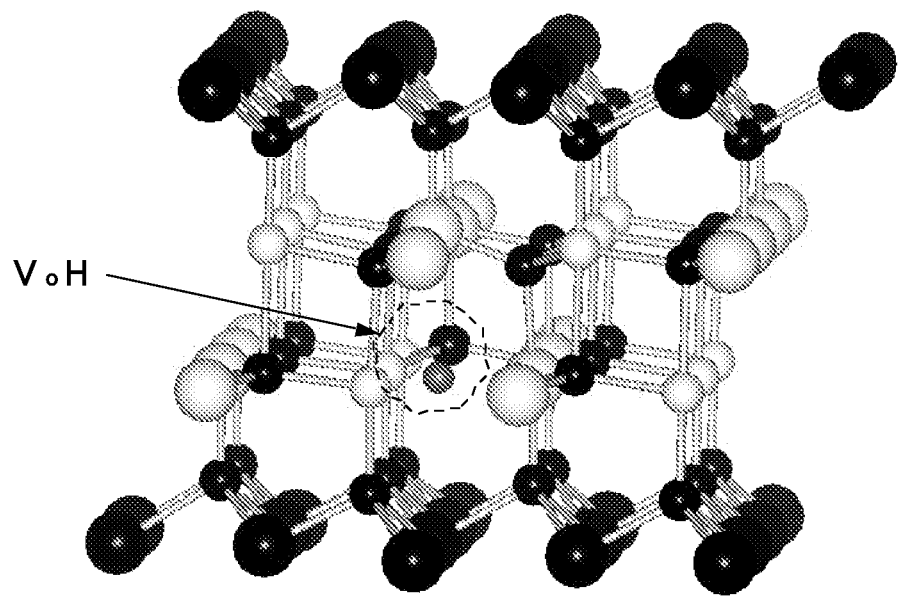
FIGS. 43A and 43B show the initial state and the final state, respectively.
Figure 43B:
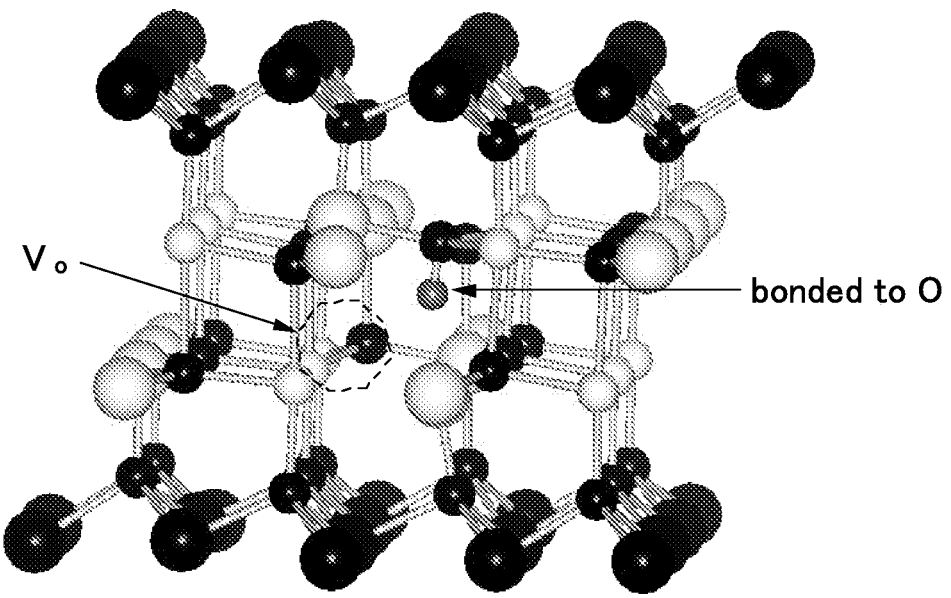
Figure 44:
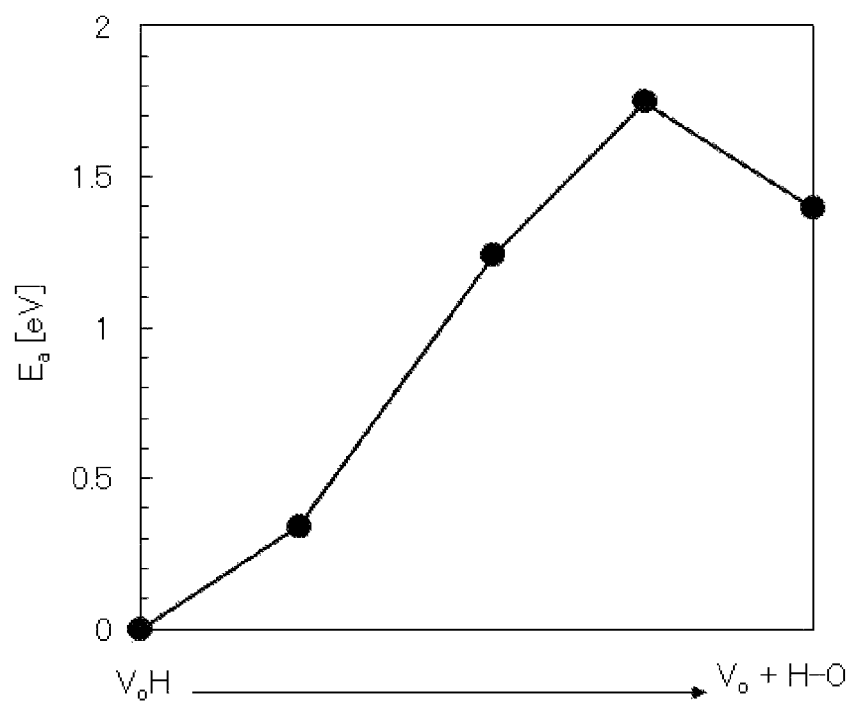
FIG. 44 shows an activation barrier.

FIG. 43A shows a model in the initial state and FIG. 43B shows a model in the final state. FIG. 44 shows the calculated activation barrier ($E_a$) in the initial state and the final state. Note that here, the initial state refers to a state in which H exists in an oxygen vacancy $V_o$ ($V_oH$), and the final state refers to a structure including an oxygen vacancy $V_o$ and a state in which H is bonded to oxygen bonded to one Ga atom and two Zn atoms (H—O).

From the calculation results, bonding of H in an oxygen vacancy $V_o$ to another oxygen atom needs an energy of approximately 1.75 eV, while entry of H bonded to O in an oxygen vacancy $V_o$ needs an energy of approximately 0.35 eV.

Reaction frequency (Γ) was calculated with use of the activation barriers ($E_a$) obtained by the calculation and Formula 1.

The reaction frequency at 350° C. was calculated on the assumption that the frequency factor $v=10^{13}$ [1/sec]. The frequency of H transfer from the model shown in FIG. 43A to the model shown in FIG. 43B was $7.53\times10^{-2}$ [1/sec], whereas the frequency of H transfer from the model shown in FIG. 43B to the model shown in FIG. 43A was $1.44\times10^{10}$ [1/sec]. This suggests that H is unlikely to be released from the oxygen vacancy $V_o$ once $V_oH$ is formed.

From the above results, it was found that H in IGZO easily diffused in annealing and if an oxygen vacancy $V_o$ existed, H was likely to enter the oxygen vacancy $V_o$ to be $V_oH$.

<(2) Transition Level of $V_oH$>

The calculation by the NEB method, which was described in <(1) Ease of formation and stability of $V_oH$>, indicates that in the case where an oxygen vacancy $V_o$ and H exist in IGZO, the oxygen vacancy $V_o$ and H easily form $V_oH$ and $V_oH$ is stable. To determine whether $V_oH$ is related to a carrier trap, the transition level of $V_oH$ was calculated.

The model used for calculation is an InGaZnO$_4$ crystal model (112 atoms). $V_oH$ models of the oxygen sites 1 and 2 shown in FIG. 40 were made to calculate the transition levels. The calculation conditions are shown in Table 2.

TABLE 2

| Software | VASP |
|---|---|
| Moldel | InGaZnO4 crystal (112 atoms) |
| Functional | HSE06 |
| Ratio of exchange terms | 0.25 |
| Pseudopotential | GGA-PBE |
| Cut-off energy | 800 eV |
| K points | 1 × 1 × 1 |

The ratio of exchange terms was adjusted to have a band gap close to the experimental value. As a result, the band gap of the InGaZnO$_4$ crystal model without defects was 3.08 eV that was close to the experimental value, 3.15 eV.

The transition level ($\varepsilon(q/q')$) of a model having defect D can be calculated by the following Formula 2. Note that $\Delta E(D^q)$ represents the formation energy of defect D at charge q, which is calculated by Formula 3.

$$\varepsilon(q/q') = \frac{\Delta E(D^q) - \Delta E(D^{q'})}{q' - q} \quad \text{[Formula 2]}$$

$$\Delta E(D^q) = \quad \text{[Formula 3]}$$
$$E_{tot}(D^q) - E_{tot}(\text{bulk}) + \sum_i \Delta n_i \mu_i + q(\varepsilon_{VHM} + \Delta V_q + E_F)$$

In Formulae 2 and 3, $E_{tot}(D^q)$ represents the total energy of the model having defect D at the charge q in, $E_{tot}$(bulk) represents the total energy in a model without defects (complete crystal), $\Delta n_i$ represents a change in the number of atoms i contributing to defects, $\mu_i$ represents the chemical potential of atom i, $\varepsilon_{VBM}$ represents the energy of the valence band maximum in the model without defects, $\Delta V_q$ represents the correction term relating to the electrostatic potential, and $E_F$ represents the Fermi energy.

Figure 45:
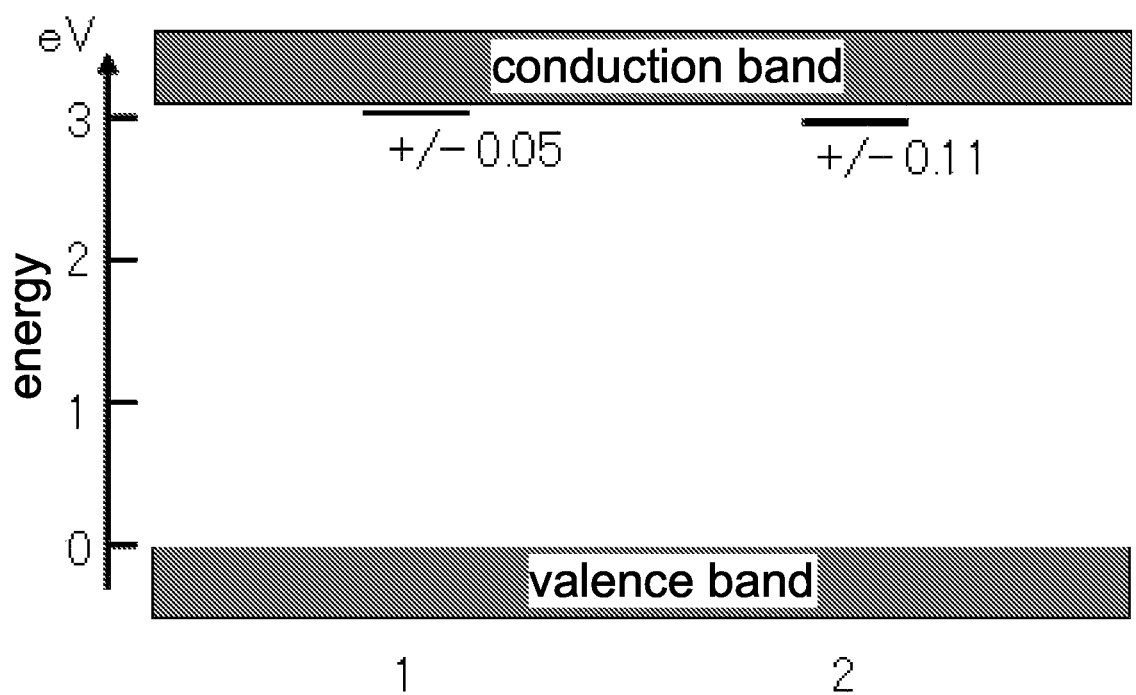
FIG. 45 shows the transition levels of VoH.

FIG. 45 shows the transition levels of $V_oH$ obtained from the above formulae. The numbers in FIG. 45 represent the depth from the conduction band minimum. In FIG. 45, the transition level of $V_oH$ in the oxygen site 1 is at 0.05 eV from the conduction band minimum, and the transition level of $V_oH$ in the oxygen site 2 is at 0.11 eV from the conduction band minimum. Therefore, these $V_oH$ seems to be related to electron traps, that is, $V_oH$ seems to behave as a donor. Furthermore, IGZO including $V_oH$ has conductivity.

This embodiment can be combined as appropriate with any of the other embodiments and examples in this specification.

Embodiment 14

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 46A to 46F illustrate specific examples of these electronic devices.

Figure 46A:
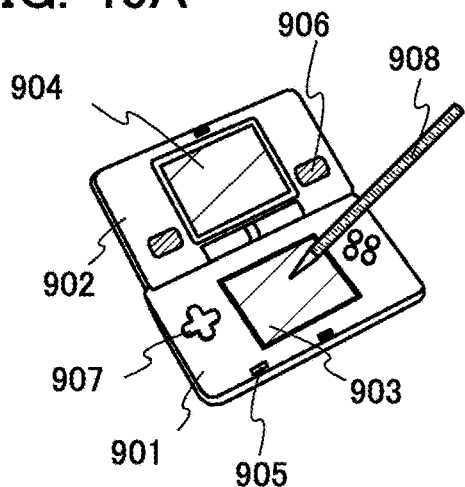
FIGS. 46A to 46F illustrate electronic devices.

FIG. 46A illustrates a portable game console including a housing 901, a housing 902, a display portion 903, a display portion 904, a microphone 905, a speaker 906, an operation key 907, a stylus 908, and the like. Although the portable game machine in FIG. 46A has the two display portions 903 and 904, the number of display portions included in a portable game machine is not limited to this.

Figure 46B:
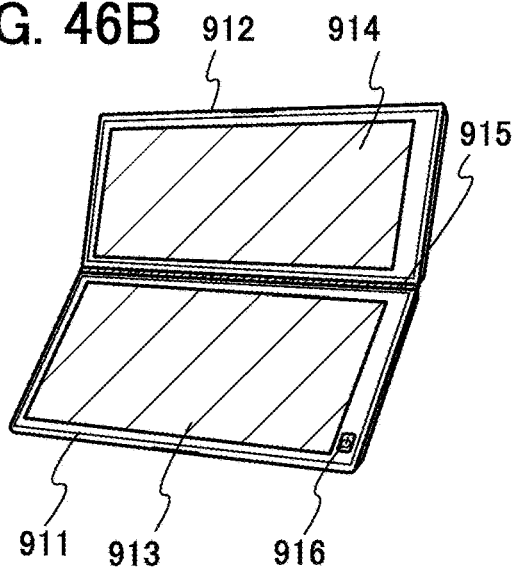

FIG. 46B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 46C:
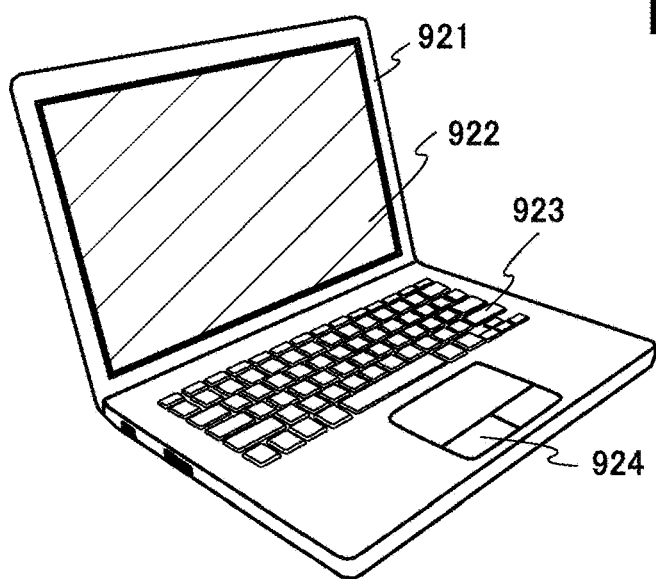

FIG. 46C illustrates a laptop personal computer, which includes a housing 921, a display portion 922, a keyboard 923, a pointing device 924, and the like.

Figure 46D:
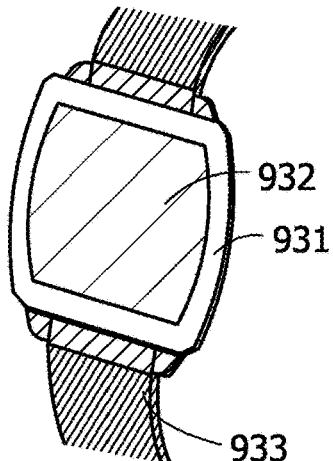

FIG. 46D illustrates a wrist-watch-type information terminal, which includes a housing 931, a display portion 932, a wristband 933, and the like. The display portion 932 may be a touch panel.

Figure 46E:
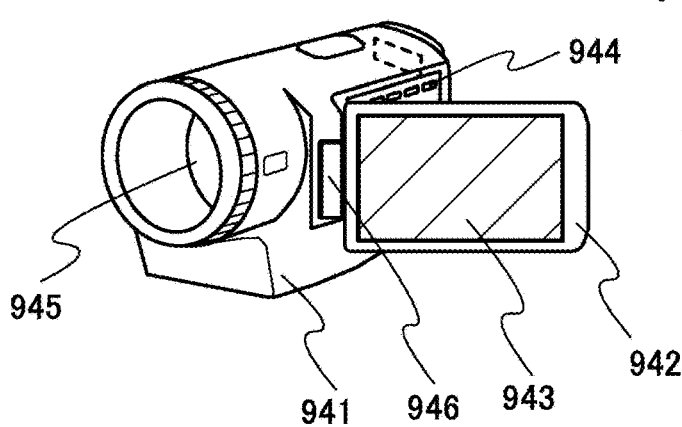

FIG. 46E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 46F:
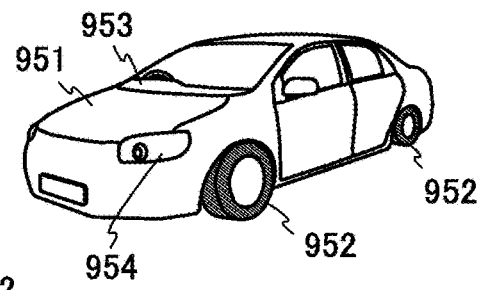
Figure 47A:
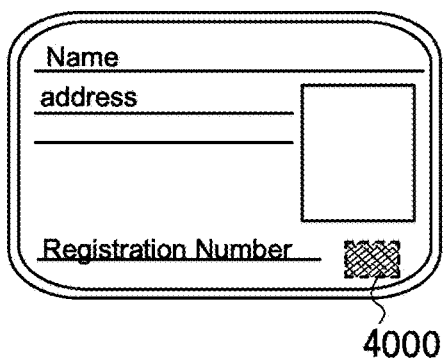
FIGS. 47A to 47F illustrate usage examples of an RF tag.
Figure 47B:
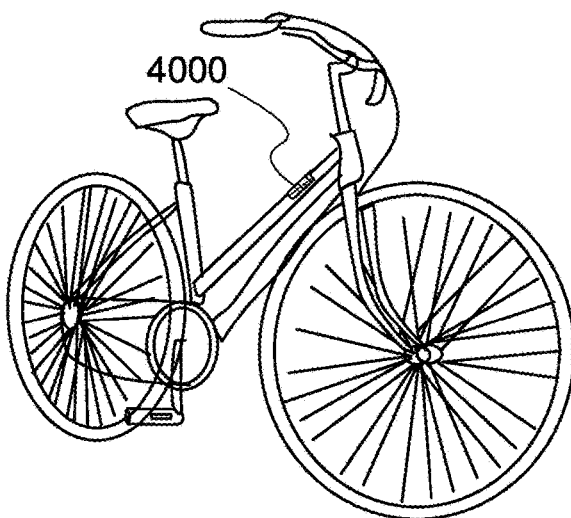
Figure 47C:
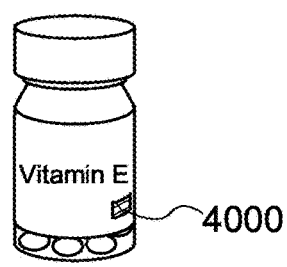
Figure 47D:
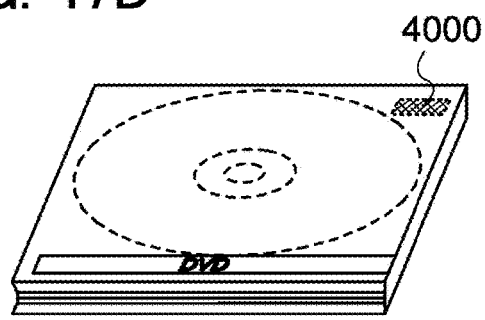
Figure 47E:
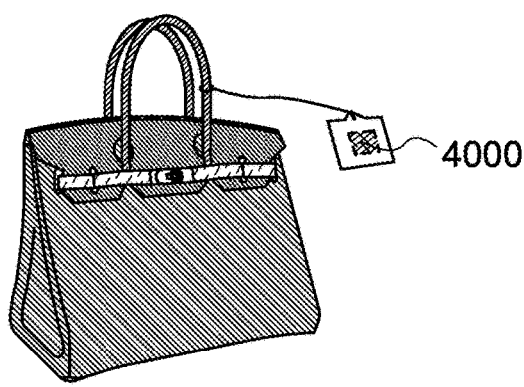
Figure 47F:
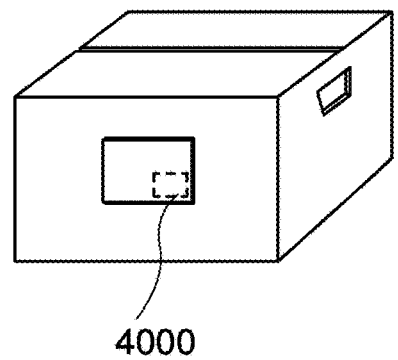

FIG. 46F illustrates an ordinary vehicle including a car body 951, wheels 952, a dashboard 953, lights 954, and the like.

This embodiment can be combined with any of the other embodiments described in this specification as appropriate.

Embodiment 15

In this embodiment, application examples of an RF tag of one embodiment of the present invention will be described with reference to FIGS. 47A to 47F. The RF tag is widely used and can be provided for, for example, products such as bills, coins, securities, bearer bonds, documents (e.g., driver's licenses or resident's cards, see FIG. 47A), vehicles (e.g., bicycles, see FIG. 47B), packaging containers (e.g., wrapping paper or bottles, see FIG. 47C), recording media (e.g., DVD or video tapes, see FIG. 47D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 47E and 47F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

This embodiment can be combined as appropriate with any of the other embodiments and examples in this specification.

Embodiment 16

<Deposition Model>

Examples of deposition models of a CAAC-OS and nc-OS are described below.

Figure 58A:
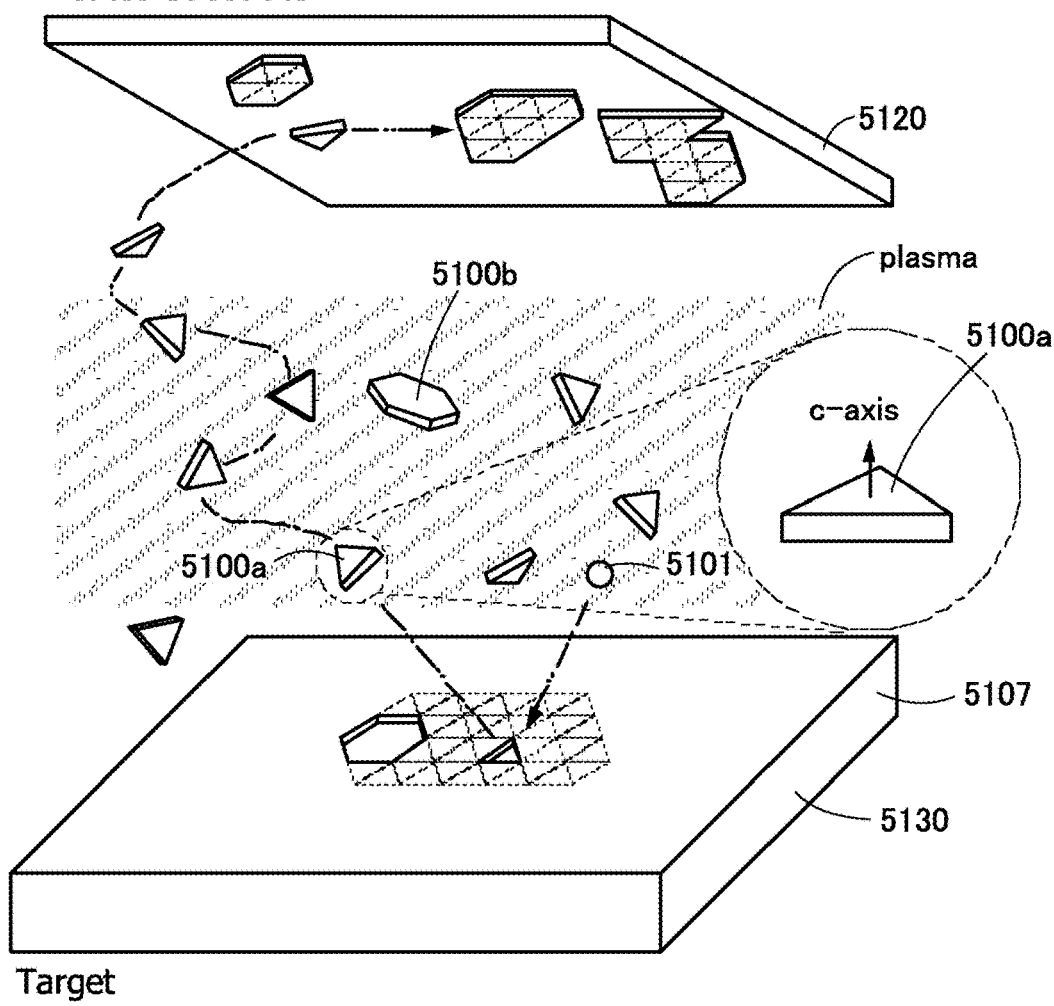
FIG. 58A schematically illustrates a CAAC-OS deposition model.

FIG. 58A is a schematic diagram of a deposition chamber illustrating a state where the CAAC-OS film is formed by a sputtering method.

A target 5130 is attached to a backing plate. Under the target 5130 and the backing plate, a plurality of magnets are provided. The plurality of magnets cause a magnetic field over the target 5130. A sputtering method in which the disposition speed is increased by utilizing a magnetic field of magnets is referred to as a magnetron sputtering method.

The target 5130 has a polycrystalline structure in which a cleavage plane exists in at least one crystal grain. Note that the details of the cleavage plane are described later.

A substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and controlled to higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. Note that the magnetic field over the target 5130 forms a high-density plasma region. In the high-density plasma region, the deposition gas is ionized, so that an ion 5101 is generated. Examples of the ion 5101 include an oxygen cation ($O^+$) and an argon cation ($Ar^+$).

The ion 5101 is accelerated to the target 5130 side by an electric field, and collides with the target 5130 eventually. At this time, a pellet 5100*a* and a pellet 5100*b* which are flat-plate-like or pellet-like sputtered particles are separated and sputtered from the cleavage plane. Note that structures of the pellet 5100*a* and the pellet 5100*b* may be distorted by an impact of collision of the ion 5101.

The pellet 5100*a* is a flat-plate-like or pellet-like sputtered particle having a triangle plane, e.g., a regular triangle plane. The pellet 5100*b* is a flat-plate-like or pellet-like sputtered particle having a hexagon plane, e.g., regular hexagon plane. Note that flat-plate-like or pellet-like sputtered particles such as the pellet 5100*a* and the pellet 5100*b* are collectively called pellets 5100. The shape of a flat plane of the pellet 5100 is not limited to a triangle or a hexagon. For example, the flat plane may have a shape formed by combining greater than or equal to 2 and less than or equal to 6 triangles. For example, a square (rhombus) is formed by combining two triangles (regular triangles) in some cases.

The thickness of the pellet 5100 is determined depending on the kind of the deposition gas and the like. The thicknesses of the pellets 5100 are preferably uniform; the reasons thereof are described later. In addition, the sputtered particle preferably has a pellet shape with a small thickness as compared to a dice shape with a large thickness.

Figure 60:
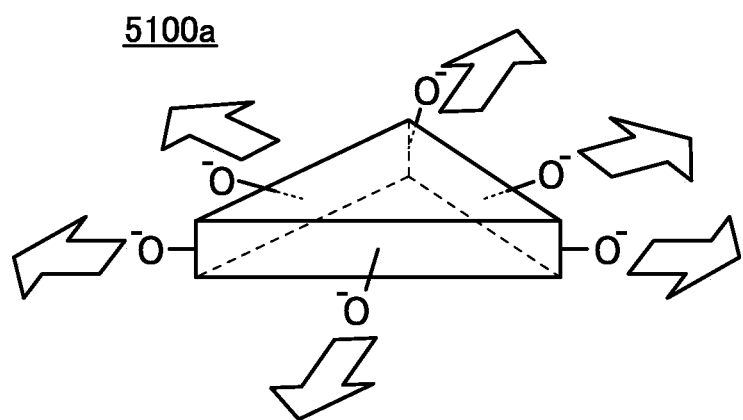
FIG. 60 illustrates a pellet.

The pellet 5100 receives charge when passing through the plasma, so that side surfaces of the pellet 5100 are negatively or positively charged in some cases. The pellet 5100 includes an oxygen atom on its side surface, and the oxygen atom may be negatively charged. For example, a case in which the pellet 5100*a* includes, on its side surfaces, oxygen atoms that are negatively charged is illustrated in FIG. 60. As in this view, when the side surfaces are charged in the same polarity, charges repel each other, and accordingly, the pellet can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, and a zinc atom is negatively charged.

Figure 61:
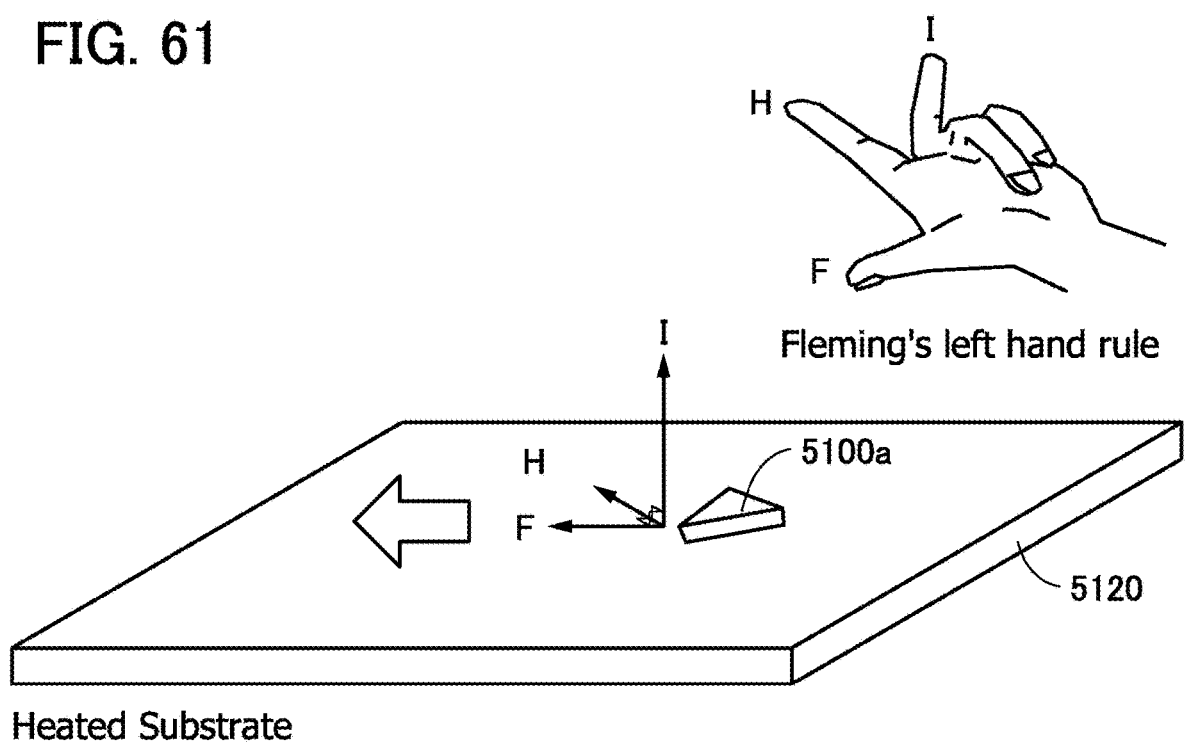
FIG. 61 illustrates force applied to a pellet on a formation surface.

As shown in FIG. 58A, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field is generated in a direction parallel to a top surface of the substrate 5120. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current (see FIG. 61). This is explainable with Fleming's left-hand rule. In order to increase a force applied to the pellet 5100, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate is 1.5 times or higher, preferably twice or higher, further preferably 3 times or higher, still further preferably 5 times or higher as high as the magnetic field in a direction perpendicular to the top surface of the substrate 5120.

Figure 62A:
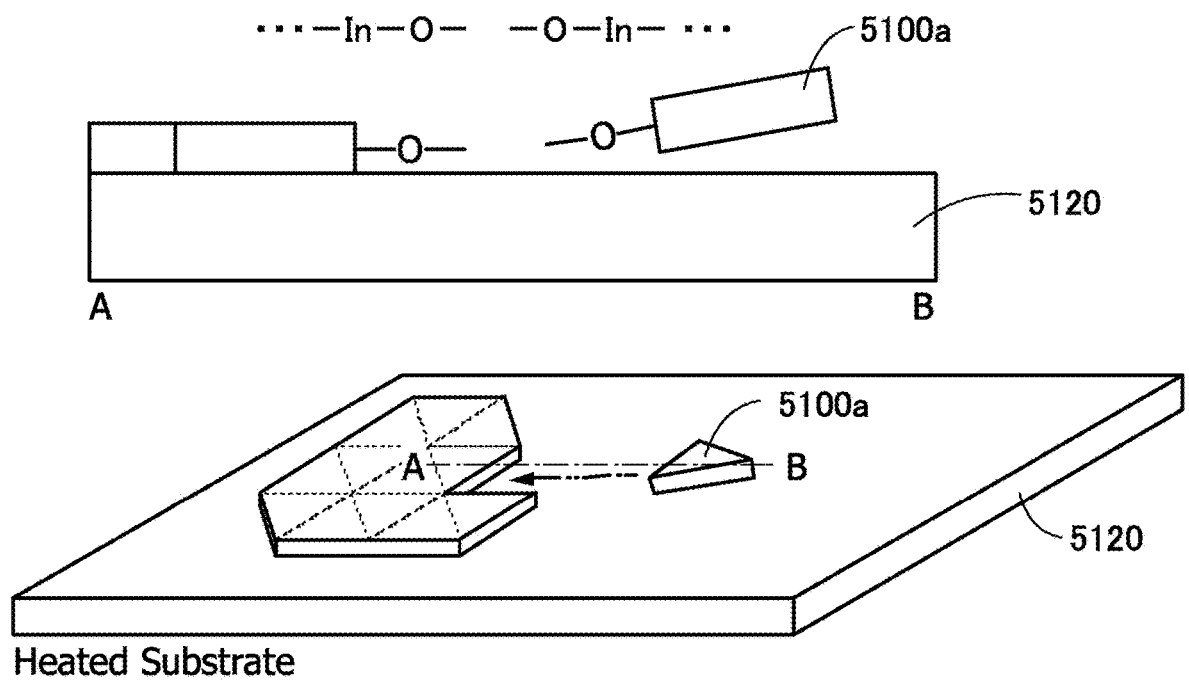
FIGS. 62A and 62B illustrate movement of a pellet on a formation surface.
Figure 62B:
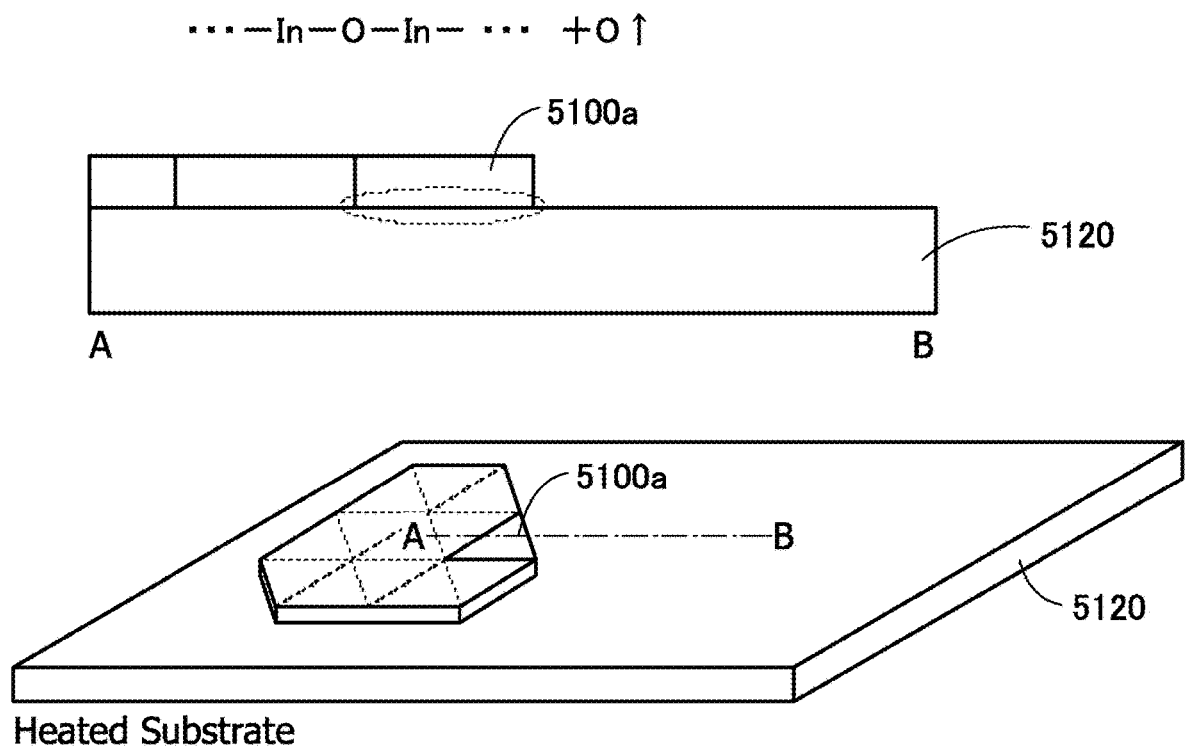

Furthermore, the substrate 5120 is heated, and resistance such as friction between the pellet 5100 and the substrate 5120 is low. As a result, as illustrated in FIG. 62A, the pellet 5100 glides above the surface of the substrate 5120. The glide of the pellet 5100 is caused in a state where the flat plane faces the substrate 5120. Then, as illustrated in FIG. 62B, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS is filled in some cases; thus, the CAAC-OS has a low density of defect states.

Further, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented. Further, the space is filled with elastic metal atoms and the like, whereby the elastic metal atoms have a function, like a highway, of jointing side surfaces of the pellets 5100 which are not aligned with each other.

It is considered that as shown in such a model, the pellets 5100 are deposited over the substrate 5120. Thus, a CAAC-OS film can be deposited even when a surface over which a film is formed (film formation surface) does not have a crystal structure, which is different from film deposition by epitaxial growth. For example, even when a surface (film formation surface) of the substrate 5120 has an amorphous structure, a CAAC-OS film can be formed.

Figure 58B:
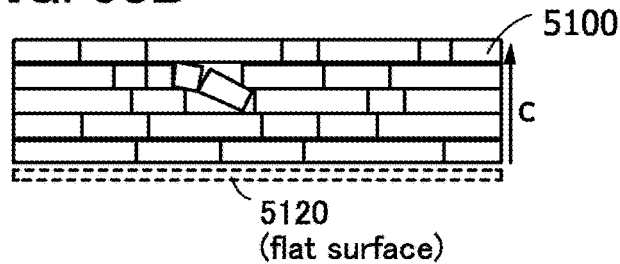
FIGS. 58B and 58C are cross-sectional views of pellets and a CAAC-OS.

Further, it is found that in formation of the CAAC-OS, the pellets 5100 are arranged in accordance with a surface shape of the substrate 5120 that is the film formation surface even when the film formation surface has unevenness besides a flat surface. For example, in the case where the surface of the substrate 5120 is flat at the atomic level, the pellets 5100 are arranged so that flat planes parallel to the a-b plane face downwards; thus, a layer with a uniform thickness, flatness, and high crystallinity is formed. By stacking n layers (n is a natural number), the CAAC-OS can be obtained (see FIG. 58B).

Figure 58C:
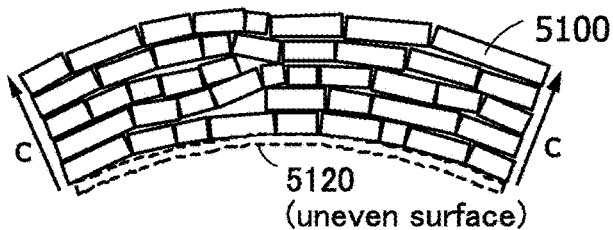

In the case where the top surface of the substrate 5120 has unevenness, a CAAC-OS where n layers (n is a natural number) in each of which the pellets 5100 are arranged along a convex surface are stacked is formed. Since the substrate 5120 has unevenness, a gap is easily generated between in the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be formed (see FIG. 58C).

As a result, laser crystallization is not needed for formation of a CAAC-OS, and a uniform film can be formed even over a large-sized glass substrate.

Since the CAAC-OS film is deposited in accordance with such a model, the sputtered particle preferably has a pellet shape with a small thickness. Note that in the case where the sputtered particle has a dice shape with a large thickness, planes facing the substrate 5120 are not uniform and thus, the thickness and the orientation of the crystals cannot be uniform in some cases.

According to the deposition model described above, a CAAC-OS with high crystallinity can be formed even on a film formation surface with an amorphous structure.

Further, formation of a CAAC-OS can be described with a deposition model including a zinc oxide particle besides the pellet 5100.

The zinc oxide particle reaches the substrate 5120 before the pellet 5100 does because the zinc oxide particle is smaller than the pellet 5100 in mass. On the surface of the substrate 5120, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 5120. The zinc oxide layer serves as a seed layer that makes a CAAC-OS grow and thus has a function of increasing crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Thus, in order to deposit a CAAC-OS with high crystallinity, a target containing zinc at a proportion higher than that of the stoichiometric composition is preferably used.

Figure 59:
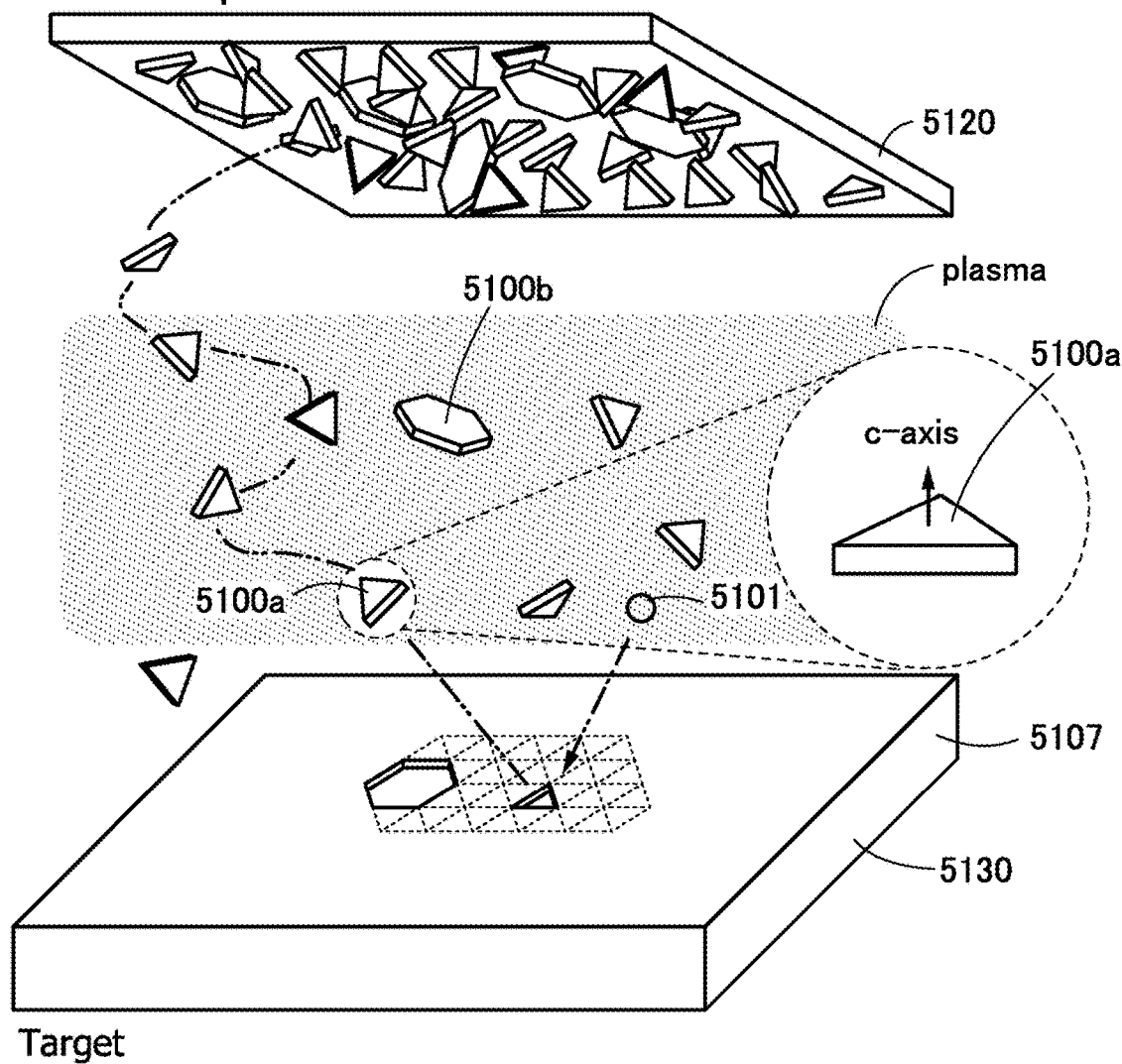
FIG. 59 schematically illustrates a deposition model of an nc-OS and a pellet.

An nc-OS can be understood with a deposition model illustrated in FIG. 59. Note that a difference between FIG. 59 and FIG. 58A lies only in the fact that whether the substrate 5120 is heated or not.

Thus, the substrate 5120 is not heated, and a resistance such as friction between the pellet 5100 and the substrate 5120 is high. As a result, the pellets 5100 cannot glide on the surface of the substrate 5120 and are stacked randomly, thereby forming an nc-OS.
<Cleavage Plane>

A cleavage plane that has been mentioned in the deposition model of the CAAC-OS will be described below.

Figure 63A:
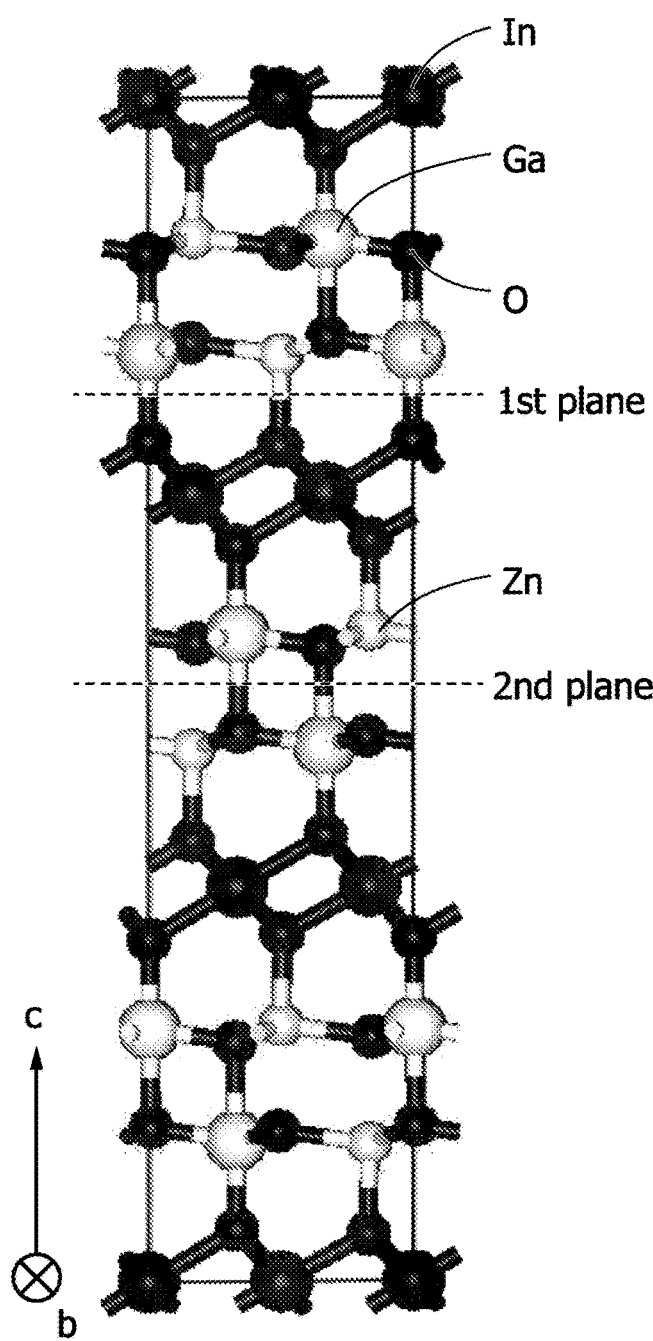
FIGS. 63A and 63B show an $InGaZnO_4$ crystal.
Figure 63B:
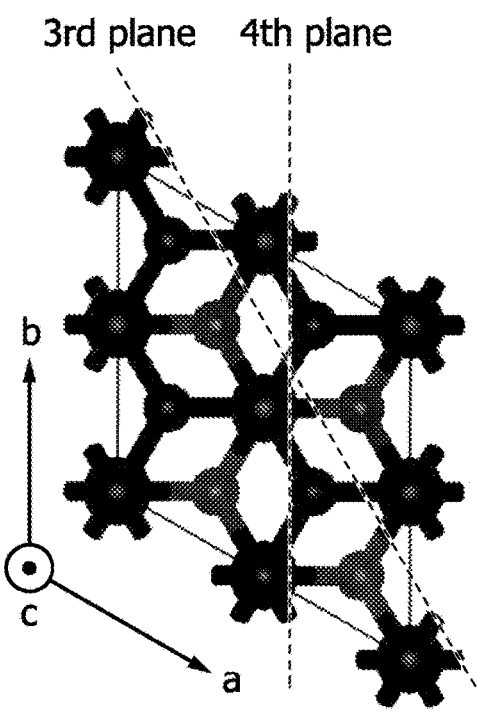

First, a cleavage plane of the target is described with reference to FIGS. 63A and 63B. FIGS. 63A and 63B show the crystal structure of InGaZnO$_4$. Note that FIG. 63A shows the structure of the case where an InGaZnO$_4$ crystal is observed from a direction parallel to the b-axis when the c-axis is in an upward direction. Furthermore, FIG. 63B shows the structure of the case where the InGaZnO$_4$ crystal is observed from a direction parallel to the c-axis.

Energy needed for cleavage at each of crystal planes of the InGaZnO$_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the InGaZnO$_4$ crystal in FIGS. 63A and 63B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 63A). The second plane is a crystal plane between a Ga—Zn—O layer and a Ga—Zn—O layer and is parallel to the (001) plane (or the a-b plane) (see FIG. 63A). The third plane is a crystal plane parallel to the (110) plane (see FIG. 63B). The fourth plane is a crystal plane parallel to the (100) plane (or the b-c plane) (see FIG. 63B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure indicates energy obtained in such a manner that electronic kinetic energy of electrons included in the structure and interactions between atoms included in the structure, between the atom and the electron, and between the electrons are considered.

As calculation results, the cleavage energy of the first plane was 2.60 J/m$^2$, that of the second plane was 0.68 J/m$^2$, that of the third plane was 2.18 J/m$^2$, and that of the fourth plane was 2.12 J/m$^2$ (see Table 1).

TABLE 3

| | Cleavage energy [J/m$^2$] |
|---|---|
| First plane | 2.60 |
| Second plane | 0.68 |
| Third plane | 2.18 |
| Fourth plane | 2.12 |

From the calculations, in the structure of the InGaZnO$_4$ crystal in FIGS. 63A and 63B, the cleavage energy of the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between the Ga—Zn—O layer and the Ga—Zn—O layer, the InGaZnO$_4$ crystals in FIG. 63A can be separated at a plane equivalent to two second planes. Therefore, in the case where an ion or the like is made to collide with a target, a wafer-like unit (we call this a pellet) which is cleaved at a plane with the lowest cleavage energy is thought to be blasted off as the minimum unit. In that case, a pellet of InGaZnO$_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and plane that is parallel to the (001) plane (or the a-b plane)), which suggests that most of the flat planes of the pellets have triangle shapes or hexagonal shapes.

Figure 64A:
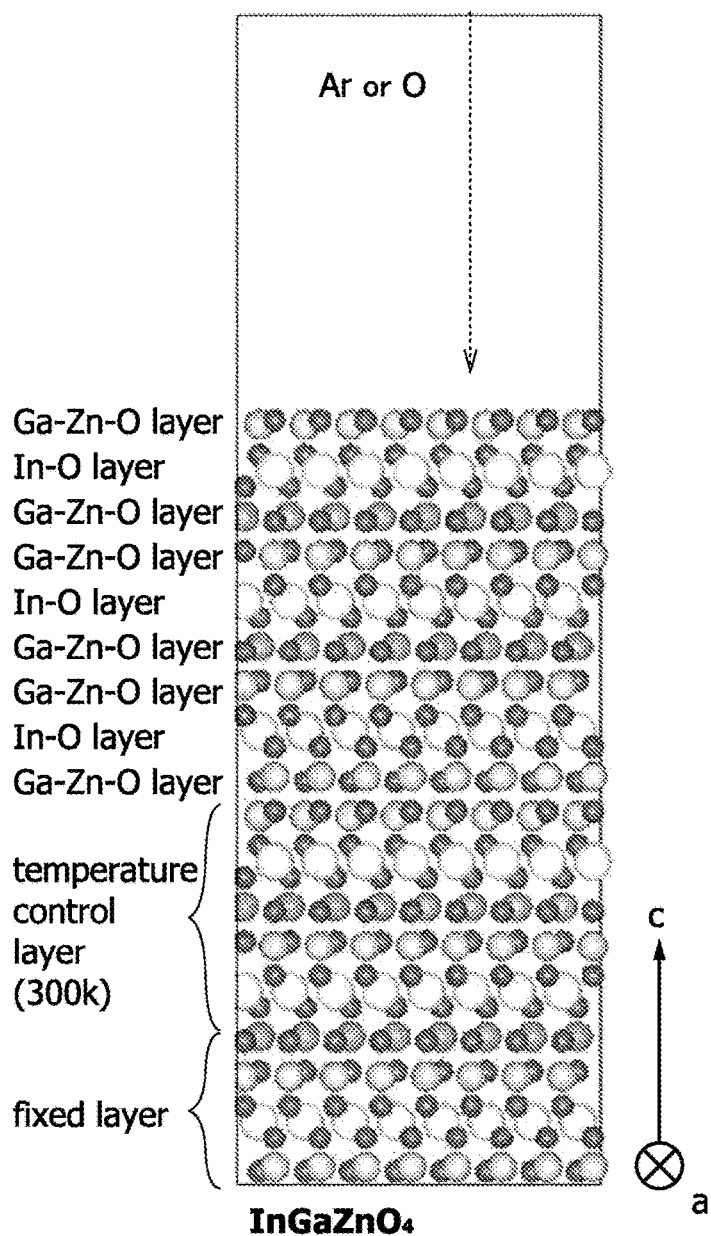
Figure 64B:
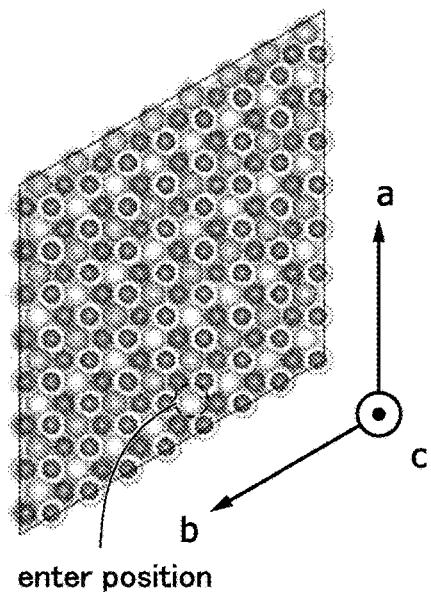

Next, through classical molecular dynamics calculation, on the assumption of an InGaZnO$_4$ crystal having a homologous structure as a target, a cleavage plane in the case where the target is sputtered using argon (Ar) or oxygen (O) is examined. FIG. 64A shows a cross-sectional structure of an InGaZnO$_4$ crystal (2688 atoms) used for the calculation, and FIG. 64B shows a top structure thereof. Note that a fixed layer in FIG. 64A prevents the positions of the atoms from moving. A temperature control layer in FIG. 64A is a layer whose temperature is constantly set to fixed temperature (300 K).

For the classical molecular dynamics calculation, Materials Explorer 5.0 manufactured by Fujitsu Limited. is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the above-mentioned conditions.

Figure 65A:
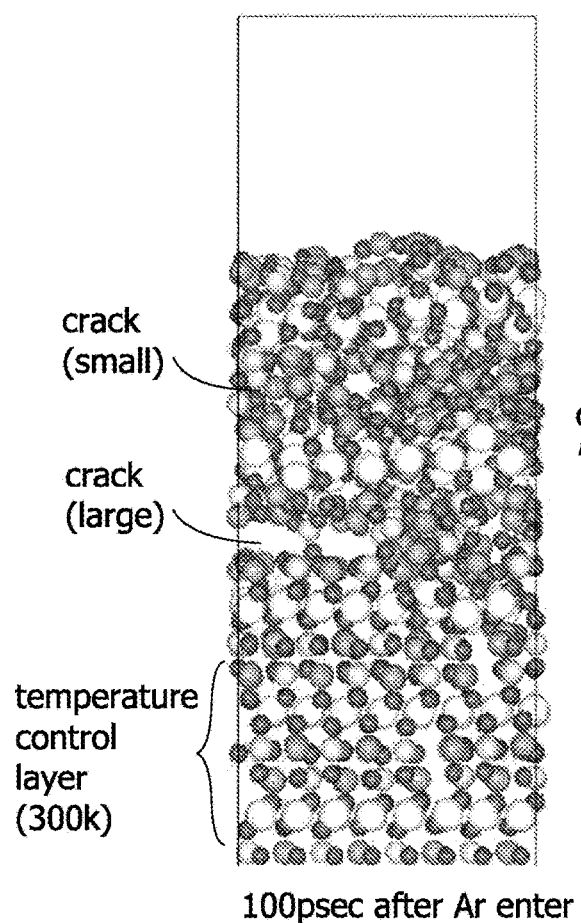
FIGS. 65A and 65B illustrate a structure of $InGaZnO_4$ and the like after collision of an atom.
Figure 65B:
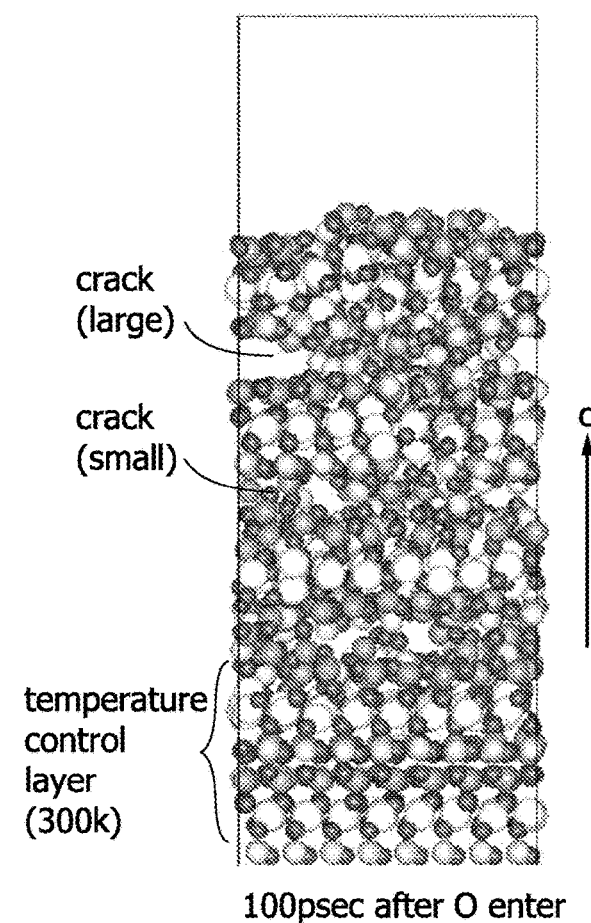

FIG. 65A shows atomic order when 99.9 picoseconds have passed after argon enters the cell including the InGaZnO$_4$ crystal in FIGS. 64A and 64B. FIG. 65B shows atomic order when 99.9 picoseconds have passed after oxygen enters the cell. Note that in FIGS. 65A and 65B, part of the fixed layer in FIG. 64A is omitted.

According to FIG. 65A, in a period from entry of argon into the cell to when 99.9 picoseconds have passed, a crack is formed from the cleavage plane corresponding to the second plane in FIG. 63A. Thus, in the case where argon collides with the InGaZnO$_4$ crystal and the uppermost surface is the second plane (the zero-th), a large crack is found to be formed in the second plane (the second).

On the other hand, according to FIG. 65B, in a period from entry of oxygen into the cell to when 99.9 picoseconds have passed, a crack is found to be formed from the cleavage plane corresponding to the second plane in FIG. 63A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, difference in size of the pellet depending on atoms which are made to collide is studied.

FIG. 66A shows trajectories of the atoms from 0 picosecond to 0.3 picoseconds after argon enters the cell including the InGaZnO$_4$ crystal in FIGS. 64A and 64B. Accordingly, FIG. 66A corresponds to a period from FIGS. 64A and 64B to FIG. 65A.

According to FIG. 66A, when argon collides with gallium (Ga) of the first layer (Ga—Zn—O layer), gallium collides with zinc (Zn) of the third layer (Ga—Zn—O layer) and then, zinc reaches the vicinity of the sixth layer (Ga—Zn—O layer). Note that the argon which collides with the gallium is sputtered to the outside. Accordingly, in the case where argon collides with the target including the InGaZnO$_4$ crystal, a crack is thought to be formed in the second plane (the second) in FIG. 64A.

FIG. 66B shows trajectories of the atoms from 0 picosecond to 0.3 picoseconds after oxygen enters the cell including the InGaZnO$_4$ crystal in FIGS. 64A and 64B. Accordingly, FIG. 66B corresponds to a period from FIGS. 64A and 64B to FIG. 65A.

On the other hand, according to FIG. 66B, when oxygen collides with gallium (Ga) of the first layer (Ga—Zn—O layer), gallium collides with zinc (Zn) of the third layer (Ga—Zn—O layer) and then, zinc does not reach the fifth layer (In—O layer). Note that the oxygen which collides with the gallium is sputtered to the outside. Accordingly, in the case where oxygen collides with the target including the InGaZnO$_4$ crystal, a crack is thought to be formed in the second plane (the first) in FIG. 64A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by the following Formula 4 and the following Formula 5. Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

$$E = \frac{1}{2}m_A v_A^2 + \frac{1}{2}m_{Ga} v_{Ga}^2 \quad \text{[Formula 4]}$$

$$m_A v_A + m_{Ga} v_{Ga} = m_A v'_A + m_{Ga} v'_{Ga} \quad \text{[Formula 5]}$$

On the assumption that collision of argon or oxygen is elastic collision, the relationship among $v_A$, $v'_A$, $v_{Ga}$, and $v'_{Ga}$ can be represented by the following Formula 3.

$$v'_A - v'_{Ga} = -(v_A - v_{Ga}) \quad \text{[Formula 6]}$$

From the formulae 4, 5, and 6, on the assumption that $v_{Ga}$ is 0, the speed of gallium $v'_{Ga}$ after collision of argon or oxygen can be represented by the following Formula 7.

$$v'_{Ga} = \frac{\sqrt{m_A}}{m_A + m_{Ga}} \cdot 2\sqrt{2E} \quad \text{[Formula 7]}$$

In Formula 7, mass of argon or oxygen is substituted into $m_A$, whereby the speeds after collision of the atoms are compared. In the case where the argon and the oxygen have the same energy before collision, the speed of gallium in the case where argon collides with the gallium was found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, it is considered that a crack is formed at a deeper position in the case where argon collides with the gallium than in the case where oxygen collides with the gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size which is minuter than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model illustrated in FIG. 58A where sputtered pellets are deposited to form a CAAC-OS is a reasonable model.

The CAAC-OS deposited in such a manner has a density substantially equal to that of a single crystal OS. For example, the density of the single crystal OS film having a homologous structure of InGaZnO$_4$ is 6.36 g/cm$^3$, and the density of the CAAC-OS film having substantially the same atomic ratio is approximately 6.3 g/cm$^3$.

Figure 67A:
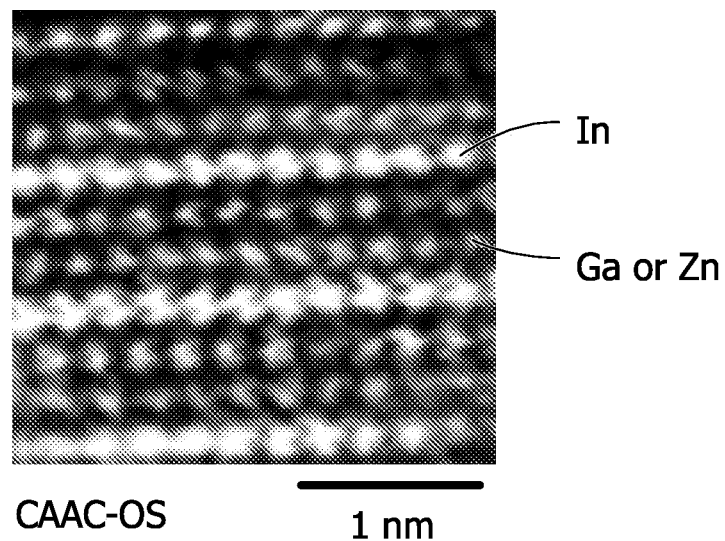
FIGS. 67A and 67B are cross-sectional HAADF-STEM images of a CAAC-OS and a target.
Figure 67B:
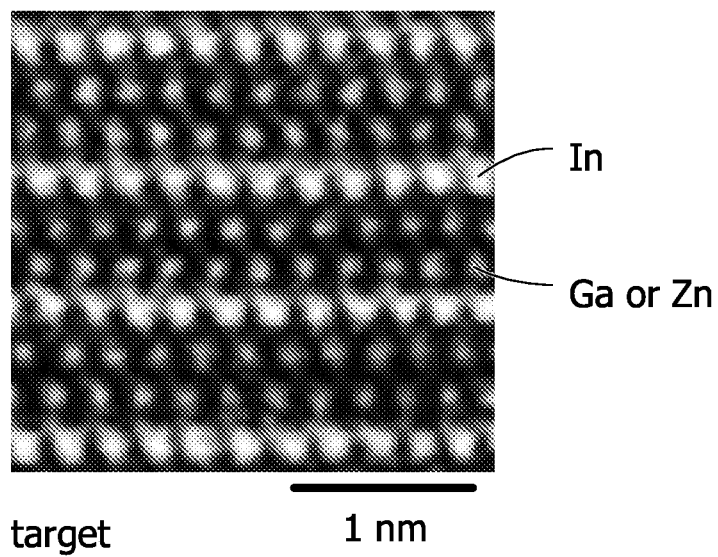

FIGS. 67A and 67B show atomic order of cross sections of an In—Ga—Zn oxide (see FIG. 67A) that is a CAAC-OS deposited by sputtering and a target thereof (see FIG. 67B). For observation of atomic arrangement, a high-angle annular dark field scanning transmission electron microscopy (HAADF-STEM) is used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 67A and FIG. 67B are compared, it is found that the CAAC-OS and the target each have a homologous structure and atomic order in the CAAC-OS correspond to that in the target. Thus, as illustrated in the deposition model in FIG. 58A, the crystal structure of the target is transferred, whereby a CAAC-OS is formed.

This embodiment can be combined as appropriate with any of the other embodiments and examples in this specification.

Example 1

In this example, experimental results on plasma treatment for forming the source region and the drain region in the transistor of one embodiment of the present invention will be described. Note that as the structure of the transistor, the structure of the transistor 101 illustrated in FIGS. 1A and 1B was used.

In this example, two kinds of transistors were fabricated; one of the transistors was fabricated without a resist mask on the gate electrode layer at plasma treatment, and the other of the transistors was fabricated with a resist mask left on the gate electrode layer at plasma treatment. The fabricating method is described in detail below.

As the substrate, a glass substrate was used. As the base insulating film, a stacked film consisting of a 100-nm-thick silicon nitride film and a 400-nm-thick silicon oxynitride film was deposited over the glass substrate by a plasma CVD method.

Then, heat treatment was performed on the base insulating film by rapid thermal annealing (RTA) at 650° C. for 6 minutes.

Next, a 5-nm-thick tantalum nitride film was formed over the base insulating film, and oxygen was added to the base insulating film through the tantalum nitride film by oxygen plasma treatment.

Next, a 50-nm-thick oxide semiconductor film was deposited by a sputtering method using an oxide target with a ratio of In:Ga:Zn=5:5:6.

Then, heat treatment of the oxide semiconductor film was performed at 450° C., in a nitrogen atmosphere for 1 hour and in a mixed atmosphere of nitrogen and oxygen for 1 hour.

Then, the oxide semiconductor film was selectively etched to form an oxide semiconductor layer. A 100-nm-thick silicon oxynitride film as a gate insulating film was deposited over the oxide semiconductor layer by a plasma CVD method.

Next, as a gate electrode layer, a 30-nm-thick tantalum nitride film and a 150-nm-thick tungsten film were deposited over the gate insulating film by a sputtering method.

Next, a resist mask was formed over the tungsten film. Then, the tungsten film, the tantalum nitride film, and the silicon oxynitride film were sequentially selectively etched, so that part of the oxide semiconductor layer (the first region and the second region) was exposed.

Then, plasma treatment was performed on the samples under the same conditions, with or without the resist mask left. For the plasma treatment, a vacuum apparatus that can apply high-frequency power (13.56 MHz) between a pair of electrodes was used. A substrate was placed on the cathode side, and plasma was generated by application of high-frequency waves with a power density of 0.47 or 0.94 W/cm$^2$ in a 5 Pa argon reduced-pressure atmosphere at a substrate temperature of 20° C. The treatment was performed for 1 minute.

Next, a 100-nm-thick silicon nitride film containing hydrogen was deposited over the above-described structure, and a 300-nm-thick silicon oxynitride film was deposited over the silicon nitride film. Both were deposited by a plasma CVD method.

Then, contact holes reaching the first region and the second region of the oxide semiconductor layer were formed in the silicon nitride film and the silicon oxynitride film.

Next, stacked layers of a 50-nm-thick tungsten film, a 400-nm-thick aluminum film, and a 100-nm-thick titanium film were sequentially deposited by a sputtering method so as to cover the contact holes, and were selectively etched, so that the source electrode layer and the drain electrode layer were formed.

Next, as a passivation film, a silicon nitride film was deposited over the above-described structure by a plasma CVD method, and then subjected to heat treatment at 350° C. in a mixed atmosphere of nitrogen and oxygen for 1 hour.

By the above-described method, the transistors were fabricated. Note that the transistor fabricated by performing the plasma treatment after the resist mask removal is referred to as a transistor A, and the transistor fabricated by performing the plasma treatment before the resist mask removal is referred to as a transistor B.

Figure 48A:
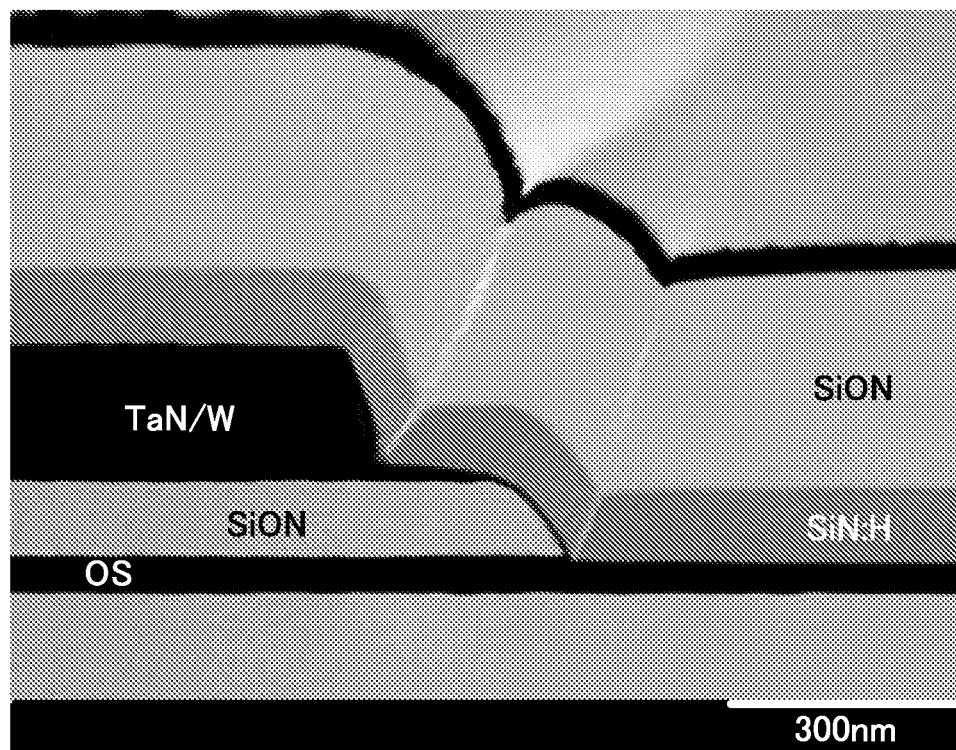
FIGS. 48A and 48B are cross-sectional TEM images of transistors.
Figure 48B:
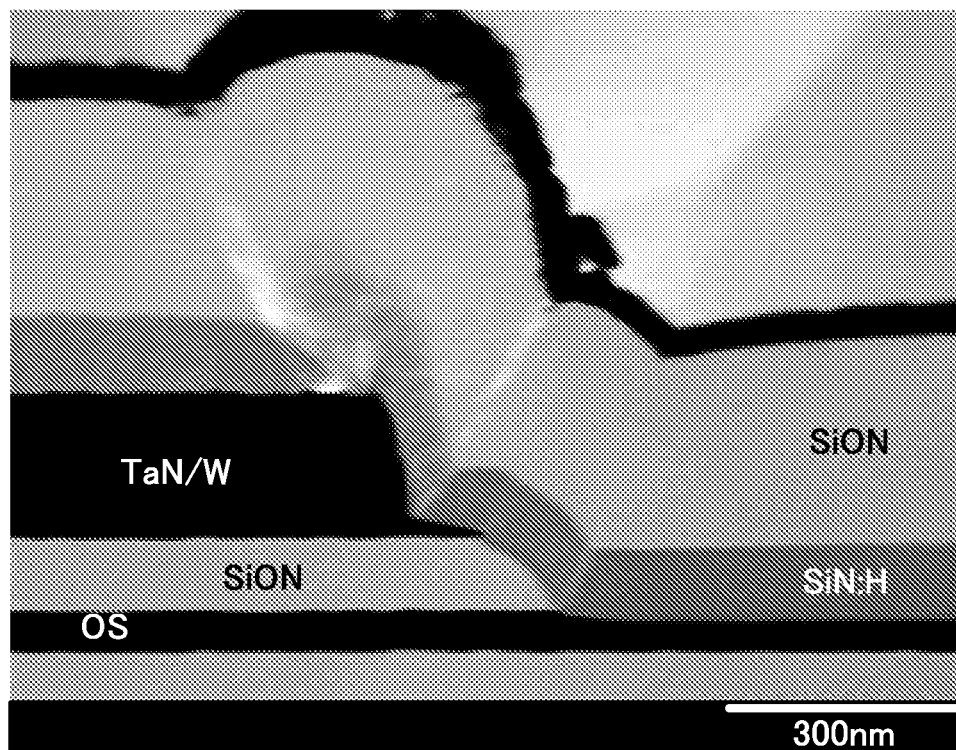

FIGS. 48A and 48B are cross-sectional TEM images each showing an end portion of the channel region in the channel length direction of the transistor. FIG. 48A shows a cross section of the transistor A, and FIG. 48B shows a cross section of the transistor B.

In the transistor A, a substance having the same color tone as the gate electrode layer is deposited on the end portion of the gate insulating film, while such a substance is not deposited in the transistor B.

Figure 49A:
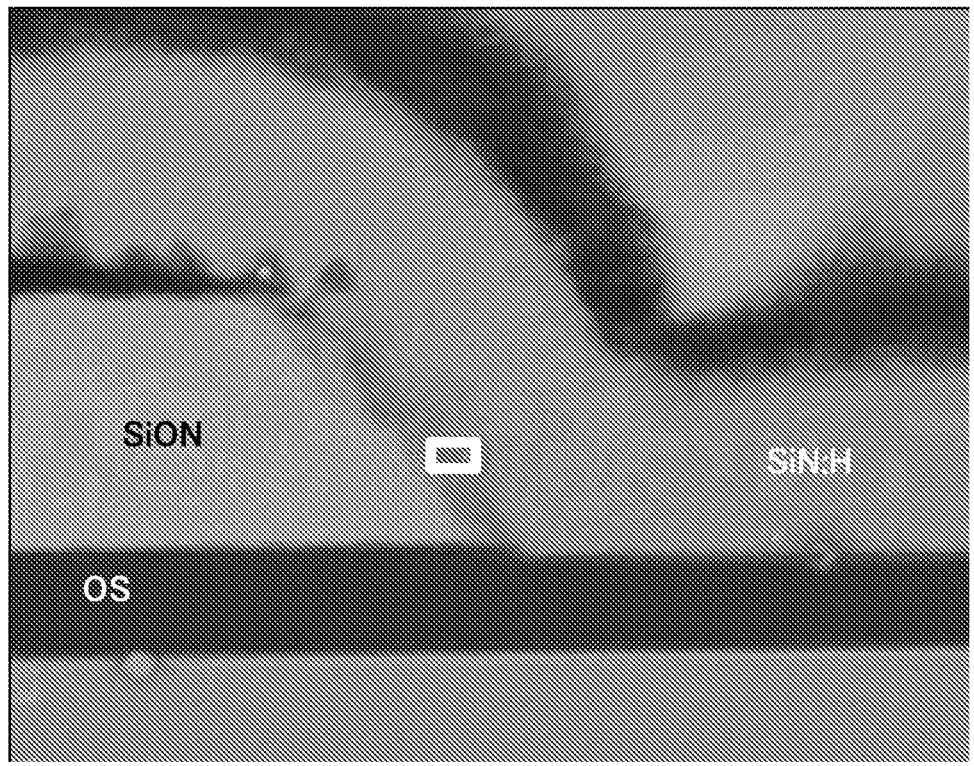
FIGS. 49A and 49B are cross-sectional TEM images of transistors.
Figure 49B:
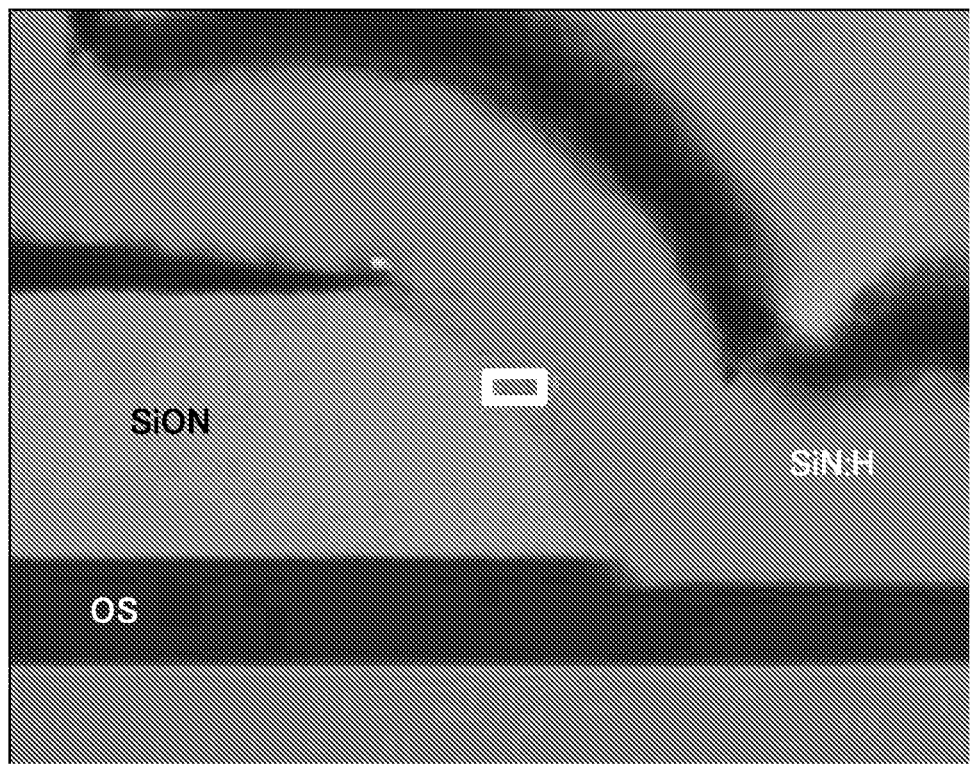

FIGS. 49A and 49B are cross-sectional views in the channel length direction of samples for the analysis, which were fabricated by the same fabricating method as those of the above-described transistors. FIG. 49A shows a cross section of the sample corresponding to the transistor A, and FIG. 49B shows a cross section of the sample corresponding to the transistor B. The region surrounded by the rectangle located in the center in both of the cross-sectional images was subjected to energy dispersive X-ray spectroscopy (EDX), and the results are shown in Table 4.

TABLE 4

| Characteristic X-rays | Plasma treatment (At %) | |
|---|---|---|
| | After resist mask removal | Before resist mask removal |
| CK | 14.59 | 13.80 |
| NK | 26.16 | 19.79 |
| OK | 21.44 | 22.54 |
| FK | 2.71 | 3.47 |
| SiK | 28.30 | 38.99 |
| CuK | 2.33 | 1.41 |
| WL | 2.14 | — |

From Table 4, the deposit on the end portion of the gate insulating film in FIG. 48A can be assumed to be tungsten. The deposit of tungsten results from sputtering of the tungsten film serving as the gate electrode layer. Since tungsten is not detected in the transistor B, the resist mask seems to prevent tungsten sputtering.

Figure 50A:
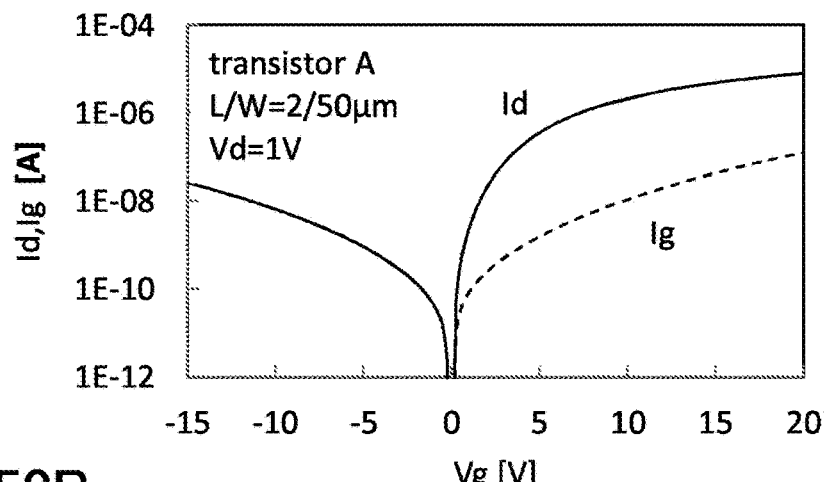
FIGS. 50A to 50C show Id-Vg characteristics of transistors.
Figure 50B:
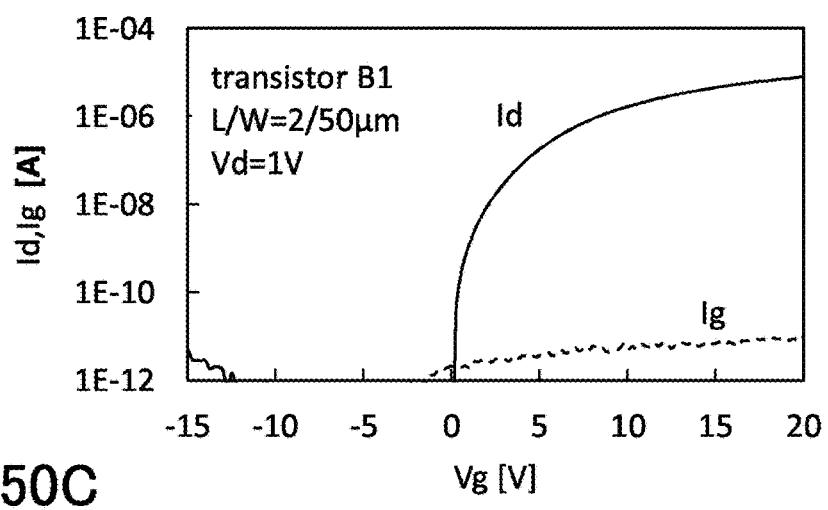
Figure 50C:
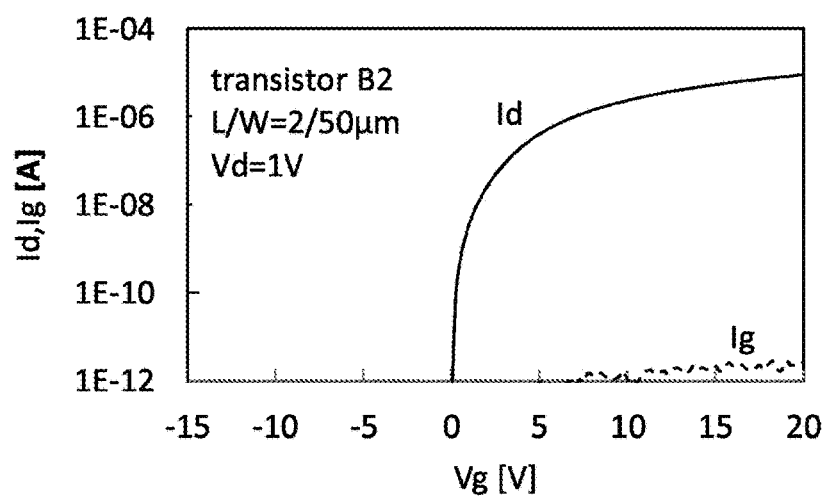

FIGS. 50A to 50C show Id-Vg characteristics of fabricated transistors. The transistor in FIG. 50A is the transistor A fabricated by performing the plasma treatment at 0.94 W/cm² after the resist mask removal. The transistor in FIG. 50B is a transistor B1 fabricated by performing the plasma treatment at 0.47 W/cm² before the resist mask removal. The transistor in FIG. 50C is a transistor B2 fabricated by performing the plasma treatment at 0.94 W/cm² before the resist mask removal.

As shown in FIG. 50A, the transistor A shows an extremely large gate leakage current (Ig) because the tungsten deposit on the end portion of the gate insulating film as shown in FIG. 48A serves as a leakage path.

Meanwhile in FIGS. 50B and 50C, the transistors B1 and B2 show sufficiently small gate leakage currents. This also indicates that the plasma treatment with the resist mask left prevents formation of the tungsten deposit on the end portion of the gate insulating film.

Next, gate bias-temperature stress tests were performed on the fabricated transistors. The tests were performed in both dark and photo states at a substrate temperature of 60° C., by application of ±12 V to the gate for 1 hour setting the source and the drain at the common potential. Note that a white LED was used as a light source in the photo state, and the illuminance was set at 10000 lx.

Figure 51:
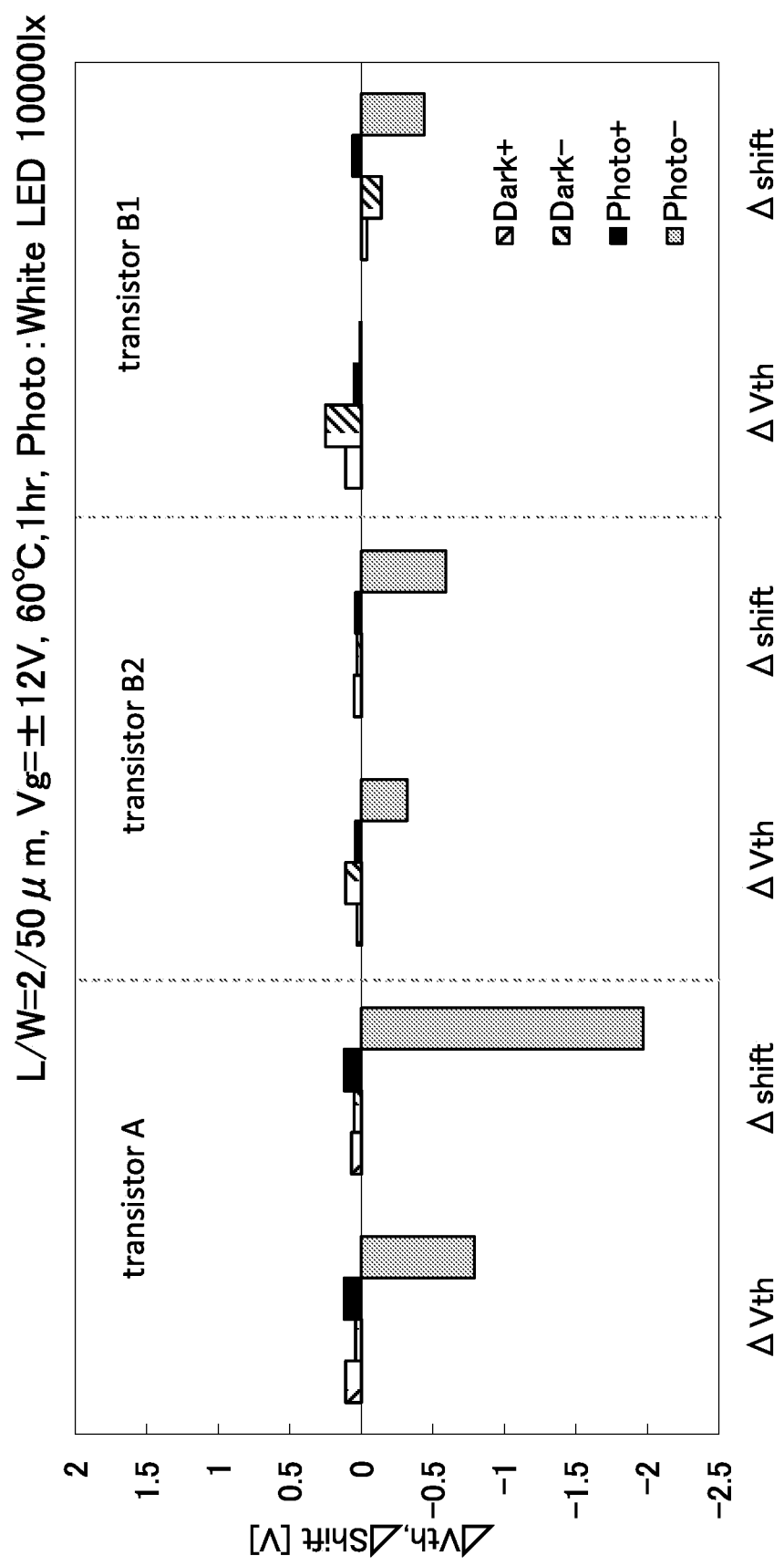
FIG. 51 shows results of gate bias-temperature stress tests.

FIG. 51 shows the results of the gate bias-temperature stress tests, where ΔVth is a variation in threshold voltage, and Δshift is a variation in shift value. Note that the shift value is the voltage at the current rising edge in Id-Vg characteristics, and is defined as the gate voltage (Vg [V]) when a drain current (Id [A]) is $1 \times 10^{-12}$ A.

In the negative gate bias test in the photo state, the transistor A had a large ΔVth and a large Δshift, while the transistor B1 and the transistor B2 each had a small ΔVth and a small Δshift.

Figure 52:
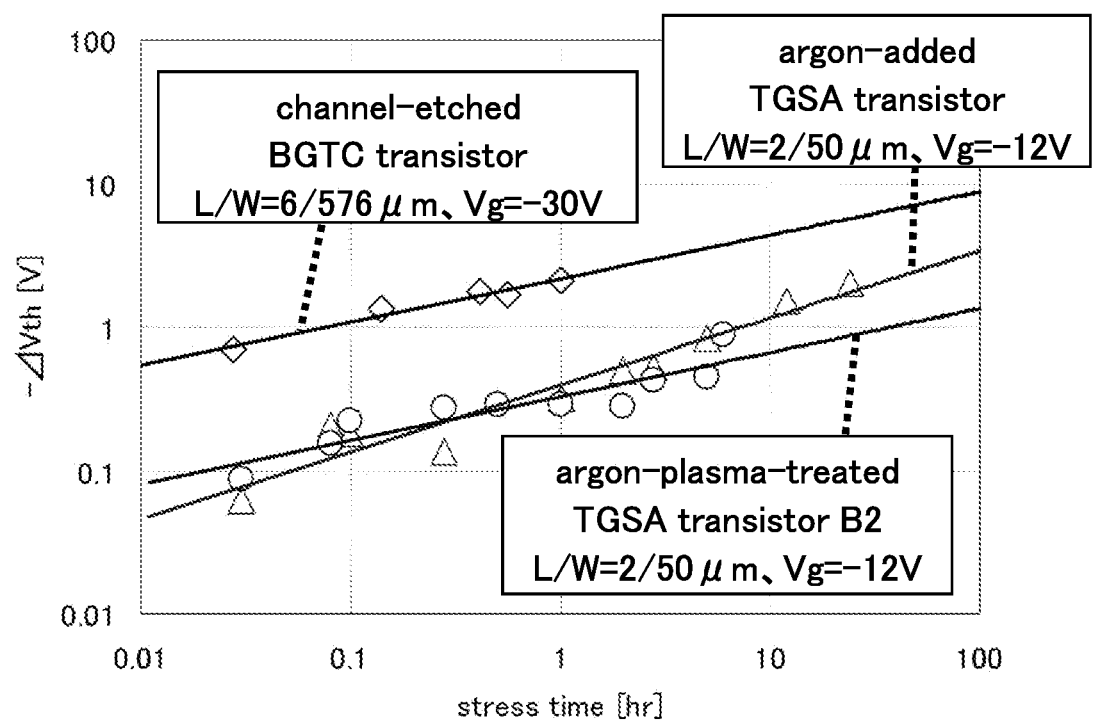
FIG. 52 shows results of gate bias-temperature stress tests.
Figure 53A:
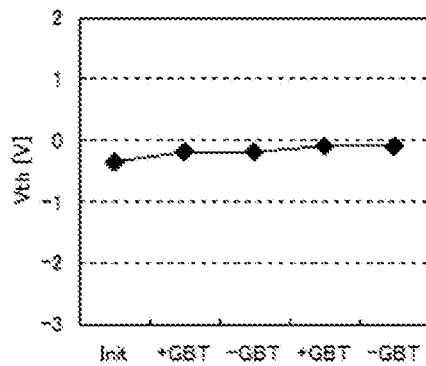
FIGS. 53A to 53D shows results of gate bias-temperature stress tests.
Figure 53B:
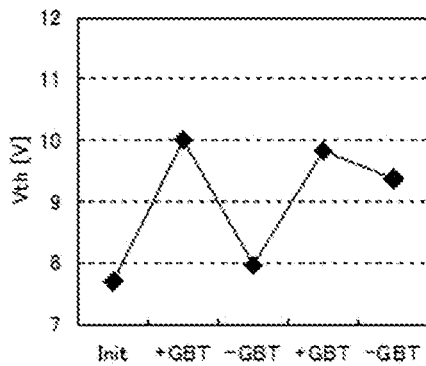
Figure 53C:
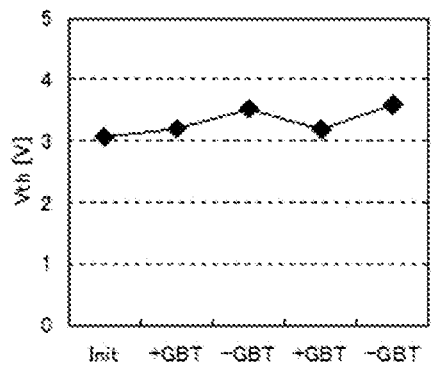
Figure 53D:
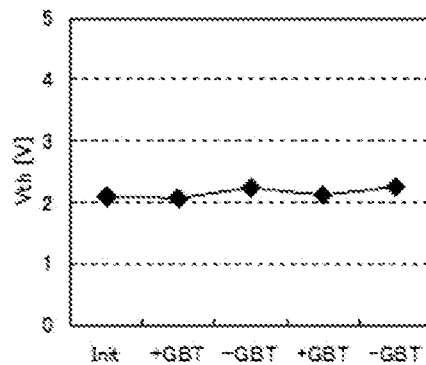

FIG. 52 shows the comparison results of the negative gate bias-temperature stress tests among the top-gate self-aligned (TGSA) transistor B2, the transistor that has the same TGSA structure as the transistor B2 but is different in that argon is added to the source region and the drain region with an ion doping apparatus, and a channel-etched bottom-gate top-contact (BGTC) transistor. The vertical axis shows −ΔVth, and the horizontal axis shows stress time. The ion doping was performed at a dose of $5E^{14}$ ions/cm² at an acceleration voltage of 10 kV. The BGTC transistor is different from the TGSA transistors in that the test was performed at a gate bias of −30 V and that the transistor had the following size: L/W is 6 μm/576 μm.

As shown in FIG. 52, the argon-plasma-treated transistor B2 had a smaller variation in threshold voltage than the other transistors.

FIGS. 53A to 53D are comparison test results of transistors including a channel-protective bottom-gate (BGTC) transistor. The test was performed by alternately applying a positive bias and a negative bias to the gate in the dark state. Note that the channel-protective bottom-gate transistor had L/W of 10.2 μm/82.6 μm, and the gate bias thereto was set at ±30 V.

As shown in FIGS. 53A to 53D, the argon-plasma-treated transistor B2 had a small variation in threshold voltage though having a small L length.

Therefore, a transistor whose source and drain regions are formed through argon plasma treatment can have favorable electric characteristics and reliability.

This embodiment can be combined as appropriate with any of the other embodiments and example in this specification.

Example 2

In this example, a sample corresponding to the transistor of one embodiment of the present invention was fabricated, and the region corresponding to the source region and the drain region and the region corresponding to the channel region in the sample were subjected to SIMS. The results are described below.

Figure 54A:
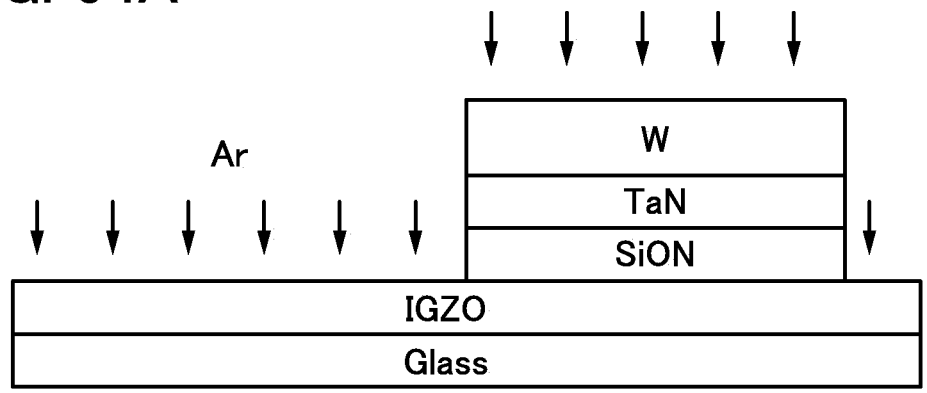
FIGS. 54A and 54B illustrate a sample for SIMS.

First, an oxide semiconductor layer (IGZO), a gate insulating film (silicon oxynitride), and a gate electrode layer (tantalum nitride and tungsten) were deposited over a glass substrate according to the transistor fabricating method described in Example 1, so that the structure illustrated in FIG. 54A was formed. Then, as illustrated in the drawing, argon was added downward to the structure with an ion doping apparatus at 30 kV and a dose of $1.0E^{15}$ ions/cm². Note that this method is different from the transistor fabricating method of Example 1 in not forming the insulating layer between the glass substrate and the oxide semiconductor layer. As a reference transistor, a sample with the same structure except that argon was added was fabricated.

Figure 54B:
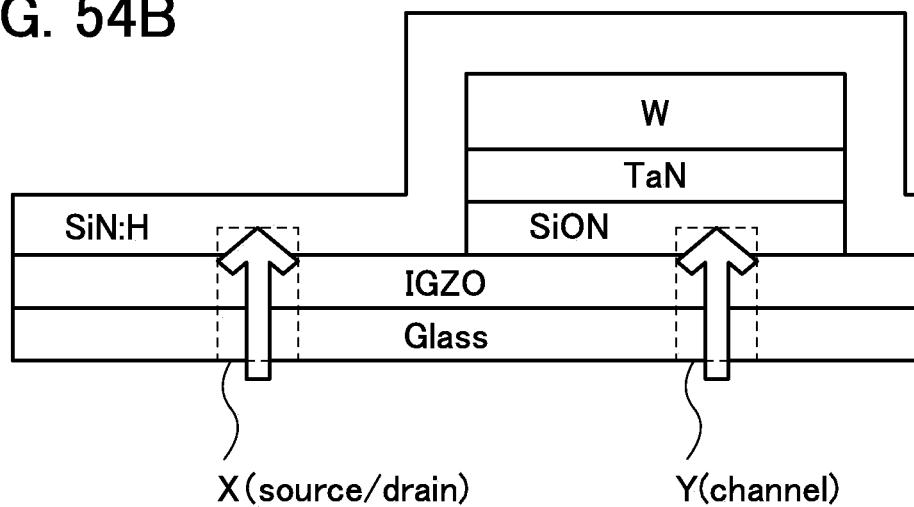

Next, a silicon nitride film containing hydrogen was formed over the above structure according to the transistor fabricating method to form the structure illustrated in FIG. 54B. Then, SIMS of hydrogen was performed on a region X (corresponding to the source region and the drain region)

and a region Y (corresponding to the channel region). Note that the SIMS was performed from the glass substrate side.

Figure 55A:
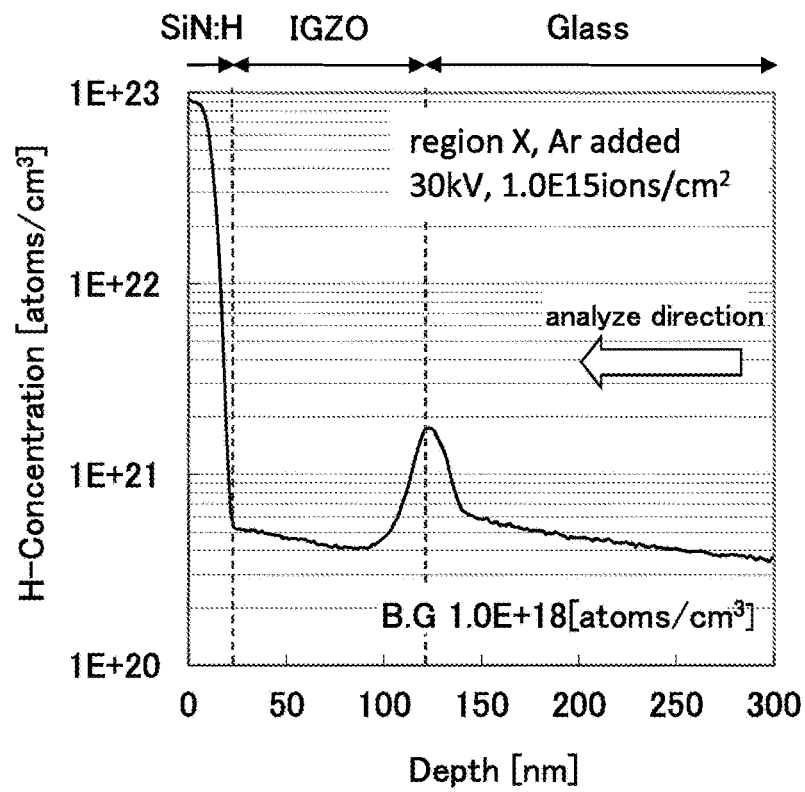
FIGS. 55A and 55B show results of SIMS.
Figure 55B:
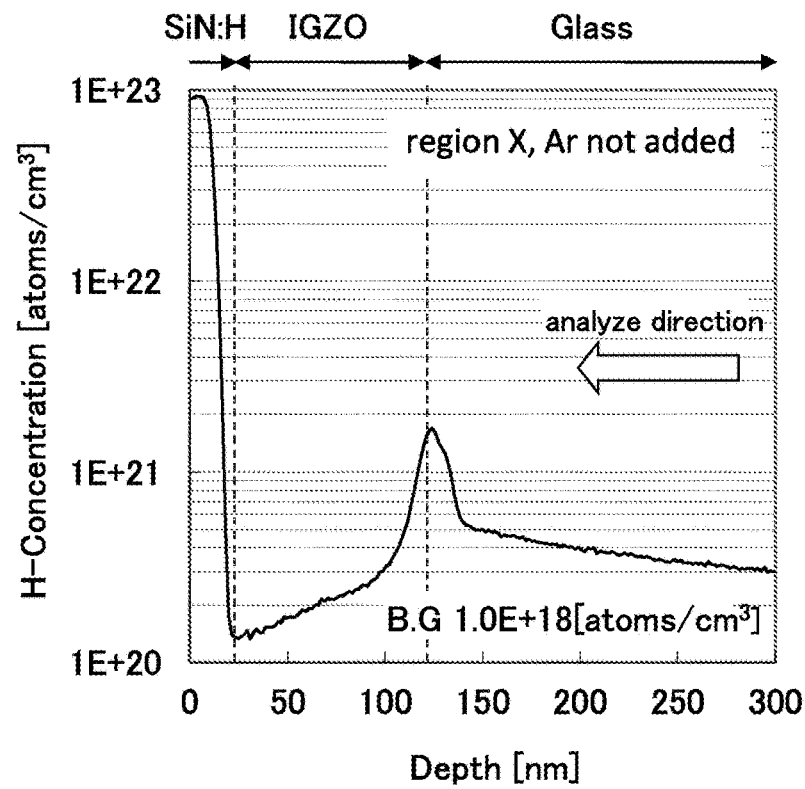

FIGS. 55A and 55B show hydrogen depth profiles of the region X in the sample to which argon was added and the sample to which argon was not added, respectively. The hydrogen concentration of the oxide semiconductor layer in the region X was higher than or equal to $4 \times 10^{20}$ in the sample to which argon was added and lower than $4 \times 10^{20}$ in the sample to which argon was not added.

Figure 56A:
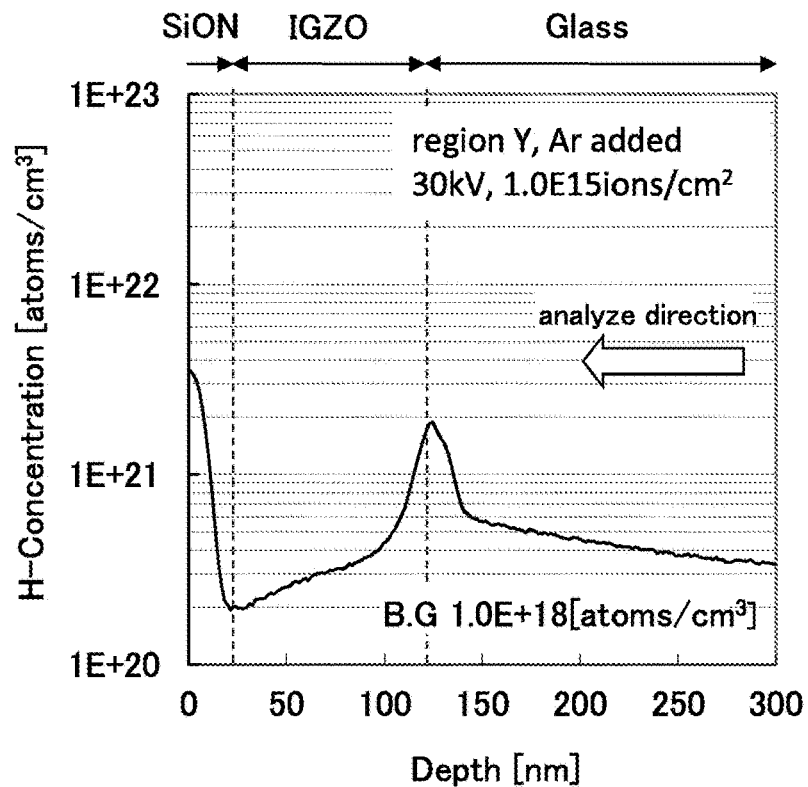
FIGS. 56A and 56B show results of SIMS.
Figure 56B:
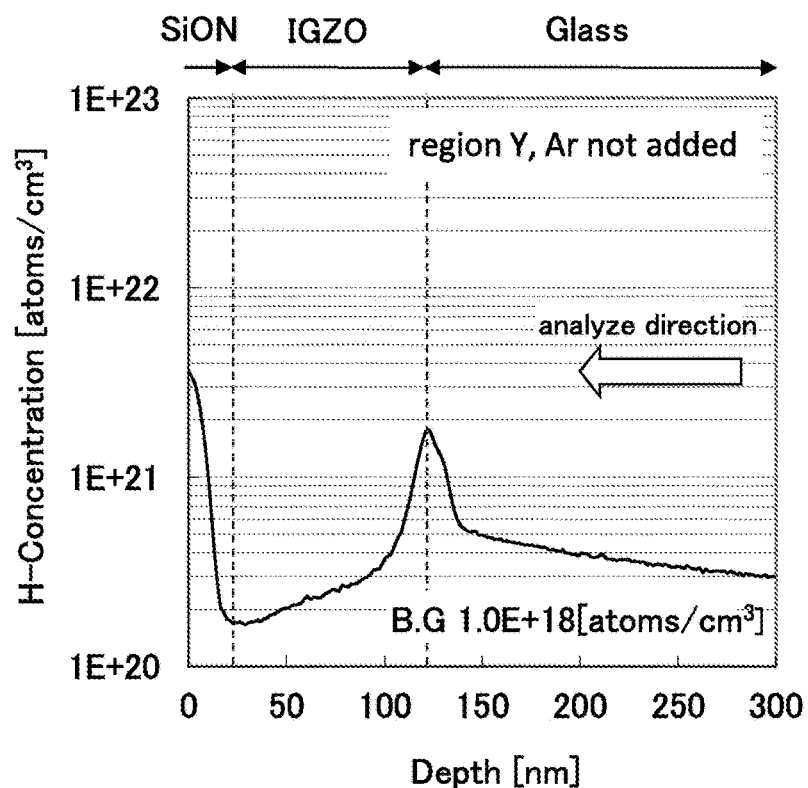

FIGS. 56A and 56B show hydrogen depth profiles of the region Y in the sample to which argon was added and the sample to which argon was not added, respectively. In the region Y, there is no difference in hydrogen depth profile depending on the argon addition. Furthermore, the region Y has a lower hydrogen concentration than the region X of the argon-added sample.

These results reveal that argon-added source and drain regions have a higher hydrogen concentration than a channel region in the transistor structure.

That is, the addition of argon forms oxygen vacancies in an oxide semiconductor layer, and hydrogen is diffused to the oxide semiconductor layer from a nitride insulating film containing hydrogen which is formed in contact with the oxide semiconductor layer.

This embodiment can be combined as appropriate with any of the other embodiments and example in this specification.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed and part of the range is removed, whereby one embodiment of the invention can be constituted excluding part of the range can be constructed. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a TFT and a light-emitting element, the following case is possible: Company A manufactures and sells semiconductor devices including TFTs, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a TFT and a light-emitting element, even when this specification or the like does not include a description of the case where a semiconductor device including the TFT is used alone or the case where a light-emitting device including the light-emitting element is used alone, one embodiment of the invention can be constituted by only the semiconductor device including the TFT and another embodiment of the invention can be constituted by only the light-emitting device including the light-emitting element. Those embodiments of the invention are clear and can be regarded as being disclosed in this specification or the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. The embodiment of the invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which AT elements (AT is an integer) are provided. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the invention is clear.

This application is based on Japanese Patent Application serial no. 2014-020061 filed with Japan Patent Office on Feb. 5, 2014 and Japanese Patent Application serial no. 2014-041446 filed with Japan Patent Office on Mar. 4, 2014, the entire contents of which are hereby incorporated by reference.

What is claimed is:

1. A semiconductor device comprising a transistor comprising:
   an oxide semiconductor layer;
   a gate insulating layer over the oxide semiconductor layer;

a gate electrode overlapping with the oxide semiconductor layer with the gate insulating layer provided therebetween, the gate electrode comprising a first layer and a second layer provided over the first layer;

a first conductive layer over the oxide semiconductor layer, the first conductive layer configured to be one of a source electrode and a drain electrode of the transistor; and a first insulating layer over the gate electrode, the first insulating layer having a region being in contact with a top surface of the gate insulating layer, wherein in a cross-sectional view parallel to a channel length direction of the transistor, an end portion of the first layer of the gate electrode is positioned on an outer side than an end portion of the second layer of the gate electrode, wherein in the cross-sectional view parallel to the channel length direction of the transistor, the oxide semiconductor layer comprises a channel formation region, a first region being adjacent to the channel formation region and being in contact with the gate insulating layer, a second region being in contact with the first conductive layer, and a third region located between the first region and the second region and being in contact with the first insulating layer, and wherein a thickness of the second region is smaller than a thickness of the first region.

2. The semiconductor device according to claim 1, further comprising a second insulating layer under the oxide semiconductor layer, wherein the second insulating layer comprises a fourth region being in contact with the oxide semiconductor layer and a fifth region being in contact with the first insulating layer, and wherein a thickness of the fourth region is larger than a thickness of the fifth region.

3. The semiconductor device according to claim 1, wherein each of the first region and the third region includes an impurity element, and wherein a concentration of the impurity element in the first region is lower than a concentration of the impurity element in the third region.

4. The semiconductor device according to claim 3, further comprising a second insulating layer under the oxide semiconductor layer, wherein the second insulating layer comprises a fourth region being in contact with the oxide semiconductor layer and a fifth region being in contact with the first insulating layer, and wherein a thickness of the fourth region is larger than a thickness of the fifth region.

5. The semiconductor device according to claim 1, wherein the oxide semiconductor layer comprises In, Ga, and Zn.

6. The semiconductor device according to claim 1, wherein each of the first layer and the second layer of the gate electrode comprises at least one element selected from the group consisting of Al, Ti, Cr, Co, Ni, Cu, Y, Zr, Mo, Ru, Ag, Mn, Nd, Sc, Ta, and W.

7. The semiconductor device according to claim 1, wherein the first conductive layer has a stacked layer comprising elements selected from the group consisting of Al, Cr, Cu, Ta, Ti, Mo, W, Ni, Mn, Nd, and Sc.

8. A semiconductor device comprising a transistor comprising:

an oxide semiconductor layer;

a gate insulating layer over the oxide semiconductor layer;

a gate electrode overlapping with the oxide semiconductor layer with the gate insulating layer provided therebetween, the gate electrode comprising a first layer and a second layer provided over the first layer;

a first conductive layer over the oxide semiconductor layer, the first conductive layer configured to be one of a source electrode and a drain electrode of the transistor; and a first insulating layer over the gate electrode, the first insulating layer having a region being in contact with a top surface of the gate insulating layer, wherein in a cross-sectional view parallel to a channel length direction of the transistor, an end portion of the first layer of the gate electrode is positioned on an outer side than an end portion of the second layer of the gate electrode, wherein in the cross-sectional view parallel to the channel length direction of the transistor, an end portion of the gate insulating layer is positioned on an outer side than the end portion of the first layer of the gate electrode, wherein in the cross-sectional view parallel to the channel length direction of the transistor, the oxide semiconductor layer comprises a channel formation region, a first region being adjacent to the channel formation region and being in contact with the gate insulating layer, a second region being in contact with the first conductive layer, and a third region being adjacent to the first region and being in contact with the first insulating layer, and wherein a thickness of the second region is smaller than a thickness of the first region.

9. The semiconductor device according to claim 8, further comprising a second insulating layer under the oxide semiconductor layer, wherein the second insulating layer comprises a fourth region being in contact with the oxide semiconductor layer and a fifth region being in contact with the first insulating layer, and wherein a thickness of the fourth region is larger than a thickness of the fifth region.

10. The semiconductor device according to claim 8, wherein each of the first region and the third region includes an impurity element, and wherein a concentration of the impurity element in the first region is lower than a concentration of the impurity element in the third region.

11. The semiconductor device according to claim 10, further comprising a second insulating layer under the oxide semiconductor layer, wherein the second insulating layer comprises a fourth region being in contact with the oxide semiconductor layer and a fifth region being in contact with the first insulating layer, and wherein a thickness of the fourth region is larger than a thickness of the fifth region.

12. The semiconductor device according to claim 8, wherein the oxide semiconductor layer comprises In, Ga, and Zn.

13. The semiconductor device according to claim 8, wherein each of the first layer and the second layer of the gate electrode comprises at least one element selected from the group consisting of Al, Ti, Cr, Co, Ni, Cu, Y, Zr, Mo, Ru, Ag, Mn, Nd, Sc, Ta, and W.

14. The semiconductor device according to claim 8, wherein the first conductive layer has a stacked layer comprising elements selected from the group consisting of Al, Cr, Cu, Ta, Ti, Mo, W, Ni, Mn, Nd, and Sc.

15. A semiconductor device comprising a transistor comprising:
   an oxide semiconductor layer;
   a gate insulating layer over the oxide semiconductor layer;
   a gate electrode overlapping with the oxide semiconductor layer with the gate insulating layer provided therebetween, the gate electrode comprising a first layer and a second layer provided over the first layer;
   a first conductive layer over the oxide semiconductor layer, the first conductive layer configured to be one of a source electrode and a drain electrode of the transistor; and
   a first insulating layer over the gate electrode, the first insulating layer having a region being in contact with a top surface of the gate insulating layer and a side surface of the first layer of the gate electrode,
   wherein in a cross-sectional view parallel to a channel length direction of the transistor, an end portion of the first layer of the gate electrode is positioned on an outer side than an end portion of the second layer of the gate electrode,
   wherein in the cross-sectional view parallel to the channel length direction of the transistor, an angle between a side surface of the first layer of the gate electrode and the top surface of the gate insulating layer is less than an angle between a side surface of the second layer of the gate electrode and a top surface of the first layer of the gate electrode, and
   wherein in the cross-sectional view parallel to the channel length direction of the transistor, the oxide semiconductor layer comprises a channel formation region, a first region being adjacent to the channel formation region and being in contact with the gate insulating layer, a second region being in contact with the first conductive layer, and a third region located between the first region and the second region and being in contact with the first insulating layer.

16. The semiconductor device according to claim 15, further comprising a second insulating layer under the oxide semiconductor layer,
   wherein the second insulating layer comprises a fourth region being in contact with the oxide semiconductor layer and a fifth region being in contact with the first insulating layer, and
   wherein a thickness of the fourth region is larger than a thickness of the fifth region.

17. The semiconductor device according to claim 15,
   wherein each of the first region and the third region includes an impurity element, and
   wherein a concentration of the impurity element in the first region is lower than a concentration of the impurity element in the third region.

18. The semiconductor device according to claim 15, wherein the oxide semiconductor layer comprises In, Ga, and Zn.

19. The semiconductor device according to claim 15, wherein each of the first layer and the second layer of the gate electrode comprises at least one element selected from the group consisting of Al, Ti, Cr, Co, Ni, Cu, Y, Zr, Mo, Ru, Ag, Mn, Nd, Sc, Ta, and W.

20. The semiconductor device according to claim 15, wherein the first conductive layer has a stacked layer comprising elements selected from the group consisting of Al, Cr, Cu, Ta, Ti, Mo, W, Ni, Mn, Nd, and Sc.

* * * * *